(12) United States Patent
Tanaka et al.

(10) Patent No.: US 10,923,517 B2
(45) Date of Patent: Feb. 16, 2021

(54) SOLID-STATE IMAGING APPARATUS HAVING OUTPUT CIRCUIT UNIT FOR OUTPUTTING A PIXEL SIGNAL

(71) Applicant: SONY CORPORATION, Tokyo (JP)

(72) Inventors: Harumi Tanaka, Kanagawa (JP); Yoshiaki Masuda, Kanagawa (JP); Shinji Miyazawa, Kanagawa (JP); Minoru Ishida, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/854,344

(22) Filed: Apr. 21, 2020

(65) Prior Publication Data
US 2020/0251511 A1 Aug. 6, 2020

Related U.S. Application Data

(63) Continuation of application No. 16/086,404, filed as application No. PCT/JP2017/010302 on Mar. 15, 2017, now Pat. No. 10,672,809.

(30) Foreign Application Priority Data

Mar. 29, 2016 (JP) ................. 2016-065607

(51) Int. Cl.
*H01L 27/146* (2006.01)
*G01N 21/78* (2006.01)
(Continued)

(52) U.S. Cl.
CPC ....... *H01L 27/14605* (2013.01); *G01N 21/64* (2013.01); *G01N 21/78* (2013.01);
(Continued)

(58) Field of Classification Search
CPC ............ H01L 21/76898; H01L 23/481; H01L 27/14605; H01L 27/14621; H01L 27/14627; H01L 27/14634; H01L 27/14636; H01L 27/14685; H01L 31/02366; H01L 31/0543
See application file for complete search history.

(56) References Cited

U.S. PATENT DOCUMENTS

2012/0068291 A1  3/2012  Kawasaki et al.
2013/0020468 A1  1/2013  Mitsuhashi et al.
(Continued)

FOREIGN PATENT DOCUMENTS

WO   WO 2016/185901    11/2016

*Primary Examiner* — Stephen W Smoot
(74) *Attorney, Agent, or Firm* — Sheridan Ross P.C.

(57) ABSTRACT

The present disclosure relates to reducing the size of a solid-state imaging apparatus. The solid-state imaging apparatus is configured by laminating a first structure body, comprising a pixel array unit in which pixels for performing photoelectric conversion are two-dimensionally aligned, and a second structure body, comprising an output circuit unit for outputting a pixel signal. The output circuit unit, including a through via which penetrates a semiconductor substrate constituting a part of the second structure body, and a signal output external terminal connected to the outside of the apparatus are arranged under the first structure body, the output circuit unit is connected to the signal output external terminal via the through via, and the outermost surface of the apparatus is a resin layer formed on an upper layer of an on-chip lens of the pixel array unit.

10 Claims, 82 Drawing Sheets

(51) Int. Cl.
  *G01N 21/64*  (2006.01)
  *H01L 23/48*  (2006.01)
  *H01L 31/054*  (2014.01)
  *H04N 5/369*  (2011.01)
  *H04N 5/349*  (2011.01)

(52) U.S. Cl.
  CPC ...... *H01L 23/481* (2013.01); *H01L 27/14618* (2013.01); *H01L 27/14632* (2013.01); *H01L 27/14636* (2013.01); *H01L 27/14685* (2013.01); *H01L 27/14687* (2013.01); *H01L 31/0543* (2014.12); *H04N 5/349* (2013.01); *H04N 5/369* (2013.01); *G01N 21/6454* (2013.01); *G01N 2021/6471* (2013.01); *H01L 27/14621* (2013.01); *H01L 27/14627* (2013.01); *H01L 27/14634* (2013.01)

(56) References Cited

U.S. PATENT DOCUMENTS

| | | |
|---|---|---|
| 2015/0097259 A1 | 4/2015 | Chang et al. |
| 2018/0152657 A1 | 5/2018 | Miyazawa |
| 2019/0043910 A1 | 2/2019 | Miyazawa |
| 2019/0057989 A1 | 2/2019 | Ishiwata et al. |
| 2019/0096948 A1 | 3/2019 | Masuda et al. |

# SOLID-STATE IMAGING APPARATUS HAVING OUTPUT CIRCUIT UNIT FOR OUTPUTTING A PIXEL SIGNAL

CROSS REFERENCE TO RELATED APPLICATIONS

This application is a continuation of U.S. patent application Ser. No. 16/086,404 filed Sep. 19, 2018, now U.S. Pat. No. 10,672,809, which is a national stage application under 35 U.S.C. 371 and claims the benefit of PCT Application No. PCT/JP2017/010302 having an international filing date of Mar. 15, 2017, which designated the United States, which PCT application claimed the benefit of Japanese Patent Application No. 2016-065607 filed Mar. 29, 2016, the entire disclosures of each of which are incorporated herein by reference.

TECHNICAL FIELD

The present disclosure relates to a solid-state imaging apparatus, and more particularly to a solid-state imaging apparatus that can further downsize the size of the apparatus.

BACKGROUND ART

A configuration in which a plurality of semiconductor substrates are laminated is proposed, or the like to further downsize a solid-state imaging apparatus, such as a complementary metal oxide semiconductor (CMOS) image sensor (e.g., see Patent Document 1).

CITATION LIST

Patent Document

Patent Document 1: Japanese Patent Application Laid-Open No. 2014-72294

SUMMARY OF THE INVENTION

Problems to be Solved by the Invention

As the solid-state imaging apparatus is downsized, an area occupied by a terminal unit for taking out an output signal becomes larger for the plane size of the apparatus, making the downsizing difficult.

The present disclosure has been made in light of such a situation and can further downsize the size of the apparatus.

Solutions to Problems

A solid-state imaging apparatus according to a first aspect of the present technology is configured by laminating a first structure body, at which a pixel array unit in which pixels for performing photoelectric conversion are two-dimensionally aligned is formed, and a second structure body, at which an output circuit unit for outputting a pixel signal outputted from the pixels to an outside of the apparatus is formed, in which the output circuit unit, a through via which penetrates a semiconductor substrate constituting a part of the second structure body, and a signal output external terminal connected to the outside of the apparatus are arranged under the pixel array unit of the first structure body, the output circuit unit is connected to the signal output external terminal via the through via, and an outermost surface of the apparatus is a resin layer formed on an upper layer of an on-chip lens of the pixel array unit.

According to the first aspect of the present technology, the first structure body, at which the pixel array unit in which the pixels for performing photoelectric conversion are two-dimensionally aligned is formed, and the second structure body, at which the output circuit unit for outputting the pixel signal outputted from the pixels to the outside of the apparatus is formed, are laminated to be configured, the output circuit unit, the through via which penetrates the semiconductor substrate constituting a part of the second structure body, and the signal output external terminal connected to the outside of the apparatus are arranged under the pixel array unit of the first structure body, the output circuit unit is connected to the signal output external terminal via the through via, and the outermost surface of the apparatus is the resin layer formed on the upper layer of the on-chip lens of the pixel array unit.

A solid-state imaging apparatus according to a second aspect of the present technology is configured by laminating a first structure body, at which a pixel array unit in which pixels for performing photoelectric conversion are two-dimensionally aligned is formed, and a second structure body, at which an output circuit unit for outputting a pixel signal outputted from the pixels to an outside of the apparatus is formed, in which the output circuit unit, a through via which penetrates a semiconductor substrate constituting a part of the second structure body, and a signal output external terminal connected to the outside of the apparatus are arranged under the pixel array unit of the first structure body, the output circuit unit is connected to the signal output external terminal via the through via, and an outermost surface of the apparatus is an antireflection film formed on a surface of an on-chip lens of the pixel array unit.

According to the second aspect of the present technology, the first structure body, at which the pixel array unit in which the pixels for performing photoelectric conversion are two-dimensionally aligned is formed, and the second structure body, at which the output circuit unit for outputting the pixel signal outputted from the pixels to the outside of the apparatus is formed, are laminated to be configured, the output circuit unit, the through via which penetrates the semiconductor substrate constituting a part of the second structure body, and the signal output external terminal connected to the outside of the apparatus are arranged under the pixel array unit of the first structure body, the output circuit unit is connected to the signal output external terminal via the through via, and the outermost surface of the apparatus is the antireflection film formed on the surface of the on-chip lens of the pixel array unit.

A solid-state imaging apparatus according to a third aspect of the present technology is configured by laminating a first structure body, at which a pixel array unit in which pixels for performing photoelectric conversion are two-dimensionally aligned is formed, a microlens array substrate or a laminated lens structure body positioned above the first structure body, and a second structure body, at which an output circuit unit for outputting a pixel signal outputted from the pixels to an outside of the apparatus is formed, in which the output circuit unit, a through via which penetrates a semiconductor substrate constituting a part of the second structure body, and a signal output external terminal connected to the outside of the apparatus are arranged under the pixel array unit of the first structure body, and the output circuit unit is connected to the signal output external terminal via the through via.

According to the third aspect of the present technology, the first structure body, at which the pixel array unit in which the pixels for performing photoelectric conversion are two-dimensionally aligned is formed, the microlens array substrate or the laminated lens structure body positioned above the first structure body, and the second structure body, at which the output circuit unit for outputting the pixel signal outputted from the pixels to the outside of the apparatus is formed, are laminated to be configured, the output circuit unit, the through via which penetrates the semiconductor substrate constituting a part of the second structure body, and the signal output external terminal connected to the outside of the apparatus are arranged under the pixel array unit of the first structure body, and the output circuit unit is connected to the signal output external terminal via the through via.

A solid-state imaging apparatus according to a fourth aspect of the present technology is configured by laminating a first structure body, at which a pixel array unit in which pixels for performing photoelectric conversion are two-dimensionally aligned is formed, and a second structure body, at which an output circuit unit for outputting a pixel signal outputted from the pixels to an outside of the apparatus is formed, in which the output circuit unit, a through via which penetrates a semiconductor substrate constituting a part of the second structure body, and a signal output external terminal connected to the outside of the apparatus are arranged under the pixel array unit of the first structure body, the output circuit unit is connected to the signal output external terminal via the through via, and an outermost surface of the apparatus is a fluorescent material formed on an upper layer of an on-chip lens of the pixel array unit.

According to the fourth aspect of the present technology, the first structure body, at which the pixel array unit in which the pixels for performing photoelectric conversion are two-dimensionally aligned is formed, and the second structure body, at which the output circuit unit for outputting the pixel signal outputted from the pixels to the outside of the apparatus is formed, are laminated to be configured, the output circuit unit, the through via which penetrates the semiconductor substrate constituting a part of the second structure body, and the signal output external terminal connected to the outside of the apparatus are arranged under the pixel array unit of the first structure body, the output circuit unit is connected to the signal output external terminal via the through via, and the outermost surface of the apparatus is the fluorescent material formed on the upper layer of the on-chip lens of the pixel array unit.

A solid-state imaging apparatus according to a fifth aspect of the present technology is configured by laminating a first structure body, at which a pixel array unit in which pixels for performing photoelectric conversion are two-dimensionally aligned is formed, and a second structure body, at which an output circuit unit for outputting a pixel signal outputted from the pixels to an outside of the apparatus is formed, in which the output circuit unit, a through via which penetrates a semiconductor substrate constituting a part of the second structure body, and a signal output external terminal connected to the outside of the apparatus are arranged under the pixel array unit of the first structure body, the output circuit unit is connected to the signal output external terminal via the through via, and an outermost surface of the apparatus is an antibody which is formed on an upper layer of the pixel array unit and reacts to a fluorescent protein.

According to the fifth aspect of the present technology, the first structure body, at which the pixel array unit in which the pixels for performing photoelectric conversion are two-dimensionally aligned is formed, and the second structure body, at which the output circuit unit for outputting the pixel signal outputted from the pixels to the outside of the apparatus is formed, are laminated to be configured, the output circuit unit, the through via which penetrates the semiconductor substrate constituting a part of the second structure body, and the signal output external terminal connected to the outside of the apparatus are arranged under the pixel array unit of the first structure body, the output circuit unit is connected to the signal output external terminal via the through via, and the outermost surface of the apparatus is the antibody which is formed on the upper layer of the pixel array unit and reacts to the fluorescent protein.

A solid-state imaging apparatus according to a sixth aspect of the present technology is configured by laminating a first structure body, at which a pixel array unit in which pixels for performing photoelectric conversion are two-dimensionally aligned is formed, and a second structure body, at which an output circuit unit for outputting a pixel signal outputted from the pixels to an outside of the apparatus is formed, in which the output circuit unit, a through via which penetrates a semiconductor substrate constituting a part of the second structure body, and a signal output external terminal connected to the outside of the apparatus are arranged under the pixel array unit of the first structure body, the output circuit unit is connected to the signal output external terminal via the through via, and an outermost surface of the apparatus is a chemically modified film which is formed on an upper layer of the pixel array unit and attaches a charge.

According to the sixth aspect of the present technology, the first structure body, at which the pixel array unit in which the pixels for performing photoelectric conversion are two-dimensionally aligned is formed, and the second structure body, at which the output circuit unit for outputting the pixel signal outputted from the pixels to the outside of the apparatus is formed, are laminated to be configured, the output circuit unit, the through via which penetrates the semiconductor substrate constituting a part of the second structure body, and the signal output external terminal connected to the outside of the apparatus are arranged under the pixel array unit of the first structure body, the output circuit unit is connected to the signal output external terminal via the through via, and the outermost surface of the apparatus is the chemically modified film which is formed on the upper layer of the pixel array unit and attaches the charge.

The solid-state imaging apparatus may be an independent apparatus or may be a module incorporated into other apparatuses.

Effects of the Invention

According to the first to sixth aspects of the present disclosure, the size of the apparatus can be further downsized.

Note that the effects described herein are not necessarily limited and may be any of the effects described in the present disclosure.

MODE FOR CARRYING OUT THE INVENTION

Hereinafter, modes (hereinafter, referred to as embodiments) for carrying out the present technology will be described. Note that the description is made in the following order.

1. First Embodiment of Solid-State Imaging Apparatus
2. System Configuration of Solid-State Imaging Apparatus
3. Circuit Arrangement Configuration Example of Pixel
4. Configuration Examples of Input Circuit and Output Circuit
5. Circuit Arrangement Configuration Example of Solid-State Imaging Apparatus
6. Cross-Sectional Structure of Solid-State Imaging Apparatus
7. Circuit Arrangement of Solid-State Imaging Apparatus In Case Where Another Upper and Lower Wiring Connection Structure is Used
8. Comparative Examples With Other Solid-State Imaging Apparatuses
9. Other Circuit Arrangement Configuration Examples of Solid-State Imaging Apparatus
  10. Detailed Structure of Solid-State Imaging Apparatus
  11. Method of Manufacturing First embodiment
  12. Further Modification Examples
  13. Second Embodiment of Solid-State Imaging Apparatus
  14. Third Embodiment of Solid-State Imaging Apparatus
  15. Fourth Embodiment of Solid-State Imaging Apparatus
  16. Fifth Embodiment of Solid-State Imaging Apparatus
  17. Sixth Embodiment of Solid-State Imaging Apparatus
  18. Examples of Mounting Solid-State Imaging Apparatuses 19. Method of Manufacturing Fourth Embodiment
20. Seventh Embodiment of Solid-State Imaging Apparatus
21. Method of Manufacturing Seventh Embodiment
22. Example of Three-Layer Laminated Structure Body
23. Application Example to Electronic Devices
24. Usage Examples of Image Sensor

1. First Embodiment of Solid-State Imaging Apparatus

Figure 1:
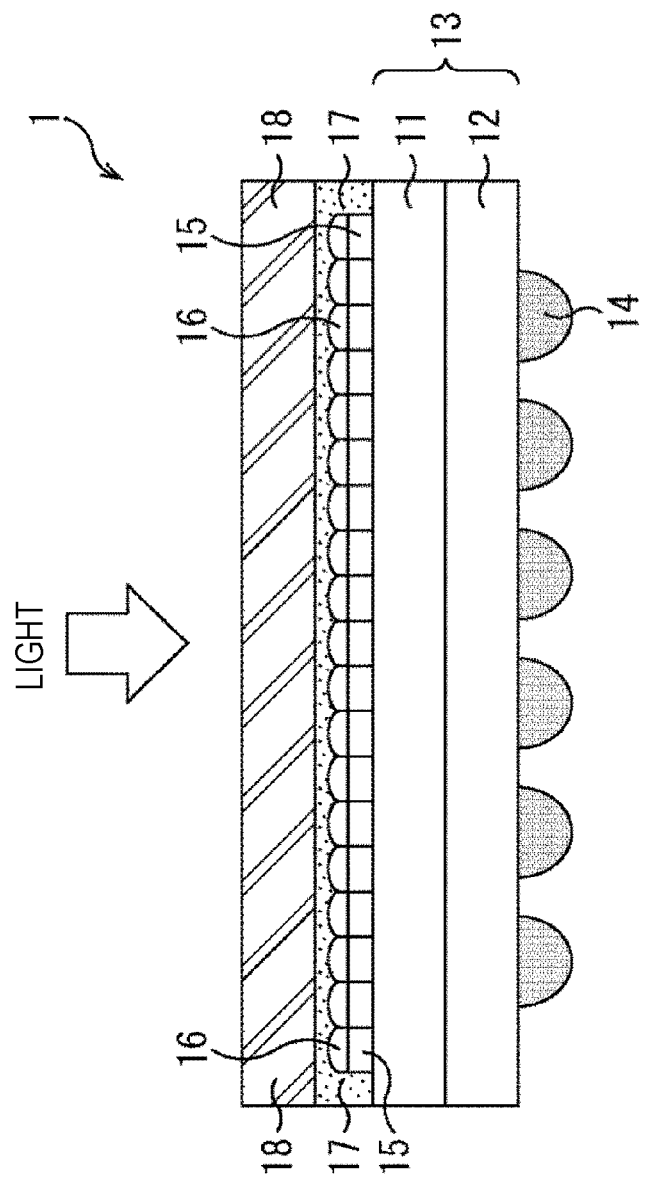
FIG. 1 is a cross-sectional view showing a schematic structure of a first embodiment of a solid-state imaging apparatus.

FIG. 1 shows a schematic structure of a first embodiment of a solid-state imaging apparatus as a semiconductor apparatus adopting the present technology.

A solid-state imaging apparatus 1 shown in FIG. 1 converts light or electromagnetic waves incident on the apparatus in the direction of the arrow in the drawing into an electric signal. Hereinafter, in the present disclosure, for convenience, an apparatus for converting light, which is a target to be converted into an electric signal, into an electric signal will be described as an example.

The solid-state imaging apparatus 1 includes a laminated structure body 13 in which a first structure body 11 and a second structure body 12 are laminated, external terminals 14, and a protective substrate 18 formed on the upper side of the first structure body 11. Note that, hereinafter, for convenience, the first structure body 11 is called an upper structure body 11, and the second structure body 12 is called a lower structure body 12, in which a side of an incident face, on which the light is incident on the apparatus, is an upper side, and a side of the other face of the apparatus opposing the incident face is a lower side in FIG. 1.

As will be described later, this solid-state imaging apparatus 1 is formed by affixing a semiconductor substrate (wafer) constituting a part of the upper structure body 11, a semiconductor substrate (wafer) constituting a part of the lower structure body 12, and the protective substrate 18 at a wafer level, and then singulating it into individual solid-state imaging apparatuses 1.

The upper structure body 11 before the singulation is one in which a pixel for converting the incident light into the electric signal is formed on the semiconductor substrate (wafer). The pixel includes, for example, a photodiode (PD) for photoelectric conversion, and a plurality of pixel transistors which control the photoelectric conversion operation and readout operation for the photoelectrically converted electric signal. The upper structure body 11 included in the solid-state imaging apparatus 1 after the singulation may be called an upper chip, an image sensor substrate, or an image sensor chip in some cases.

It is desirable that the pixel transistors included in the solid-state imaging apparatus 1 be, for example, MOS transistors.

On the upper face of the upper structure body 11, for example, color filters 15 of red (R), green (G), or blue (B) and on-chip lenses 16 are formed. On the upper side of the on-chip lenses 16, the protective substrate 18 for protecting the structural objects of the solid-state imaging apparatus 1, particularly the on-chip lenses 16 and the color filters 15, is arranged. The protective substrate 18 is, for example, a transparent glass substrate. When the hardness of the protective substrate 18 is higher than the hardness of the on-chip lenses 16, the action of protecting the on-chip lenses 16 is enhanced.

The lower structure body 12 before the singulation is one in which a semiconductor circuit including a transistor and a wiring is formed on the semiconductor substrate (wafer).

The lower structure body 12 included in the solid-state imaging apparatus 1 after the singulation may be called a lower chip, a signal processing substrate, or a signal processing chip in some cases. At the lower structure body 12, the plurality of external terminals 14 for electrically connecting with a wiring (not shown) outside the apparatus are formed. The external terminals 14 are, for example, solder balls.

The solid-state imaging apparatus 1 forms a cavityless structure in which the protective substrate 18 is fixed to the upper side of the upper structure body 11 or the upper sides of the on-chip lenses 16 through a sealing resin 17 arranged on the on-chip lenses 16. Since the hardness of the sealing resin 17 is lower than the hardness of the protective substrate 18, the sealing resin 17 can act to alleviate the transmission of the stress, which is applied to the protective substrate 18 from the outside of the solid-state imaging apparatus 1, to the inside of the apparatus, as compared with a case where a sealing resin is not present.

Note that the solid-state imaging apparatus 1 may form, as a structure different from the cavityless structure, a cavity structure in which a columnar or wall-shaped structure is formed on the upper face of the upper structure body 11, and the protective substrate 18 is fixed to the columnar or wall-shaped structure so as to be supported above the on-chip lenses 16 with a gap.

2. System Configuration of Solid-State Imaging Apparatus

Figure 2:
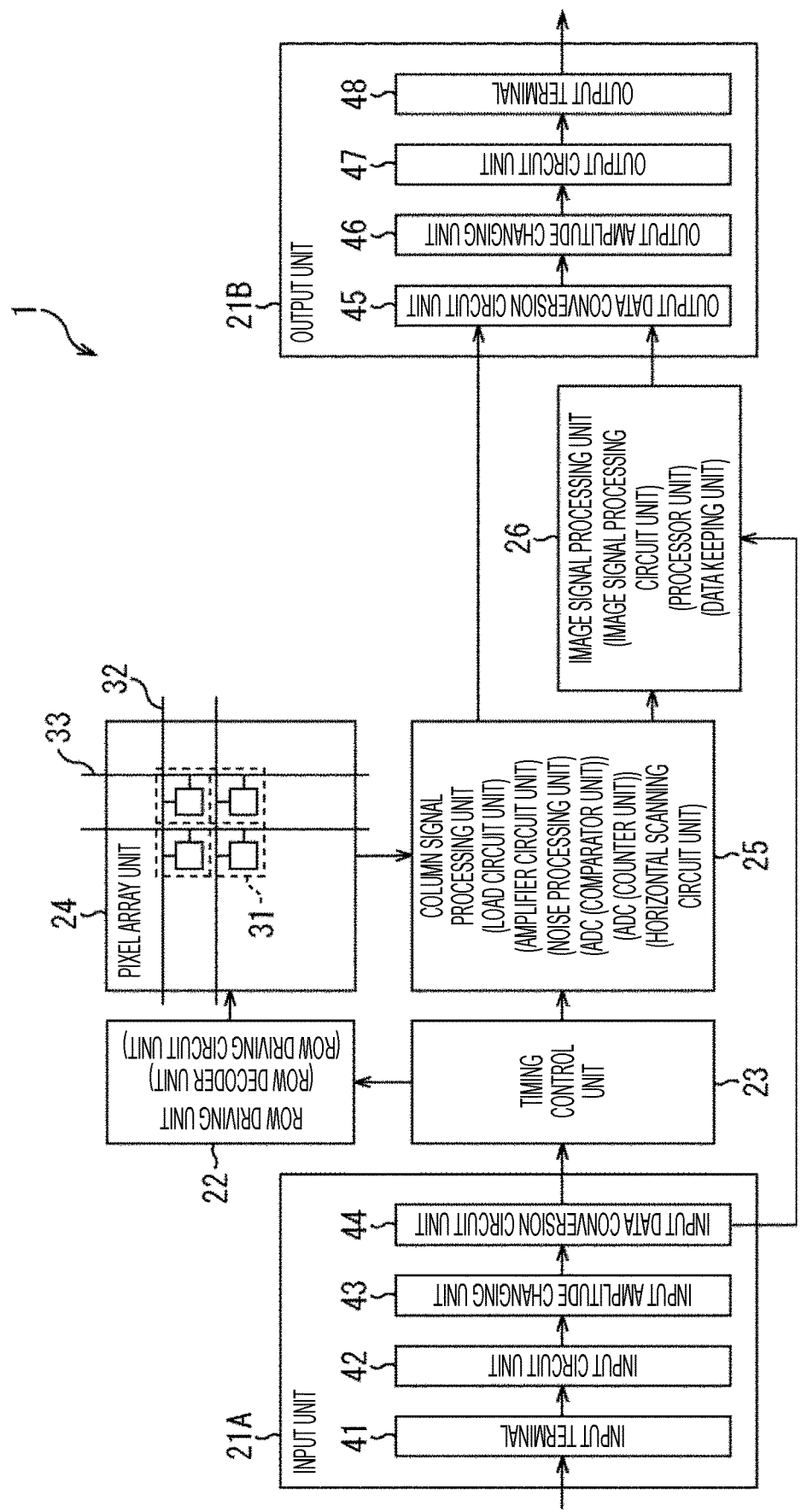
FIG. 2 is a block diagram showing a system configuration example of the solid-state imaging apparatus.

FIG. 2 is a block diagram showing a system configuration example of the solid-state imaging apparatus 1.

The solid-state imaging apparatus 1 in FIG. 2 includes a pixel array unit 24 in which a plurality of pixels 31 each having a photoelectric conversion unit (PD) are arranged in a row direction and a column direction.

The pixel array unit 24 includes row driving signal lines 32 for driving the pixels 31 by each row, and vertical signal lines (column readout lines) 33 for reading out signals generated as a result of photoelectric conversion from the plurality of pixels 31 driven by each row. As shown in FIG. 2, the plurality of pixels 31 arrayed in the row direction are connected to one row driving signal line 32. The plurality of pixels 31 arrayed in the column direction are connected to one vertical signal line 33.

The solid-state imaging apparatus 1 further includes a row driving unit 22 and a column signal processing unit 25.

The row driving unit 22 includes, for example, a row address control unit which determines a position of a row for driving the pixels, in other words, a row decoder unit, and a row driving circuit unit which generates a signal for driving the pixels 31.

The column signal processing unit 25 includes, for example, a load circuit unit which is connected to the vertical signal lines 33 and forms a source follower circuit with the pixels 31. Moreover, the column signal processing unit 25 may include an amplifier circuit unit which amplifies the signals read out from the pixels 31 through the vertical signal lines 33. Furthermore, the column signal processing unit 25 may further include a noise processing unit for removing a system noise level from the signals read out from the pixels 31 as a result of the photoelectric conversion.

The column signal processing unit 25 includes an analog-to-digital converter (ADC) for converting the signals read out from the pixels 31 or the noise-processed analog signals into digital signals. The ADC includes a comparator unit for comparing an analog signal, which is a conversion target, with a reference sweep signal, which is a comparison target, and a counter unit which measures the time until the comparison result in the comparator unit is reversed. The column signal processing unit 25 may further include a horizontal scanning circuit unit which performs control of scanning a readout column.

The solid-state imaging apparatus 1 further includes a timing control unit 23. On the basis of a reference clock signal or a timing control signal inputted into the apparatus, the timing control unit 23 supplies signals, which control the timings, to the row driving unit 22 and the column signal processing unit 25. Hereinafter, in the present disclosure, all or a part of the row driving unit 22, the column signal processing unit 25 and the timing control unit 23 may be simply called a pixel peripheral circuit unit, a peripheral circuit unit, or a control circuit section in some cases.

The solid-state imaging apparatus 1 further includes an image signal processing unit 26. The image signal processing unit 26 is a circuit which performs various signal processings on the data obtained as a result of the photoelectric conversion, in other words, the data obtained as a result of the imaging operation in the solid-state imaging apparatus 1. The image signal processing unit 26 is configured by including, for example, an image signal processing circuit unit and a data keeping unit. The image signal processing unit 26 may further include a processor unit.

One example of the signal processings executed in the image signal processing unit 26 is tone curve correction processing in which more tones are given to the imaged data subjected to the AD conversion in a case where the imaged data is data obtained by capturing a dark subject, and less tones are given to the imaged data in a case where the imaged data is data obtained by capturing a bright subject. In this case, it is desirable to store characteristic data of the tone curve in advance in the data keeping unit of the image signal processing unit 26 for the basis of what type of tone curve that the tones of the imaged data are corrected.

The solid-state imaging apparatus 1 further includes an input unit 21A. For example, the input unit 21A inputs, into the solid-state imaging apparatus 1 from the outside of the apparatus, the reference clock signal, the timing control signals such as vertical synchronization signals and horizontal synchronization signals, and the characteristic data stored in the data keeping unit of the image signal processing unit 26, and the like. The input unit 21A includes an input terminal 41 which is the external terminal 14 for inputting the data into the solid-state imaging apparatus 1, and an input circuit unit 42 which takes in the signal, which is inputted into the input terminal 41, into the inside of the solid-state imaging apparatus 1.

The input unit 21A further includes an input amplitude changing unit 43 which changes the amplitude of the signal taken in by the input circuit unit 42 to an amplitude easy to use inside the solid-state imaging apparatus 1.

The input unit 21A further includes an input data conversion circuit unit 44 which changes the alignment of the data strings of the input data. The input data conversion circuit unit 44 is, for example, a serial-to-parallel conversion circuit which receives a serial signal as input data and converts the serial signal into a parallel signal.

Note that the input amplitude changing unit 43 and the input data conversion circuit unit 44 may be omitted in some cases.

In a case where the solid-state imaging apparatus 1 is connected to an external memory device such as a flash memory, an SRAM or a DRAM, the input unit 21A can further include a memory interface circuit which receives data from these external memory devices.

The solid-state imaging apparatus 1 further includes an output unit 21B. The output unit 21B outputs, to the outside of the apparatus from the solid-state imaging apparatus 1, image data captured by the solid-state imaging apparatus 1 and image data subjected to the signal processings by the image signal processing unit 26. The output unit 21B includes an output terminal 48 which is the external terminal 14 for outputting the data to the outside of the apparatus from the solid-state imaging apparatus 1, and an output circuit unit 47 which is a circuit that outputs the data to the outside of the apparatus from the inside of the solid-state imaging apparatus 1 and is a circuit that drives the external wiring connected to the output terminal 48 outside the solid-state imaging apparatus 1.

The output unit 21B further includes an output amplitude changing unit 46 which changes the amplitude of the signal used inside the solid-state imaging apparatus 1 to an amplitude easy to be used by the external device connected to the outside of the solid-state imaging apparatus 1.

The output unit 21B further includes an output data conversion circuit unit 45 which changes the alignment of the data strings of the output data. The output data conversion circuit unit 45 is, for example, a parallel-to-serial conversion circuit which converts the parallel signal used inside the solid-state imaging apparatus 1 into a serial signal.

The output data conversion circuit unit 45 and the output amplitude changing unit 46 may be omitted in some cases.

In a case where the solid-state imaging apparatus 1 is connected to an external memory device such as a flash memory, an SRAM or a DRAM, the output unit 21B can further include a memory interface circuit which outputs the data to these external memory devices.

Note that, in the present disclosure, for convenience, a circuit block including both of or at least one of the input unit 21A and the output unit 21B may be called an input/output unit 21 in some cases. Moreover, a circuit unit including both of or at least one of the input circuit unit 42 and the output circuit unit 47 may be called an input/output circuit unit 49 in some cases.

3. Circuit Arrangement Configuration Example of Pixel

Figure 3:
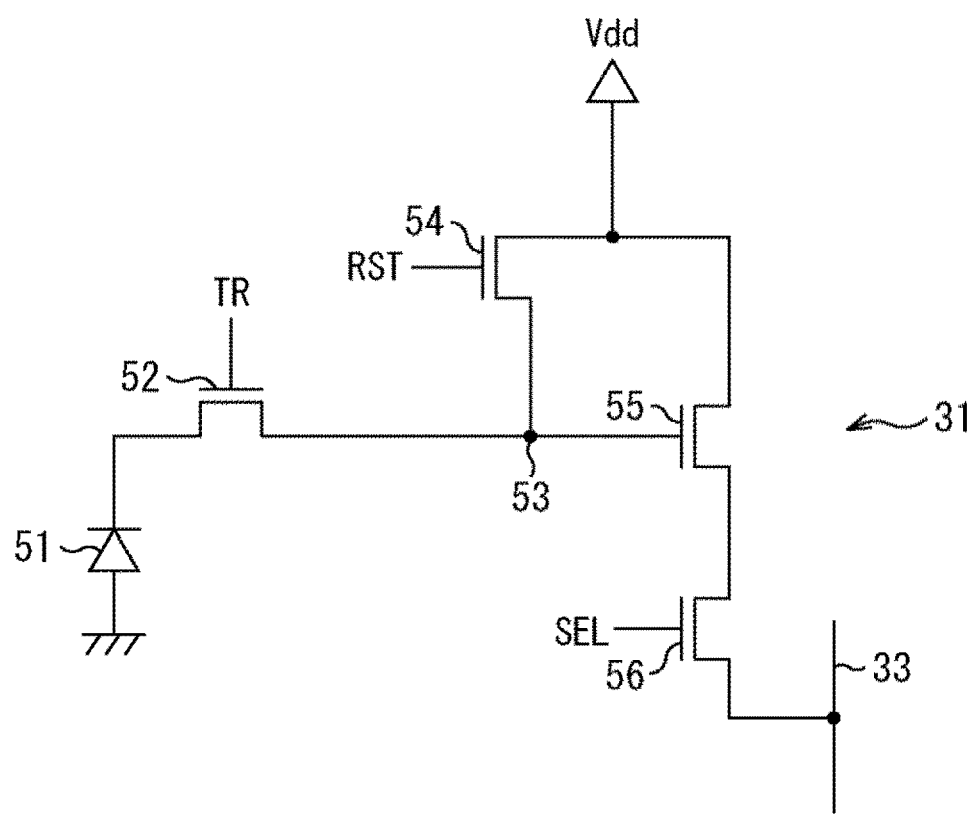
FIG. 3 is a diagram showing a circuit arrangement configuration example of a pixel.

FIG. 3 shows a circuit arrangement configuration example of the pixel 31 of the solid-state imaging apparatus 1 according to the first embodiment.

The pixel 31 has a photodiode 51 as a photoelectric conversion element, a transfer transistor 52, a floating diffusion (FD) 53, a reset transistor 54, an amplifier transistor 55, and a selection transistor 56.

The photodiode 51 generates and accumulates charge (signal charge) according to the received light amount. The anode terminal of the photodiode 51 is grounded, and the cathode terminal thereof is connected to the FD 53 via the transfer transistor 52.

When turned on by a transfer signal TR, the transfer transistor 52 reads out the charge generated by the photodiode 51 and transfers the charge to the FD 53.

The FD 53 keeps the charge read out from the photodiode 51. When turned on by a reset signal RST, the reset transistor 54 resets the potential of the FD 53 by discharging the charge accumulated in the FD 53 to the drain (constant voltage source Vdd).

The amplifier transistor 55 outputs a pixel signal corresponding to the potential of the FD 53. That is, the amplifier transistor 55 constitutes a source follower circuit together with a load MOS (not shown) as a constant current source connected via the vertical signal line 33, and a pixel signal indicating a level corresponding to the charge accumulated in the FD 53 is outputted to the column signal processing unit 25 from the amplifier transistor 55 via the selection transistor 56 and the vertical signal line 33.

The selection transistor 56 is turned on when the pixel 31 is selected by a selection signal SEL, and outputs the pixel signal of the pixel 31 to the column signal processing unit 25 via the vertical signal line 33. Each of the signal lines through which the transfer signal TR, the selection signal SEL and the reset signal RST are transmitted corresponds to the row driving signal line 32 in FIG. 2.

The pixel 31 can be configured as described above. However, the configuration is not limited to this configuration, and other configurations can be adopted.

4. Configuration Examples of Input Circuit Unit and Output Circuit Unit

Figure 4:
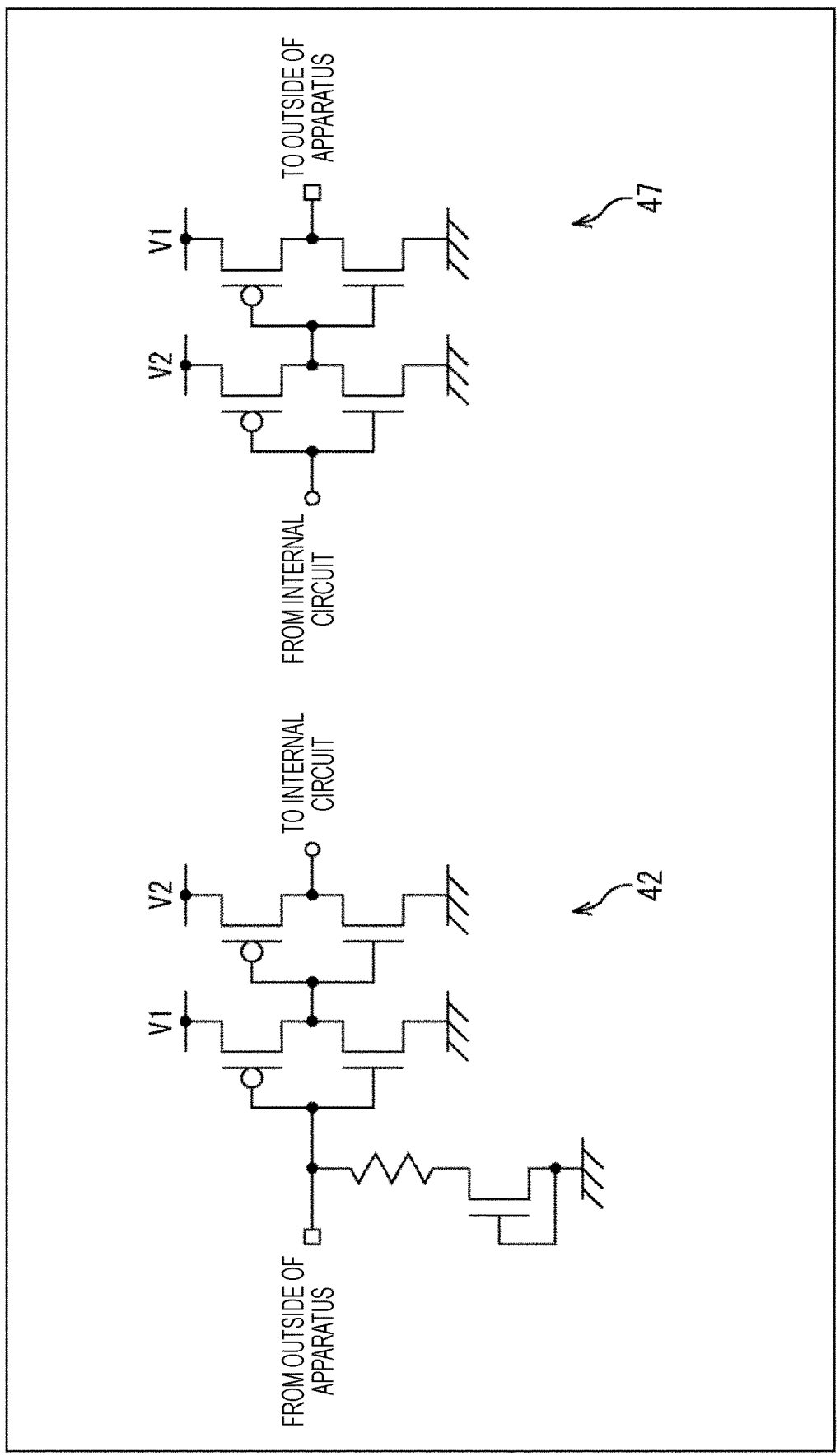
FIG. 4 is a diagram showing configuration examples of an input circuit unit and an output circuit unit.

FIG. 4 shows circuit arrangement configuration examples of the input circuit unit 42 included in the input unit 21A and the output circuit unit 47 included in the output unit 21B of the solid-state imaging apparatus 1 according to the first embodiment.

Note that input/output circuit unit 49 may be configured by including one of the input circuit unit 42 and the output circuit unit 47 for one external terminal 14 or may be configured as a bidirectional input/output circuit including both the input circuit unit 42 and the output circuit unit 47 in parallel.

The input circuit unit 42 is a circuit having the following features.

(1) The input circuit unit 42 is a circuit having the same logic for or only inverts the data inputted into the input circuit unit 42 from the input terminal 41 of the solid-state imaging apparatus 1 and the data outputted to the internal circuit of the solid-state imaging apparatus 1 from the input circuit unit 42. In other words, the input circuit unit 42 is a circuit which does not change the alignment of the data in the signal strings. Still in other words, the input circuit unit 42 is a circuit which does not change a position of switching "1" and "0" or "Hi" and "Low" of the logic in the signal strings.

(2) The input circuit unit 42 is a circuit which converts the voltage amplitude of the signal, which is inputted into the input terminal 41 of the solid-state imaging apparatus 1, into a voltage amplitude which is preferable for a circuit arranged subsequently to the input circuit unit 42, in other words, a circuit further inside the solid-state imaging apparatus 1 to receive. This circuit converts the data, which is inputted into the circuit, into the direction in which the voltage amplitude decreases in some cases.

(2)' Alternatively, the input circuit unit 42 is a circuit which converts the signal (e.g., a small amplitude differential signal of an LVDS), which is inputted into the input circuit unit 42, into a format or a voltage amplitude (e.g., a single-end full swing digital signal), which is preferable for a circuit arranged subsequently to the input circuit unit 42, in other words, a circuit further inside the solid-state imaging apparatus 1 to receive, to be outputted. This circuit converts the data, which is inputted into the circuit, into the direction in which the voltage amplitude increases in some cases.

(3) Moreover, in a case where excessive noise is inputted into the input circuit unit 42, the input circuit unit 42 may include in some cases a protective circuit which does not propagate this noise to a circuit arranged subsequently to the input circuit unit 42, in other words, a circuit further inside the solid-state imaging apparatus 1 and blocks the noise.

The output circuit unit 47 is a circuit having the following features.

(1) The output circuit unit 47 is a circuit having the same logic for or only inverts the data inputted into the output circuit unit 47 from the internal circuit of the solid-state imaging apparatus 1 and the data outputted to the outside of the solid-state imaging apparatus 1 from the output circuit unit 47 via the output terminal 48 of the solid-state imaging apparatus 1. In other words, the output circuit unit 47 is a circuit which does not change the alignment of the data in the signal strings. Still in other words, the output circuit unit 47 is a circuit which does not change a position of switching "1" and "0" or "Hi" and "Low" of the logic in the signal strings.

(2) The output circuit unit 47 is a circuit which enhances the current capability of driving the signal lines between the output terminal 48 of the solid-state imaging apparatus 1 and the external element connected to the solid-state imaging apparatus 1. Alternatively, the output circuit unit 47 is a circuit which increases the voltage amplitude of the signal lines. This circuit converts the data, which is inputted into the circuit, into the direction in which the voltage amplitude increases in some cases.

(2)' Alternatively, the output circuit unit 47 is a circuit which converts the signal (e.g., a single-end full swing digital signal), which is inputted into the output circuit unit 47 from the internal circuit of the solid-state imaging apparatus 1, into a format or a voltage amplitude (e.g., a small amplitude differential signal of an LVDS), which is preferable for the external element connected to the output terminal 48 to receive the signal, to be outputted. This circuit converts the data, which is inputted into the circuit, into the direction in which the voltage amplitude decreases in some cases.

As shown in FIG. 4, the input/output circuit unit 49 including at least one of the input circuit unit 42 and the output circuit unit 47 includes one or more transistors. In the present disclosure, for convenience, the transistor included in the input/output circuit unit 49 may be called an input/output transistor in some cases. The input/output circuit unit 49 may include an inverter circuit, a buffer circuit and the like or may further include an enable circuit which controls the input operation or the output operation.

The input circuit unit 42 or the output circuit unit 47 can also serve as an amplitude changing unit for the input signal or the output signal by appropriately setting the power supply voltage used in the circuit. For example, in a case where the amplitude of the signal in a part of the pixel peripheral circuit unit or in the image signal processing unit 26 of the solid-state imaging apparatus 1 is V2, whereas the amplitude of the signal inputted into the input terminal 41 from the outside of the solid-state imaging apparatus 1 or the amplitude of the signal outputted to the outside of the solid-state imaging apparatus 1 from the output terminal 48 is V1 which is greater than V2, by setting the power supply voltage of the inverter positioned closer to the internal circuit of the solid-state imaging apparatus 1 to V2 and the power supply voltage of the inverter positioned in the outward direction of the solid-state imaging apparatus 1 to V1 when the circuit of the input circuit unit 42 or the output circuit unit 47 is for example, the circuit shown in FIG. 4, the input circuit unit 42 can receive the signal with the amplitude V1 from the outside and decrease this amplitude to V2 to be inputted into the internal circuit of the solid-state imaging apparatus 1, and the output circuit unit 47 can receive the signal with the amplitude V2 from the internal circuit of the solid-state imaging apparatus 1 and increase this amplitude to V1 to be outputted to the outside. Note that, in a case where the voltages V1 and V2 shown in FIG. 4 are set to the same voltage, the configuration does not have the function of changing the signal amplitude.

Note that, in the present disclosure including the above description, a voltage difference between a reference voltage (a ground voltage in the case of the circuit in FIG. 4) in the transistor circuit and a voltage (e.g., V1 in the case of the circuit in FIG. 4), which is a voltage of the power supply supplied to the circuit and is different from the reference voltage, may be simply called a power supply voltage in some cases.

5. Circuit Arrangement Configuration Example of Solid-State Imaging Apparatus Next, how the arrangement of the circuit of the solid-state imaging apparatus 1 according to the first embodiment, that is, each block of the solid-state imaging apparatus 1 shown in FIG. 2 is mounted separately in the upper structure body 11 and the lower structure body 12 will be described.

Figure 5:
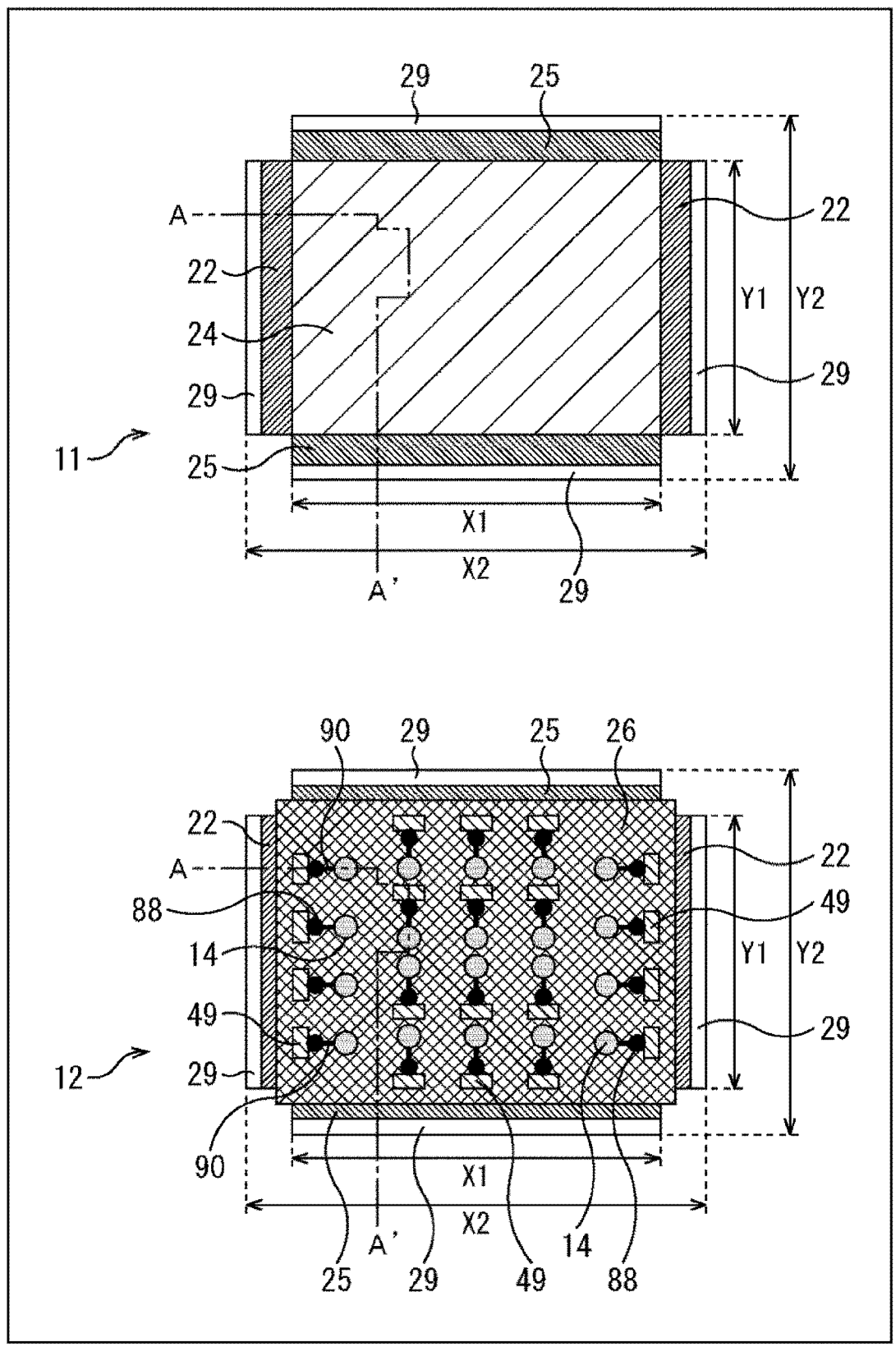
FIG. 5 is a diagram showing a first circuit arrangement configuration example of circuit arrangement in the solid-state imaging apparatus.

FIG. 5 is a diagram showing a first circuit arrangement configuration example of the circuit arrangement in the solid-state imaging apparatus 1.

In the first circuit arrangement configuration example, the pixel array unit 24 is arranged at the upper structure body 11.

Among the pixel peripheral circuit unit included in the solid-state imaging apparatus 1, a part of the row driving unit 22 is arranged at the upper structure body 11, and a part thereof is arranged at the lower structure body 12. For example, of the row driving unit 22, the row driving circuit unit is arranged at the upper structure body 11, and the row decoder unit is arranged at the lower structure body 12.

The row driving unit 22 arranged at the upper structure body 11 is arranged outside the pixel array unit 24 in the row direction, and the row driving unit 22 arranged at the lower structure body 12 is at least partly arranged on the lower side of the row driving unit 22 included in the upper structure body 11.

Among the pixel peripheral circuit unit included in the solid-state imaging apparatus 1, a part of the column signal processing unit 25 is arranged at the upper structure body 11, and a part thereof is arranged at the lower structure body 12. For example, of the column signal processing unit 25, the load circuit unit, the amplifier circuit unit, the noise processing unit, and the comparator unit of the ADC are arranged at the upper structure body 11, and the counter unit of the ADC is arranged at the lower structure body 12.

The column signal processing unit 25 arranged at the upper structure body 11 is arranged outside the pixel array unit 24 in the column direction, and the column signal processing unit 25 arranged at the lower structure body 12 is at least partly arranged on the lower side of the column signal processing unit 25 included in the upper structure body 11.

A wiring connection unit 29 is arranged at the outside of the row driving unit 22 arranged at the upper structure body 11 and the outside of the row driving unit 22 arranged at the lower structure body 12 to connect the wirings of these two row driving units 22.

Figure 6:
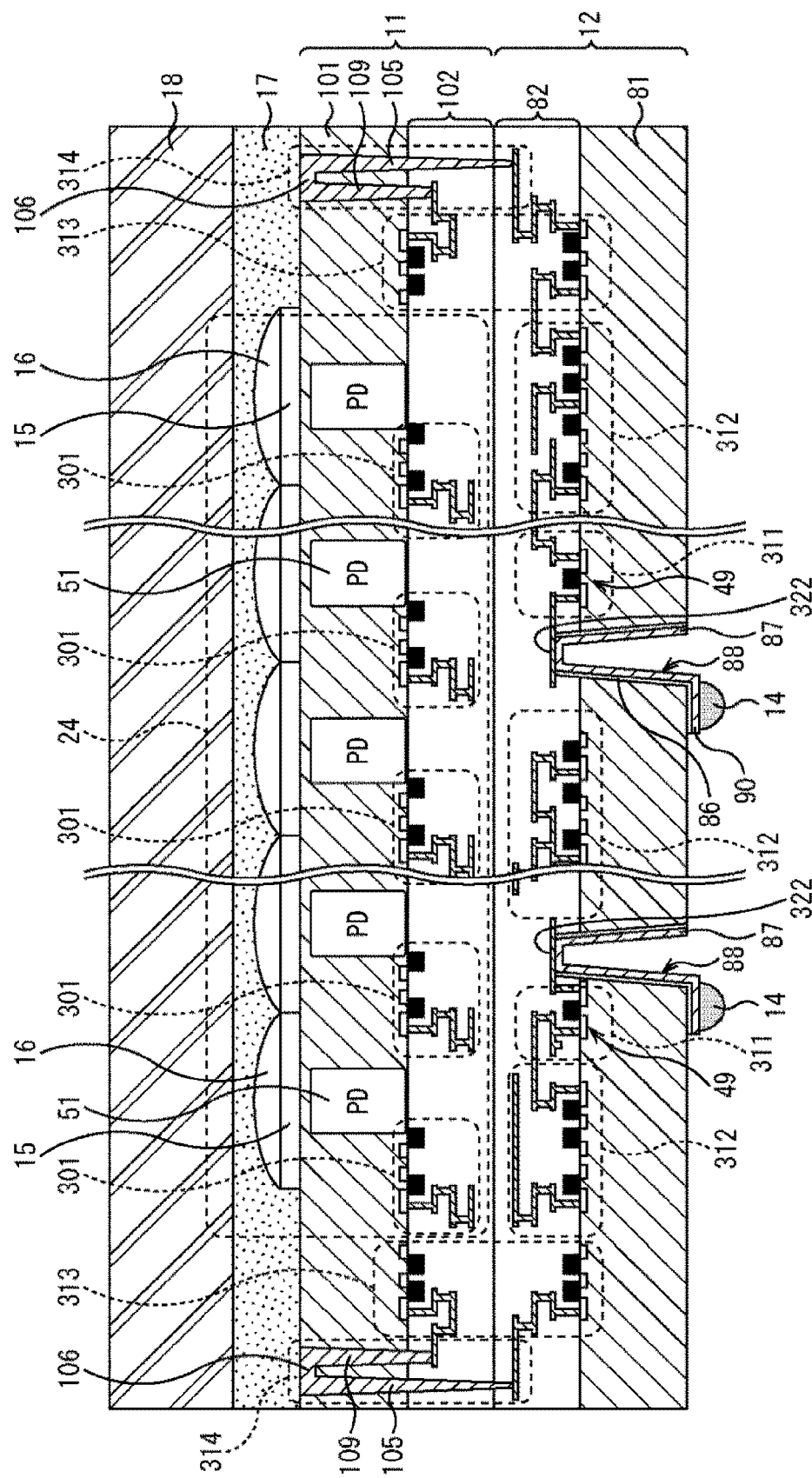
FIG. 6 is a view showing the cross-sectional structure along the line A-A' in FIG. 5.

The wiring connection unit 29 is also arranged at the outside of the column signal processing unit 25 arranged at the upper structure body 11 and the outside of the column signal processing unit 25 arranged at the lower structure body 12 to connect the wirings of these two column signal processing units 25. For these wiring connection units 29, a wiring connection structure described later using FIG. 6 is used.

The image signal processing unit 26 is arranged on the inner side of the row driving unit 22 and the column signal processing unit 25 arranged at the lower structure body 12.

At the lower structure body 12, the input/output circuit unit 49 is arranged in a region at the lower side of the pixel array unit 24 of the upper structure body 11.

The input/output circuit unit 49 is a circuit unit including both of or at least one of the input circuit unit 42 and the output circuit unit 47. In a case where the input/output circuit unit 49 is configured with both of the input circuit unit 42 and the output circuit unit 47, the input/output circuit unit 49 is divided for each one external terminal 14 and the plurality thereof are arranged at the lower structure body 12. In a case where the input/output circuit unit 49 is configured with only the input circuit unit 42, the input circuit unit 42 is divided for each one external terminal 14 (input terminal 41) and the plurality thereof are arranged at the lower structure body 12. In a case where the input/output circuit unit 49 is configured with only the output circuit unit 47, the output circuit unit 47 is divided for each one external terminal 14 (output terminal 48) and the plurality thereof are arranged at the lower structure body 12. The image signal processing unit 26 is arranged around each of the plurality of these divided and arranged input/output circuit units 49. In other words, the input/output circuit units 49 are arranged in the region where the image signal processing unit 26 is arranged.

Note that, at the lower structure body 12, the input/output circuit unit 49 may be arranged in a region at the lower side of the row driving unit 22 or at the lower side of the column signal processing unit 25 of the upper structure body 11.

In other words, the input/output circuit unit 49 can be arranged in any region at the lower structure body 12 side, at which the external terminals 14 are formed, and under the region of the pixel array unit 24 of the upper structure body 11 or under the pixel peripheral circuit unit of the upper structure body 11 (the circuit units formed at the upper structure body 11 in a pixel peripheral circuit region 313 in FIG. 6).

Note that, in the region where the input terminal 41, the input circuit unit 42, the output circuit unit 47, and the output terminal 48 are arranged, power supply terminals and ground terminals may be arranged in place of these in the solid-state imaging apparatus 1 according to the first embodiment including other configuration examples described later.

Among the transistor circuits arranged at the lower structure body 12, the power supply voltage of the transistor circuit constituting the input circuit unit 42 and the output circuit unit 47 may be higher than the power supply voltage of the transistor circuit constituting the image signal processing unit 26.

For example, the power supply voltage of the transistor circuit constituting the input circuit unit 42 and the output circuit unit 47 may be 1.8 V to 3.3 V, and the power supply voltage of the transistor circuit constituting the image signal processing unit 26 may be 1.2 V to 1.5 V. Since the power supply voltage of the former (the transistor circuit constituting the input circuit unit 42 and the output circuit unit 47) and the power supply voltage of the latter (the transistor circuit constituting the image signal processing unit 26) are different, it is desirable that a distance for arranging a well region, in which the power supply voltage is applied in the input circuit unit 42 and the output circuit 47, and a well region, in which the voltage supply voltage is applied in the image signal processing unit 26 arranged around the former well region, to be spaced part, so-called a width of well isolation region, be longer than distances provided between a plurality well regions in which the power supply voltage is applied in the image signal processing unit 26.

Moreover, the depth of an element isolation region included in the input circuit unit 42 and the output circuit unit 47 may be deeper than the depth of an element isolation region included in the image signal processing unit 26. Furthermore, it is desirable that the gate length of the transistors included in the input circuit unit 42 and the output circuit unit 47 be longer than the gate length of the transistors included in the image signal processing unit 26.

Among the pixel peripheral circuit unit included in the solid-state imaging apparatus 1, the supply power voltage of the transistor circuit constituting a part of the pixel peripheral circuit unit arranged at the upper structure body 11, for example, one of the load circuit unit, the amplifier circuit unit, the noise processing unit, and the comparator unit of the ADC included in the column signal processing unit 25 may be higher than the power supply voltage of the transistor circuit constituting a part of the pixel peripheral circuit unit arranged at the lower structure body 12, for example, the counter unit of the ADC included in the column signal processing unit 25. As an example, the power supply voltage of the transistor circuit constituting the former (the pixel peripheral circuit unit arranged at the upper structure body 11, for example, one of the load circuit unit, the amplifier circuit unit, the noise processing unit, and the comparator unit of the ADC included in the column signal processing unit 25) may be 1.8 V to 3.3 V, and the power supply voltage of the transistor circuit of the latter (the pixel peripheral circuit unit arranged at the lower structure body 12, for example, the counter unit of the ADC) may be 1.2 V to 1.5 V. The power supply voltage of the latter transistor circuit may be the same as the power supply voltage of the transistor circuit constituting the image signal processing unit 26 arranged at the lower structure body 12. Since the power supply voltage of the former transistor circuit is higher than the power supply voltage of the latter transistor circuit, it is desirable that the distances provided between the plurality of well regions to which the power supply voltage is applied in the former transistor circuit be longer than the distances provided between the plurality of well regions to which the power supply voltage is applied in the latter transistor circuit. Moreover, it is desirable that the depth of the element isolation region included in the former transistor circuit be deeper than the depth of the element isolation region included in the latter transistor circuit. Furthermore, it is desirable that the gate length of the transistor included in the former transistor circuit be longer than the gate length of the transistor included in the latter transistor circuit.

Further, the power supply voltage of the pixel transistor circuit constituting the pixels 31 arranged at the upper structure body 11 may be the same as the power supply voltage of the transistor circuit constituting the pixel peripheral circuit unit (e.g., one of the load circuit unit, the amplifier circuit unit, the noise processing unit, and the comparator unit of the ADC included in the column signal processing unit 25) arranged at the upper structure body 11.

The power supply voltage of the pixel transistor circuit constituting the pixels 31 arranged at the upper structure body 11 may be higher than the power supply voltage of the transistor circuit constituting the pixel peripheral circuit unit (e.g., the counter unit of the ADC) or the image signal processing unit 26 arranged at the lower structure body 12. Therefore, in a case where an element isolation region with a structure of digging a semiconductor substrate is used as the element isolation region, the depth of a part of the element isolation region provided around the pixel transistor arranged at the upper structure body 11 may be deeper than the depth of the element isolation region provided around the transistor of the pixel peripheral circuit unit or the image signal processing unit 26 arranged at the lower structure body 12. Alternatively, as the element isolation region around the pixel transistor, instead of the element isolation region digging the semiconductor substrate, an element isolation region forming an impurity region with a conductivity type reverse to that of a diffusion layer region of the pixel transistor may be used partly around the pixel transistor.

Moreover, the gate length of the pixel transistor arranged at the upper structure body 11 may be longer than the gate length of the transistor of the pixel peripheral circuit unit or the image signal processing unit 26 arranged at the lower structure body 12. On the other hand, in order to suppress the occurrence of noise charge in the vicinity of the element isolation region where the increase of the noise charge caused by deepening the element isolation region is concerned, the depth of the element isolation region provided around the pixel transistor arranged at the upper structure body 11 may be shallower than the depth of the element isolation region provided around the transistor constituting the pixel peripheral circuit unit arranged at the upper structure body 11. Alternatively, as the element isolation region around the pixel transistor, instead of the element isolation region digging the semiconductor substrate, an element isolation region forming an impurity region with a conductivity type reverse to that of a diffusion layer region of the pixel transistor may be used partly around the pixel transistor.

6. Cross-Sectional Structure of Solid-State Imaging Apparatus

The cross-sectional structure and circuit arrangement of the solid-state imaging apparatus 1 according to the first embodiment will be further described with reference to FIG. 6.

FIG. 6 is a view showing the cross-sectional structure of the solid-state imaging apparatus 1 along the line A-A' in FIG. 5. Note that, for convenience, a part of FIG. 6 is described with a replacement with the cross-sectional structure in another configuration example of the present technology described later.

At a portion including the upper structure body 11 and the above thereof provided in the solid-state imaging apparatus 1, the pixel array unit 24 is arranged, in which the pluralities of on-chip lenses 16, color filters 15, and pixels 31 each having the pixel transistor and the photodiode 51 are arrayed in an array. In the region (pixel array region) of the pixel array unit 24, pixel transistor regions 301 are also arranged. The pixel transistor region 301 is a region where at least one pixel transistor among the transfer transistor 52, the amplifier transistor 55, and the reset transistor 54 is formed.

The plurality of external terminals 14 are arranged in a region which is on the lower surface of a semiconductor substrate 81 included in the lower structure body 12 and is positioned under the pixel array unit 24 included in the upper structure body 11.

Note that, in the description for FIG. 6, "the region which is on the lower surface of the semiconductor substrate 81 included in the lower structure body 12 and is positioned under the pixel array unit 24 included in the upper structure body 11" is called a first specific region, and "a region which is on the upper surface of the semiconductor substrate 81 included in the lower structure body 12 and is positioned under the pixel array unit 24 included in the upper structure body 11" is called a second specific region.

At least a part of the plurality of external terminals 14 arranged in the first specific region is a signal input terminal 14A for inputting a signal into the solid-state imaging apparatus 1 from the outside or a signal output terminal 14B for outputting a signal to the outside from the solid-state imaging apparatus 1. In other words, the signal input terminal 14A and the signal output terminal 14B are the external terminals 14 excluding the power supply terminal and the ground terminal from among the external terminals 14. In the present disclosure, the signal input terminal 14A or the signal output terminal 14B is called a signal input/output terminal 14C.

Through vias 88 penetrating the semiconductor substrate 81 are arranged in the first specific region in the vicinities of the signal input/output terminals 14C. Note that, in the present disclosure, a via hole penetrating the semiconductor substrate 81 and a via wiring formed inside the via hole may be together simply called the through via 88 in some cases.

It is desirable that this through via hole have a structure formed by digging to a conductive pad 322 (hereinafter, may be called a via pad 322 in some cases), which is a part of a multilayered wiring layer 82 arranged above the upper surface of the semiconductor substrate 81 and is an end (bottom portion) of the via hole, from the lower surface of the semiconductor substrate 81.

The signal input/output terminal 14C arranged in the first specific region is electrically connected to the through via 88 (more specifically, a via wiring formed inside the through via hole) also arranged in the first specific region.

The input/output circuit unit 49 including the input circuit unit 42 or the output circuit unit 47 is arranged in the second specific region in a region in the vicinity of the signal input/output terminal 14C and the through via.

The signal input/output terminal 14C arranged in the first specific region is electrically connected to the input/output circuit unit 49 through the through via 88 and the via pad 322, or a part of the multilayered wiring layer 82.

The region where the input/output circuit unit 49 is arranged is called an input/output circuit region 311. A signal processing circuit region 312 is formed adjacent to the input/output circuit region 311 on the upper surface of the semiconductor substrate 81 included in the lower structure body 12. The signal processing circuit region 312 is a region where the image signal processing unit 26 described with reference to FIG. 2 is formed.

A region where the pixel peripheral circuit unit including all or a part of the row driving unit 22 and the column signal processing unit 25 described with reference to FIG. 2 is arranged is called a pixel peripheral circuit region 313. The pixel peripheral circuit region 313 is arranged in a region outside the pixel array unit 24 on the lower surface of a semiconductor substrate 101 included in the upper structure body 11 and the upper surface of the semiconductor substrate 81 included in the lower structure body 12.

The signal input/output terminal 14C may be arranged in the lower region of the input/output circuit region 311 arranged at the lower structure body 12 or may be arranged in the lower region of the signal processing circuit region 312. Alternatively, the signal input/output terminal 14C may be arranged on the lower side of the pixel peripheral circuit unit such as the row driving unit 22 or the column signal processing unit 25 arranged at the lower structure body 12.

In the present disclosure, a wiring connection structure, which connects the wiring included in a multilayered wiring layer 102 of the upper structure body 11 and the wiring included in the multilayered wiring layer 82 of the lower structure body 12, may be called an upper and lower wiring connection structure in some cases, and a region where this structure is arranged may be called an upper and lower wiring connection region 314 in some cases.

The upper and lower wiring connection structure is formed by a first through electrode (silicon penetrating electrode) 109 penetrating the semiconductor substrate 101 from the upper surface of the upper structure body 11 to the multilayered wiring layer 102, a second through electrode (chip through electrode) 105 penetrating the semiconductor substrate 101 and the multilayered wiring layer 102 from the upper surface of the upper structure body 11 to the multilayered wiring layer 82 of the lower structure body 12, and a connection wiring 106 for connecting these two through electrodes (through silicon vias (TSVs)). In the present disclosure, such an upper and lower wiring connection structure may be called a twin-contact structure in some cases.

The upper and lower wiring connection region 314 is arranged outside the pixel peripheral circuit region 313.

In the first embodiment, the pixel peripheral circuit region 313 is formed in both of the upper structure body 11 and the lower structure body 12, but can be formed in only one of the structure bodies.

Moreover, in the first embodiment, the upper and lower wiring connection region 314 is arranged outside the pixel array unit 24 outside the pixel peripheral circuit region 313, but may be arranged outside the pixel array unit 24 inside the pixel peripheral circuit region 313.

Furthermore, in the first embodiment, as a structure which electrically connects the multilayered wiring layer 102 of the upper structure body 11 and the multilayered wiring layer 82 of the lower structure body 12, the twin-contact structure, which connects the layers by using the two through electrodes, the silicon through electrode 109 and the chip through electrode 105, was adopted.

The structure which electrically connects the multilayered wiring layer 102 of the upper structure body 11 and the multilayered wiring layer 82 of the lower structure body 12 may be, for example, a sharing contact structure in which a wiring layer 103 of the upper structure body 11 and a wiring layer 83 of the lower structure body 12 are both commonly connected to one through electrode.

7. Circuit Arrangement of Solid-State Imaging Apparatus in Case where Another Upper and Lower Wiring Connection Structure is Used The circuit arrangement and cross-sectional structure of the solid-state imaging apparatus 1 will be described with reference to FIGS. 7 and 8 in a case where another upper and lower wiring connection structure is used.

Figure 7:
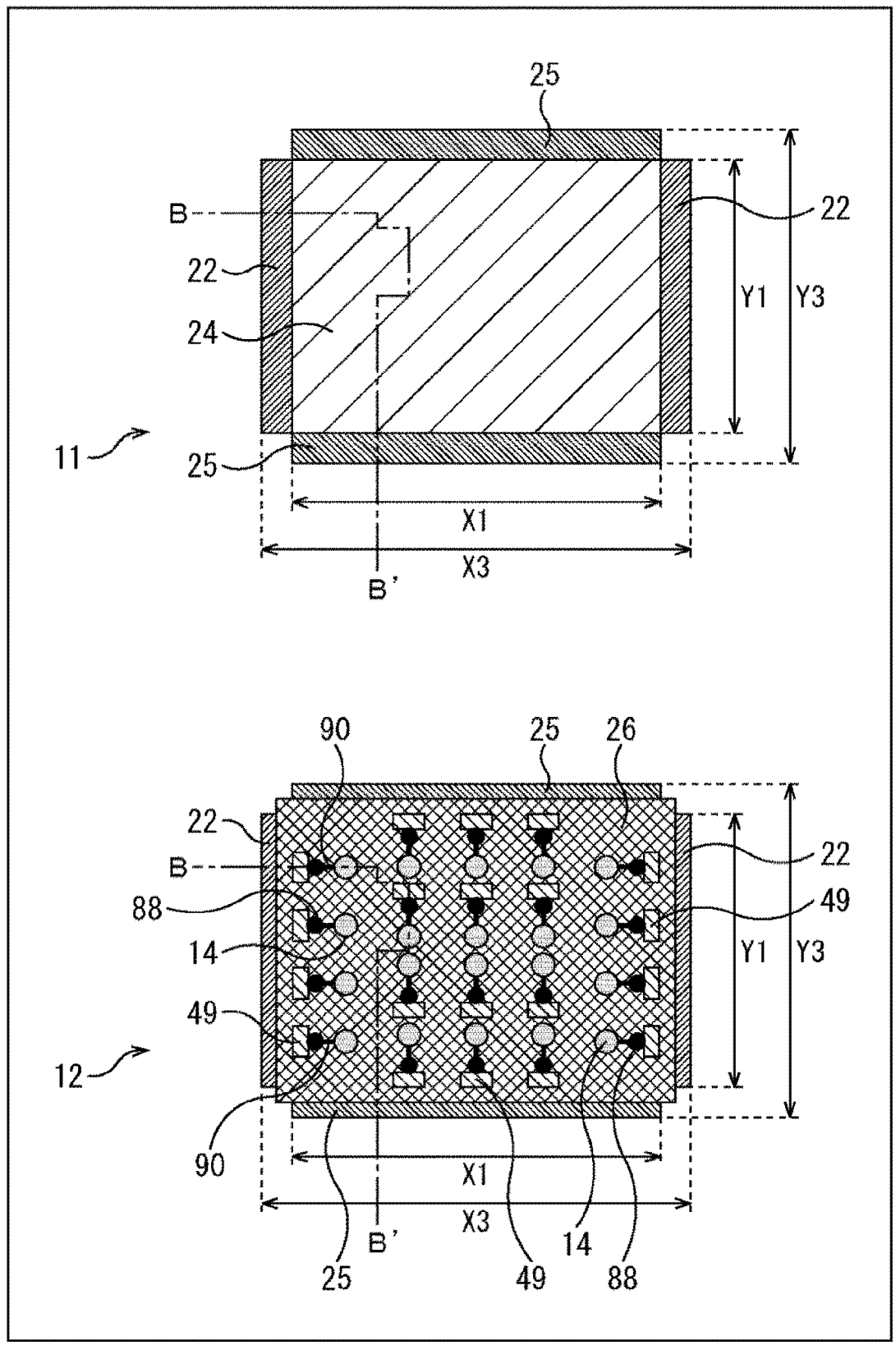
FIG. 7 is a diagram showing a second circuit arrangement configuration example of the circuit arrangement in the solid-state imaging apparatus.
Figure 8:
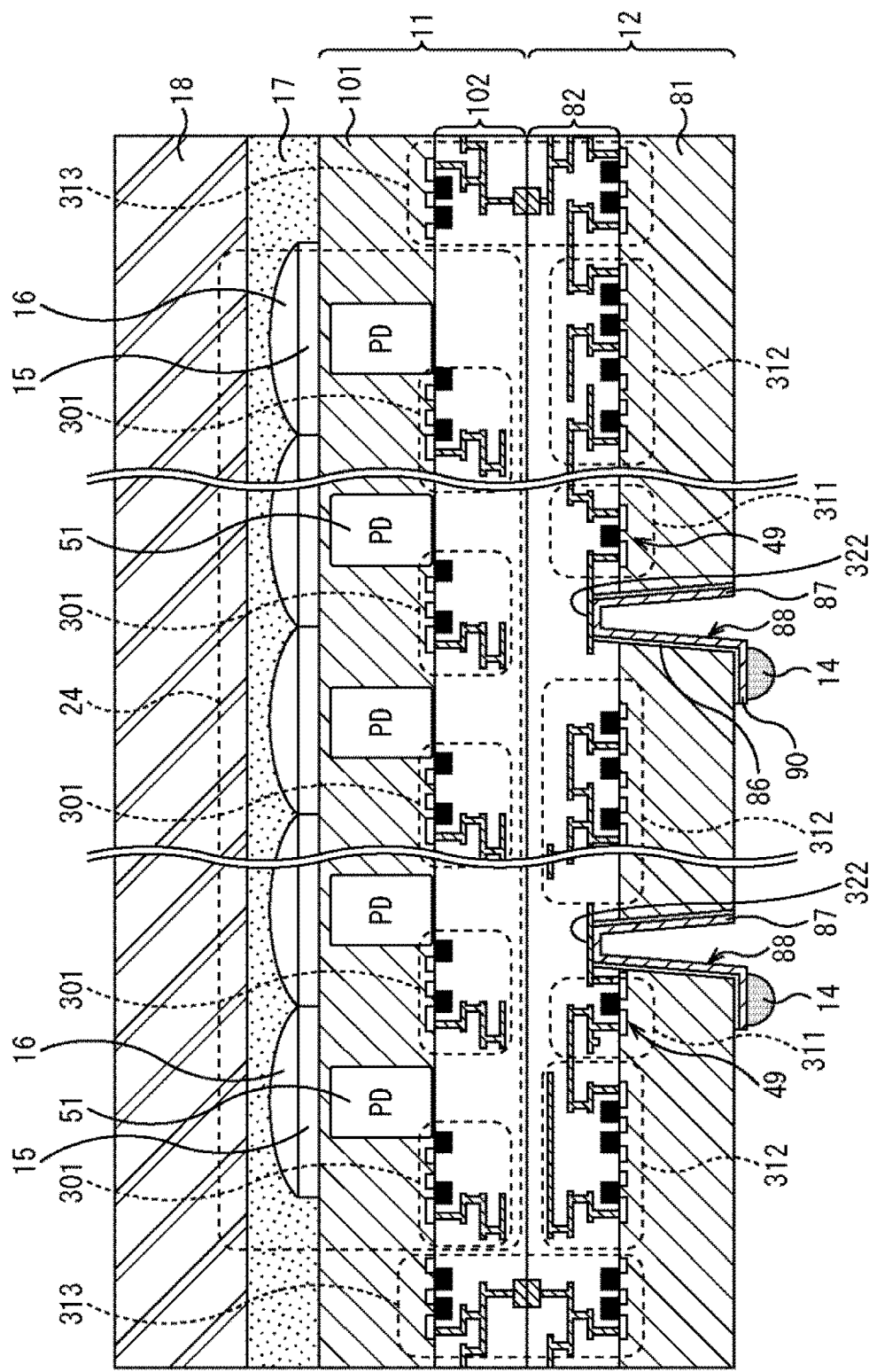
FIG. 8 is a view showing the cross-sectional structure along the line B-B' in FIG. 7.

FIG. 8 is a view showing the cross-sectional structure of the solid-state imaging apparatus 1 along the line B-B' in FIG. 7 in a case where a structure different from the upper and lower wiring connection structure shown in FIG. 6 is used. Note that, for convenience, a part of FIG. 8 is described with a replacement with the cross-sectional structure in another configuration example of the present technology described later.

In the pixel peripheral circuit region 313 in FIG. 8, a part of the wiring of the multilayered wiring layer 102 of the upper structure body 11 is arranged at the lowermost face of the multilayered wiring layer 102, in other words, at the bonding face of the upper structure body 11 and the lower structure body 12. Moreover, a part of the wiring of the multilayered wiring layer 82 of the lower structure body 12 is also arranged at the uppermost face of the multilayered wiring layer 82, in other words, at the bonding face of the upper structure body 11 and the lower structure body 12. Then, a part of the wiring of the multilayered wiring layer 102 and a part of the wiring of the multilayered wiring layer 82 are arranged at substantially the same position on this bonding face, and the wirings are electrically connected to each other. A mode of electrically connecting the wirings to each other may be a mode of directly contacting the two wirings or may be a mode of forming a thin insulating film or a highly resistant film between the two wirings, in which the formed film is partially electrically conducted. Alternatively, the mode may be a mode of forming a thin insulating film or a highly resistant film between the two wirings, in which the two wirings propagate an electric signal by capacitive coupling.

In the present disclosure, the structure, in which a part of the wiring of the multilayered wiring layer 102 of the upper structure body 11 and a part of the wiring of the multilayered wiring layer 82 of the lower structure body 12 are formed at substantially the same position on the bonding face and the two wirings are electrically connected, may be generically called an upper and lower wiring direct connection structure or simply a wiring direct connection structure in some cases.

A specific example of substantially the same position may include, for example, a position where at least part of the two wirings electrically connected is overlapped in a plan view of the solid-state imaging apparatus 1 in a direction from the upper side to the lower side. In a case where, for example, copper (Cu) is used as the material of the two wirings connected, this connection structure may be called a Cu—Cu direct bonding structure or simply a Cu—Cu bonding structure.

In a case where the upper and lower wiring direct connection structure is used, this connection structure can be arranged outside the pixel array unit 24. Alternatively, this connection structure can be arranged inside the pixel peripheral circuit region 313 included in the upper structure body 11 and inside the pixel peripheral circuit region 313 included in the lower structure body 12. More specifically, among the wirings constituting the upper and lower wiring direct connection structure, the wiring arranged on the upper structure body 11 side of the bonding face can be arranged on the lower side of the circuit included in the pixel peripheral circuit region 313 of the upper structure body 11. Moreover, among the wirings constituting the upper and lower wiring direct connection structure, the wiring arranged on the lower structure body 12 side of the bonding face can be arranged on the upper side of the circuit included in the pixel peripheral circuit region 313 of the lower structure body 12. Alternatively, by using the wiring arranged at the pixel array unit 24 (the pixel transistor region 301) as the wiring of the upper structure body 11, the upper and lower wiring direct connection structure by this wiring and the wiring of the lower structure body 12 can be arranged under the pixel array unit 24 (the pixel transistor region 301).

Second Circuit Arrangement Configuration Example

FIG. 7 is a diagram showing a second circuit arrangement configuration example of the solid-state imaging apparatus 1.

In the second circuit arrangement configuration example, the upper and lower wiring direct connection structure described above is used as the upper and lower wiring connection structure.

As shown in FIG. 7, the arrangement of the pixel array unit 24 in the second circuit arrangement configuration example is similar to that in the first circuit arrangement configuration example shown in FIG. 5. That is, the pixel array unit 24 is arranged at the upper structure body 11.

Moreover, as shown in FIG. 7, the arrangements of the row driving unit 22 and the column signal processing unit 25 of the solid-state imaging apparatus 1 in the second circuit arrangement configuration example are also similar to those in the first circuit arrangement configuration example shown in FIG. 5.

On the other hand, the arrangement of the upper and lower wiring connection unit in the second circuit arrangement configuration example is different from that in the first circuit arrangement configuration example shown in FIG. 5.

The connection between the wiring of the row driving unit 22 arranged at the upper structure body 11 and the wiring of the row driving unit 22 arranged at the lower structure body 12 is formed by using the upper and lower wiring direct connection structure in a region where the row driving unit 22 arranged at the upper structure body 11 and the row driving unit 22 arranged at the lower structure body 12 overlap.

The connection between the wiring of the column signal processing unit 25 arranged at the upper structure body 11 and the wiring of the column signal processing unit 25 arranged at the lower structure body 12 is formed by using the upper and lower wiring direct connection structure in a region where the column signal processing unit 25 arranged at the upper structure body 11 and the column signal processing unit 25 arranged at the lower structure body 12 overlap.

In the first circuit arrangement configuration example shown in FIG. 5, the upper and lower wiring connection structure which connects the wirings of the row driving unit 22 and the upper and lower wiring connection structure which connects the wirings of the column signal processing unit 25 were arranged at the wiring connection units 29 outside the row driving unit 22 and outside the column signal processing unit 25, respectively. On the other hand, in the second circuit arrangement configuration example shown in FIG. 7, the upper and lower wiring connection structure which connects the wirings of the row driving unit 22 and the upper and lower wiring connection structure which connects the wirings of the column signal processing unit 25 are formed in the region of the row driving unit 22 and the region of the column signal processing unit 25, respectively. Therefore, in the solid-state imaging apparatus 1 shown in the second circuit arrangement configuration example, the wiring connection units 29 in the upper structure body 11 and the lower structure body 12 are omitted, and it is possible to realize an apparatus with an external size smaller than that of the solid-state imaging apparatus 1 shown in the first circuit arrangement configuration example.

8. Comparative Examples with Other Solid-State Imaging Apparatuses

Comparative Example 1

The characteristics of the structure of the solid-state imaging apparatus 1 will be described as compared with the structures of other solid-state imaging apparatuses.

Figure 9:
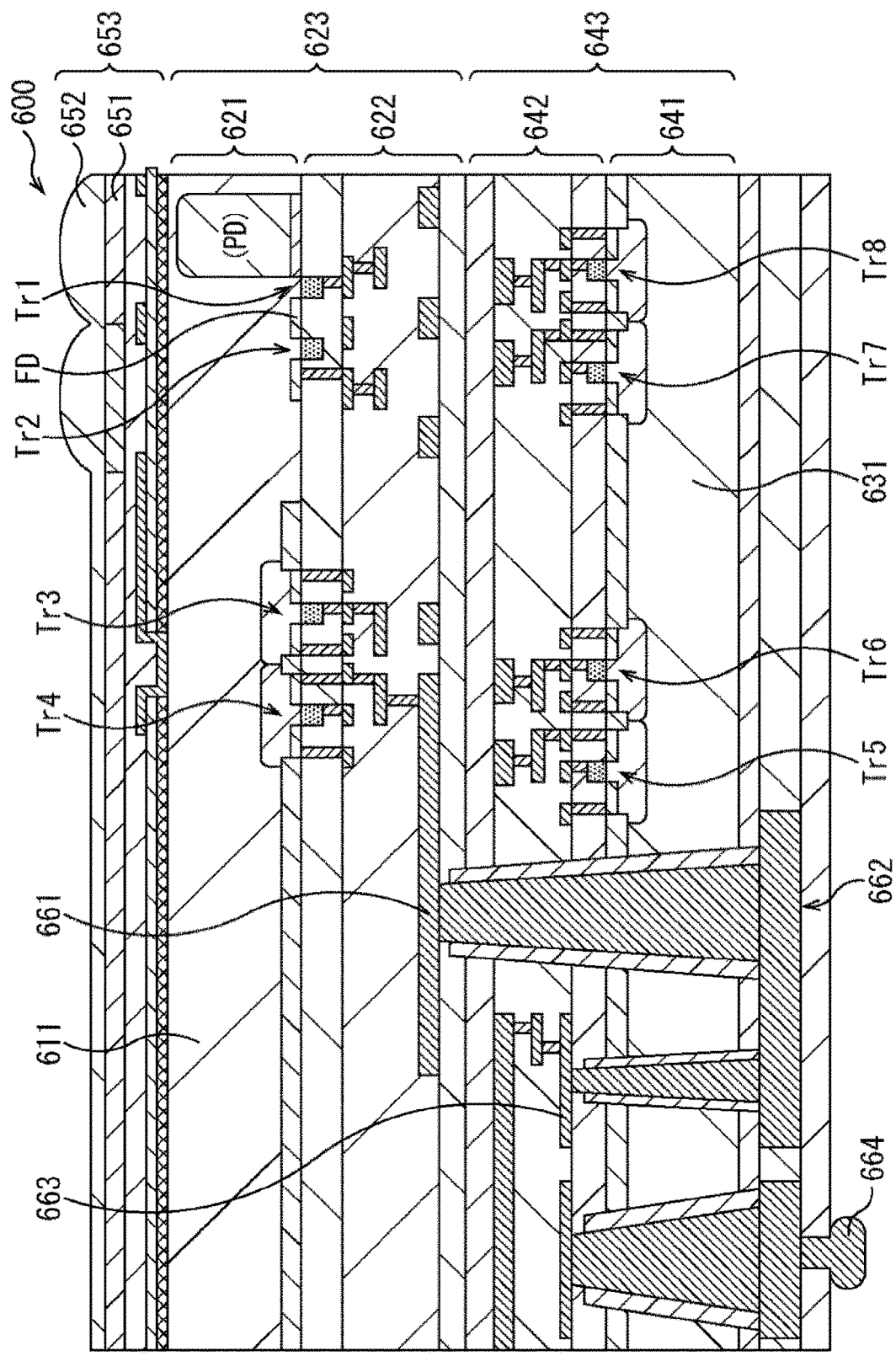
FIG. 9 is a view showing a cross section of the final shape of a solid-state imaging apparatus as Comparative Example 1.

FIG. 9 is a view showing a cross section of the final shape of a solid-state imaging apparatus disclosed in Japanese Patent Application Laid-Open No. 2014-72294 (hereinafter referred to as Comparative Structure Disclosure Document 1) as Comparative Example 1.

A solid-state imaging apparatus 600 in FIG. 9 has a structure in which a first portion 623, which includes a first element unit 621 including a first semiconductor layer 611, and a first wiring unit 622, and a second portion 643, which includes a second element unit 641 including a second semiconductor layer 631, and a second wiring unit 642, are laminated. On the back side of the first portion 623, an optical member 653, in which color filters 651, on-chip lenses 652 and the like are formed, is arranged.

In the solid-state imaging apparatus 600, a structure, which connects a first wiring 661 and a second wiring 663 through a conductive member 662, is formed outside transistors Tr3 and Tr4 constituting a control unit and outside regions where transistors Tr5 to Tr8 constituting a signal processing unit are arranged, and an external terminal 664 is arranged outside this connection structure. Note that there is no description of where to arrange an input/output circuit.

On the other hand, the present technology can make the external size smaller than that of the solid-state imaging apparatus 600 in FIG. 9 by the structure in which (1) the external terminals 14, (2) the semiconductor region where the input circuit unit 42 or the output circuit unit 47 connected to the external terminals 14 is formed, (3) the semiconductor region where the photodiodes 51, which perform imaging, and the pixel transistors are formed, (4) the color filters 15 and the on-chip lenses 16, and (5) the protective substrate 18 are laminated in substantially the same region.

In the final shape of the solid-state imaging apparatus 600 in FIG. 9, a protective substrate for protecting the on-chip lenses 652 is not provided on the upper side of the on-chip lenses 652. Then, in Comparative Structure Disclosure Document 1, a method of manufacturing the solid-state imaging apparatus 600 in FIG. 9 is described, in which the first portion 623 and the second portion 643 are bonded, the color filters 651 and the on-chip lenses 652 are formed, thereafter the substrate is reversed, and then an opening, which exposes an electrode unit, and the external terminal 664 are formed. To form the external terminal 664, it is necessary to crimp the external terminal 664 onto a metal wiring by applying a stress equal to or greater than a specific value. When the external terminal 664 is formed by the above manufacturing method in the solid-state imaging apparatus 600 without the protective substrate on the on-chip lenses 652, the on-chip lenses 652 are pressed against the manufacturing apparatus when the external terminal 664 is crimped, and the on-chip lenses 652 may be damaged.

Moreover, in the solid-state imaging apparatus 600 in FIG. 9, the external terminal 664 is formed in a region outside the pixel array unit and is not formed right under the on-chip lenses 652. In this case, the force applied to the on-chip lenses 652 when the external terminal 664 is crimped is such that the force applied to crimp the external terminal 664 is diagonally dispersed.

In a case where the external terminal 664 is formed right under the pixel region, that is, right under the on-chip lenses 652 in order to realize a solid-state imaging apparatus with a small external size, since the on-chip lenses 652 are on the extended line of the direction of the force applied to crimp the external terminal 664, the force applied to the on-chip lenses 652 becomes greater, and the occurrence of the damage to the on-chip lenses 652 may become more serious.

Furthermore, Comparative Structure Disclosure Document 1 also discloses a manufacturing method in which the color filters 651 and the on-chip lenses 652 are formed after the external terminal 664 is formed.

However, in the case of this manufacturing method, when the color filters 651 and the on-chip lenses 652 are formed in a state where a large number of protrusions by the external terminal 664 are provided on the surface of the solid-state imaging apparatus, it may be difficult to fix the solid-state imaging apparatus to the manufacturing apparatus of these by a general method such as a vacuum suction method.

On the other hand, the solid-state imaging apparatus 1 in FIG. 1 has the protective substrate 18 on the on-chip lenses 16. Therefore, it is possible to form the external terminals 14 without pressing the on-chip lenses 16 against the manufacturing apparatus of the external terminals 14. The solid-state imaging apparatus 1 enables the structure, in which (1) the external terminals 14, (2) the semiconductor region where the input circuit unit 42 or the output circuit unit 47 connected to the external terminals 14 is formed, (3) the semiconductor region where the photodiodes 51, which perform imaging, and the pixel transistors are formed, (4) the color filters 15 and the on-chip lenses 16, and (5) the protective substrate 18 are laminated in substantially the same region, and can make the external size smaller than that of the solid-state imaging apparatus 600 in FIG. 9.

Comparative Example 2

Figure 10:
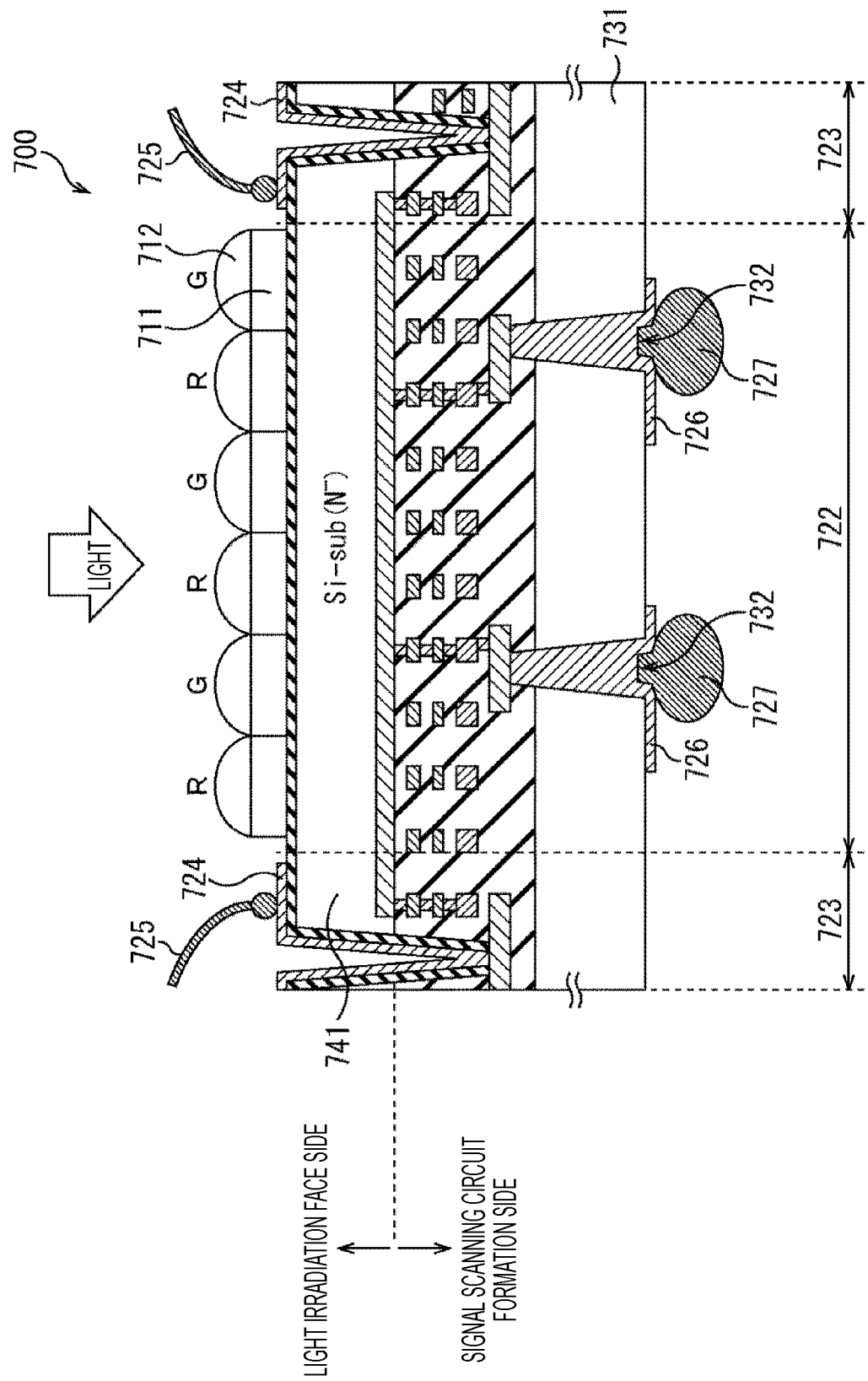
FIG. 10 is a view showing a cross section of the final shape of a solid-state imaging apparatus as Comparative Example 2.

FIG. 10 is a view showing a cross section of the final shape of a solid-state imaging apparatus disclosed in Japanese Patent Application Laid-Open No. 2010-50149 (Comparative Structure Disclosure Document 2) as Comparative Example 2.

A solid-state imaging apparatus 700 in FIG. 10 is divided into an imaging region 722 where photodiodes (not shown), color filters 711, on-chip lenses 712, and the like are formed, and a peripheral region 723 formed therearound.

A first pad 724 for inputting/outputting a driving pulse and a signal is arranged in the peripheral region 723. A bonding wire 725 is connected to the first pad 724. Then, a second pad 726 for giving a reference potential Vss is arranged in the imaging region 722. An external terminal (solder ball) 727 is provided on the second pad 726.

As described above, the solid-state imaging apparatus 700 includes the external terminals 727 on the lower side of a pixel array.

The solid-state imaging apparatus 1 can make the external size smaller than that of the solid-state imaging apparatus 700 in FIG. 10 by the structure in which (1) the external terminals 14, (2) the semiconductor region where the input circuit unit 42 or the output circuit unit 47 connected to the external terminals 14 is formed, (3) the semiconductor region where the photodiodes 51, which perform imaging, and the pixel transistors are formed, (4) the color filters 15 and the on-chip lenses 16, and (5) the protective substrate 18 are laminated in substantially the same region.

The solid-state imaging apparatus 700 in FIG. 10 is a solid-state semiconductor apparatus which does not include the laminated structure with the upper structure body 11 and the lower structure body 12 of the solid-state imaging element 1, in other words, includes only one layer of a semiconductor substrate on which a transistor circuit is formed.

In the final shape of the solid-state imaging apparatus 700 disclosed in FIG. 10, vias 732, which penetrate a support substrate 731, and the external terminals 727 are formed on the lower side of the pixel array in the imaging region 722.

However, the external terminals 727 formed in FIG. 10 are terminals for the reference potential Vss (ground potential). The terminal for the reference potential Vss does not require an input circuit constituted by a transistor circuit when the reference potential Vss is supplied to the inside of the solid-state imaging apparatus. Therefore, in the solid-state imaging apparatus 700 disclosed in FIG. 10, the external terminals 737 for the reference potential Vss can be arranged on the lower side of the imaging region 722.

On the other hand, in the imaging region 722, pixels each including a photodiode and a pixel transistor are arranged side by side. Therefore, in a case of a structure including only one layer of a semiconductor substrate 741 on which a transistor circuit is formed, it is difficult to form an input circuit together in a pixel region in the semiconductor substrate 741 on which the pixels are formed. Therefore, in the solid-state imaging apparatus 700 including only one layer of the semiconductor substrate 741 disclosed in FIG. 10, it is possible to arrange a power supply terminal, which does not require an input/output circuit, on the lower side of the pixel region, but it is impossible to arrange an external terminal which requires an input circuit or an output circuit, in other words, an external terminal for signal input or signal output.

Moreover, similarly to the solid-state imaging apparatus 600 shown in FIG. 9, the solid-state imaging apparatus 700 in FIG. 10 does not include a protective substrate on the on-chip lenses 712. Thus, there is a problem that the on-chip lenses 712 are damaged when the external terminals are crimped.

On the other hand, the solid-state imaging apparatus 1 includes a structure in which a plurality of layers of semiconductor substrates, on which transistor circuits are formed, are laminated. With this arrangement, it is possible to arrange the external terminals 14, which require input circuits or output circuits, in other words, the signal input/output terminals 14C for signal input or signal output on the lower side of the pixel region. Furthermore, the solid-state imaging apparatus 1 has the protective substrate 18 on the on-chip lenses 16. Therefore, it is possible to form the external terminals 14 without pressing the on-chip lenses 16 against the manufacturing apparatus of the external terminals 14. Thus, the solid-state imaging apparatus 1 enables the structure, in which (1) the external terminals 14, (2) the semiconductor region where the input circuit unit 42 or the output circuit unit 47 connected to the external terminals 14 is formed, (3) the semiconductor region where the photodiodes 51, which perform imaging, and the pixel transistors are formed, (4) the color filters 15 and the on-chip lenses 16, and (5) the protective substrate 18 are laminated in substantially the same region, and can make the external size smaller than that of the solid-state imaging apparatus 700 in FIG. 10.

Comparative Example 3

Figure 11:
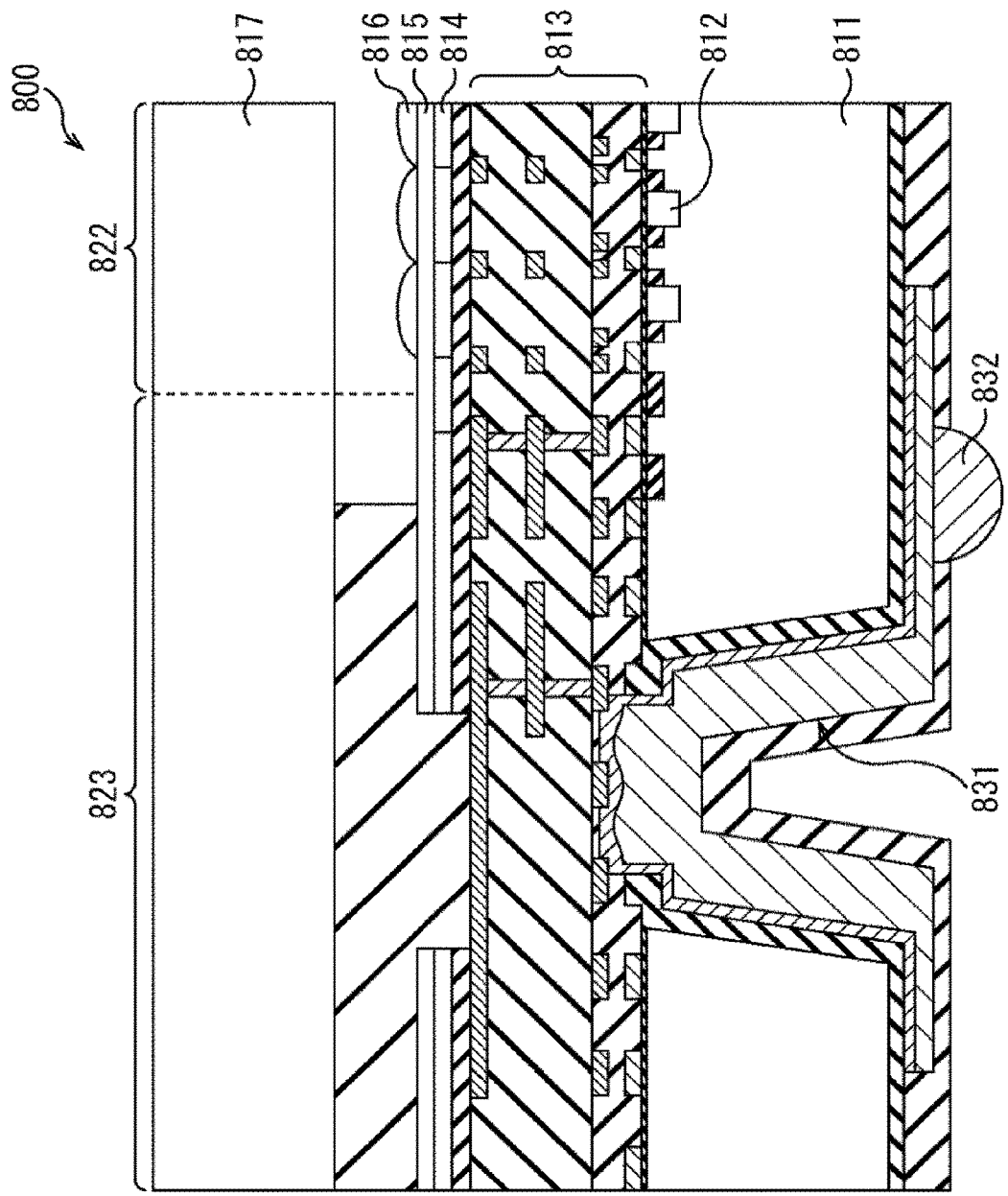
FIG. 11 is a view showing a cross section of the final shape of a solid-state imaging apparatus as Comparative Example 3.

FIG. 11 is a view showing a cross section of the final shape of a solid-state imaging apparatus disclosed in Japanese Patent Application Laid-Open No. 2011-9645 (Comparative Structure Disclosure Document 3) as Comparative Example 3.

In a solid-state imaging apparatus 800 in FIG. 11, imaging elements 812 each including a photodiode and a transistor are formed on a first main face (upper face) of a semiconductor substrate 811. On the upper side of the imaging elements 812, a multilayered wiring layer 813, color filters 814, an overcoat 815, and on-chip lenses 816 are formed. Moreover, the solid-state imaging apparatus 800 includes a protective substrate 817 on the upper side of the on-chip lenses 816.

A peripheral circuit unit 823, in which a silicon through electrode 831 penetrating the semiconductor substrate 811, an external terminal (solder ball) 832 connected to the outside, and the like are formed, is arranged outside an imaging pixel unit 822 in which the imaging elements 812, the color filters 814, and the on-chip lenses 816 are formed.

Similarly to the solid-state imaging apparatus 700 in Comparative Example 2, the solid-state imaging apparatus 800 in FIG. 11 is a solid-state semiconductor apparatus which does not include the laminated structure in which the upper structure body and the lower structure body are laminated, in other words, includes only one layer of a semiconductor substrate on which a transistor circuit is formed. Thus, it is impossible to arrange an external terminal, which requires an input circuit or an output circuit, in other words, an external terminal for signal input or signal output on the lower side of the pixel region.

On the other hand, the solid-state imaging apparatus 1 includes a structure in which a plurality of layers of semiconductor substrates, on which transistor circuits are formed, are laminated. With this arrangement, it is possible to arrange the external terminals 14, which require input circuits or output circuits, in other words, the external terminals 14 for signal input or signal output on the lower side of the pixel region. Thus, the solid-state imaging apparatus 1 enables the structure, in which (1) the external terminals 14, (2) the semiconductor region where the input circuit unit 42 or the output circuit unit 47 connected to the external terminals 14 is formed, (3) the semiconductor region where the photodiodes 51, which perform imaging, and the pixel transistors are formed, (4) the color filters 15 and the on-chip lenses 16, and (5) the protective substrate 18 are laminated in substantially the same region, and can make the external size smaller than that of the solid-state imaging apparatus 800 in FIG. 11.

Furthermore, in a case where the silicon through electrode 831 is formed only in the outer peripheral unit of the apparatus (the peripheral circuit unit 823) as in the solid-state imaging apparatus 800 in FIG. 11, a power supply terminal and a ground terminal are also similarly arranged only in the outer peripheral unit of the apparatus. In this case, it was necessary to arrange a large number of power supply terminals and ground terminals for countermeasures against IR drop and wiring delay. On the other hand, in the solid-state imaging apparatus 1, since the through vias 88 can be arranged in any region of the lower structure body 12, which is further inside than the upper and lower substrate connection region 314, some of the through vias 88 can be used for the power supply terminals and the ground terminals. That is, the power supply terminals and ground terminals can also be arranged in any region. This can decrease the numbers of power supply terminals and ground terminals as compared with the case where the power supply terminals and the ground terminals are arranged only in the outer peripheral unit. Accordingly, the circuit area of the entire solid-state imaging apparatus 1 can be reduced.

Differences Between Solid-State Imaging Apparatus in FIG. 1 and Comparative Examples The solid-state imaging apparatus 1 can make the external size smaller by the structure in which (1) the external terminals 14, (2) the semiconductor region where the input circuit unit 42 or the output circuit unit 47 connected to the external terminals 14 is formed, (3) the semiconductor region where the photodiodes 51, which perform imaging, and the pixel transistors are formed, (4) the color filters 15 and the on-chip lenses 16, and (5) the protective substrate 18 are laminated in substantially the same region.

In the case of the solid-state imaging apparatuses with the semiconductor laminated structure without a protective substrate shown in Comparative Examples 1 and 2, the on-chip lenses may be damaged. That is, there are obstructive factors to obtain a solid-state imaging apparatus with the same external size as the present technology by adopting the structure in which the above (1) to (4) are laminated in substantially the same region. In other words, the function and action of "realizing a small solid-state imaging apparatus by laminating the above (1) to (4) in substantially the same region" are the function and action which cannot be obtained by the solid-state imaging apparatuses with semiconductor laminated structure without a protective substrate shown in Comparative Examples 1 and 2.

In the case of the solid-state semiconductor apparatus including only one layer of the semiconductor substrate on which the transistor circuit is formed shown in Comparative Example 3, a solid-state imaging apparatus with the same external size as the present technology cannot be obtained by adopting the structure in which the above (1) to (5) are laminated in substantially the same region. In other words, there are obstructive factors. That is, the function and action of "realizing a small solid-state imaging apparatus by laminating the above (1) to (5) in substantially the same region" are the function and action which cannot be obtained by the solid-state imaging apparatus including only one layer of the semiconductor substrate on which the transistor circuit is formed shown in Comparative Example 3.

Thus, the function and action of "realizing a solid-state imaging apparatus with an external size smaller, by the structure in which the above (1) to (5) are laminated in substantially the same region, than that of a solid-state imaging apparatus without this structure" according to the present technology are the function and action which cannot be obtained by the single configuration of the "solid-state imaging apparatuses with the semiconductor laminated structure without a protective substrate" shown in Comparative Examples 1 and 2, and are the function and action which cannot be either obtained by the single configuration of the "solid-state imaging apparatus including only one layer of the semiconductor substrate on which the transistor circuit is formed" shown in Comparative Example 3.

9. Other Circuit Arrangement Configuration Examples of Solid-State Imaging Apparatus Third Circuit Arrangement Configuration Example FIG. 12 is a diagram showing a third circuit arrangement configuration example which is another circuit arrangement configuration example of the solid-state imaging apparatus 1 and a modification of the first circuit arrangement configuration example.

In the first circuit arrangement configuration example shown in FIG. 5, the input/output circuit unit 49 was divided and arranged for each one of the external terminals 14. Then, the image signal processing unit 26 surrounded the periphery of each input/output circuit unit 49.

Figure 12:
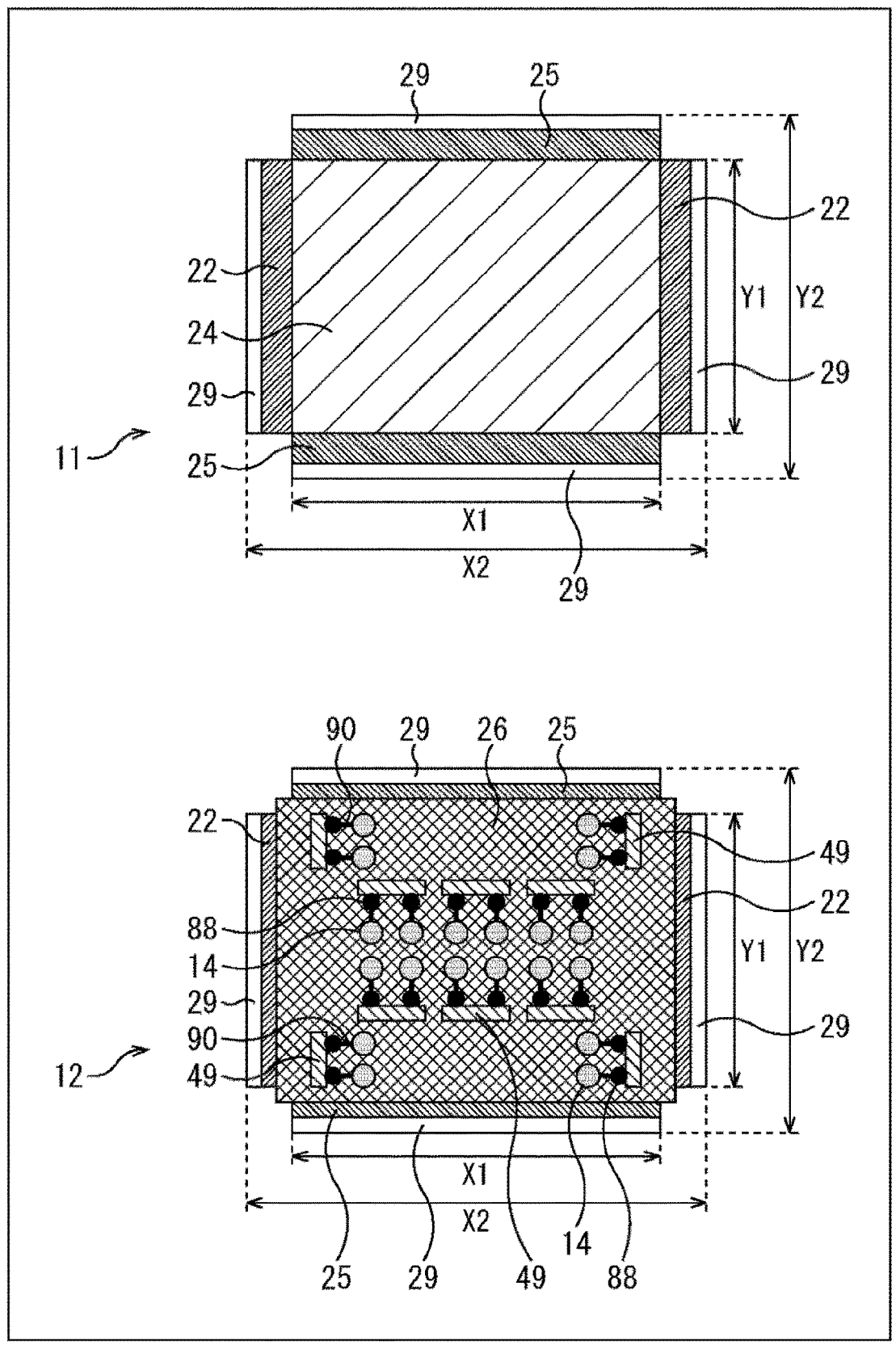
FIG. 12 is a diagram showing a third circuit arrangement configuration example of the circuit arrangement in the solid-state imaging apparatus.

On the other hand, in the third circuit arrangement configuration example shown in FIG. 12, the input/output circuit units 49 are arranged collectively for each of the plurality of external terminals 14. In one region of the input/output circuit unit 49, for example, the input/output circuit unit 49 of a certain external terminal 14 and the input/output circuit unit 49 of another external terminal 14 are arranged in contact with each other, and the image signal processing unit 26 is not arranged between these input/output circuit units 49. Since there are less number of places of the arrangements isolated between the wells with different power supply voltages in the third circuit arrangement configuration example, in which the plurality of input/output circuit units 49 with the same power supply voltage are collectively arranged as one chunk of an input/output circuit unit region, than the first circuit arrangement configuration example in which the input/output circuit unit 49 and the image signal processing unit 26 with different power supply voltages are alternately and adjacently arranged, there is a possibility that more circuits can be mounted, for example, to the image signal processing unit 26 in the lower structure body 12 even if the external sizes of the solid-state imaging apparatuses 1 are the same.

Moreover, in the third circuit arrangement configuration example shown in FIG. 12, a part of the input/output circuit unit 49 may be not arranged on the lower side of the pixel array unit 24 included in the upper structure body 11, but may be arranged on the lower side of the pixel peripheral circuit unit included in the upper structure body 11, for example, the lower side of the row driving unit 22 included in the upper structure body 11 or outside the region where the image signal processing unit 26 included in the lower structure body 12 is arranged. With this arrangement, even if the external sizes of the solid-state imaging apparatuses 1 are the same, there is a possibility that even more circuits can be mounted, for example, to the image signal processing unit 26 in the lower structure body 12.

Fourth Circuit Arrangement Configuration Example

Figure 13:
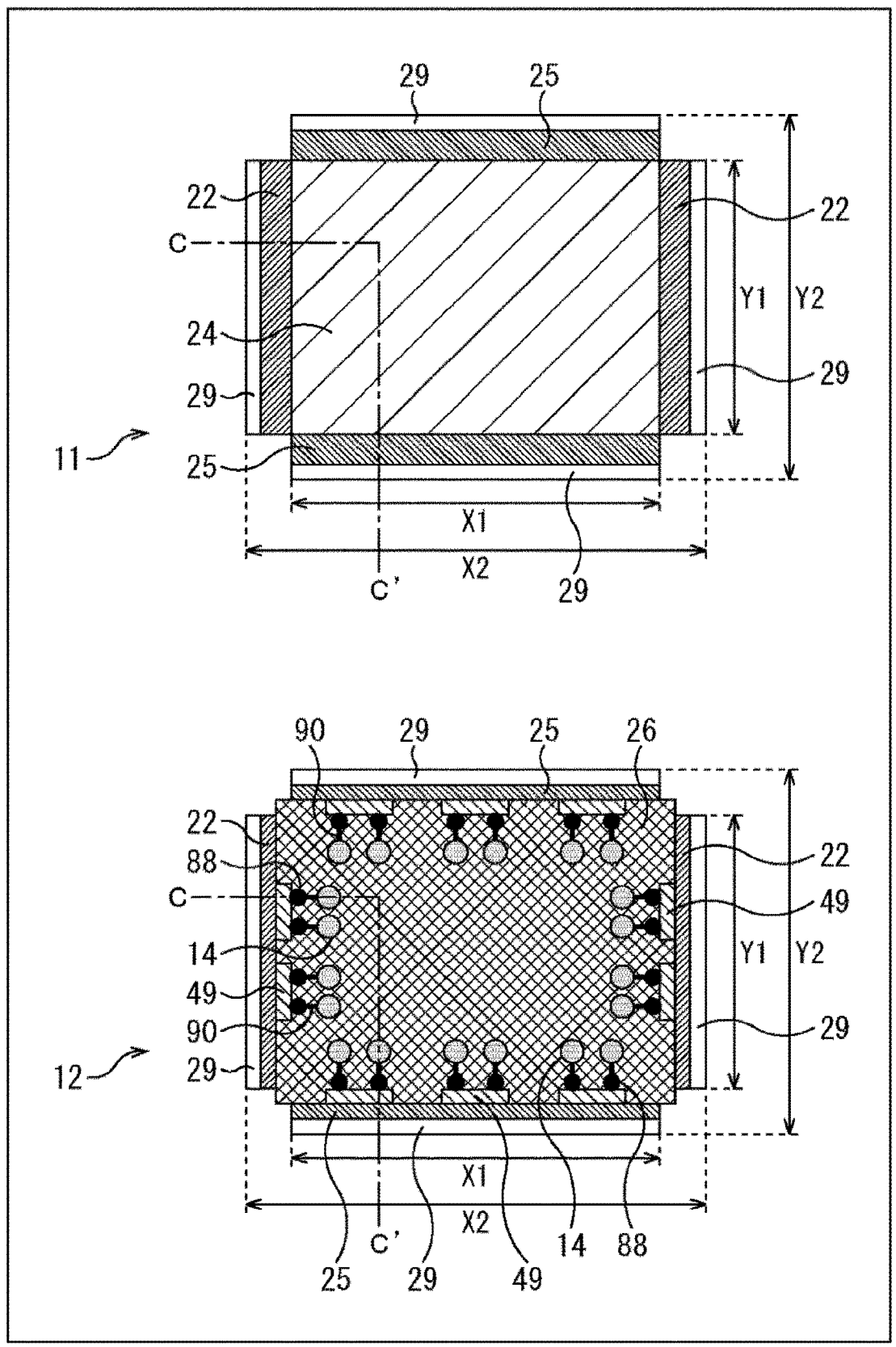
FIG. 13 is a diagram showing a fourth circuit arrangement configuration example of the circuit arrangement in the solid-state imaging apparatus.

FIG. 13 is a diagram showing a fourth circuit arrangement configuration example which is another circuit arrangement configuration example of the solid-state imaging apparatus 1 and a modification of the first and third circuit arrangement configuration examples.

Figure 14:
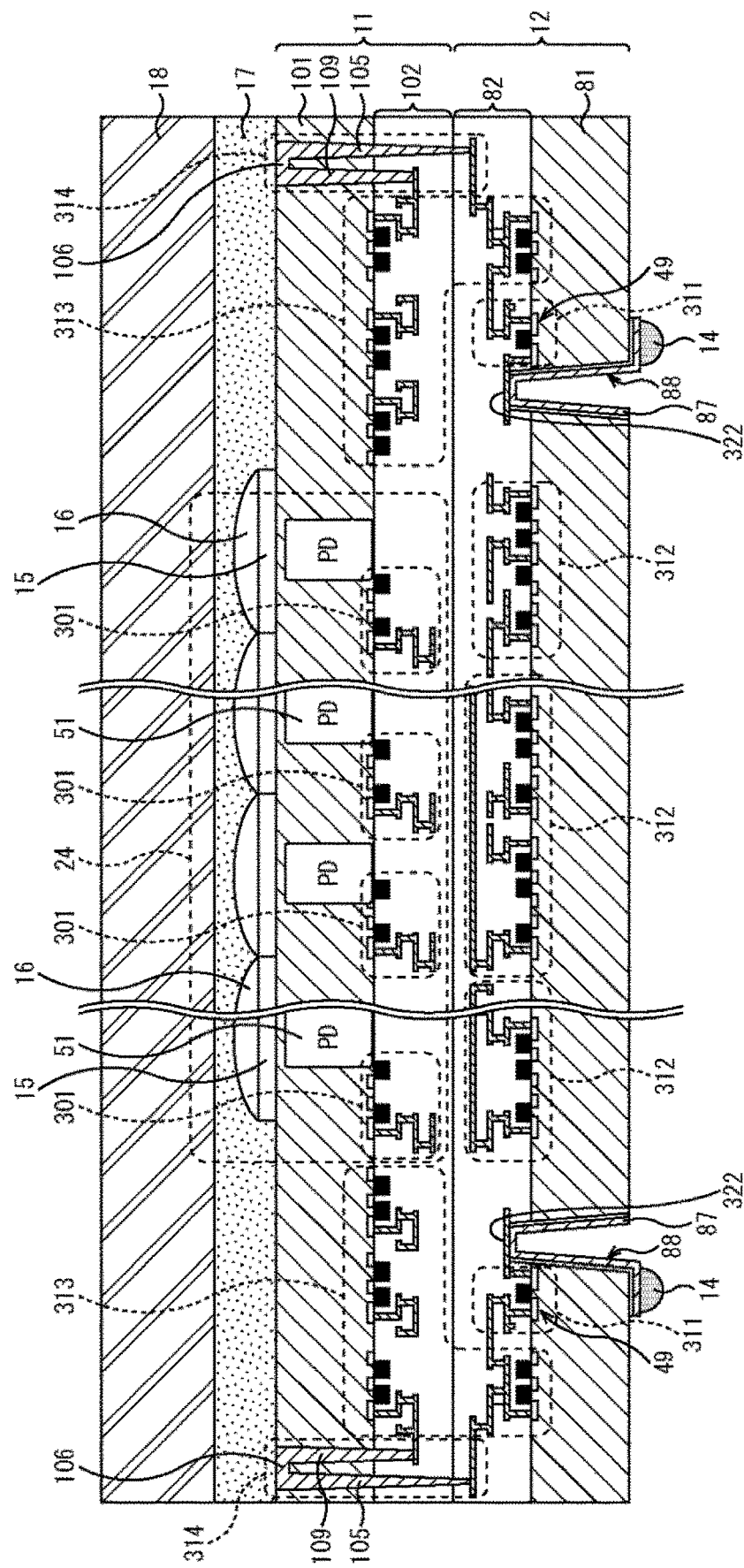
FIG. 14 is a view showing the cross-sectional structure along the line C-C' in FIG. 13.

FIG. 14 is a view showing the cross-sectional structure of the solid-state imaging apparatus 1 along the line C-C' in FIG. 13. Note that, for convenience, a part of FIG. 14 is described with a replacement with the cross-sectional structure in another configuration example of the present technology described later.

In the fourth circuit arrangement configuration example shown in FIGS. 13 and 14, all of the input/output circuit units 49, in other words, the input circuit units 42 and the output circuit units 47 are arranged at the outer peripheral portion of the region where the image signal processing unit 26 included in the lower structure body 12 is arranged. The regions where these input/output circuit units 49 are arranged may be on the lower side of the row driving unit 22 and the column signal processing unit 25 (the pixel peripheral circuit region 313) included in the upper structure body 11 or may be on the lower side of the outer peripheral portion of the pixel array unit 24 included in the upper structure body 11.

Note that the regions where the input/output circuit units 49 are arranged do not need to be arranged, for example, without any discontinuity over the entire row direction of the column signal processing unit 25, and there may be a region, where the input/output circuit unit 49 is not arranged, between the column signal processing unit 25 and the image signal processing unit 26.

Moreover, the regions where the input/output circuit units 49 are arranged do not need to be arranged without any discontinuity over the entire column direction of the row driving unit 22, and there may be a region, where the input/output circuit unit 49 is not arranged, between the row driving unit 22 and the image signal processing unit 26.

Since there are less number of places of the arrangements isolated between the wells with different power supply voltages in the fourth circuit arrangement configuration example than the third circuit arrangement configuration example, there is a possibility that more circuits can be mounted, for example, to the image signal processing unit 26 in the lower structure body 12 even if the external sizes of the solid-state imaging apparatuses 1 are the same.

Fifth Circuit Arrangement Configuration Example

Figure 15:
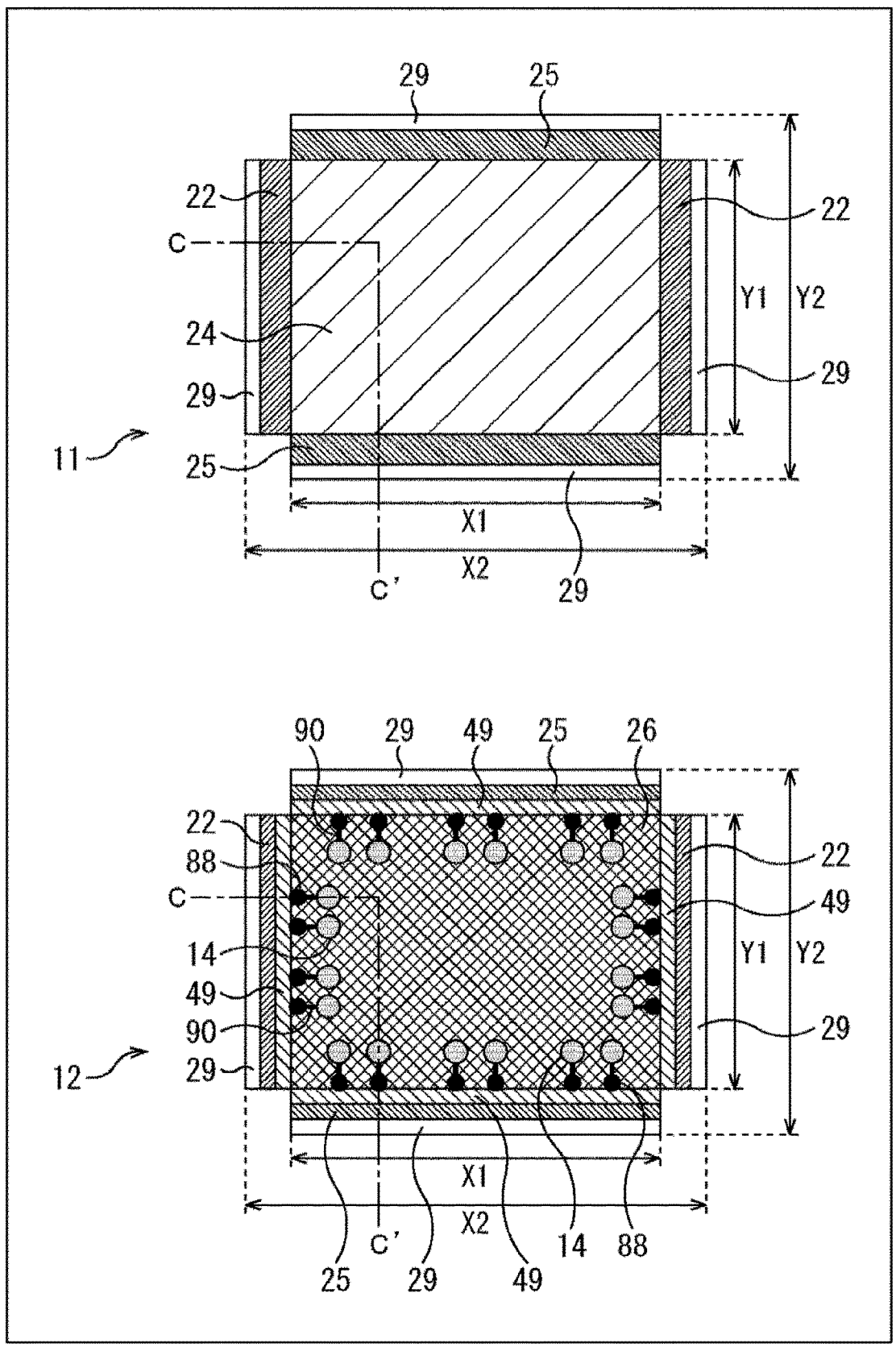
FIG. 15 is a diagram showing a fifth circuit arrangement configuration example of the circuit arrangement in the solid-state imaging apparatus.

FIG. 15 is a diagram showing a fifth circuit arrangement configuration example which is another circuit arrangement configuration example of the solid-state imaging apparatus 1 and a modification of the first, third, and fourth circuit arrangement configuration examples.

In the fourth circuit arrangement configuration example shown in FIG. 13, there was a region, where the input/output circuit unit 49 is not arranged between the column signal processing unit 25 and the image signal processing unit 26 nor between the row driving unit 22 and the image signal processing unit 26.

On the other hand, in the fifth circuit arrangement configuration example shown in FIG. 15, the input/output circuit units 49 are arranged in column over the entire row direction of the column signal processing unit 25 and over the entire column direction of the row driving unit 22. With this arrangement, there is a possibility that the area of the input/output circuit unit 49 can be enlarged.

Moreover, in the fifth circuit arrangement configuration example, there is a possibility that more circuits can be mounted, for example, to the image signal processing unit 26 in the lower structure body 12 even if the external size of the solid-state imaging apparatus 1 is the same as that of the solid-state imaging apparatuses 1 in the first and third circuit arrangement configuration examples.

Sixth Circuit Arrangement Configuration Example

Figure 16:
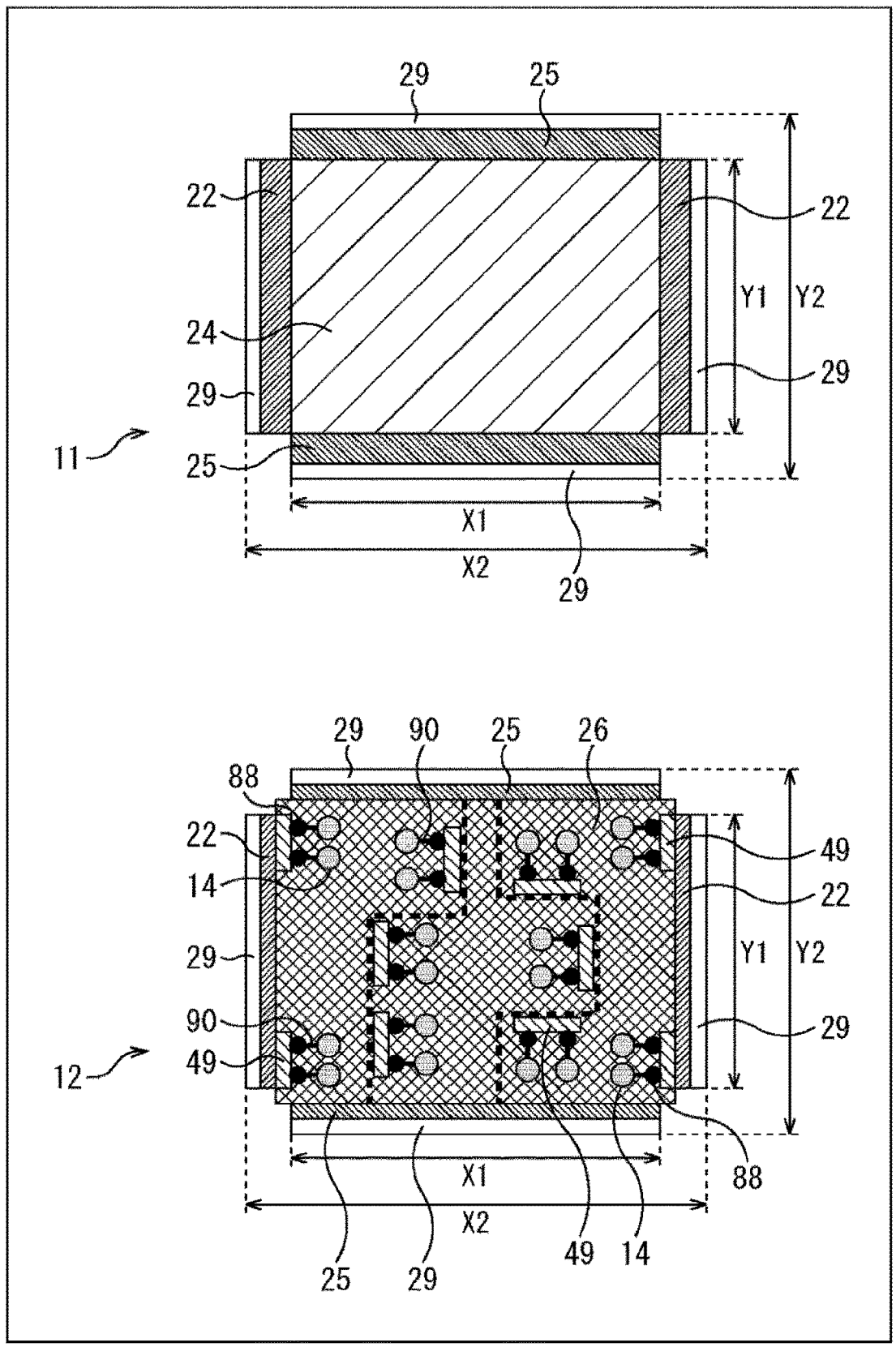
FIG. 16 is a diagram showing a sixth circuit arrangement configuration example of the circuit arrangement in the solid-state imaging apparatus.

FIG. 16 is a diagram showing a sixth circuit arrangement configuration example which is another circuit arrangement configuration example of the solid-state imaging apparatus 1 and a modification of the first and third circuit arrangement configuration examples.

In the first and third circuit arrangement configuration examples, the input/output circuit unit 49 was arranged in the region in the lower structure body 12 on the lower side of the pixel array unit 24 of the upper structure body 11, and the image signal processing unit 26 was arranged therearound.

In the sixth circuit arrangement configuration example in FIG. 16, the image signal processing unit 26 of the lower structure body 12 is arranged with a configuration including a plurality of (three in FIG. 16) circuit blocks divided by broken lines. Then, in the sixth circuit arrangement configuration example, the input/output circuit units 49 are arranged at block boundaries of the circuit blocks included in the image signal processing unit 26 or at portions which are boundaries with the row driving unit 22.

In a case where the image signal processing unit 26 is divided into a plurality of circuit blocks to be arranged, a power supply line and a ground line to a circuit included in each circuit block may be arranged at the block boundary portion in some cases. Therefore, the distance between the circuit and the circuit at the block boundary portion may be arranged so as to be longer than the distance between the circuit and the circuit inside the circuit block in some cases. By thus arranging the input/output circuit units 49 at the boundary portions of the circuit blocks in which the circuit density is relatively low, there is a possibility that the input/output circuit units 49 can be arranged with ease of circuit layout design and hardly lowering the integration degree of the circuits as compared with a case where the input/output circuit units 49 are arranged inside the circuit blocks. With this arrangement, even if the external sizes of the solid-state imaging apparatuses 1 are the same, there is a possibility that even more circuits can be mounted, for example, to the image signal processing unit 26 in the lower structure body 12 by using the sixth circuit arrangement configuration example.

Seventh Circuit Arrangement Configuration Example

Figure 17:
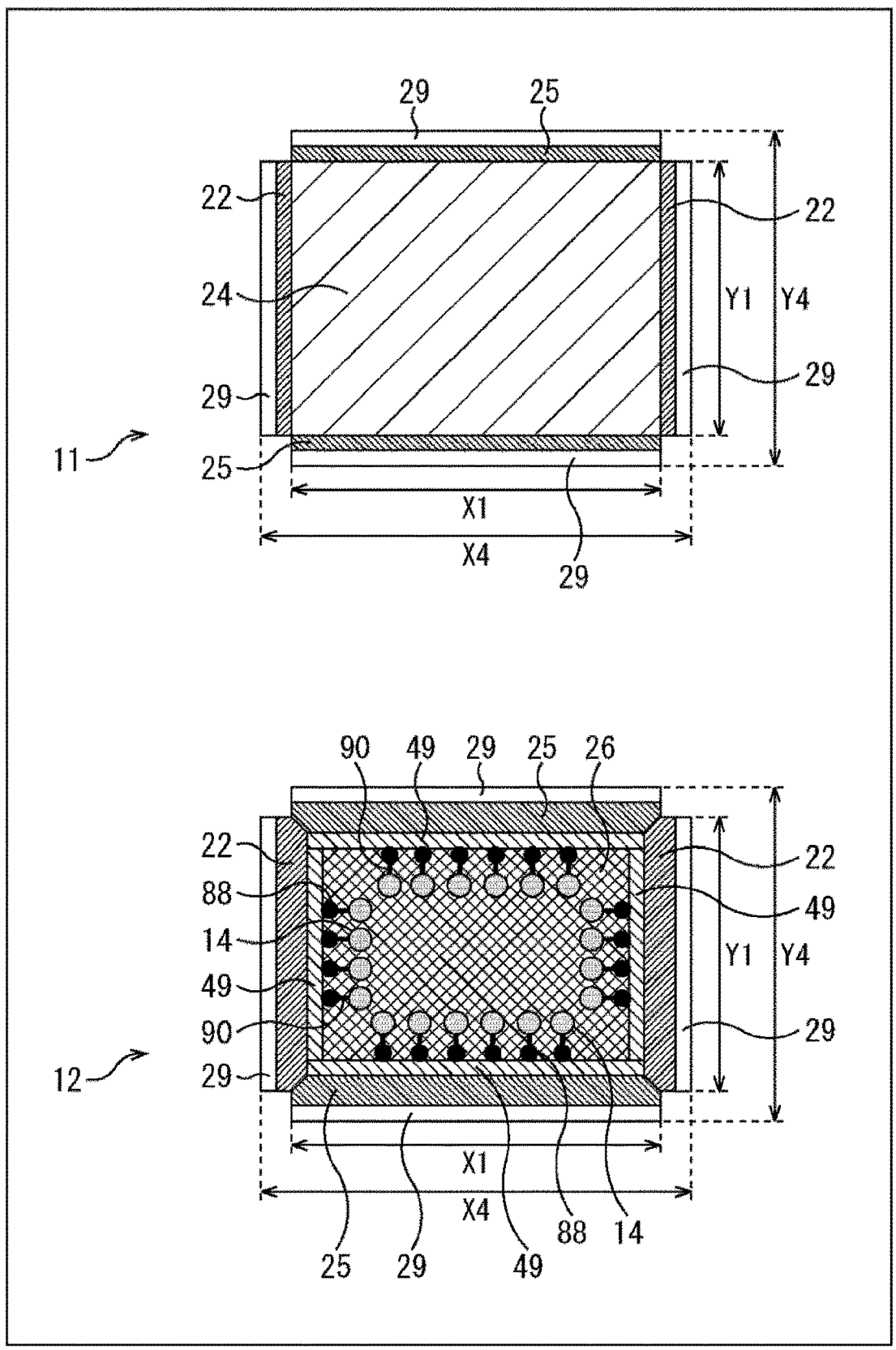
FIG. 17 is a diagram showing a seventh circuit arrangement configuration example of the circuit arrangement in the solid-state imaging apparatus.

FIG. 17 is a diagram showing a seventh circuit arrangement configuration example which is another circuit arrangement configuration example of the solid-state imaging apparatus 1 and a modification of the fifth circuit arrangement configuration example.

In the seventh circuit arrangement configuration example in FIG. 17, the area of the row driving unit 22 arranged at the lower structure body 12 is formed to be larger than the area of the row driving unit 22 arranged at the upper structure body 11. Moreover, the row driving unit 22 arranged at the lower structure body 12 is arranged to extend further toward the inside direction of the apparatus than the row driving unit 22 arranged at the upper structure body 11.

Similarly, the area of the column signal processing unit 25 arranged at the lower structure body 12 is formed to be larger than the area of the column signal processing unit 25 arranged at the upper structure body 11. Moreover, the column signal processing unit 25 arranged at the lower structure body 12 is arranged to extend further toward the inside direction of the apparatus than the column signal processing unit 25 arranged at the upper structure body 11.

With this arrangement, there is a possibility that the external size of the solid-state imaging apparatus 1 can be made smaller in the seventh circuit arrangement configuration example than the fifth circuit arrangement configuration example shown in FIG. 15 even if the sizes of the pixel array units 24 of the solid-state imaging apparatuses 1 are the same.

Note that the arrangement examples of the row driving unit 22 and the column signal processing unit 25 shown in the seventh circuit arrangement configuration example can also be applied to other configuration examples of the present technology.

Eighth Circuit Arrangement Configuration Example

Figure 18:
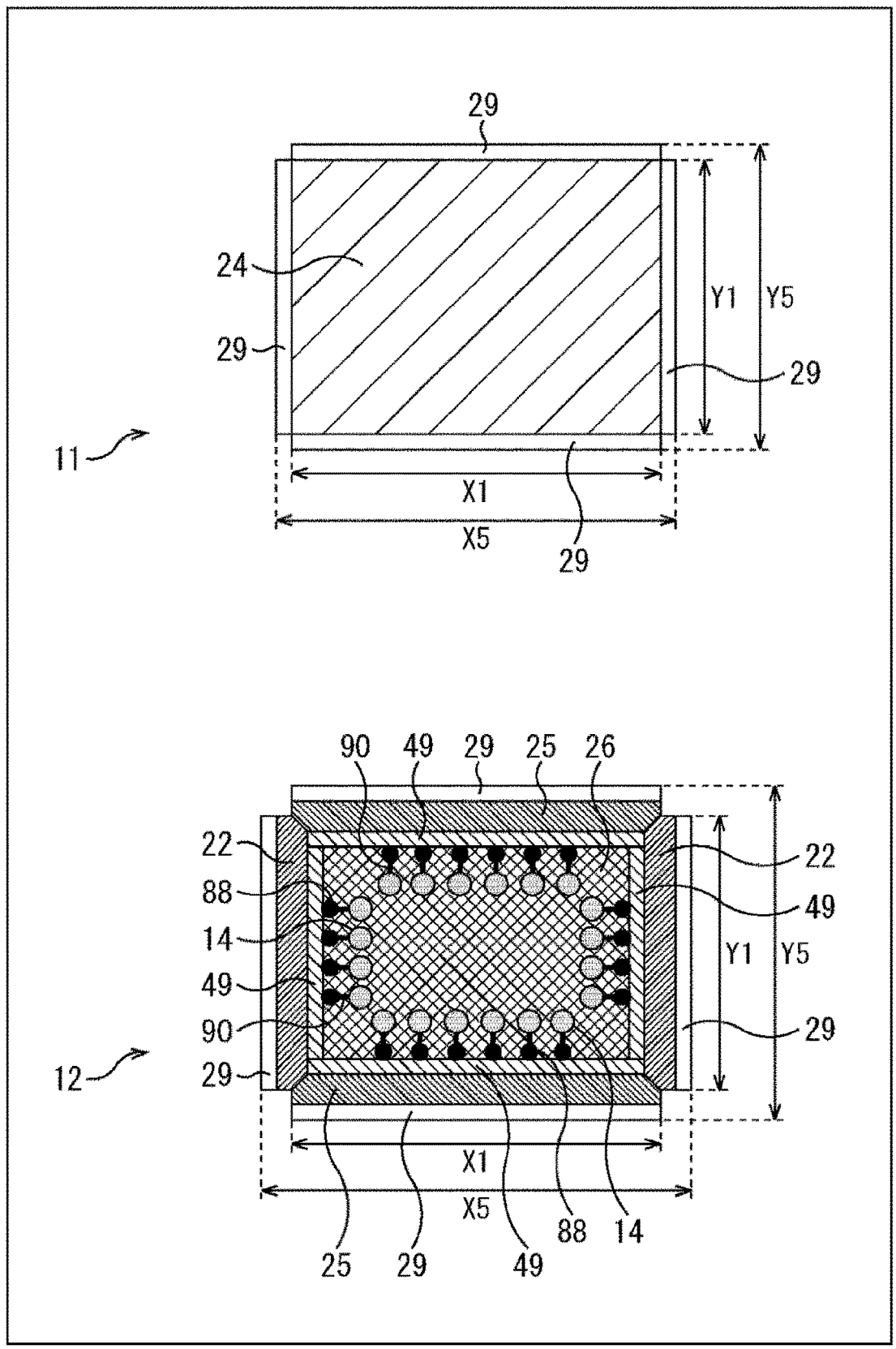
FIG. 18 is a diagram showing an eighth circuit arrangement configuration example of the circuit arrangement in the solid-state imaging apparatus.

FIG. 18 is a diagram showing an eighth circuit arrangement configuration example which is another circuit arrangement configuration example of the solid-state imaging apparatus 1 and a modification of the seventh circuit arrangement configuration example.

In the seventh circuit arrangement configuration example shown in FIG. 17, the row driving unit 22 was also arranged at the upper structure body 11 although the area thereof was smaller than that of the row driving unit 22 arranged at the lower structure body 12. Similarly, the column signal processing unit 25 was also arranged at the upper structure body 11 although the area thereof was smaller than that of the column signal processing unit 25 arranged at the lower structure body 12.

On the other hand, in the eighth circuit arrangement configuration example in FIG. 18, the row driving unit 22 and the column signal processing unit 25 are arranged only at the lower structure body 12. The signal outputted to the pixel array unit 24 from the row driving unit 22 is transmitted to the pixel array unit 24 arranged at the upper structure body 11 from the row driving unit 22 arranged at the lower structure body 12 via the wiring connection unit 29 having the upper and lower wiring connection structure in the pixel peripheral circuit region 313 shown in FIG. 8. Similarly, the signal inputted to column signal processing unit 25 from the pixel array unit 24 is transmitted to the column signal processing unit 25 arranged at the lower structure body 12 from the pixel array unit 24 arranged at the upper structure body 11 via the wiring connection unit 29 having the upper and lower wiring connection structure in the pixel peripheral circuit region 313 shown in FIG. 8. With this arrangement, there is a possibility that the external size of the solid-state imaging apparatus 1 can be made smaller in the eighth circuit arrangement configuration example than the seventh circuit arrangement configuration example shown in FIG. 17 even if the sizes of the pixel array units 24 of the solid-state imaging apparatuses 1 are the same.

Note that the arrangement examples of the row driving unit 22 and the column signal processing unit 25 shown in the eighth circuit arrangement configuration example can also be applied to other configuration examples of the present technology.

Ninth Circuit Arrangement Configuration Example

Figure 19:
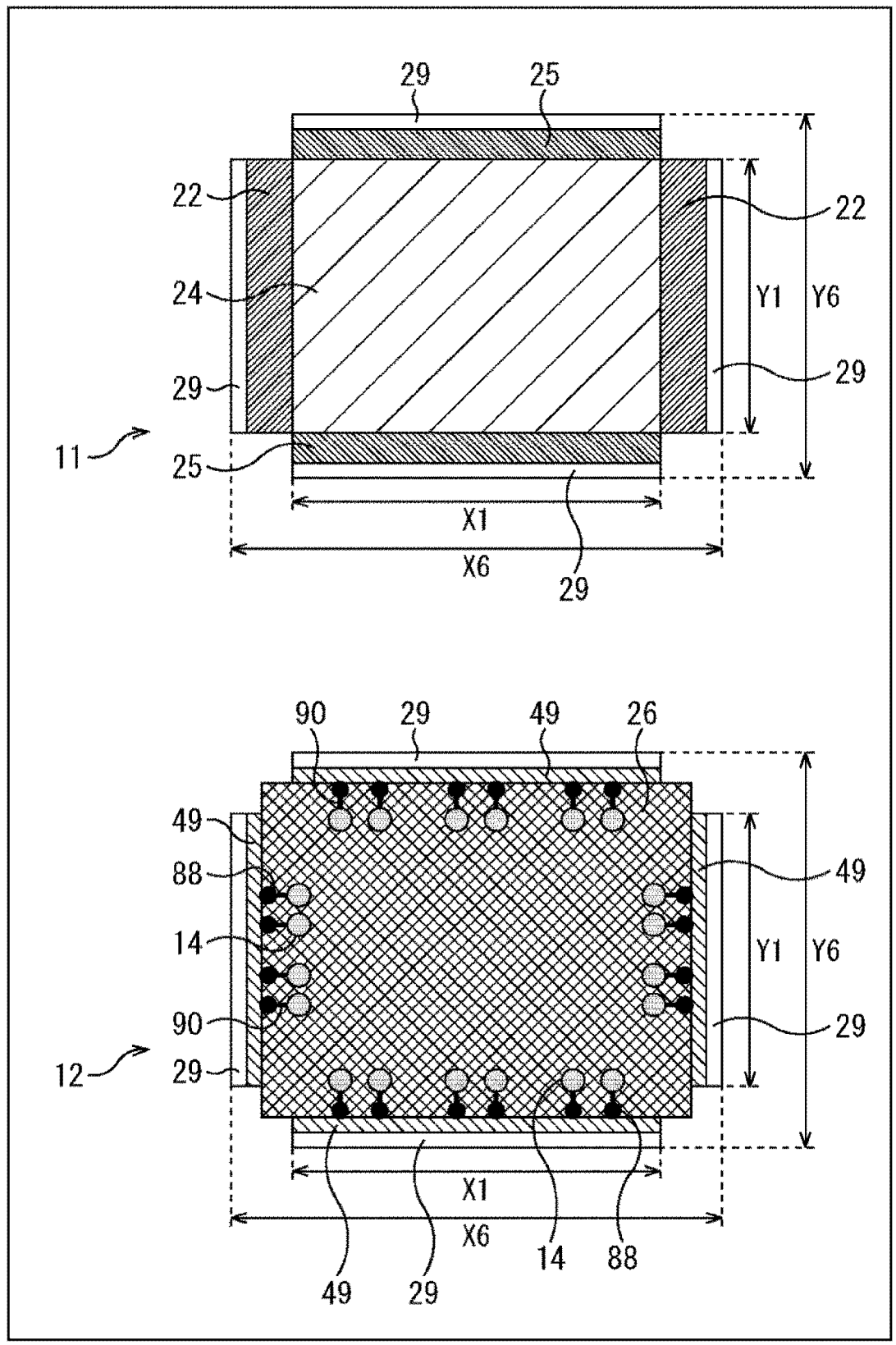
FIG. 19 is a diagram showing a ninth circuit arrangement configuration example of the circuit arrangement in the solid-state imaging apparatus.

FIG. 19 is a diagram showing a ninth circuit arrangement configuration example which is another circuit arrangement configuration example of the solid-state imaging apparatus 1 and a modification of the fifth circuit arrangement configuration example.

In the ninth circuit arrangement configuration example shown in FIG. 19, the row driving unit 22 and the column signal processing unit 25 are all arranged at the upper structure body 11. Then, at the lower structure body 12, in regions on the lower sides of the row driving unit 22 and the column signal processing unit 25 arranged at the upper structure body 11, the image signal processing unit 26 is arranged to extend in the outer peripheral direction as compared with the fifth circuit arrangement configuration example shown in FIG. 15. Moreover, the input/output circuit units 49 may be arranged in the regions positioned on the lower sides of the row driving unit 22 and the column signal processing unit 25 arranged at the upper structure body 11. With this arrangement, there is a possibility that the area of the image signal processing unit 26 can be enlarged to mount more circuits to the image signal processing unit 26 in the ninth circuit arrangement configuration example as compared with the fifth circuit arrangement configuration example shown in FIG. 15 even if the sizes of the pixel array units 24 of the solid-state imaging apparatuses 1 are the same.

Note that the arrangement examples of the row driving unit 22 and the column signal processing unit 25 shown in the ninth circuit arrangement configuration example can also be applied to other configuration examples of the present technology.

Tenth Circuit Arrangement Configuration Example

Figure 20:
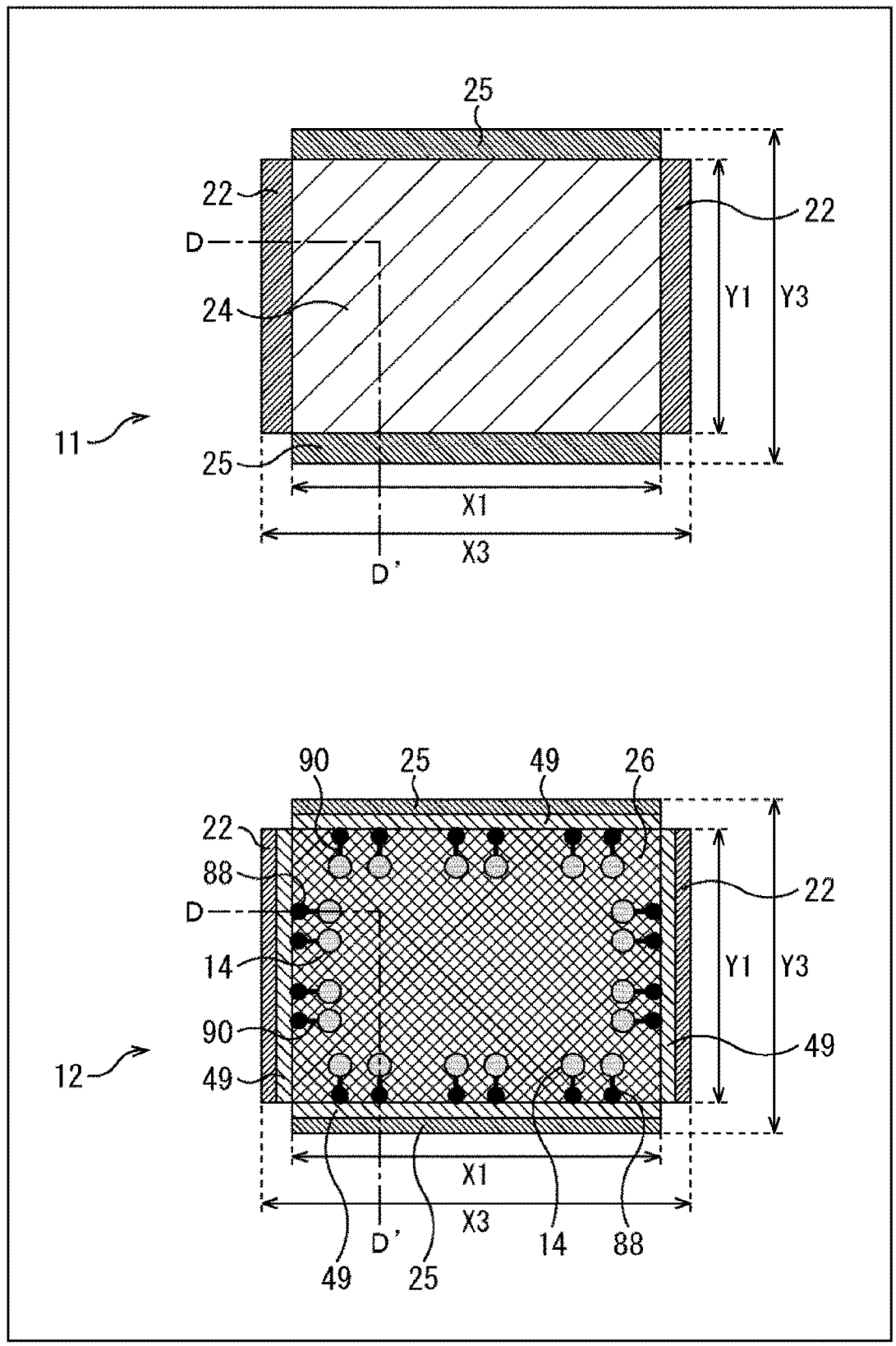
FIG. 20 is a diagram showing a tenth circuit arrangement configuration example of the circuit arrangement in the solid-state imaging apparatus.

FIG. 20 is a diagram showing a tenth circuit arrangement configuration example which is another circuit arrangement configuration example of the solid-state imaging apparatus 1 and a modification of the second circuit arrangement configuration example.

Figure 21:
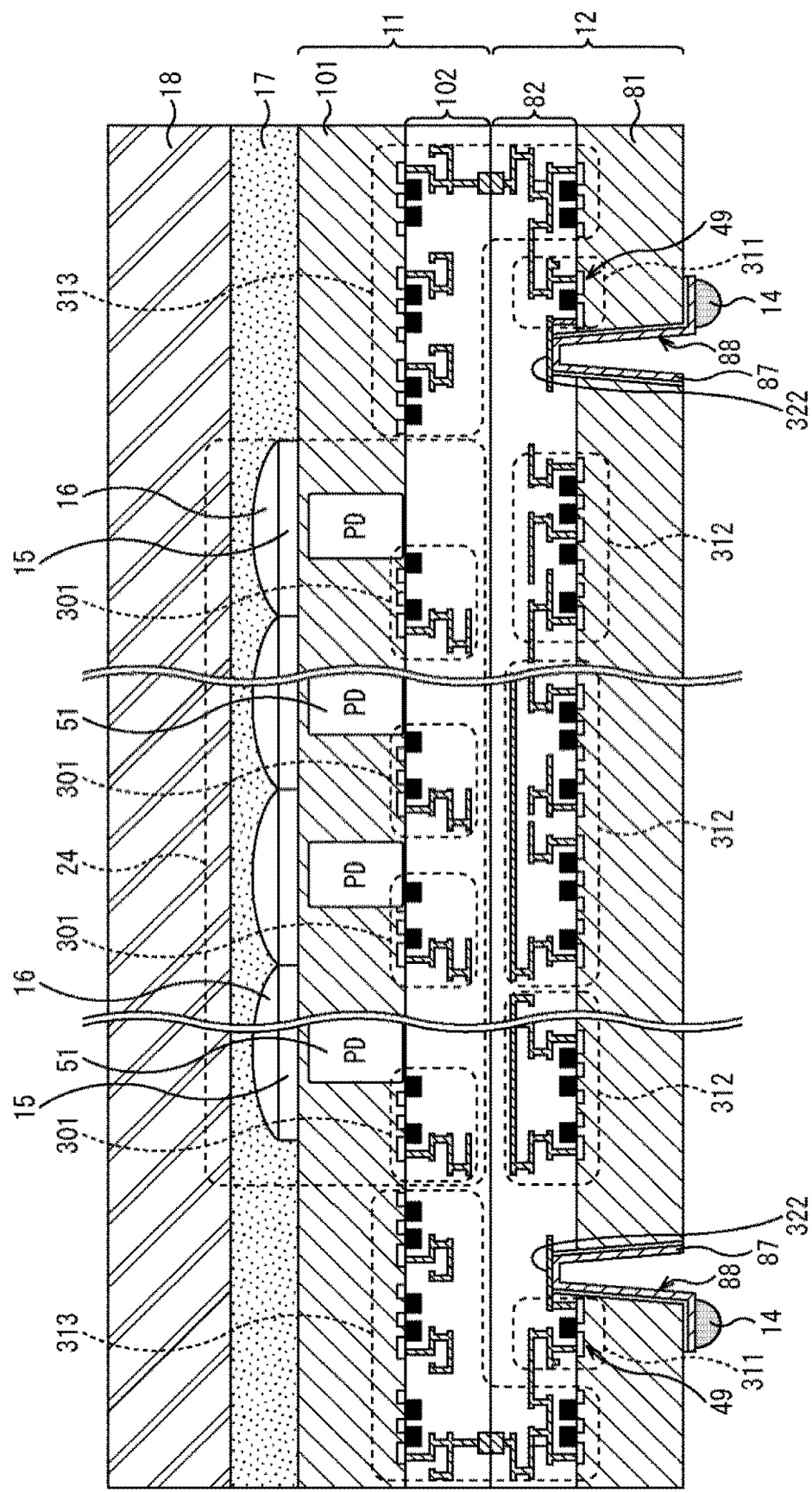
FIG. 21 is a view showing the cross-sectional structure along the line D-D' in FIG. 20.

FIG. 21 is a view showing the cross-sectional structure of the solid-state imaging apparatus 1 along the line D-D' in FIG. 20. Note that, for convenience, a part of FIG. 21 is described with a replacement with the cross-sectional structure in another configuration example of the present technology described later.

In the tenth circuit arrangement configuration example shown in FIGS. 20 and 21, similarly to the second circuit arrangement configuration example shown in FIGS. 7 and 8, the upper and lower wiring direct connection structure can be arranged inside the pixel peripheral circuit region 313 included in the upper structure body 11 and inside the pixel peripheral circuit region 313 included in the lower structure body 12.

Moreover, in the tenth circuit arrangement configuration example shown in FIGS. 20 and 21, all of the input/output circuit units 49, in other words, the input circuit units 42 and the output circuit units 47 are arranged outside the region where the image signal processing unit 26 of the lower structure body 12 is arranged. These regions where the input/output circuit units 49 are arranged may be on the lower sides of the row driving unit 22 and the column signal processing unit 25 included in the upper structure body 11 or may be on the lower side of the pixel array unit 24 included in the upper structure body 11.

Note that the regions where the input/output circuit units 49 are arranged do not need to be arranged, for example, without any discontinuity over the entire row direction of the column signal processing unit 25, and there may be a region, where the input/output circuit unit 49 is not arranged, between the column signal processing unit 25 and the image signal processing unit 26.

Furthermore, the regions where the input/output circuit units 49 are arranged do not need to be arranged without any discontinuity over the entire column direction of the row driving unit 22, and there may be a region, where the input/output circuit unit 49 is not arranged, between the row driving unit 22 and the image signal processing unit 26. By the tenth circuit arrangement configuration example, there is a possibility that more circuits can be mounted, for example, to the image signal processing unit 26 in the lower structure body 12 even if the external size of the solid-state imaging apparatus 1 is the same as that of the solid-state imaging apparatuses 1 in the second circuit arrangement configuration example shown in FIG. 7.

Note that the arrangement examples of the circuits shown in the tenth circuit arrangement configuration example can also be applied to other configuration examples of the present technology.

Eleventh Circuit Arrangement Configuration Example

Figure 22:
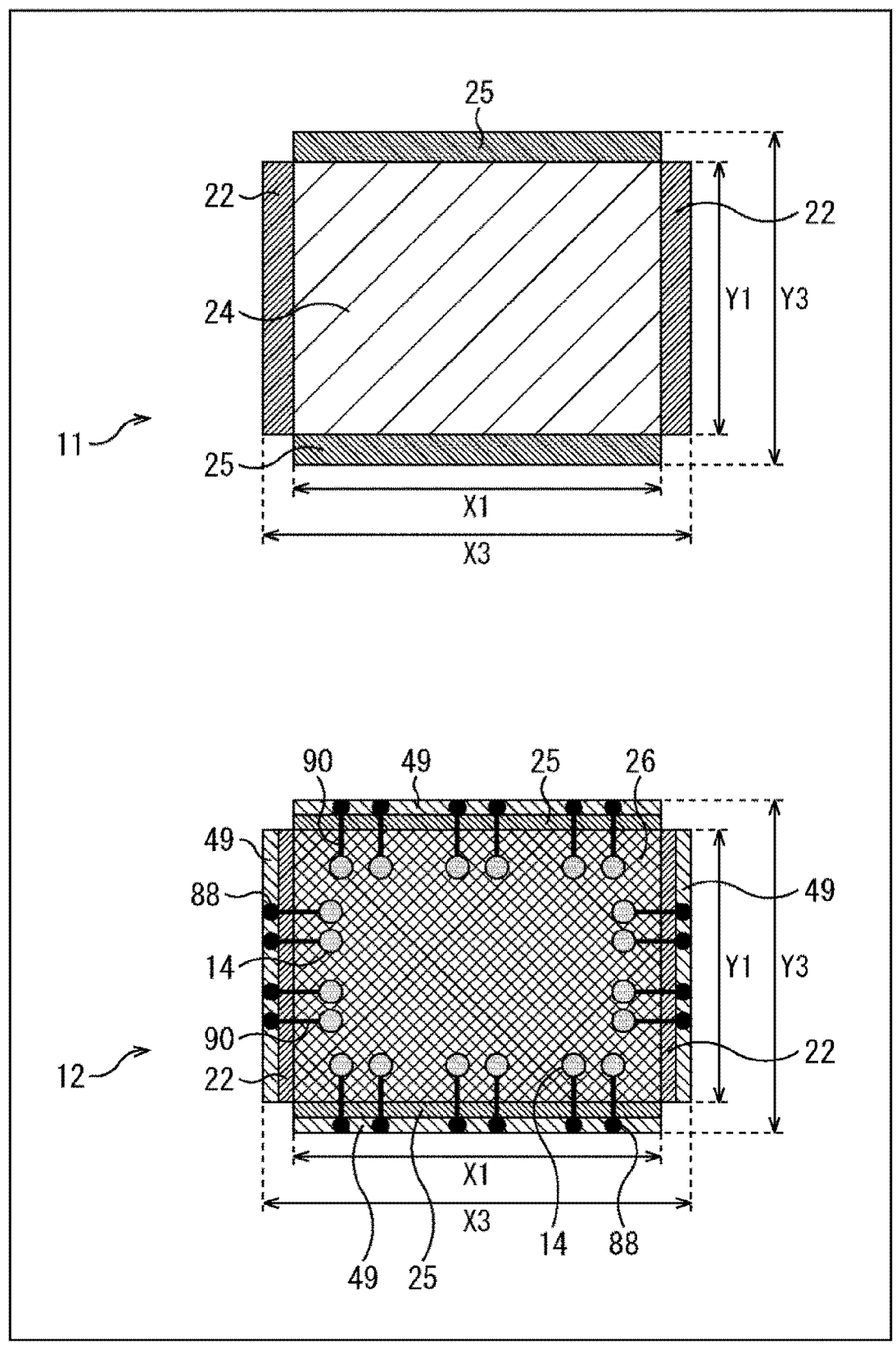
FIG. 22 is a diagram showing an eleventh circuit arrangement configuration example of the circuit arrangement in the solid-state imaging apparatus.

FIG. 22 is a diagram showing an eleventh circuit arrangement configuration example which is another circuit arrangement configuration example of the solid-state imaging apparatus 1 and a modification of the tenth circuit arrangement configuration example.

In the tenth circuit arrangement configuration example shown in FIG. 20, a part of the row driving unit 22 and a part of the column signal processing unit 25 were arranged at both the upper structure body 11 and the lower structure body 12. Then, in the lower structure body 12, the input/output circuit units 49 were arranged in the regions on the lower side of the row driving unit 22 arranged at the upper structure body 11 and further inner side of the apparatus than the row driving unit 22 arranged at the lower structure body 12. Similarly, in the lower structure body 12, the input/output circuit units 49 were arranged in the regions on the lower side of the column signal processing unit 25 arranged at the upper structure body 11 and further inner side of the apparatus than the column signal processing unit 25 arranged at the lower structure body 12.

In the eleventh circuit arrangement configuration example shown in FIG. 22, a part of the row driving unit 22 and a part of the column signal processing unit 25 are arranged at both the upper structure body 11 and the lower structure body 12. Then, in the lower structure body 12, the input/output circuit units 49 are arranged in the regions on the lower side of the row driving unit 22 arranged at the upper structure body 11 and further outer side of the apparatus than the row driving unit 22 arranged at the lower structure body 12. Similarly, in the lower structure body 12, the input/output circuit units 49 are arranged in the regions on the lower side of the column signal processing unit 25 arranged at the upper structure body 11 and further outer side of the apparatus than the column signal processing unit 25 arranged at the lower structure body 12.

With this arrangement, compared with the tenth circuit arrangement configuration example shown in FIG. 20, for example, in the lower structure body 12, there is a possibility that the arrangements of the signal lines between the image signal processing unit 26 and the row driving unit 22 arranged at the lower structure body 12 and the signal lines between the image signal processing unit 26 and the column signal processing unit 25 are facilitated or these signal lines can be arranged with high density.

Note that the arrangement examples of the circuits shown in the eleventh circuit arrangement configuration example can also be applied to other configuration examples of the present technology.

10. Detailed Structure of Solid-State Imaging Apparatus

Figure 23:
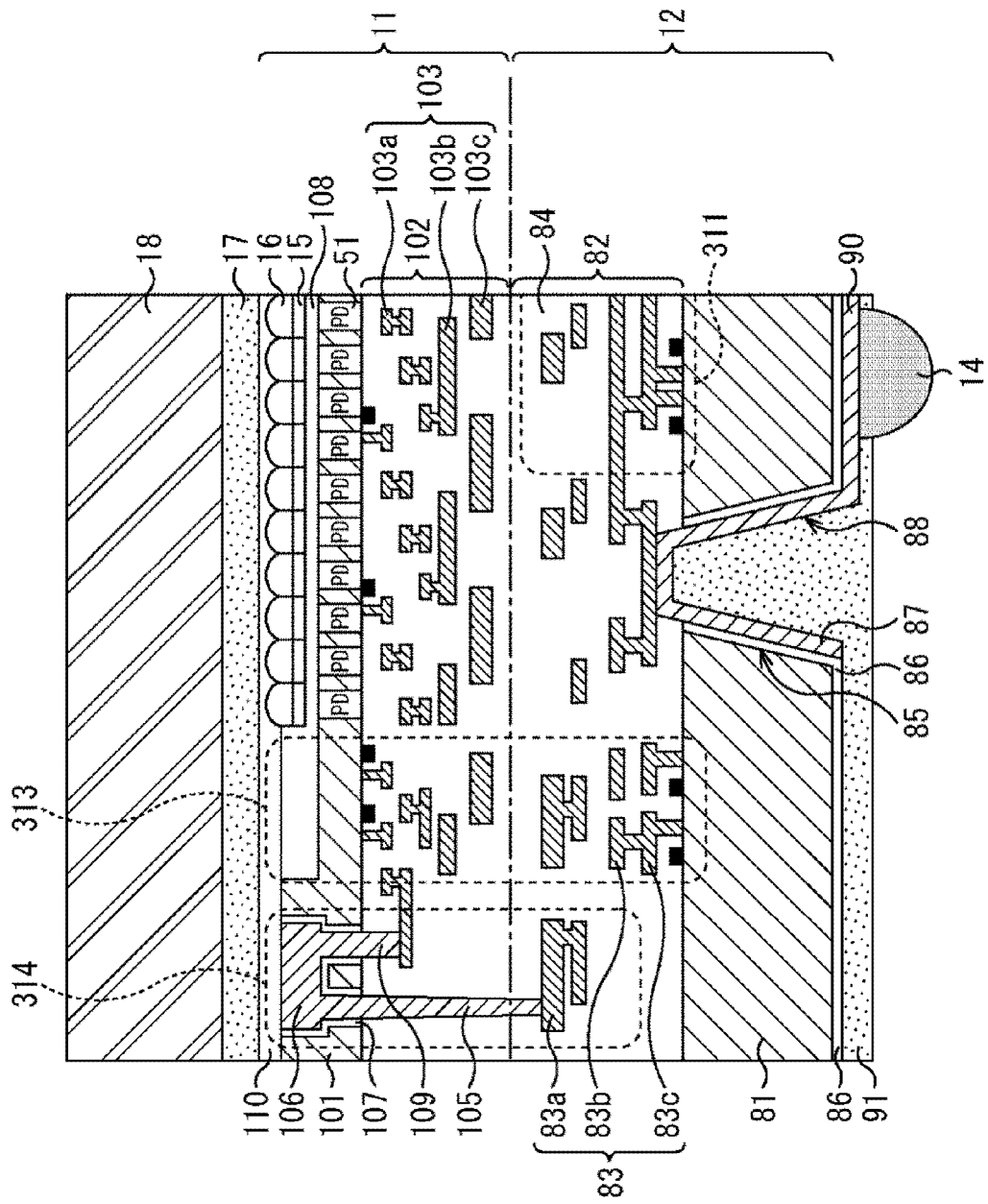
FIG. 23 is an enlarged cross-sectional view of the vicinity of the outer periphery of the solid-state imaging apparatus 1.

Next, the detailed structure of the solid-state imaging apparatus 1 will be described with reference to FIG. 23. FIG. 23 is an enlarged cross-sectional view of the vicinity of the outer periphery of the solid-state imaging apparatus 1 with the twin-contact structure.

In the lower structure body 12, the multilayered wiring layer 82 is formed on the upper side (the upper structure body 11 side) of the semiconductor substrate 81 including, for example, silicon (Si). This multilayered wiring layer 82 forms the input/output circuit region 311, the signal processing circuit region 312 (not shown in FIG. 23), the pixel peripheral circuit region 313, and the like shown in FIG. 6.

The multilayered wiring layer 82 is configured with the plurality of wiring layers 83, which include an uppermost wiring layer 83a closest to the upper structure body 11, an intermediate wiring layer 83b, a lowermost wiring layer 83c closest to the semiconductor substrate 81, and the like, and an interlayer insulating film 84 formed between the respective wiring layers 83.

The plurality of wiring layers 83 are formed by using, for example, copper (Cu), aluminum (Al), tungsten (W), or the like, and the interlayer insulating film 84 is formed by, for example, a silicon oxide film, a silicon nitride film, or the like. Each of the plurality of wiring layers 83 and the interlayer insulating film 84 may include the same material for all layers, or two or more materials may be used separately depending on the layers.

A silicon through hole 85 penetrating the semiconductor substrate 81 is formed at a predetermined position at the semiconductor substrate 81, and a connection conductor 87 is embedded in the inner wall of the silicon through hole 85 with an insulating film 86 interposed therebetween, thereby forming the through via (through silicon via (TSV)) 88. The insulating film 86 can be formed by, for example, a SiO2 film, a SiN film, or the like. In the first embodiment, the through via 88 has a reversely tapered shape in which the plane area of the wiring layer 83 side is smaller than that of the external terminal 14 side, but on the contrary, may have a forwardly tapered shape in which the plane area of the external terminal 14 side is smaller, or may have a non-tapered shape in which the areas of the external terminal 14 side and the wiring layer 83 side are substantially the same.

The connection conductor 87 of the through via 88 is connected to a rewiring 90 formed on the lower face side of the semiconductor substrate 81, and the rewiring 90 is connected to the external terminal 14. The connection conductor 87 and the rewiring 90 can include, for example, copper (Cu), tungsten (W), titanium (Ti), tantalum (Ta), titanium tungsten alloy (TiW), polysilicon, or the like.

Moreover, a solder mask (solder resist) 91 is formed on the lower face side of the semiconductor substrate 81 so as to cover the rewiring 90 and the insulating film 86 except for the region where the external terminal 14 is formed.

On the other hand, in the upper structure body 11, the multilayered wiring layer 102 is formed on the lower side (the lower structure body 12 side) of the semiconductor substrate 101 including, for example, silicon (Si). This multilayered wiring layer 102 forms the circuit of the pixel 31 shown in FIG. 3.

The multilayered wiring layer 102 is configured with the plurality of wiring layers 103, which include an uppermost wiring layer 103a closest to the semiconductor substrate 101, an intermediate wiring layer 103b, a lowermost wiring layer 103c closest to the lower structure body 12, and the like, and an interlayer insulating film 104 formed between the respective wiring layers 103.

For a material used as the plurality of wiring layers 103 and the interlayer insulating film 104, the same material as the wiring layers 83 and the interlayer insulating film 84 described above can be adopted. Moreover, the plurality of wiring layers 103 and the interlayer insulating film 104 are similar to the wiring layers 83 and the interlayer insulating film 84 described above in that the wiring layers 103 and the interlayer insulating film 104 may include one material or two or more materials separately.

Note that the multilayered wiring layer 102 of the upper structure body 11 is configured with five wiring layers 103 and the multilayered wiring layer 82 of the lower structure body 12 is configured with four wiring layers 83 in the example in FIG. 23, but the total number of wiring layers is not limited thereto, and the wiring layers can be formed by any number of layers.

In the semiconductor substrate 101, the photodiode 51 formed by a PN junction is formed for each pixel 31.

Furthermore, although detailed illustration is omitted, the plurality of pixel transistors such as the transfer transistor 52, the amplifier transistor 55, and the like, and the FD 53 are also formed in the multilayered wiring layer 102 and the semiconductor substrate 101.

At a predetermined position of the semiconductor substrate 101 where the color filters 15 and the on-chip lenses 16 are not formed, the silicon through electrode 109, which is connected to the predetermined wiring layer 103 of the upper structure body 11, and the chip through electrode 105, which is connected to the predetermined wiring layer 83 of the lower structure body 12, are formed.

The chip through electrode 105 and the silicon through electrode 109 are connected by the connection wiring 106 formed on the upper face of the semiconductor substrate 101. Further, the insulating films 107 are formed between each of the silicon through electrode 109 and the chip through electrode 105 and the semiconductor substrate 101.

A planarized film 108 is formed between the photodiodes 51 and the color filters 15 of the semiconductor substrate 101, and a planarized film 110 is also formed between the on-chip lenses 16 and the sealing resin 17.

As described above, the laminated structure body 13 of the solid-state imaging apparatus 1 shown in FIG. 1 has a laminated structure in which the multilayered wiring layer 82 side of the lower structure body 12 and the multilayered wiring layer 102 side of the upper structure body 11 are affixed. In FIG. 23, the affixing face between the multilayered wiring layer 82 of the lower structure body 12 and the multilayered wiring layer 102 of the upper structure body 11 is indicated by an alternate long and short dash line.

Moreover, in the laminated structure body 13 of the solid-state imaging apparatus 1, the wiring layer 103 of the upper structure body 11 and the wiring layer 83 of the lower structure body 12 are connected by the two through electrodes, the silicon through electrode 109 and the chip through electrode 105, and the wiring layer 83 of the lower structure body 12 and the external terminal (back face electrode) 14 are connected by the through via 88 and the rewiring 90. With this arrangement, pixel signals generated by the pixels 31 of the upper structure body 11 are transmitted to the lower structure body 12, subjected to signal processing at the lower structure body 12, and outputted to the outside of the apparatus from the external terminals 14.

11. Method of Manufacturing First Embodiment

Manufacturing Method in Case of Twin-Contact Structure

Next, a method of manufacturing the solid-state imaging apparatus 1 with the twin-contact structure will be described with reference to FIGS. 24 to 38.

First, the lower structure body 12 and the upper structure body 11 in a wafer state are separately manufactured.

For the lower structure body 12, the multilayered wiring layer 82, which becomes a part of the input/output circuit unit 49 and the row driving unit 22 or the column signal processing unit 25, is formed in a region which becomes each chip portion of the semiconductor substrate (silicon substrate) 81. The semiconductor substrate 81 at this point is in a state before being thinned, and has a thickness of, for example, about 600 μm.

On the other hand, for the upper structure body 11, the photodiode 51 and the source/drain region of the pixel transistor of each pixel 31 are formed in a region which becomes a chip portion of the semiconductor substrate (silicon substrate) 101. Moreover, the multilayered wiring layer 102 constituting the row driving signal lines 32, the vertical signal lines 33, and the like is formed on one face of the semiconductor substrate 101. The semiconductor substrate 101 at this point is also in a state before being thinned, and has a thickness of, for example, about 600 μm.

Figure 24:
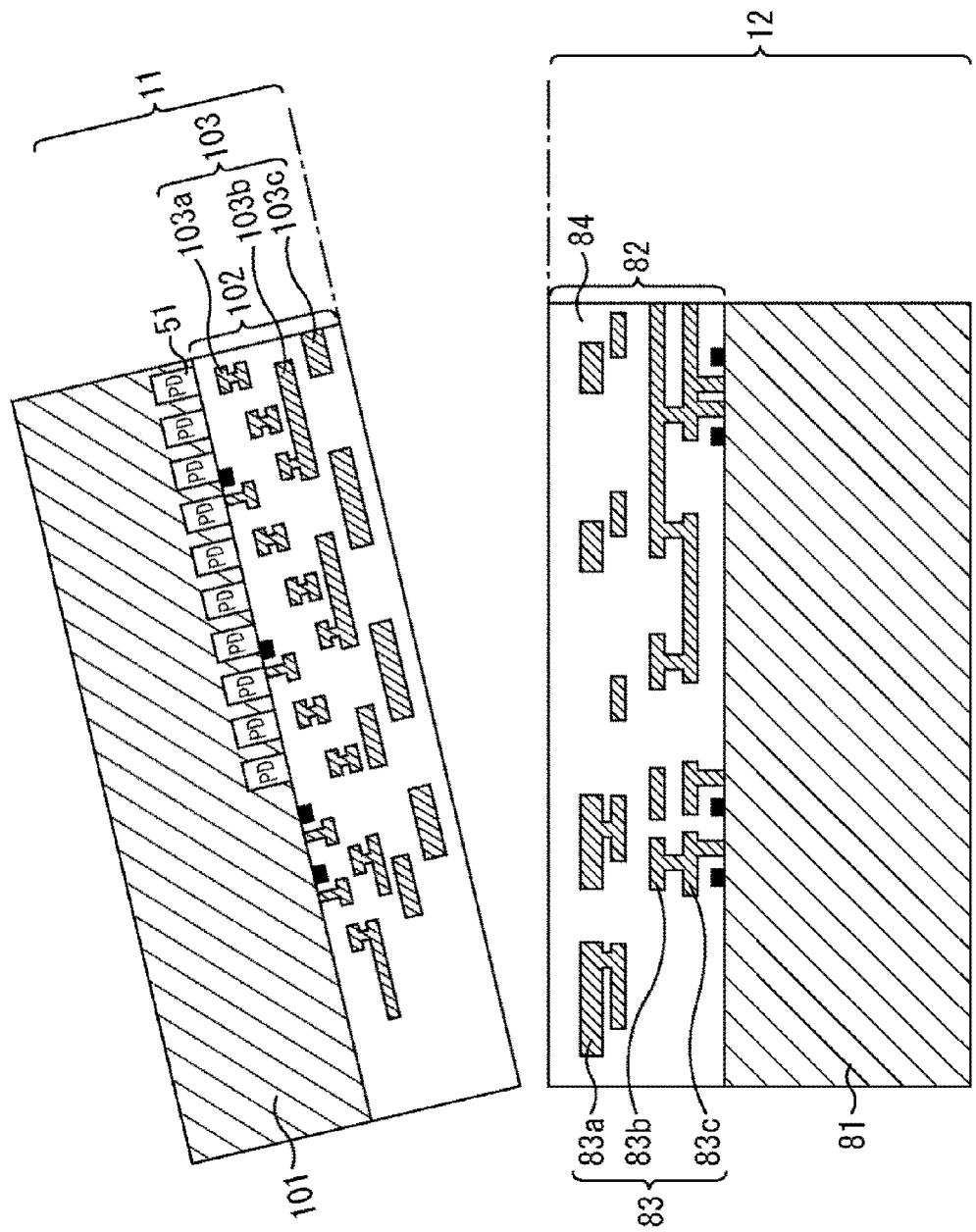
FIG. 24 is a diagram illustrating a method of manufacturing the solid-state imaging apparatus with the twin-contact structure.
Figure 25:
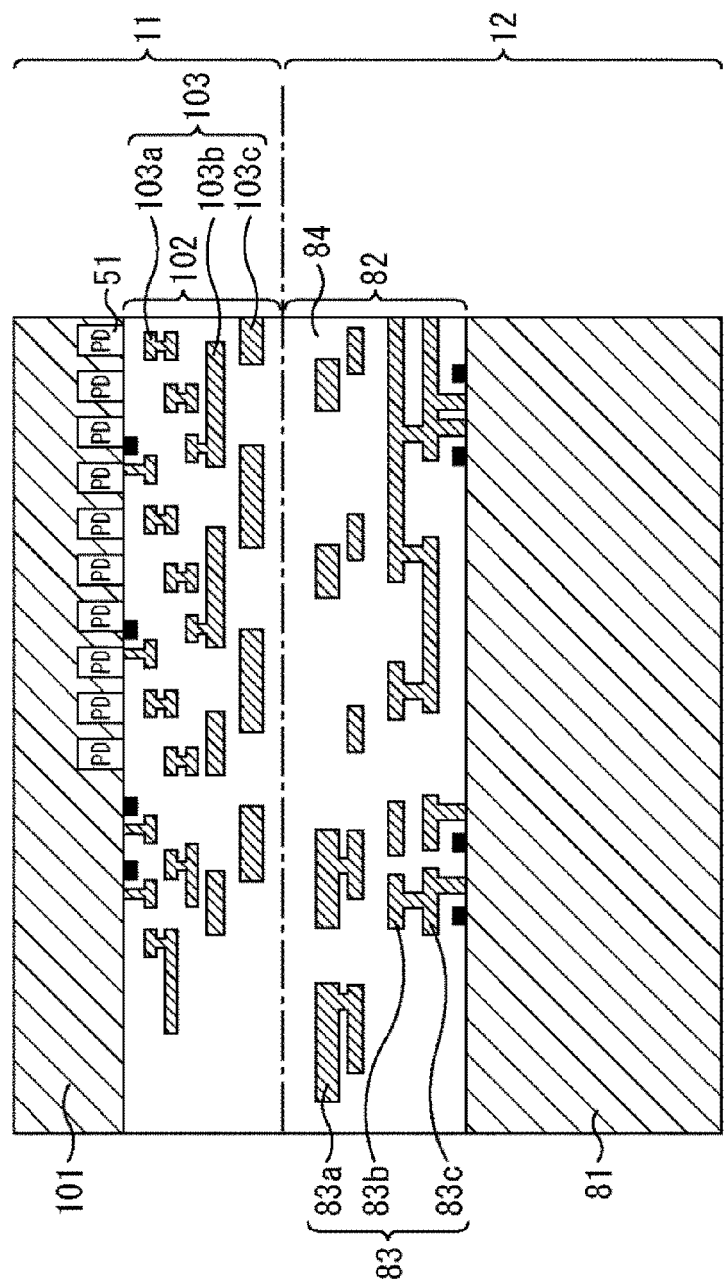
FIG. 25 is a diagram illustrating the method of manufacturing the solid-state imaging apparatus with the twin-contact structure.

Then, as shown in FIG. 24, the multilayered wiring layer 82 side of the lower structure body 12 and the multilayered wiring layer 102 side of the upper structure body 11 in the manufactured wafer state are affixed so as to face each other. Thereafter, as shown in FIG. 25, the semiconductor substrate 101 of the upper structure body 11 is thinned. The affixing is, for example, plasma bonding or bonding with an adhesive, but the affixing is performed by plasma bonding in the first embodiment. In the case of the plasma bonding, a film such as a plasma TEOS film, a plasma SiN film, a SiON film (block film), or a SiC film is formed on both the bonding faces of the upper structure body 11 and the lower structure body 12, and the bonding faces are superposed by plasma treatment and then subjected to annealing treatment so that both bonding faces are bonded.

Figure 26:
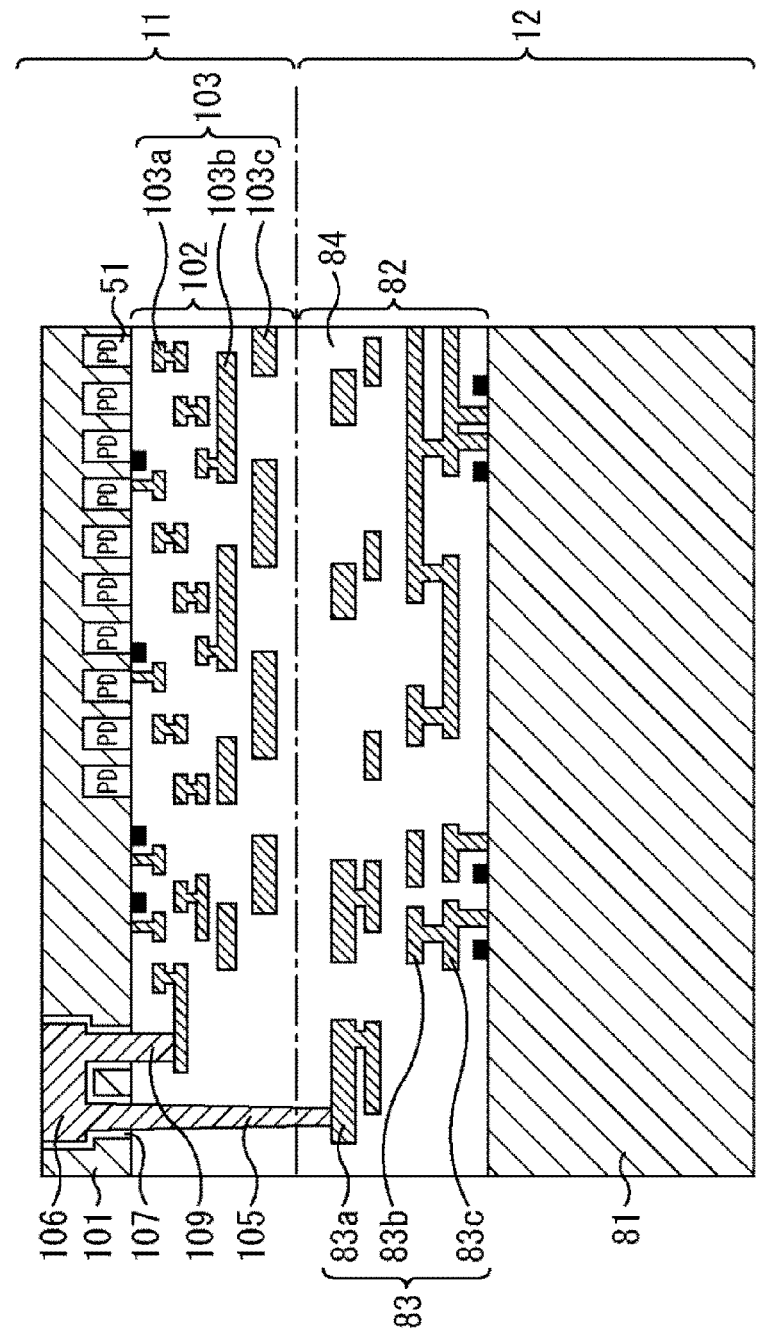
FIG. 26 is a diagram illustrating the method of manufacturing the solid-state imaging apparatus with the twin-contact structure.

After the semiconductor substrate 101 of the upper structure body 11 is thinned, the silicon through electrode 109, the chip through electrode 105, and the connection wiring 106 connecting therebetween are formed by using a damascene method or the like in the region to be the upper and lower wiring connection region 314 as shown in FIG. 26.

Figure 27:
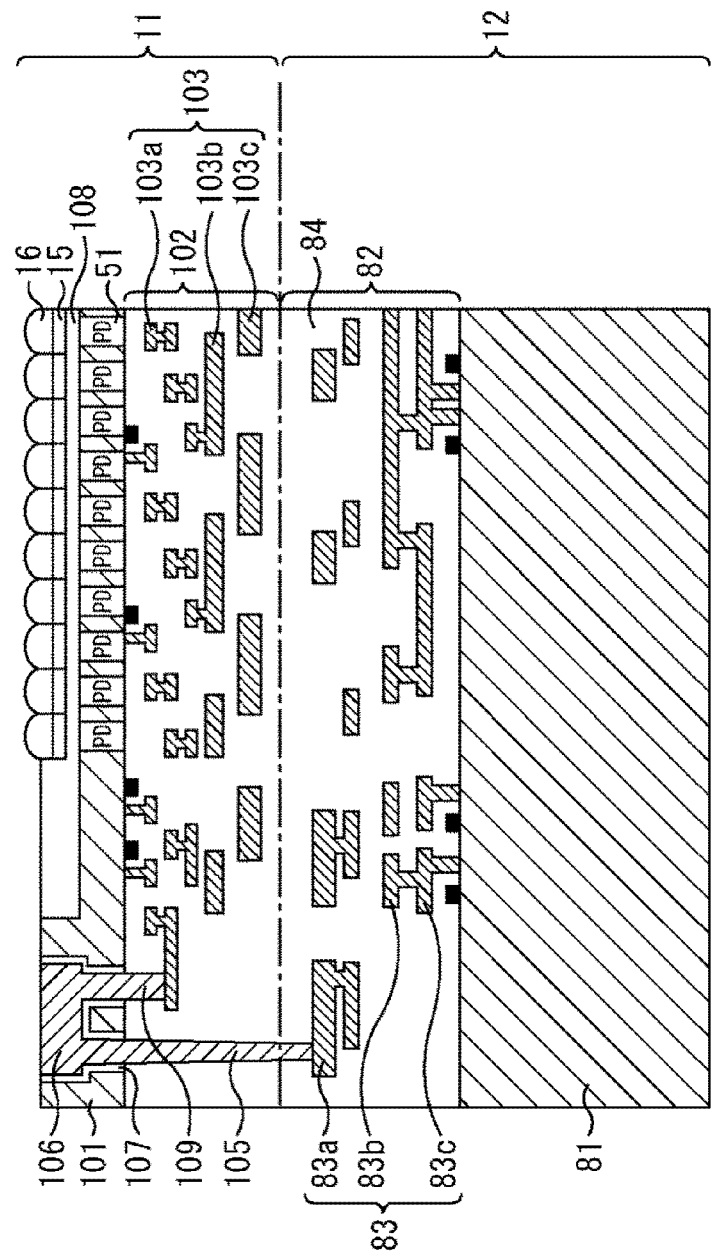
FIG. 27 is a diagram illustrating the method of manufacturing the solid-state imaging apparatus with the twin-contact structure.

Next, as shown in FIG. 27, the color filters 15 and the on-chip lenses 16 are formed above the photodiode 51 of each pixel 31 with the planarized film 108 interposed therebetween.

Figure 28:
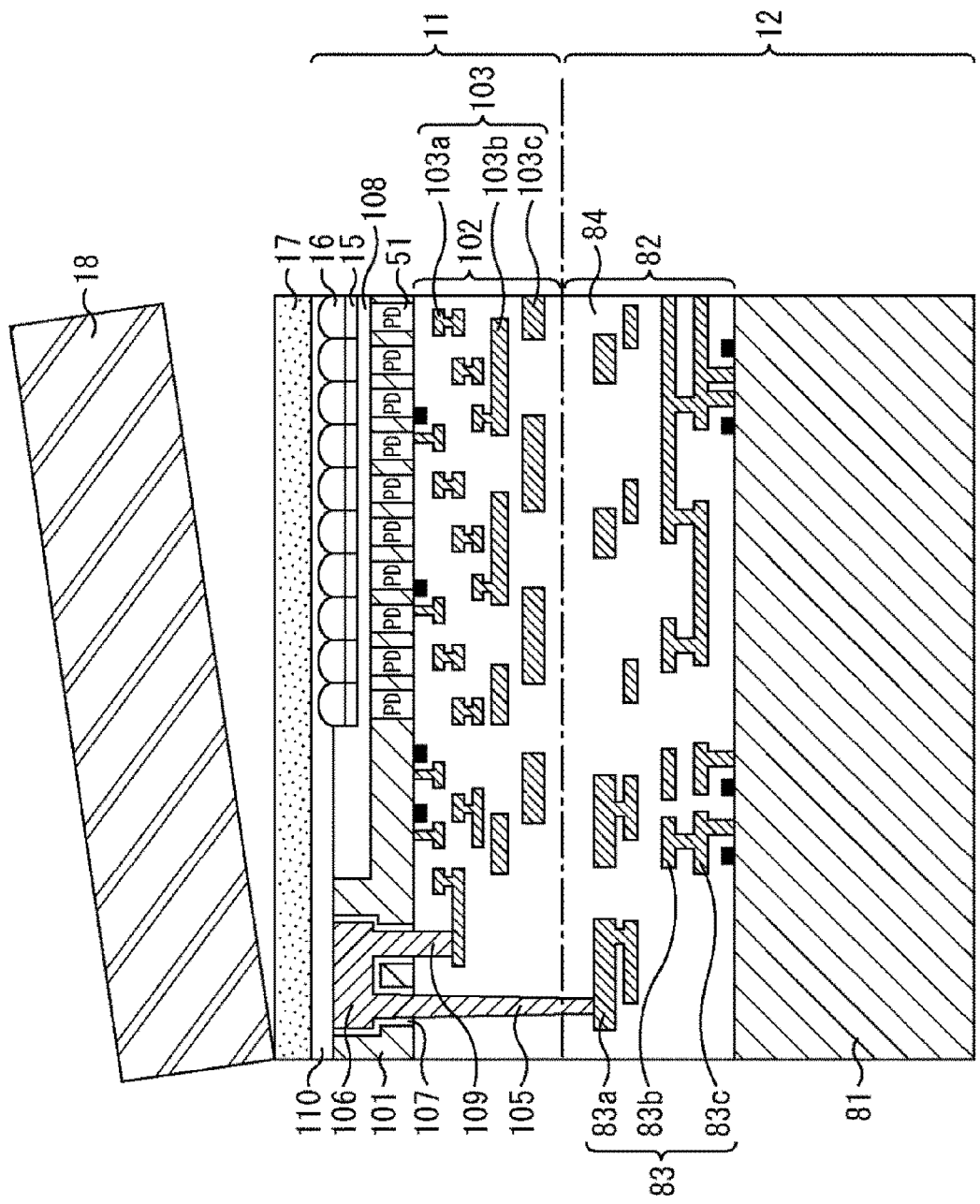
FIG. 28 is a diagram illustrating the method of manufacturing the solid-state imaging apparatus with the twin-contact structure.
Figure 29:
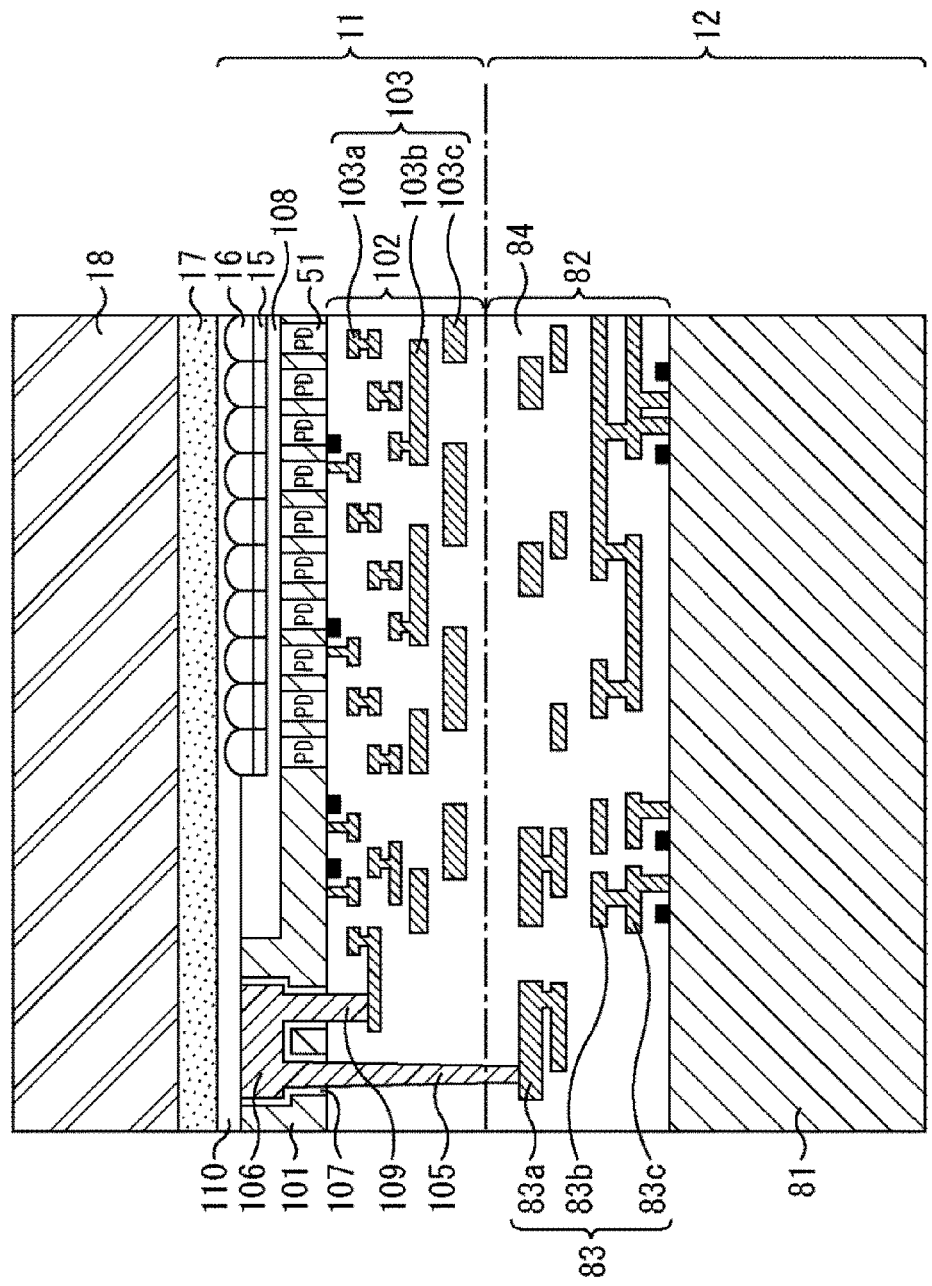
FIG. 29 is a diagram illustrating the method of manufacturing the solid-state imaging apparatus with the twin-contact structure.

Then, the entire face, on which the on-chip lenses 16 of the affixed upper structure body 11 and the lower structure body 12 are formed, is coated with the planarized film 110 and the sealing resin 17 as shown in FIG. 28, and the protective substrate 18 is connected with the cavityless structure as shown in FIG. 29.

Figure 30:
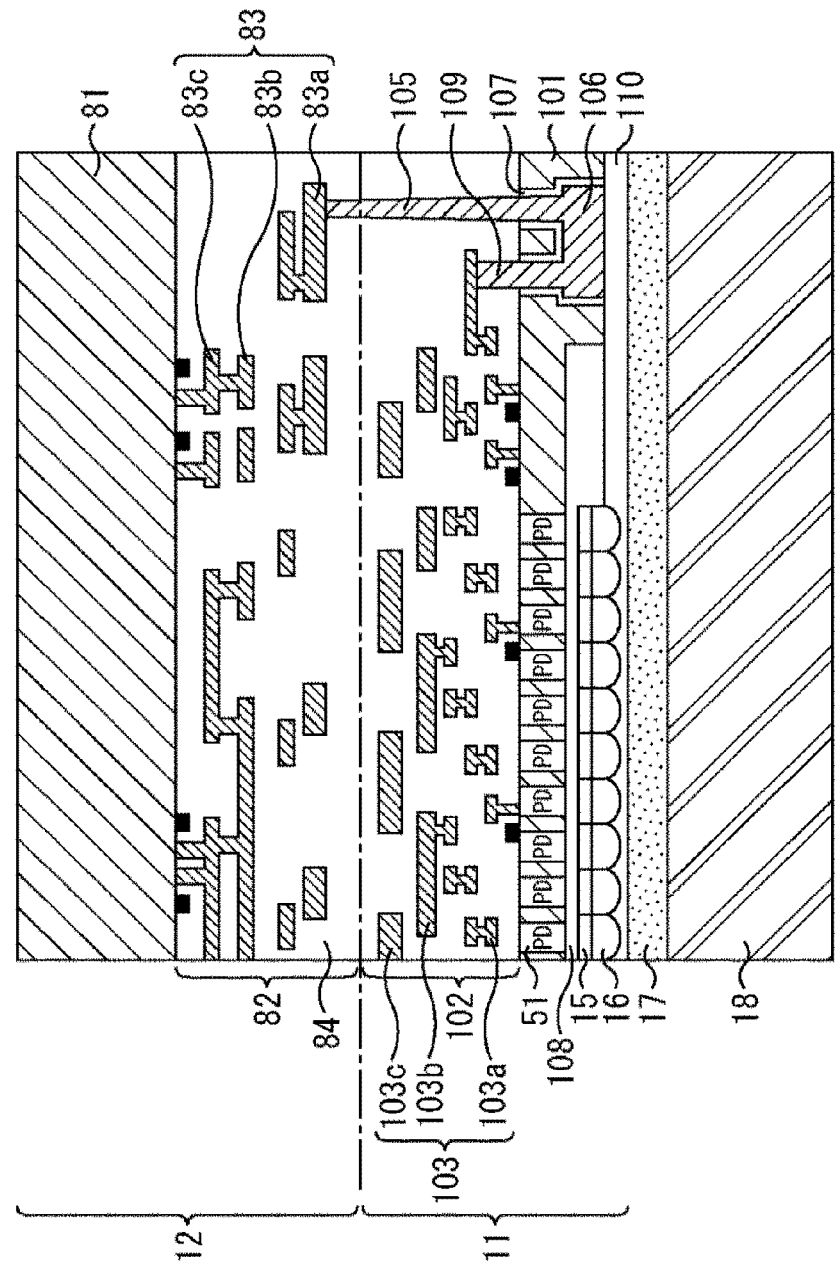
FIG. 30 is a diagram illustrating the method of manufacturing the solid-state imaging apparatus with the twin-contact structure.

Next, as shown in FIG. 30, after the entire affixed upper structure body 11 and lower structure body 12 is inverted, the semiconductor substrate 81 of the lower structure body 12 is thinned to a thickness which does not affect the device characteristics, for example, to about 30 to 100 μm.

Figure 31:
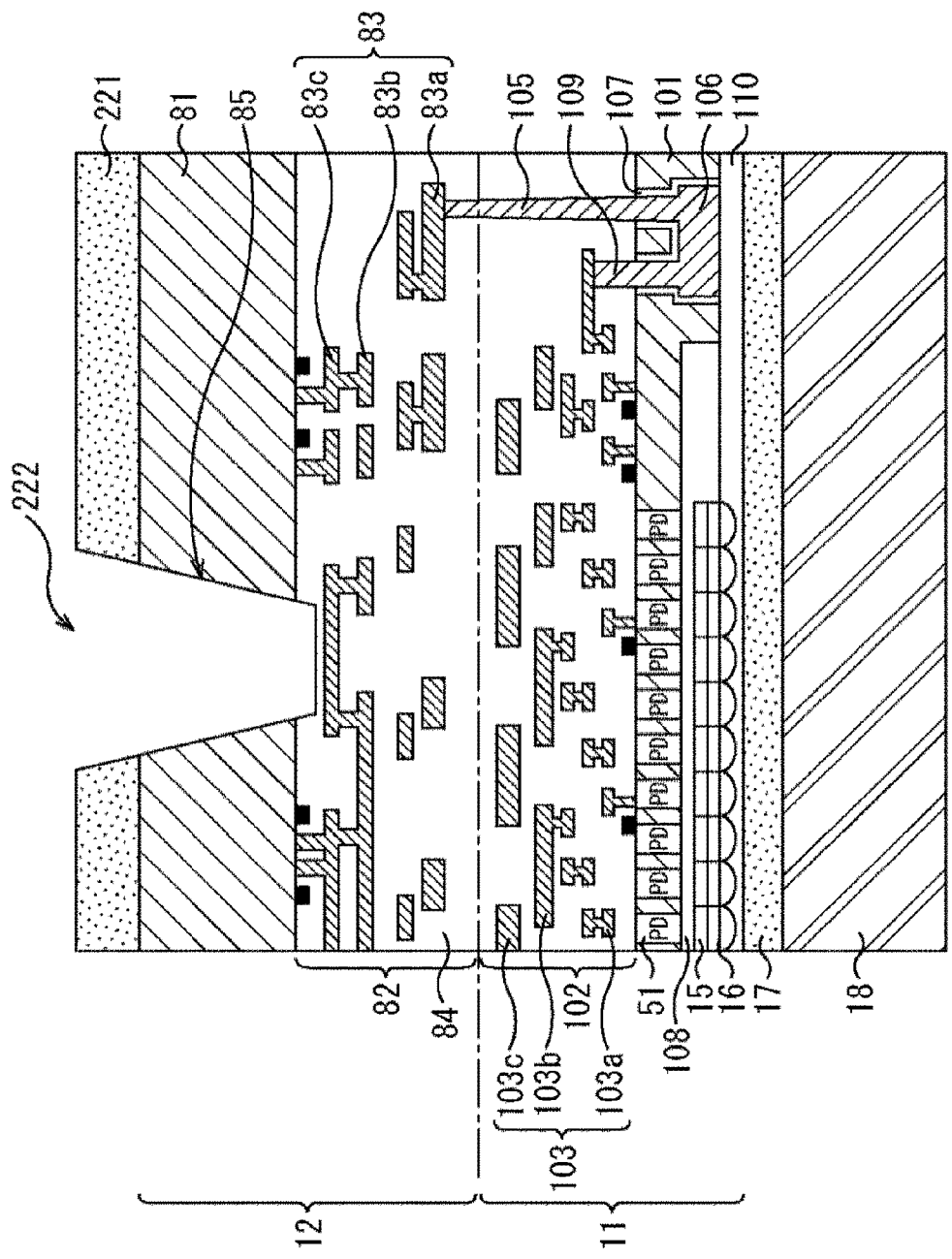
FIG. 31 is a diagram illustrating the method of manufacturing the solid-state imaging apparatus with the twin-contact structure.

Next, as shown in FIG. 31, after the photoresist 221 is patterned so as to open the position where the through via 88 (not shown) is arranged on the thinned semiconductor substrate 81, a part of the semiconductor substrate 81 and the underlying interlayer insulating film 84 are removed by dry etching, thereby forming an opening portion 222 including the silicon through hole 85.

Figure 32:
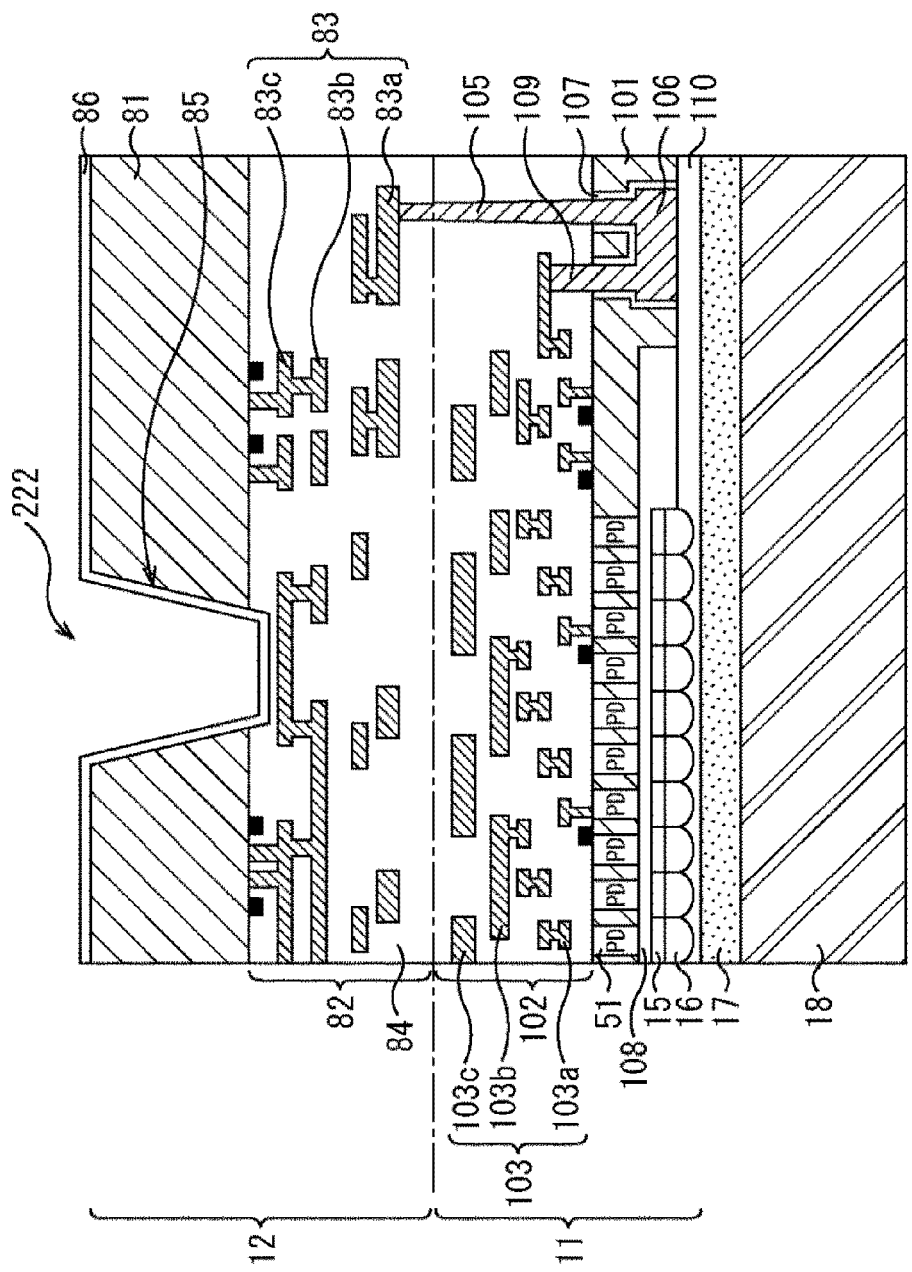
FIG. 32 is a diagram illustrating the method of manufacturing the solid-state imaging apparatus with the twin-contact structure.

Next, as shown in FIG. 32, the insulating film (isolation film) 86 is formed by, for example, a plasma CVD method on the entire upper face of the semiconductor substrate 81 including the opening portion 222. As described above, the insulating film 86 can be, for example, a SiO2 film, a SiN film, or the like.

Figure 33:
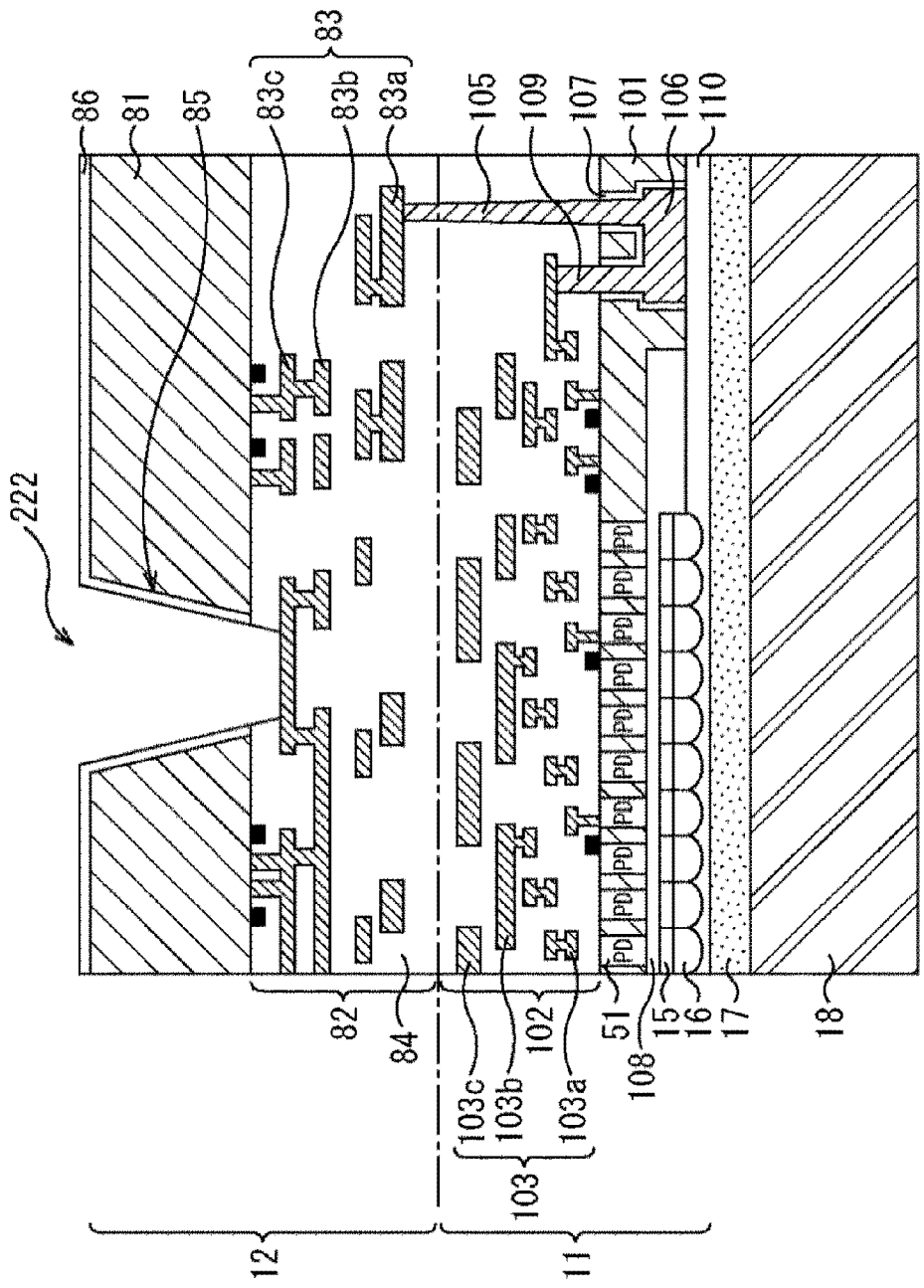
FIG. 33 is a diagram illustrating the method of manufacturing the solid-state imaging apparatus with the twin-contact structure.

Next, as shown in FIG. 33, the insulating film 86 on the bottom face of the opening portion 222 is removed by using an etch-back method, and the wiring layer 83c closest to the semiconductor substrate 81 is exposed.

Figure 34:
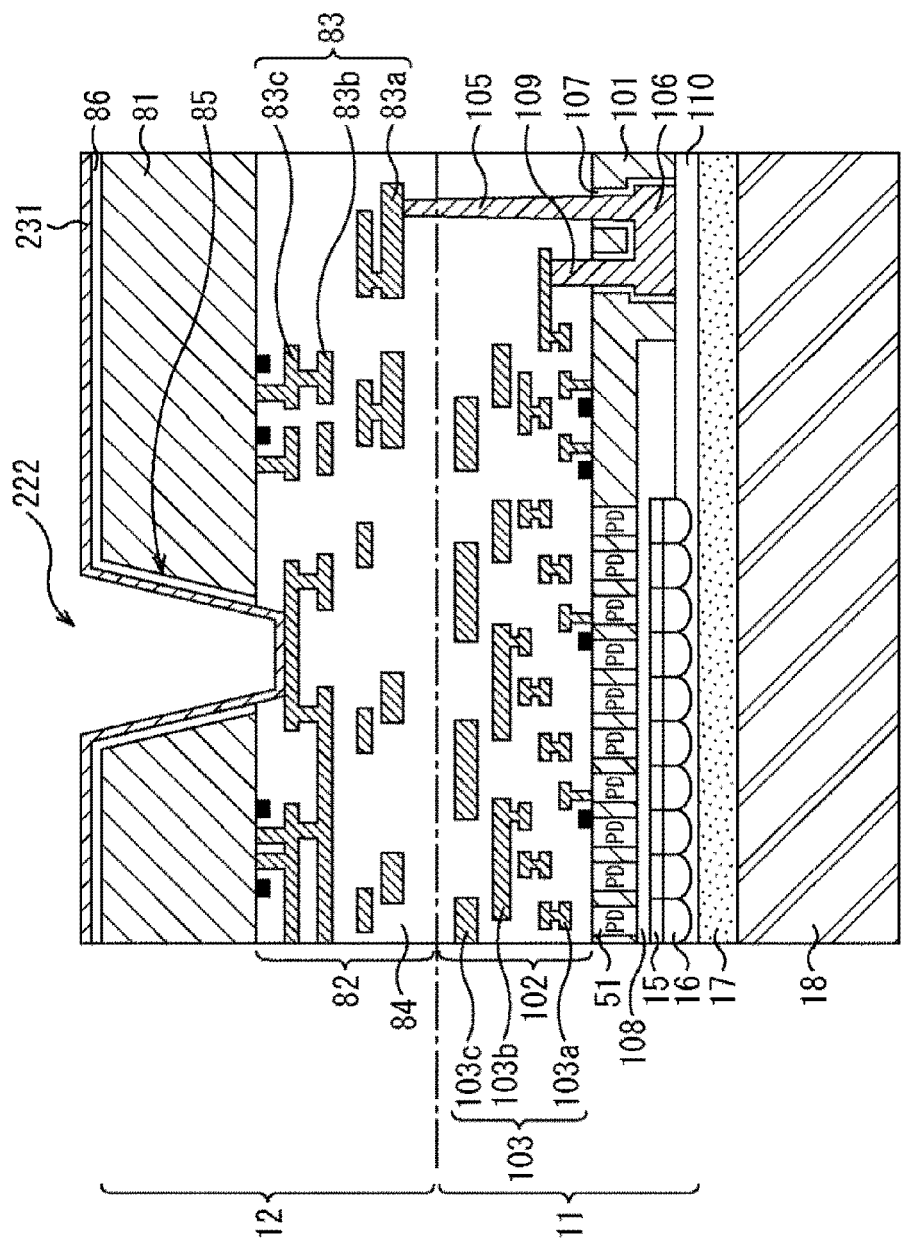
FIG. 34 is a diagram illustrating the method of manufacturing the solid-state imaging apparatus with the twin-contact structure.

Next, as shown in FIG. 34, a barrier metal film (not shown) and a Cu seed layer 231 are formed by using a sputtering method. The barrier metal film is a film for preventing the diffusion of the connection conductor 87 (Cu) shown in FIG. 35, and the Cu seed layer 231 serves as an electrode for embedding the connection conductor 87 by an electrolytic plating method. As a material of the barrier metal film, tantalum (Ta), titanium (Ti), tungsten (W), zirconium (Zr), a nitride film thereof, a carbonized film thereof, or the like can be used. In the first embodiment, titanium is used as the barrier metal film.

Figure 35:
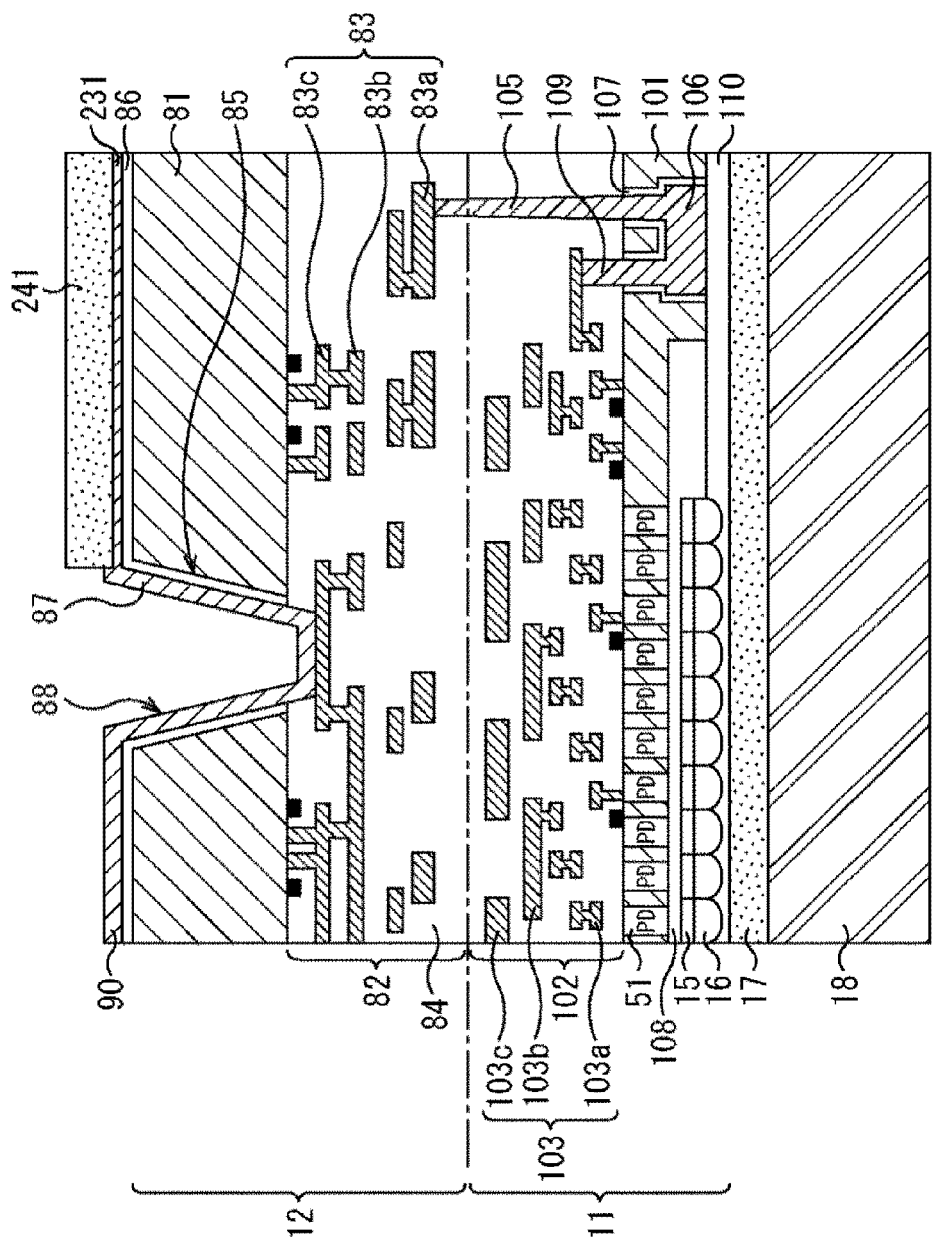
FIG. 35 is a diagram illustrating the method of manufacturing the solid-state imaging apparatus with the twin-contact structure.

Next, as shown in FIG. 35, after a resist pattern 241 is formed on a predetermined region on the Cu seed layer 231, copper (Cu) as the connection conductor 87 is used for plating by an electrolytic plating method. Thus, the through via 88 is formed, as well as the rewiring 90 is also formed on the upper side of the semiconductor substrate 81.

Figure 36:
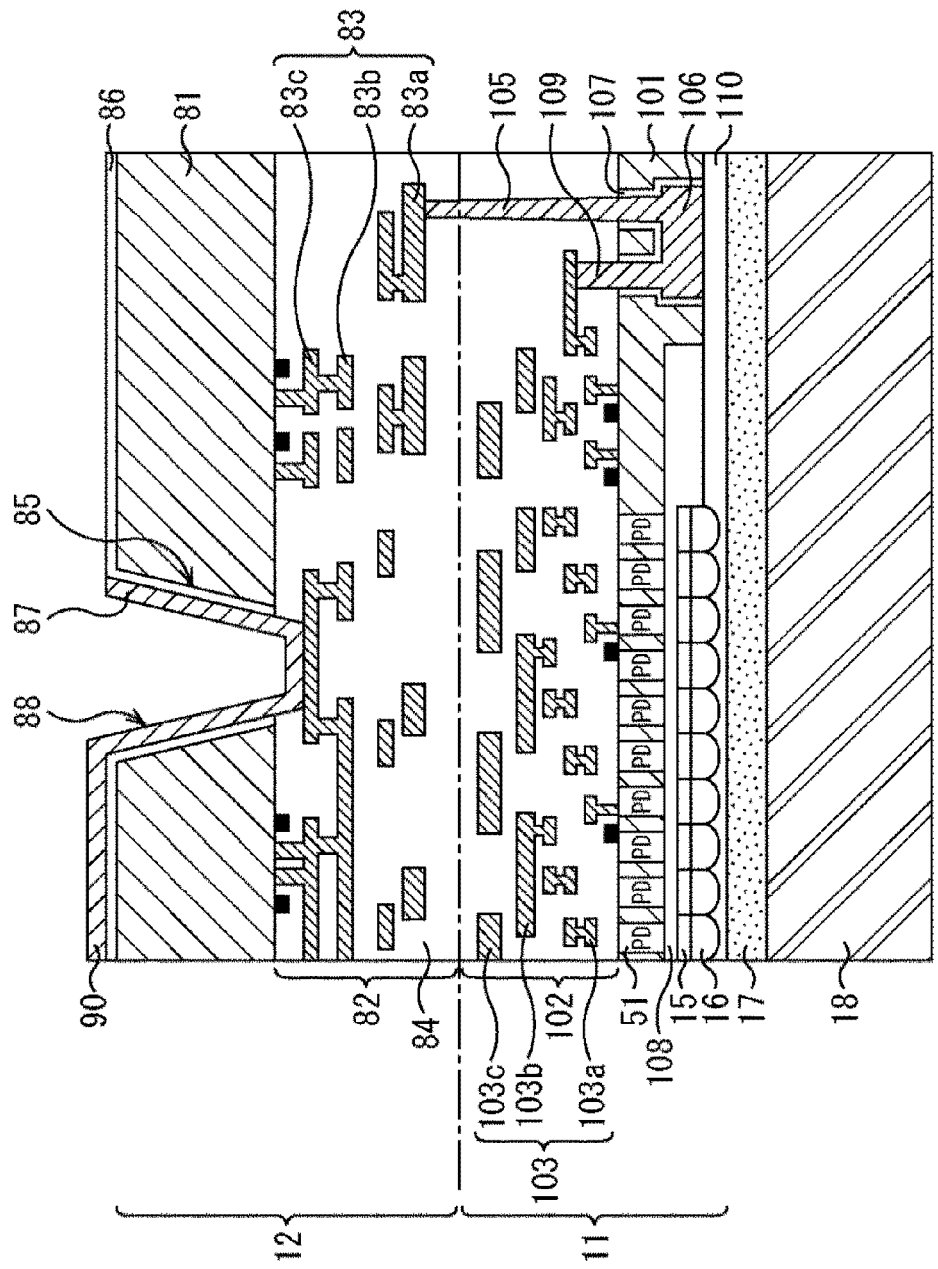
FIG. 36 is a diagram illustrating the method of manufacturing the solid-state imaging apparatus with the twin-contact structure.

Next, as shown in FIG. 36, after the resist pattern 241 is removed, the barrier metal film (not shown) and the Cu seed layer 231 under the resist pattern 241 are removed by wet etching.

Figure 37:
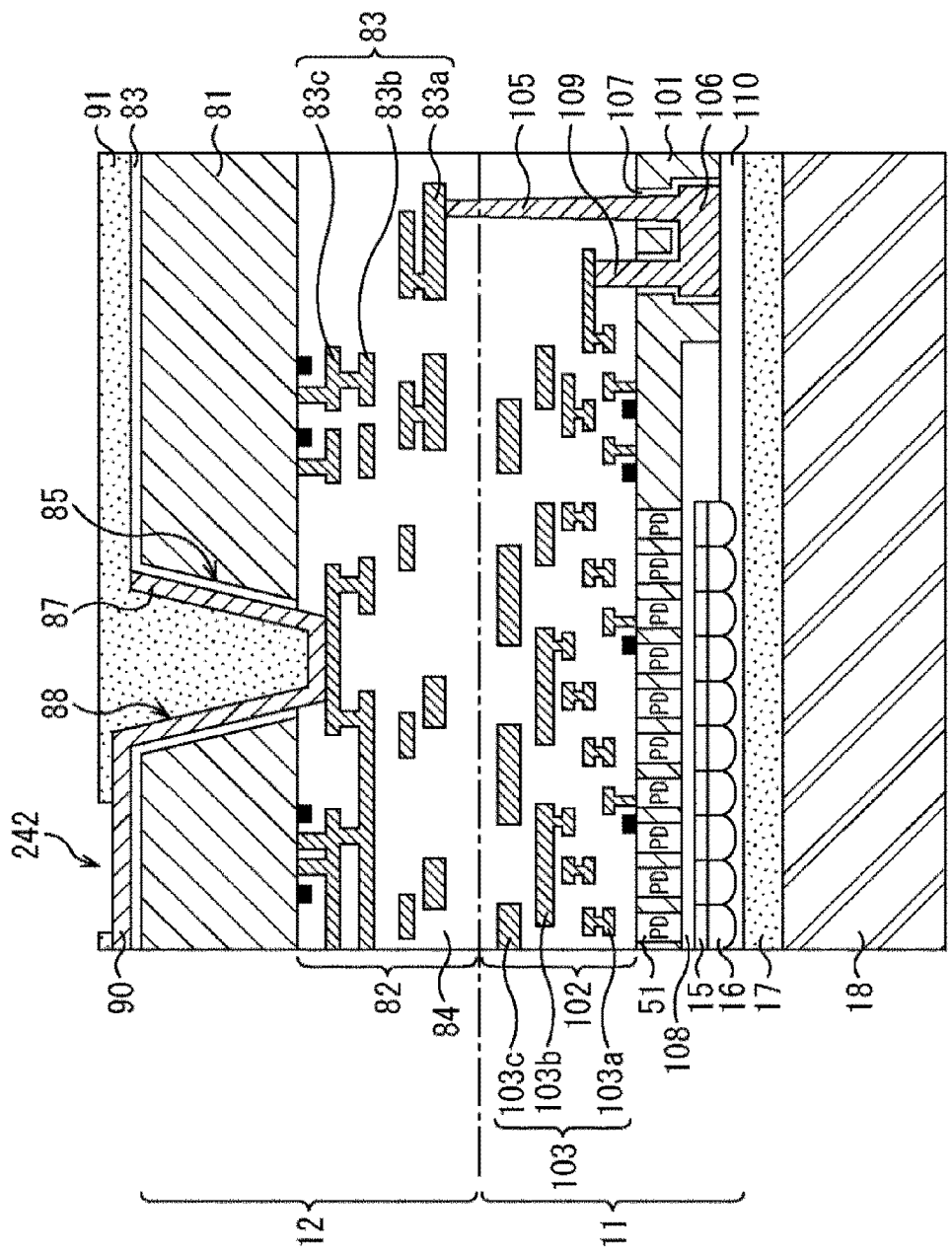
FIG. 37 is a diagram illustrating the method of manufacturing the solid-state imaging apparatus with the twin-contact structure.

Next, as shown in FIG. 37, after the solder mask 91 is formed to protect the rewiring 90, the solder mask 91 is removed only in the region where the external terminal 14 is mounted, thereby forming a solder mask opening portion 242.

Figure 38:
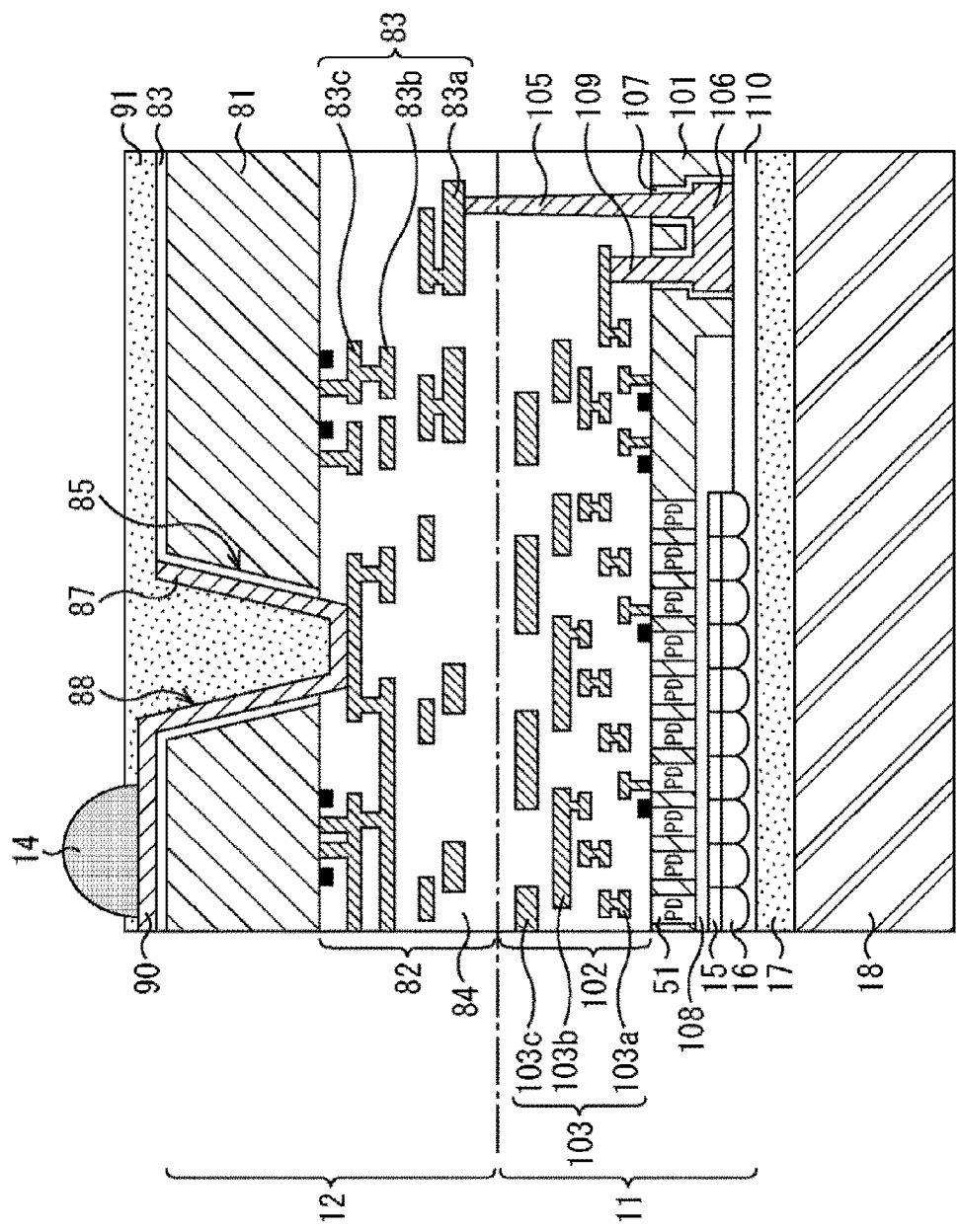
FIG. 38 is a diagram illustrating the method of manufacturing the solid-state imaging apparatus with the twin-contact structure.

Then, as shown in FIG. 38, the external terminal 14 is formed in the solder mask opening portion 242 in FIG. 37 by a solder ball mounting method or the like.

As described above, according to the manufacturing method described with reference to FIGS. 24 to 38, the upper structure body 11 (first semiconductor substrate), at which the photodiodes 51, which perform photoelectric conversion, the pixel transistor circuits and the like are formed, and the lower structure body 12 (second semiconductor substrate), at which the input/output circuit units 49 for outputting the pixel signals outputted from the pixels 31 to the outside of the solid-state imaging apparatus 1 are formed under the pixel array unit 24, are first affixed such that the wiring layers face each other. Then, the through via 88 penetrating the lower structure body 12 is formed, and the external terminal 14, which is electrically connected to the outside of the solid-state imaging apparatus 1 through the input/output circuit units 49 and the through via 88, is formed. Accordingly, the solid-state imaging apparatus 1 shown in FIG. 5 can be manufactured.

According to the manufacturing method described with reference to FIGS. 24 to 38, since the through via 88 is formed using the protective substrate 18 as a support substrate, the through via 88 has a shape digging into the wiring layer 83 (circuit) side from the external terminal 14 side.

Manufacturing Method in Case of Cu—Cu Direct Bonding Structure

Next, with reference to FIGS. 39 to 43, a method of manufacturing the solid-state imaging apparatus 1 will be described in the case where the lower structure body 12 and the upper structure body 11 are connected by the Cu—Cu direct bonding structure.

First, similarly to the manufacturing method in the case where the twin-contact structure is adopted as the upper and lower wiring connection structure, the lower structure body 12 and the upper structure body 11 in a wafer state are manufactured separately.

Figure 39:
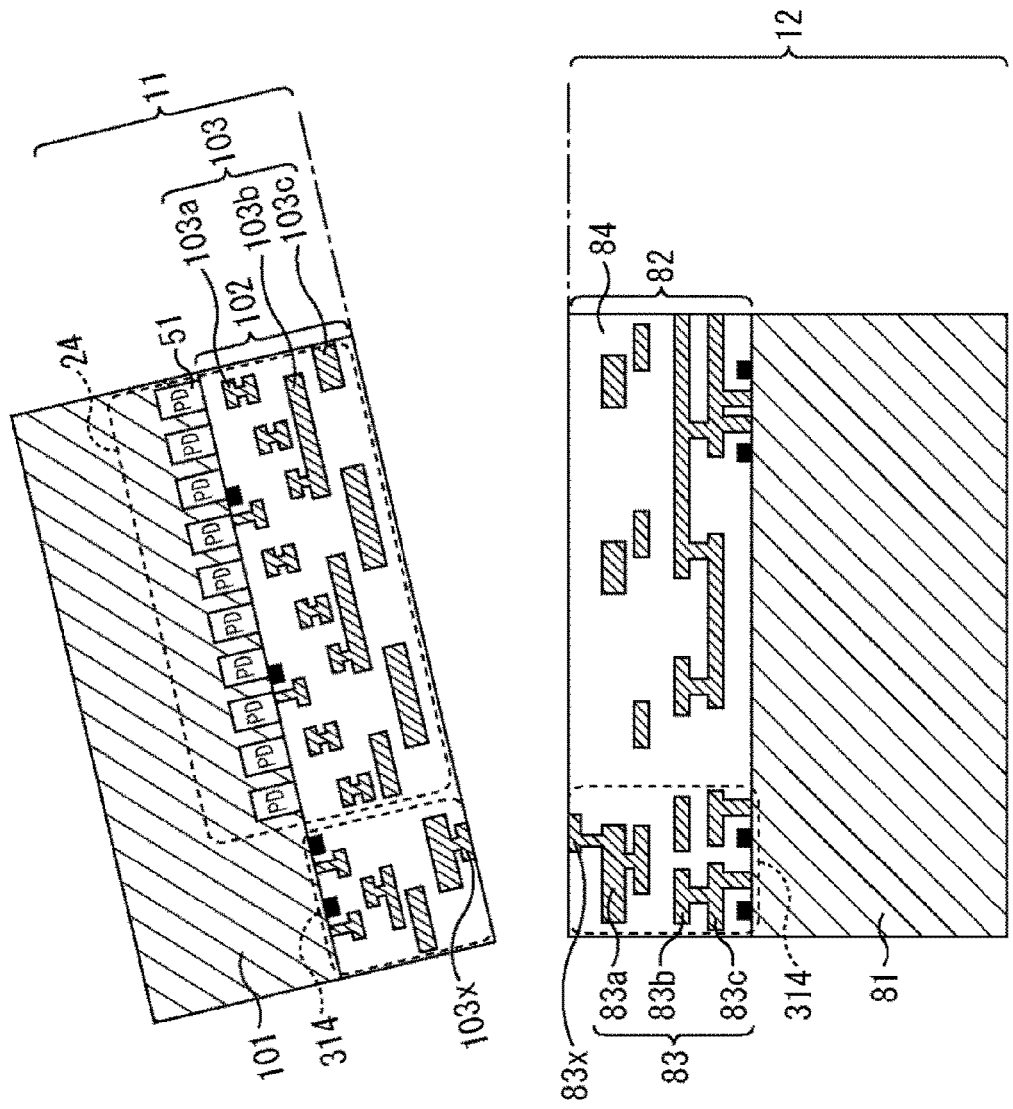
FIG. 39 is a diagram illustrating a method of manufacturing the solid-state imaging apparatus with the Cu—Cu direct bonding structure in FIG. 5.

However, as a point different from the twin-contact structure, as shown in FIG. 39, of the upper and lower wiring connection region 314 which is further outside the pixel array unit 24, in the upper structure body 11, a wiring layer 103x for directly connecting with a wiring layer 83x of the lower structure body 12 is formed on further the lower structure body 12 side than the lowermost wiring layer 103c closest to the lower structure body 12.

Similarly, of the upper and lower wiring connection region 314, also in the lower structure body 12, the wiring layer 83x for directly connecting with the wiring layer 103x of the upper structure body 11 is formed on further the upper structure body 11 side than the uppermost wiring layer 83a closest to the upper structure body 11.

Figure 40:
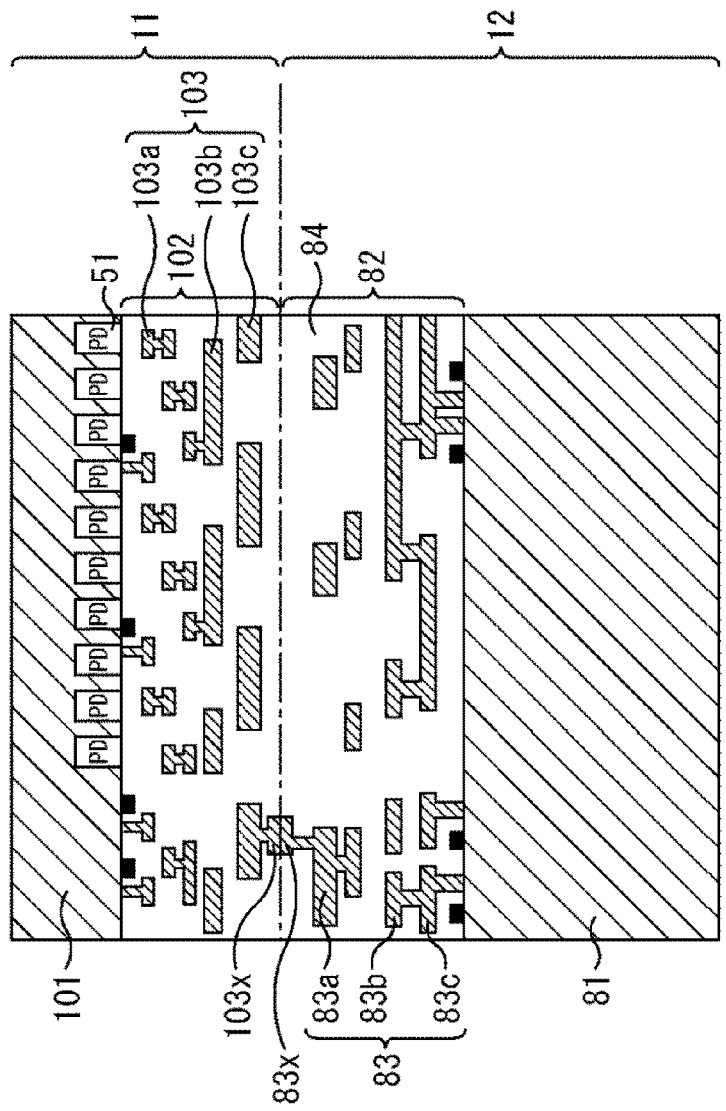
FIG. 40 is a diagram illustrating the method of manufacturing the solid-state imaging apparatus with the Cu—Cu direct bonding structure in FIG. 5.

Then, as shown in FIG. 40, the multilayered wiring layer 82 side of the lower structure body 12 and the multilayered wiring layer 102 side of the upper structure body 11 are affixed so as to face each other, and thereafter the semiconductor substrate 101 of the upper structure body 11 is thinned. By this affixing, the wiring layer 83x of the lower structure body 12 and the wiring layer 103x of the upper structure body 11 are connected by metal binding (Cu—Cu bonding).

Figure 41:
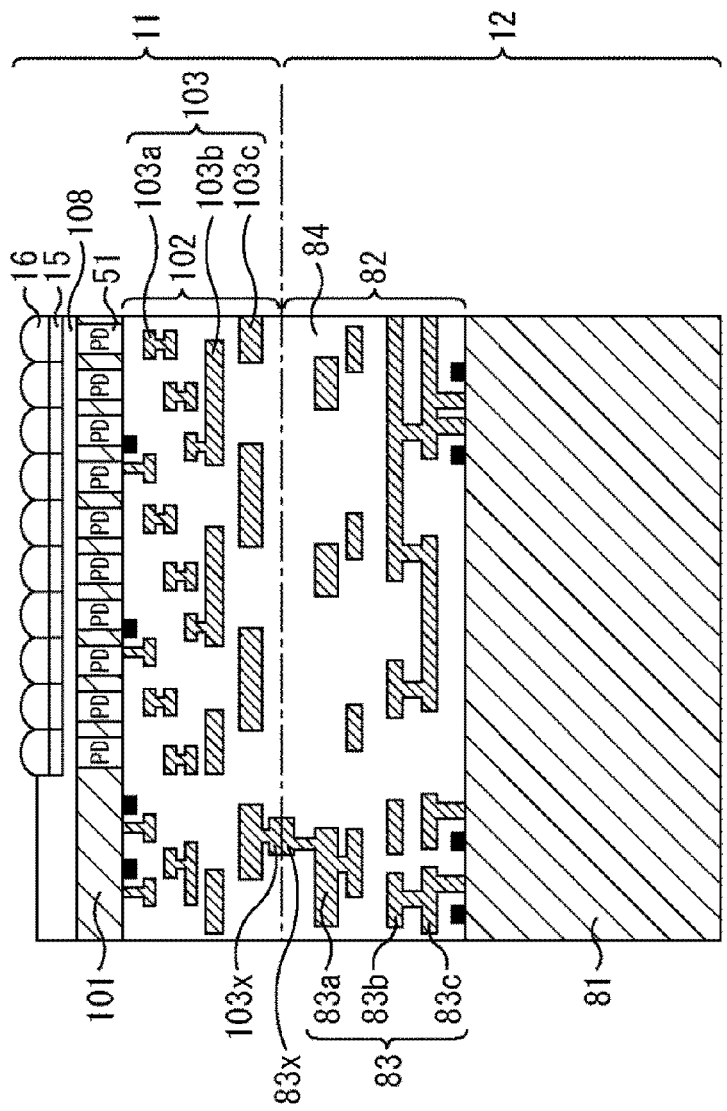
FIG. 41 is a diagram illustrating the method of manufacturing the solid-state imaging apparatus with the Cu—Cu direct bonding structure in FIG. 5.

Next, as shown in FIG. 41, the color filters 15 and the on-chip lenses 16 are formed above the photodiode 51 of each pixel 31 with the planarized film 108 interposed therebetween.

Figure 42:
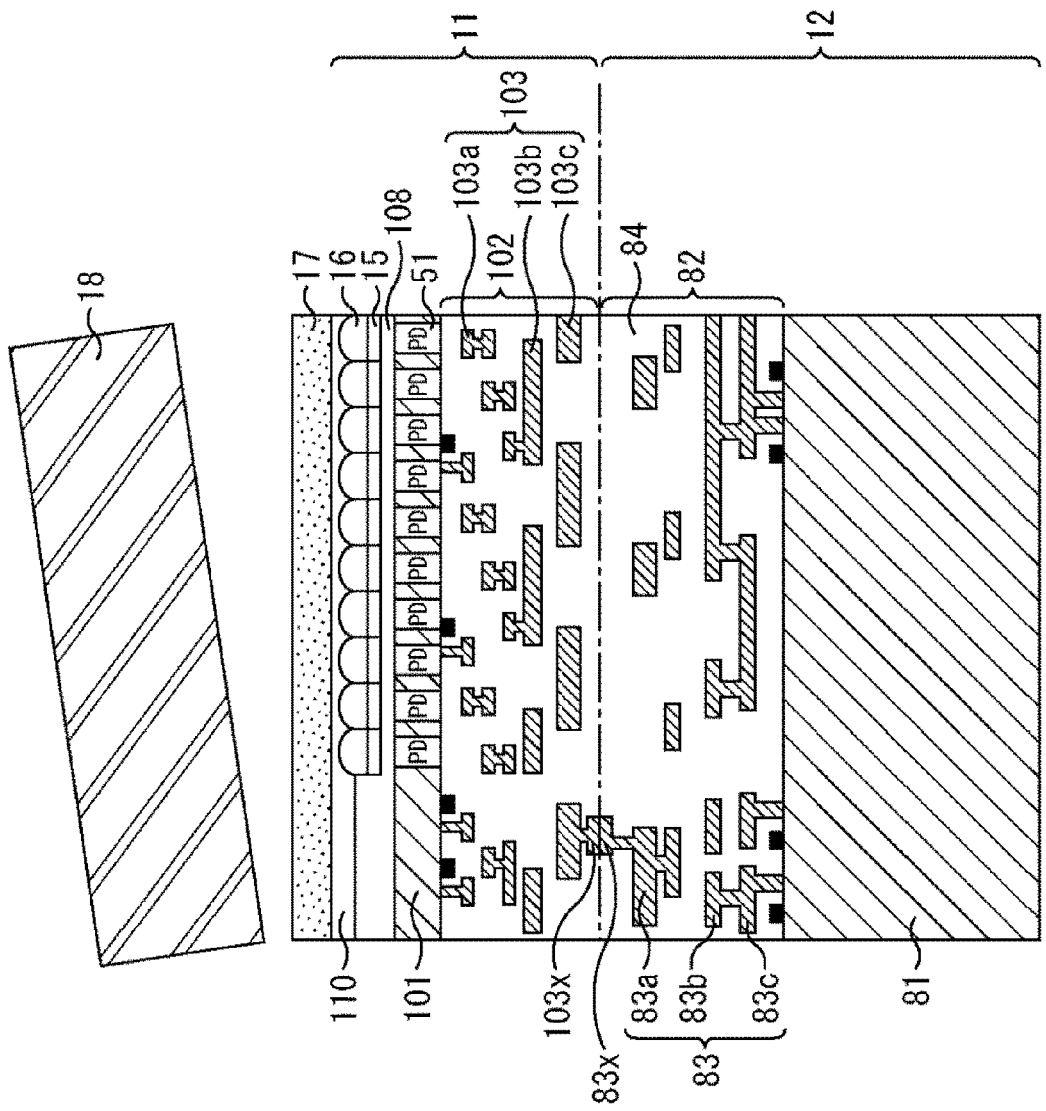
FIG. 42 is a diagram illustrating the method of manufacturing the solid-state imaging apparatus with the Cu—Cu direct bonding structure in FIG. 5.
Figure 43:
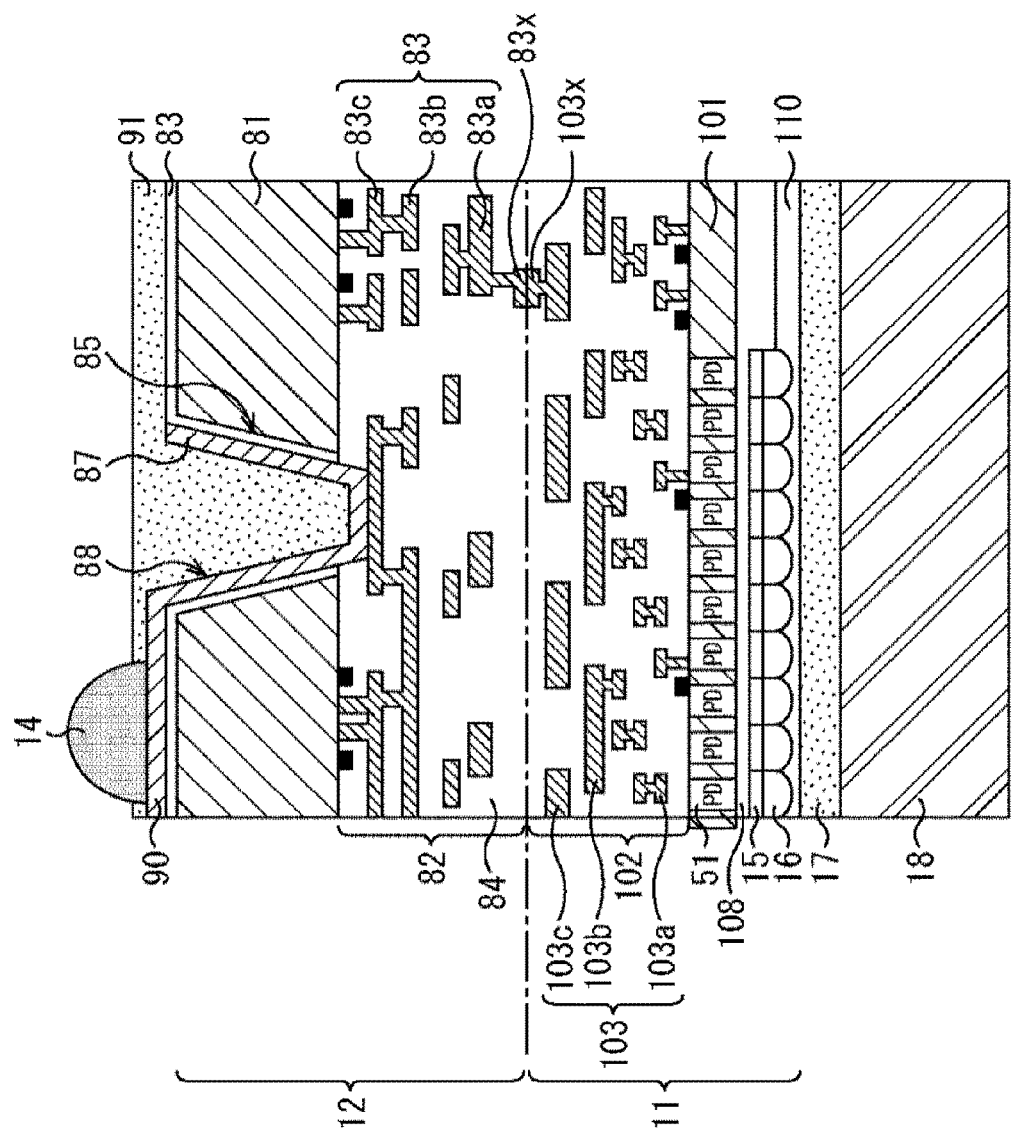
FIG. 43 is a diagram illustrating the method of manufacturing the solid-state imaging apparatus with the Cu—Cu direct bonding structure in FIG. 5.

Then, as shown in FIG. 42, the entire face, on which the on-chip lenses 16 of the affixed lower structure body 12 and the upper structure body 11 are formed, is coated with the sealing resin 17 with the planarized film 110 interposed therebetween, and the protective substrate 18 is connected with the cavityless structure.

Note that, although, in this example, the wiring layer 83x for directly connecting with the wiring layer 103 of the upper structure body 11 is formed in the lower structure body 12 in addition to the wiring layers 83a to 83c which become parts of the input/output circuit units 49 and the row driving unit 22 or the column signal processing unit 25, and the wiring layer 103x for directly connecting with the wiring layer 83 of the lower structure body 12 is formed in the upper structure body 11 in addition to the wiring layers 103a to 103c which become the driving wiring of the pixel transistors and the like, it is needless to say that the uppermost wiring layer 83a of the lower structure body 12 and the lowermost wiring layer 103c of the upper structure body 11 may be connected by metal binding (Cu—Cu bonding).

The steps after the step shown in FIG. 42 are similar to the steps described with reference to FIGS. 30 to 38 in the case of adopting the twin-contact structure as the upper and lower wiring connection structure. The final state is a state shown in FIG. 43.

12. Further Modification Examples

Further Modification Example 1

Next, a further modification example of the solid-state imaging apparatus 1 will be described with reference to FIG. 44.

Figure 44:
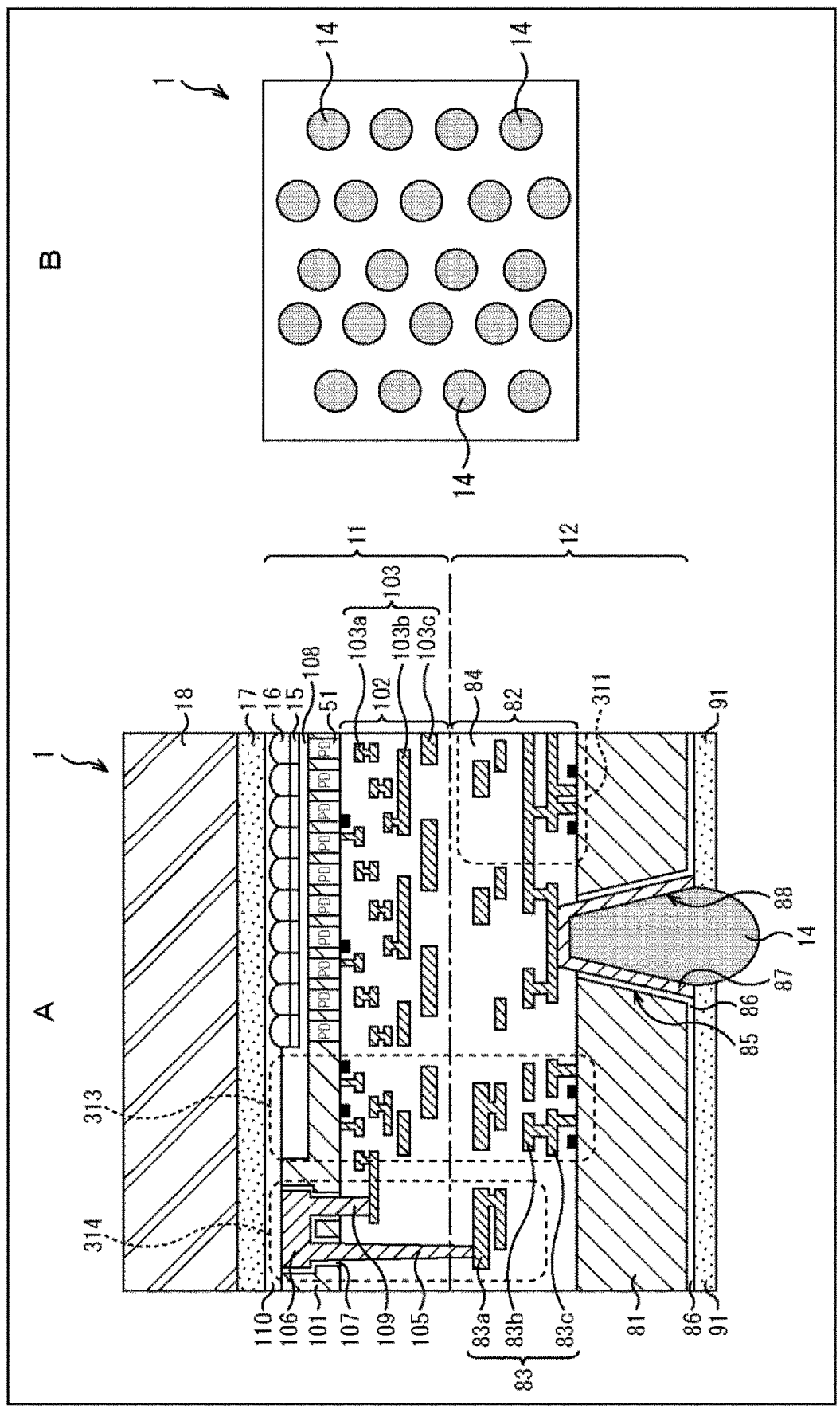
FIG. 44 is a diagram illustrating a further modification example 1 of the solid-state imaging apparatus.

A of FIG. 44 is a cross-sectional view of the vicinity of the outer periphery of the solid-state imaging apparatus 1 according to a further modification example 1, and B of FIG.

44 is a plan view of the external terminal 14 side of the solid-state imaging apparatus 1 according to the further modification example 1.

In the further modification example 1, as shown in A of FIG. 44, the external terminal 14 is formed right above the through via 88 so as to be superposed on the position of the through via 88 at the planar position. With this arrangement, as shown in B of FIG. 44, since the area for forming the rewiring 90 is unnecessary on the back side of the solid-state imaging apparatus 1, insufficiency of the area for forming the input/output unit 21 can be solved.

Further Modification Example 2

Next, a further modification example of the solid-state imaging apparatus 1 will be described with reference to FIG. 45.

Figure 45:
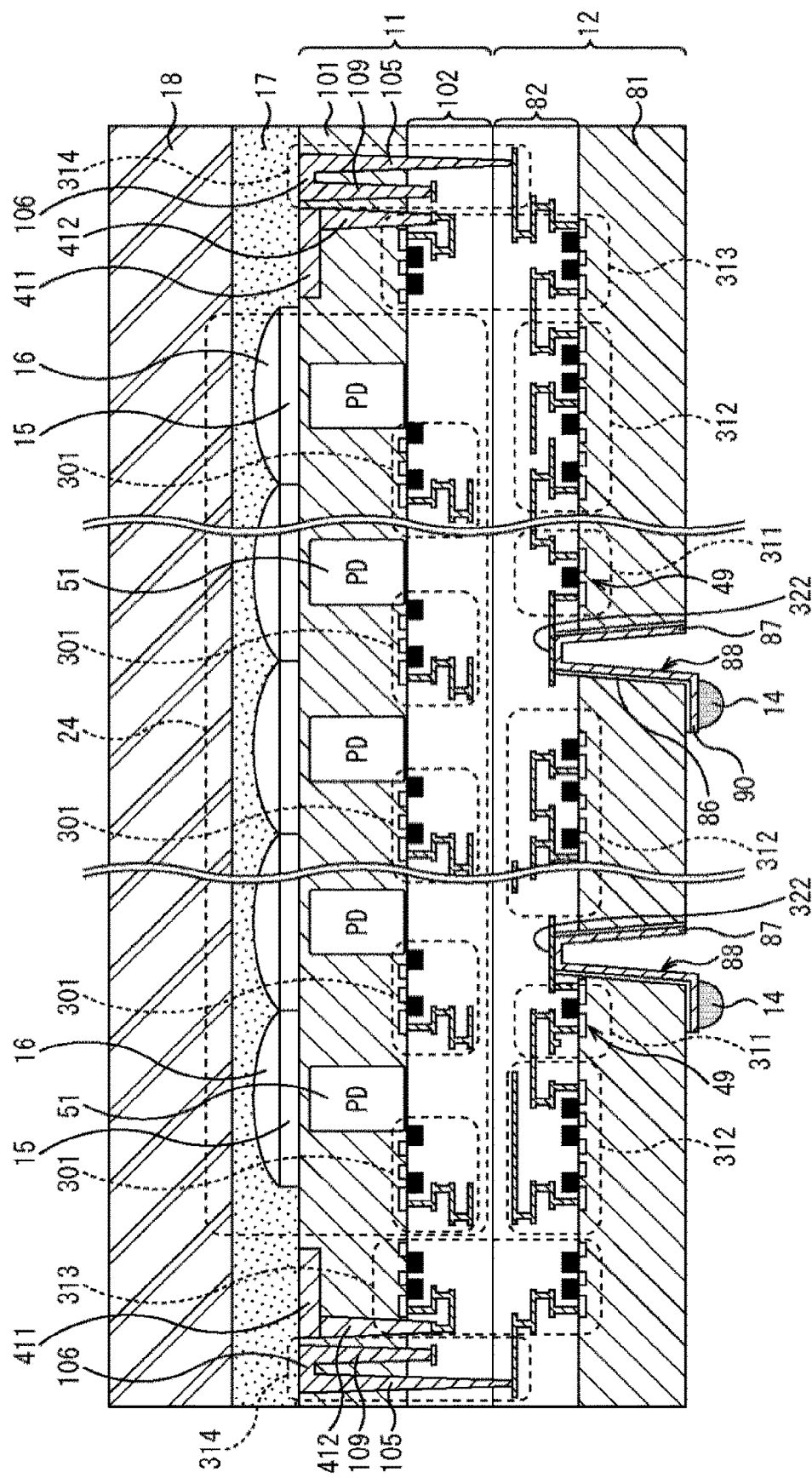
FIG. 45 is a diagram illustrating a further modification example 2 of the solid-state imaging apparatus.

FIG. 45 is a cross-sectional view of the solid-state imaging apparatus 1 according to a further modification example 2.

In the further modification example 2, for the purpose of measuring the operation of the solid-state imaging apparatus 1 by, for example, a general needle standing type semiconductor apparatus measuring machine in a state before the solid-state imaging apparatus 1 is singulated, in other words, in a state in which the plurality of solid-state imaging apparatuses 1 are formed on a wafer, the solid-state imaging apparatus 1 includes a conductive pad 411 for standing a measuring needle.

As shown in FIG. 45, the needle standing measuring conductive pad 411 is formed in a region outside the pixel array unit 24, for example, on the upper side of the pixel peripheral circuit region 313 in which the row driving unit 22, the column signal processing unit 25, and the like are formed. The conductive pad 411 is connected to a predetermined wiring layer 103 of the upper structure body 11 by a silicon through electrode 412.

It is desirable that the needle standing measuring conductive pad 411 be formed before the protective substrate 18 is arranged on the surface of the solid-state imaging apparatus 1. This makes it possible to measure the operation of the solid-state imaging apparatus 1 in the state in which the plurality of solid-state imaging apparatuses 1 are formed on the wafer before the protective substrate 18 is fixed.

The needle standing measuring conductive pad 411 may be formed at a part of the multilayered wiring layer 102 included in the upper structure body 11.

Moreover, the needle standing measuring conductive pad 411 may be formed on the upper side of a region generally called an optical black pixel region or simply an optical black region (not shown), which is included in the solid-state imaging apparatus 1 and for acquiring a reference level signal, in other words, a black level signal.

By forming the needle standing measuring conductive pad 411 in the solid-state imaging apparatus 1 before the protective substrate 18 of the solid-state imaging apparatus 1 is fixed, it is possible to measure the operation of the solid-state imaging apparatus 1 by using the needle standing type semiconductor apparatus measuring apparatus in the state in which the plurality of solid-state imaging apparatuses 1 are formed on the wafer before the protective substrate 18 is formed.

Further Modification Example 3

Next, a further modification example of the solid-state imaging apparatus 1 will be described with reference to FIG. 46.

Figure 46:
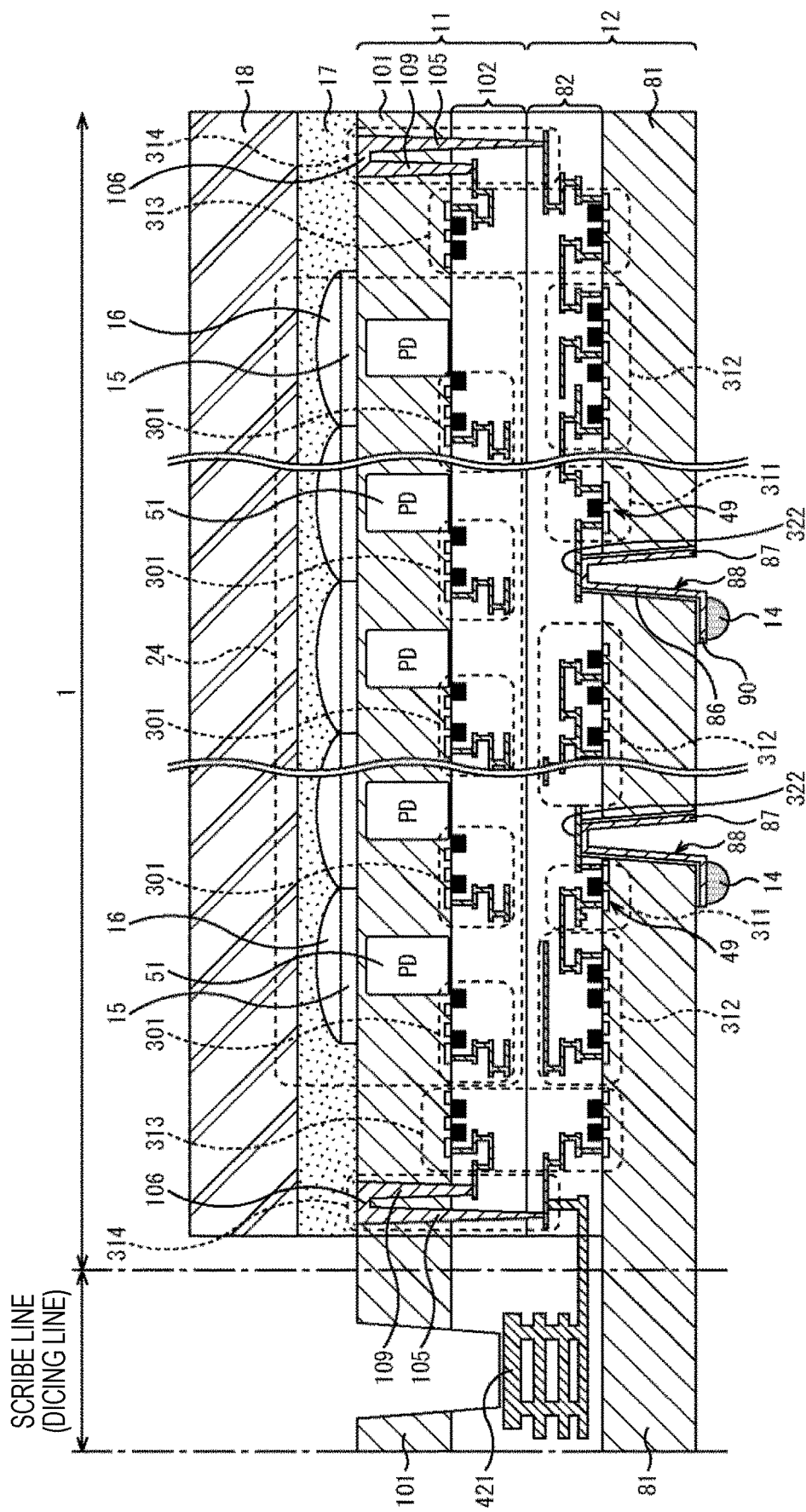
FIG. 46 is a diagram illustrating a further modification example 3 of the solid-state imaging apparatus.

FIG. 46 is a cross-sectional view of the solid-state imaging apparatus 1 according to a further modification example 3.

For the purpose of measuring the operation of the solid-state imaging apparatus 1 by, for example, a general needle standing type semiconductor apparatus measuring machine in a state before the solid-state imaging apparatus 1 is singulated, in other words, in a state in which the plurality of solid-state imaging apparatuses 1 are formed on a wafer, the solid-state imaging apparatus 1 according to the further modification example 3 also includes a conductive pad 421 for standing a measuring needle.

As shown in FIG. 46, the needle standing measuring conductive pad 421 is formed on a scribe line (dicing line) between the respective solid-state imaging apparatuses 1.

It is desirable that the needle standing measuring conductive pad 421 be formed before the protective substrate 18 is arranged on the surface of the solid-state imaging apparatus 1. This makes it possible to measure the operation of the solid-state imaging apparatus 1 in the state in which the plurality of solid-state imaging apparatuses 1 are formed on the wafer before the protective substrate 18 is fixed.

The needle standing measuring conductive pad 421 may be formed at a part of the multilayered wiring layer 102 included in the upper structure body 11, may be formed at a part of the multilayered wiring layer 82 included in the lower structure body 12, or may be formed at the same layer as a part of a conductive layer used in the upper and lower wiring connection structure. Then, the needle standing measuring conductive pad 421 may be connected to the inside of the solid-state imaging apparatus 1 through a part of the multilayered wiring layer 102 included in the upper structure body 11 or may be connected to the inside of the solid-state imaging apparatus 1 through a part of the multilayered wiring layer 82 included in the lower structure body 12.

By forming the needle standing measuring conductive pad 421 in the solid-state imaging apparatus 1 before the protective substrate 18 of the solid-state imaging apparatus 1 is fixed, it is possible to measure the operation of the solid-state imaging apparatus 1 by using the needle standing type semiconductor apparatus measuring apparatus in the state in which the plurality of solid-state imaging apparatuses 1 are formed on the wafer before the protective substrate 18 is formed.

Further Modification Example 4

Next, a further modification example of the solid-state imaging apparatus 1 will be described with reference to FIG. 47.

Figure 47:
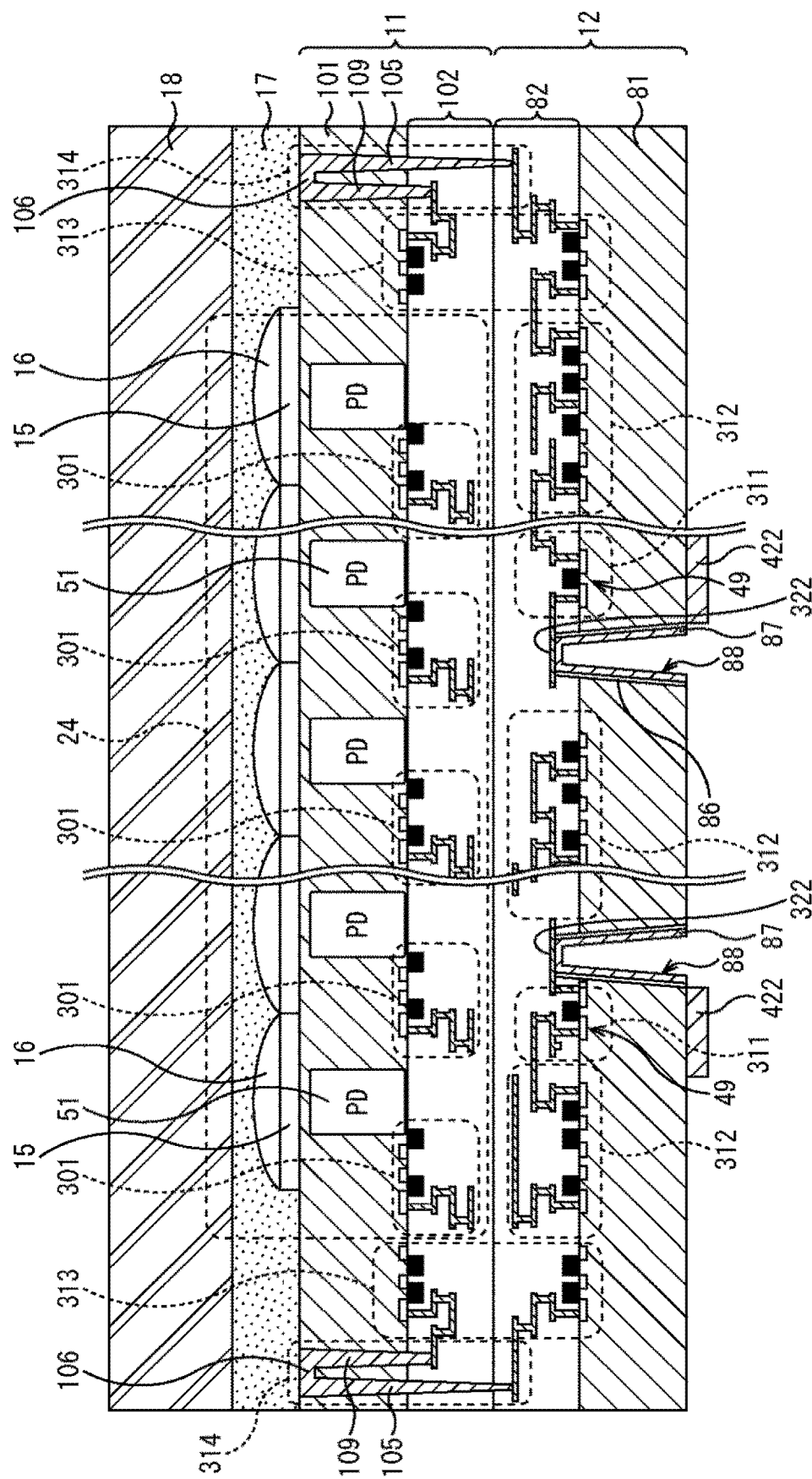
FIG. 47 is a diagram illustrating a further modification example 4 of the solid-state imaging apparatus.

FIG. 47 is a cross-sectional view of the solid-state imaging apparatus 1 according to a further modification example 4.

For the purpose of measuring the operation of the solid-state imaging apparatus 1 in a state in which the plurality of solid-state imaging apparatuses 1 are formed on a wafer, the solid-state imaging apparatus 1 according to the further modification example 4 also includes a conductive pad 422 for standing a measuring needle.

As shown in FIG. 47, the needle standing measuring conductive pad 422 is formed on the lower side of the lower structure body 12 in the state in which the plurality of solid-state imaging apparatuses 1 are formed on the wafer. The needle standing measuring conductive pad 422 may be formed by, for example, the rewiring 90 included in the lower structure body 12.

After the protective substrate 18 is arranged on the surface of the solid-state imaging apparatus 1 in the state in which the plurality of solid-state imaging apparatuses 1 are formed on the wafer, the wafer is turned upside down to arrange the protective substrate 18 at the lower side and the needle standing measuring conductive pad 422 at the upper side so that the operation of the solid-state imaging apparatus 1 can be measured. In this case, the operation of the solid-state imaging apparatus 1 may be measured using an apparatus that makes light incident from the lower side of the solid-state imaging apparatus 1.

13. Second Embodiment of Solid-State Imaging Apparatus

Well, in the first embodiment described above heretofore, as represented by the schematic cross-sectional view in FIG. 1, the solid-state imaging apparatus 1 has been configured by including the protective substrate 18 including, for example, a transparent glass substrate or the like.

However, the solid-state imaging apparatus 1 may have a configuration in which the protective substrate 18 is omitted or may include a replacement for the protective substrate 18. Hereinafter, a mode of the solid-state imaging apparatus 1, in which the protective substrate 18 is omitted, and a mode of the solid-state imaging apparatus 1, which includes a configuration with a replacement for the protective substrate 18, will be described.

Note that, in the following description of each embodiment, descriptions of parts common to the aforementioned first embodiment are omitted as appropriate, and parts different from the first embodiment will be described. In the drawings for a second embodiment and the followings, parts corresponding to those of the aforementioned first embodiment are denoted by the same reference signs.

Figure 48:
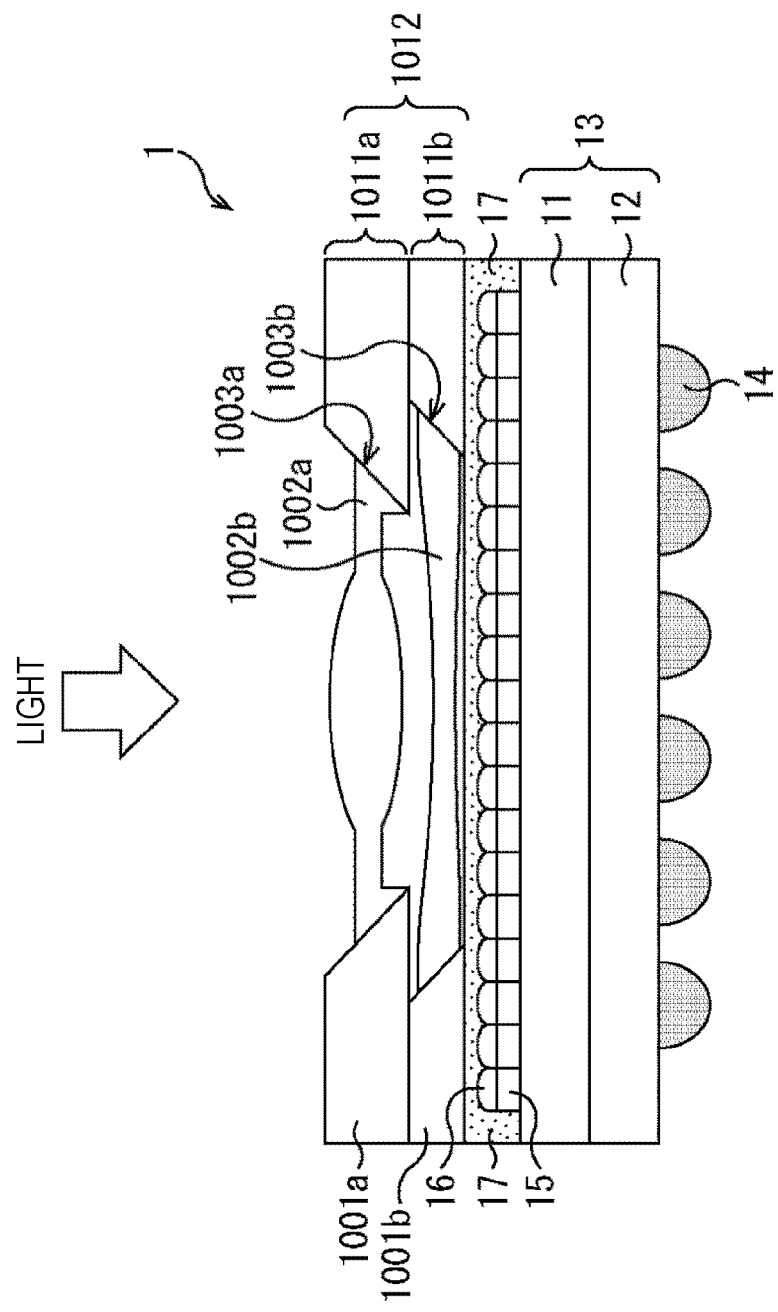
FIG. 48 is a cross-sectional view showing a schematic structure of a second embodiment of the solid-state imaging apparatus.

FIG. 48 shows a schematic structure of the second embodiment of the solid-state imaging apparatus.

In the solid-state imaging apparatus 1 according to the second embodiment shown in FIG. 48, a laminated lens structure body 1012, which is constituted by laminating a plurality of lens-attached substrates 1011, is provided above an upper structure body 11, instead of the protective substrate 18 in the first embodiment. With this arrangement, the outermost surface on the light incident side of the apparatus is the laminated lens structure body 1012. In the example in FIG. 48, the laminated lens structure body 1012 is constituted by laminating two lens-attached substrates 1011a and 1011b.

Each lens-attached substrate 1011 constituting the laminated lens structure body 1012 has a configuration in which a lens resin portion 1002 is added to a carrier substrate 1001 including a silicon substrate or the like. The carrier substrate 1001 has a through hole 1003, and the lens resin portion 1002 is formed inside the through hole 1003. That is, the lens-attached substrate 1011a is constituted by a carrier substrate 1001a having a through hole 1003a, and a lens resin portion 1002a, and the lens-attached substrate 1011b is constituted by a carrier substrate 1001b having a through hole 1003b, and a lens resin portion 1002b. The lens resin portion 1002 constituted by a lens portion and a site extending to the carrier substrate 1001 and carrying the lens portion.

In the example in FIG. 48, the laminated lens structure body 1012 is constituted by laminating the two lens-attached substrates 1011, but may be constituted by one lens-attached substrate 1011 or by laminating three or more lens-attached substrates 1011.

The laminated lens structure body 1012 is prepared, for example, as follows. The plurality of through holes 1003 are formed in the carrier substrate 1001 in a substrate state (wafer state), and a lens resin (energy curing resin) is injected into each of the plurality of formed through holes 1003 and molded by using a metal mold, thereby forming the lens resin portion 1002. Then, the plurality of lens substrates 1011, which are prepared similarly and in a substrate state, are adhered with an adhesive, by direct bonding, or the like, and thereafter singulated on a chip basis, thereby completing the laminated lens structure body 1012.

14. Third Embodiment of Solid-State Imaging Apparatus

Figure 49:
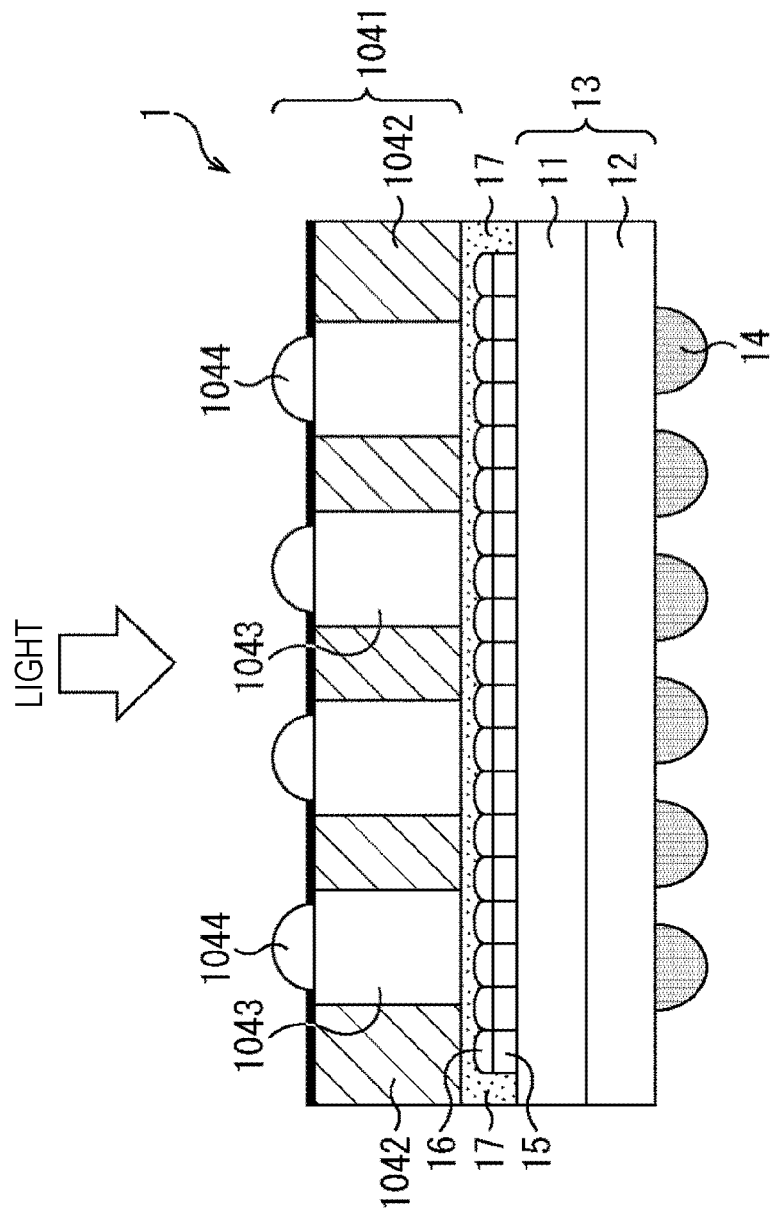
FIG. 49 is a cross-sectional view showing a schematic structure of a third embodiment of the solid-state imaging apparatus.

FIG. 49 shows a schematic structure of a third embodiment of the solid-state imaging apparatus.

In a solid-state imaging apparatus 1 according to the third embodiment shown in FIG. 49, a microlens array substrate 1041 is provided above an upper structure body 11, instead of the protective substrate 18 in the first embodiment. With this arrangement, the outermost surface on the light incident side of the apparatus is the microlens array substrate 1041.

The microlens array substrate 1041 includes a plurality of light guide paths 1043 and microlenses 1044 formed on the upper faces (light incident sides) of the respective light guide paths 1043 at a carrier substrate 1042 including a silicon substrate or the like.

The laminated lens structure body 1012 of the second embodiment shown in FIG. 48 is configured such that incident light is focused by the lens resin portion 1002 of each lens-attached substrate 1011 to form one image in photodiodes 51 of the upper structure body 11.

On the other hand, in the microlens array substrate 1041 of the third embodiment, incident light is focused on the plurality of microlenses 1044 basis arranged on the carrier substrate 1042 to form an image in photodiodes 51 of the upper structure body 11.

The manufacturing method in the case of the twin-contact structure described with reference to FIGS. 24 to 38 and the manufacturing method in the case of the Cu—Cu direct bonding structure described with reference to FIGS. 39 to 43 in the first embodiment can be applied to methods of manufacturing the solid-state imaging apparatus 1 according to the second embodiment and the solid-state imaging apparatus 1 according to the third embodiment. However, the protective substrate 18 in each of the manufacturing methods described above is replaced with the laminated lens structure body 1012 in the solid-state imaging apparatus 1 according to the second embodiment and with the microlens array substrate 1041 in the solid-state imaging apparatus 1 according to the third embodiment.

15. Fourth Embodiment of Solid-State Imaging Apparatus

Figure 50:
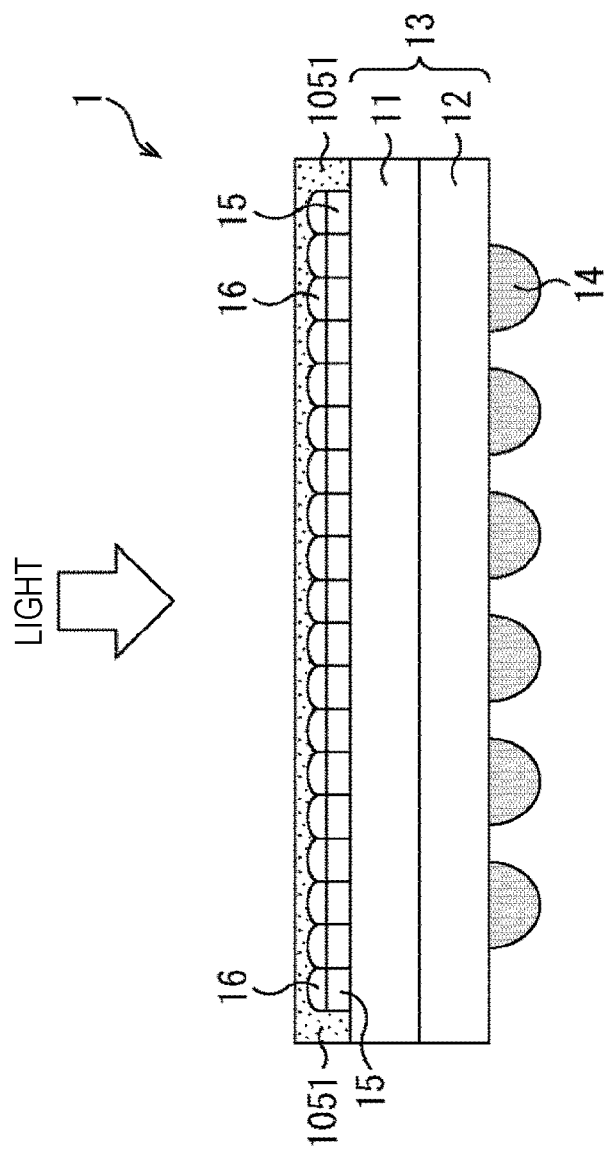
FIG. 50 is a cross-sectional view showing a schematic structure of a fourth embodiment of the solid-state imaging apparatus.

FIG. 50 shows a schematic structure of a fourth embodiment of the solid-state imaging apparatus.

In a solid-state imaging apparatus 1 according to the fourth embodiment shown in FIG. 50, the protective substrate 18 in the first embodiment is omitted, the outermost surface on the light incident side of the apparatus is a resin layer 1051 formed on upper layers of on-chip lenses 16.

The resin layer 1051 may include the same material as the sealing resin 17 of the first embodiment or may be, for example, an organic resin containing a fluorescent pigment or the like. In a case where the resin layer 1051 is the organic resin containing the fluorescent pigment, photodiodes 51 of an upper structure body 11 sense light emission by the fluorescent pigment contained in the resin layer 1051.

Alternatively, the resin layer 1051 may be replaced with a silicate-based (e.g., (Ba, Sr, Ca)2SiO4:Eu2+ or Sr3SiO5: Eu2+) or nitride-based (e.g., CaAlSiN3:Eu2+) fluorescent material such that the photodiodes 51 are configured to sense light emission by these fluorescent materials.

16. Fifth Embodiment of Solid-State Imaging Apparatus

Figure 51:
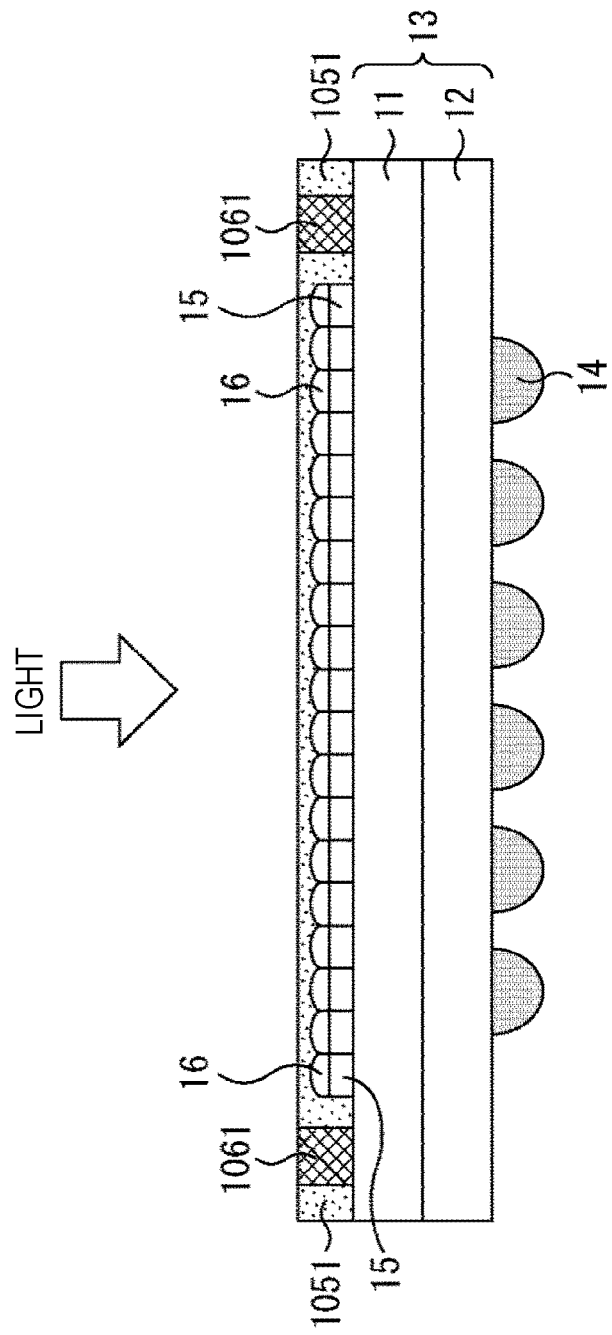
FIG. 51 is a cross-sectional view showing a schematic structure of a fifth embodiment of the solid-state imaging apparatus.

FIG. 51 shows a schematic structure of a fifth embodiment of the solid-state imaging apparatus.

A solid-state imaging apparatus 1 according to the fifth embodiment shown in FIG. 51 has a structure in which a rib structure body 1061 is further added to the structure of the fourth embodiment shown in FIG. 50.

Specifically, the rib structure body 1061 is formed on the upper face of an upper structure body 11 outside a pixel array unit 24 (not shown in FIG. 51) in which color filters 15 and on-chip lenses 16 are formed on a pixel basis. This rib structure body 1061 may be formed, for example, in a rectangular shape so as to surround the outer periphery of the solid-state imaging apparatus 1 or may be formed at four corners of the rectangular shape or only at the central portion of each side as viewed from the upper side, which is the light incident side of the solid-state imaging apparatus 1. In other words, the rib structure body 1061 should be formed on at least a part of the outer peripheral portion further outside than the pixel array unit 24. The rib structure body 1061 can be formed by a metal film of copper (Cu), aluminum (Al), tungsten (W), or the like, silicon, an oxide film, a nitride film, or the like.

17. Sixth Embodiment of Solid-State Imaging Apparatus

Figure 52:
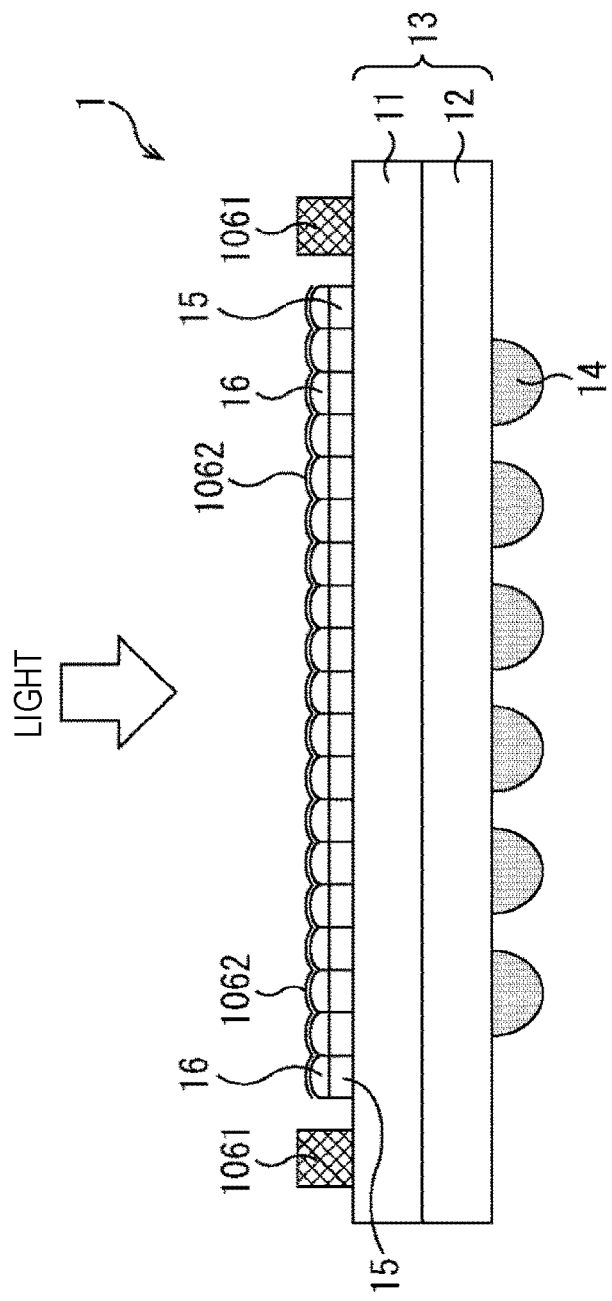
FIG. 52 is a cross-sectional view showing a schematic structure of a sixth embodiment of the solid-state imaging apparatus.

FIG. 52 shows a schematic structure of a sixth embodiment of the solid-state imaging apparatus.

A solid-state imaging apparatus 1 according to the sixth embodiment shown in FIG. 52 has a structure in which the resin layer 1051 of the structure of the fifth embodiment shown in FIG. 51 is omitted. With this arrangement, the outermost surface on the light incident side of the apparatus is on-chip lenses 16 and a rib structure body 1061 positioned at the outer peripheral portion on the outer sides thereof. Moreover, strictly speaking, since an antireflection film 1062 including an oxide film, a nitride film, or the like is formed on the outermost faces of the on-chip lenses 16, the outermost surface of the region where the on-chip lenses 16 are formed is the antireflection film 1062.

Even in a case where the resin layer 1051 is omitted, since the rib structure body 1061 is formed, the on-chip lenses 16 can be protected. Furthermore, in a case where the solid-state imaging apparatus 1 in FIG. 52 is combined with a package including the rib structure body, the rib structure body 1061 of the solid-state imaging apparatus 1 according to the sixth embodiment in FIG. 52 may be omitted. In other words, a mode is possible in which the rib structure body is not formed, which is the structure omitting the resin layer 1051 of the structure of the fourth embodiment shown in FIG. 50.

18. Examples of Mounting Solid-State Imaging Apparatuses

Figure 53:
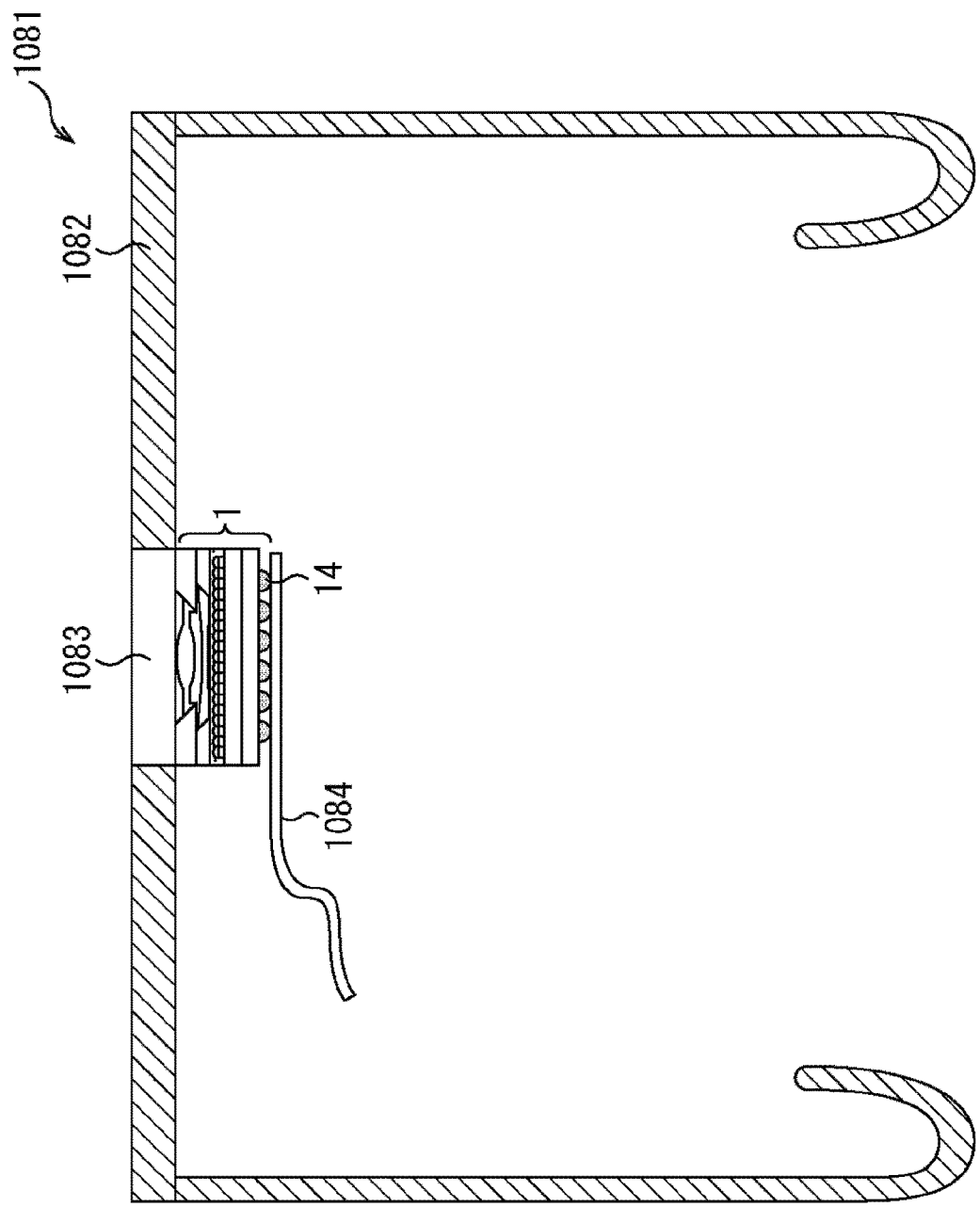
FIG. 53 is a diagram showing an example of mounting the solid-state imaging apparatus according to the second embodiment.

FIG. 53 shows an example in which the solid-state imaging apparatus 1 according to the second embodiment shown in FIG. 48 is mounted on eyeglasses.

In eyeglasses 1081 shown in FIG. 53, a bridge portion 1083 of an eyeglass frame 1082 is configured to transmit light with, for example, a transparent acrylic resin or the like, and the solid-state imaging apparatus 1 according to the second embodiment is attached to the inner side of the bridge portion 1083, which is a user wearing side. The bridge portion 1083 also serves as the protective substrate 18 of the first embodiment.

The solid-state imaging apparatus 1 incorporated as a part of the eyeglasses 1081 images, for example, an image corresponding to the field of view of the user wearing the eyeglasses 1081.

The external terminals 14 of the solid-state imaging apparatus 1 are connected to a flexible substrate 1084, and the output of the image data generated in the solid-state imaging apparatus 1 and the input of the timing control signal and power supply voltage supplied to the solid-state imaging apparatus 1 are performed via the flexible substrate 1084.

Figure 54:
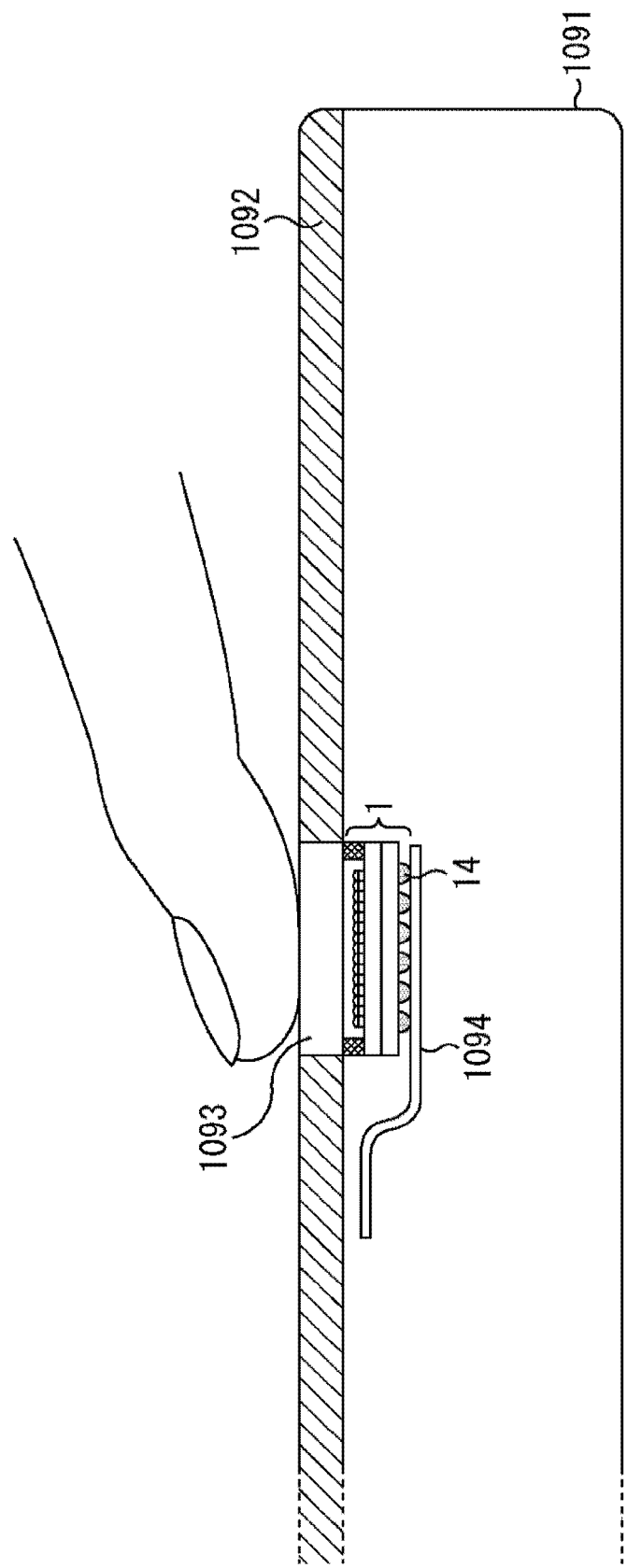
FIG. 54 is a diagram showing an example of mounting the solid-state imaging apparatus according to the sixth embodiment.

FIG. 54 shows an example in which the solid-state imaging apparatus 1 according to the sixth embodiment shown in FIG. 52 is mounted on a laptop personal computer (PC).

In a laptop PC 1091 shown in FIG. 54, for example, a part of a manipulation face 1092, on which a keyboard (not shown) is arranged, is, for example, a detection window 1093 configured to transmit light with a transparent acrylic resin or the like, and the solid-state imaging apparatus 1 according to the sixth embodiment is attached to the lower side of the detection window 1093, which is the inside of the laptop PC 1091. The solid-state imaging apparatus 1 attached to the lower side of the detection window 1093 functions as, for example, a fingerprint sensor which detects the fingerprint of the user.

The external terminals 14 of the solid-state imaging apparatus 1 are connected to a flexible substrate 1094, and the output of the image data generated in the solid-state imaging apparatus 1 and the input of the timing control signal and power supply voltage supplied to the solid-state imaging apparatus 1 are performed via the flexible substrate 1094.

The eyeglasses 1081 and the laptop PC 1091 shown in FIGS. 53 and 54 are examples of mounting examples of the solid-state imaging apparatus 1 according to each embodiment, and the solid-state imaging apparatus 1 according to each embodiment can also be applied to other wearable products, portable terminals, medical devices such as an endoscope, and the like.

The solid-state imaging apparatuses 1 according to the second and sixth embodiments shown in FIGS. 48 and 52 are used as the solid-state imaging apparatuses 1 incorporated into other products in FIGS. 53 and 54. However, the solid-state imaging apparatuses 1 according to the third to fifth embodiments described in FIGS. 49 to 51 may also be used.

Moreover, in FIGS. 53 and 54, in the device on which the solid-state imaging apparatus 1 is mounted, a part of the device includes a light transmission member which transmits light incident on the solid-state imaging apparatus 1, the solid-state imaging apparatus 1 is arranged in a further inner direction of the device than this light transmission member, in other words, at the destination where the light transmitted through the light transmission member is made incident, and the solid-state imaging apparatus 1 is directly fixed to the light transmission member.

In addition to this, the solid-state imaging apparatus 1 may be indirectly fixed to the light transmission member. That is, the solid-state imaging apparatus 1 may be fixed to a second member fixed to the light transmission member. For example, although the solid-state imaging apparatus 1 is fixed to the bridge portion 1083 which transmits light in FIG. 53, by fixing the solid-state imaging apparatus 1 to the eyeglass frame 1082, the solid-state imaging apparatus 1 may be indirectly fixed to the bridge portion 1083 which transmits light.

Thus, in the device on which the solid-state imaging apparatus 1 according to any one of the second to sixth embodiments described in FIGS. 48 to 52 is mounted, a part of the device includes the light transmission member which transmits light incident on the solid-state imaging apparatus 1, the solid-state imaging apparatus 1 is arranged in a further inner direction of the device than this light transmission member, in other words, at the destination where the light transmitted through the light transmission member is made incident, and the solid-state imaging apparatus 1 may be directly fixed to the light transmission member.

Alternatively, in the device on which the solid-state imaging apparatus 1 according to any one of the second to sixth embodiments described in FIGS. 48 to 52 is mounted, a part of the device includes the light transmission member which transmits light incident on the solid-state imaging apparatus 1, the solid-state imaging apparatus 1 is arranged in a further inner direction of the device than this light transmission member, in other words, at the destination where the light transmitted through the light transmission member is made incident, and the solid-state imaging apparatus 1 may be indirectly fixed to the light transmission member. That is, the solid-state imaging apparatus 1 may be fixed to a second member fixed to the light transmission member.

With these configurations, it is possible to protect the surface of the solid-state imaging apparatus 1 by the light transmission member, for example, preventing the surface of the solid-state imaging apparatus 1 from being damaged.

19. Method of Manufacturing Fourth Embodiment

Next, with reference to FIGS. 55 to 70, a method of manufacturing the solid-state imaging apparatus 1 according to the fourth embodiment in FIG. 50, in which the protective substrate 18 is omitted, will be described.

Note that the manufacturing method described with reference to FIGS. 55 to 70 is a manufacturing method in a case where the upper and lower wiring connection structure is the twin-contact structure, like the manufacturing method described with reference to FIGS. 24 to 38.

First, the lower structure body 12 and the upper structure body 11 in a wafer state are separately manufactured.

For the lower structure body 12, the multilayered wiring layer 82, which becomes a part of the input/output circuit unit 49 and the row driving unit 22 or the column signal processing unit 25, is formed in a region which becomes each chip portion of the semiconductor substrate (silicon substrate) 81. The semiconductor substrate 81 at this point is in a state before being thinned, and has a thickness of, for example, about 600 µm.

On the other hand, for the upper structure body 11, the photodiode 51 and the source/drain region of the pixel transistor of each pixel 31 are formed in a region which becomes a chip portion of the semiconductor substrate (silicon substrate) 101. Moreover, the multilayered wiring layer 102 constituting the row driving signal lines 32, the vertical signal lines 33, and the like is formed on one face of the semiconductor substrate 101. The semiconductor substrate 101 at this point is also in a state before being thinned, and has a thickness of, for example, about 600 µm.

Figure 55:
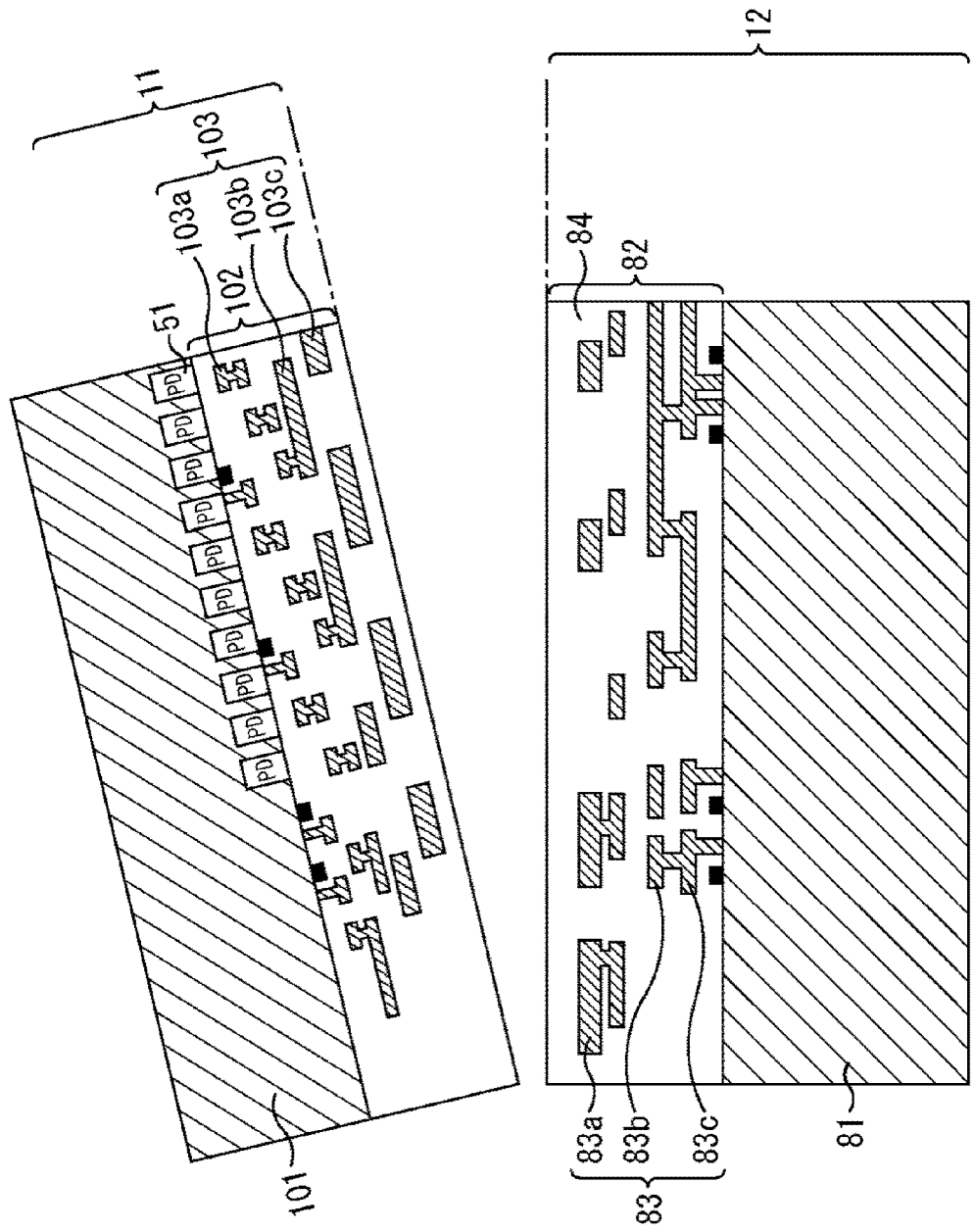
FIG. 55 is a diagram illustrating a method of manufacturing the solid-state imaging apparatus according to the fourth embodiment.
Figure 56:
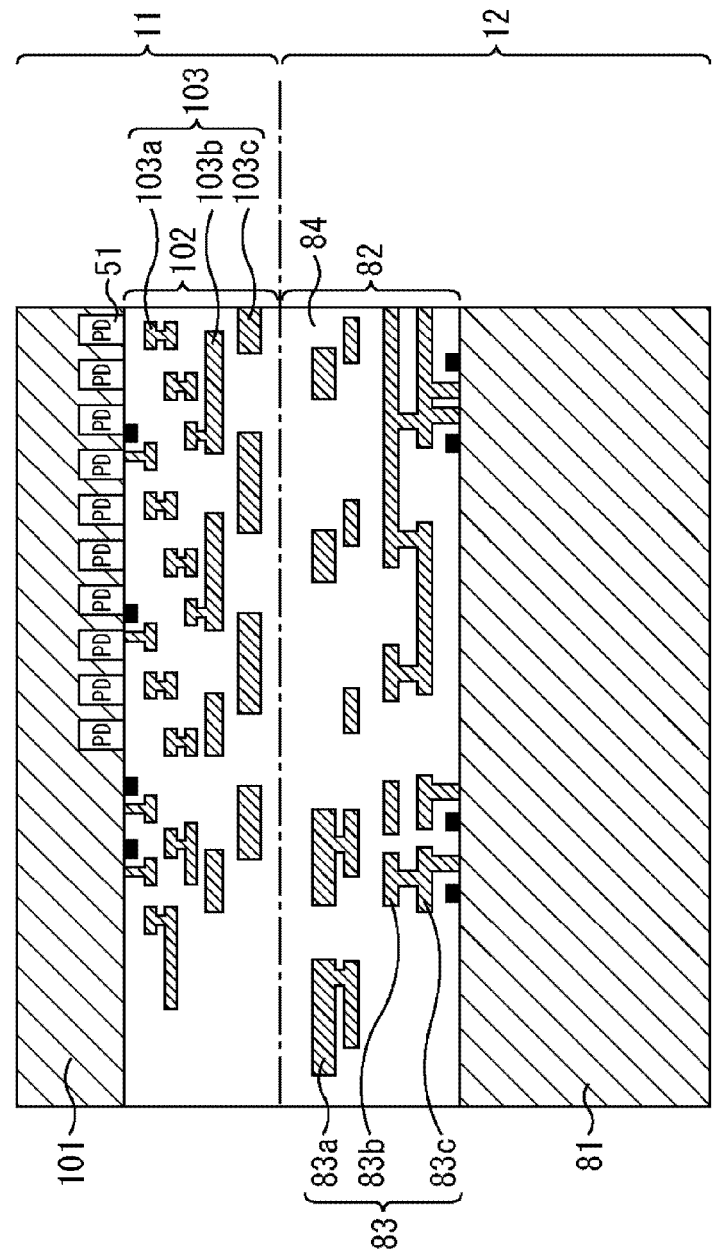
FIG. 56 is a diagram illustrating the method of manufacturing the solid-state imaging apparatus according to the fourth embodiment.

Then, as shown in FIG. 55, the multilayered wiring layer 82 side of the lower structure body 12 and the multilayered wiring layer 102 side of the upper structure body 11 in the manufactured wafer state are affixed so as to face each other. Thereafter, as shown in FIG. 56, the semiconductor substrate 101 of the upper structure body 11 is thinned. The affixing is, for example, plasma bonding or bonding with an adhesive, but the affixing is performed by plasma bonding in the fourth embodiment. In the case of the plasma bonding, a film such as a plasma TEOS film, a plasma SiN film, a SiON film (block film), or a SiC film is formed on both the bonding faces of the upper structure body 11 and the lower structure body 12, and the bonding faces are superposed by plasma treatment and then subjected to annealing treatment so that both bonding faces are bonded.

Figure 57:
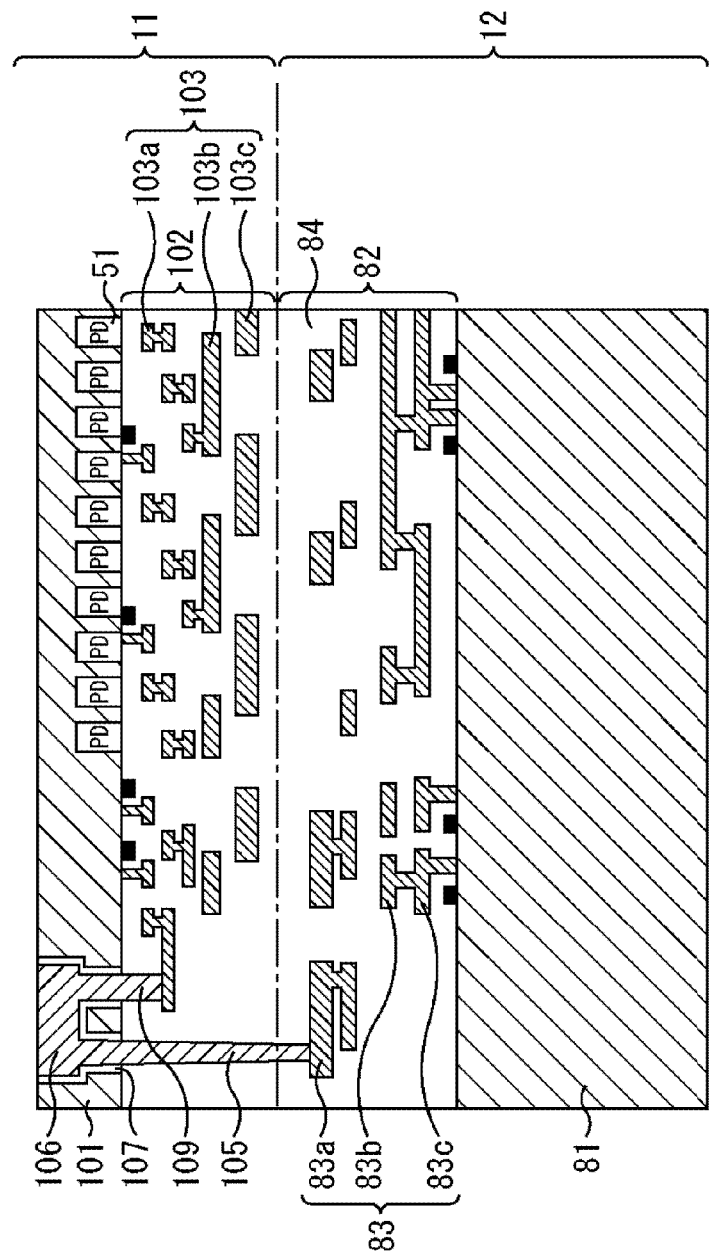
FIG. 57 is a diagram illustrating the method of manufacturing the solid-state imaging apparatus according to the fourth embodiment.

After the semiconductor substrate 101 of the upper structure body 11 is thinned, the silicon through electrode 109, the chip through electrode 105, and the connection wiring 106 connecting therebetween are formed by using a damascene method or the like in the region to be the upper and lower wiring connection region 314 as shown in FIG. 57.

Figure 58:
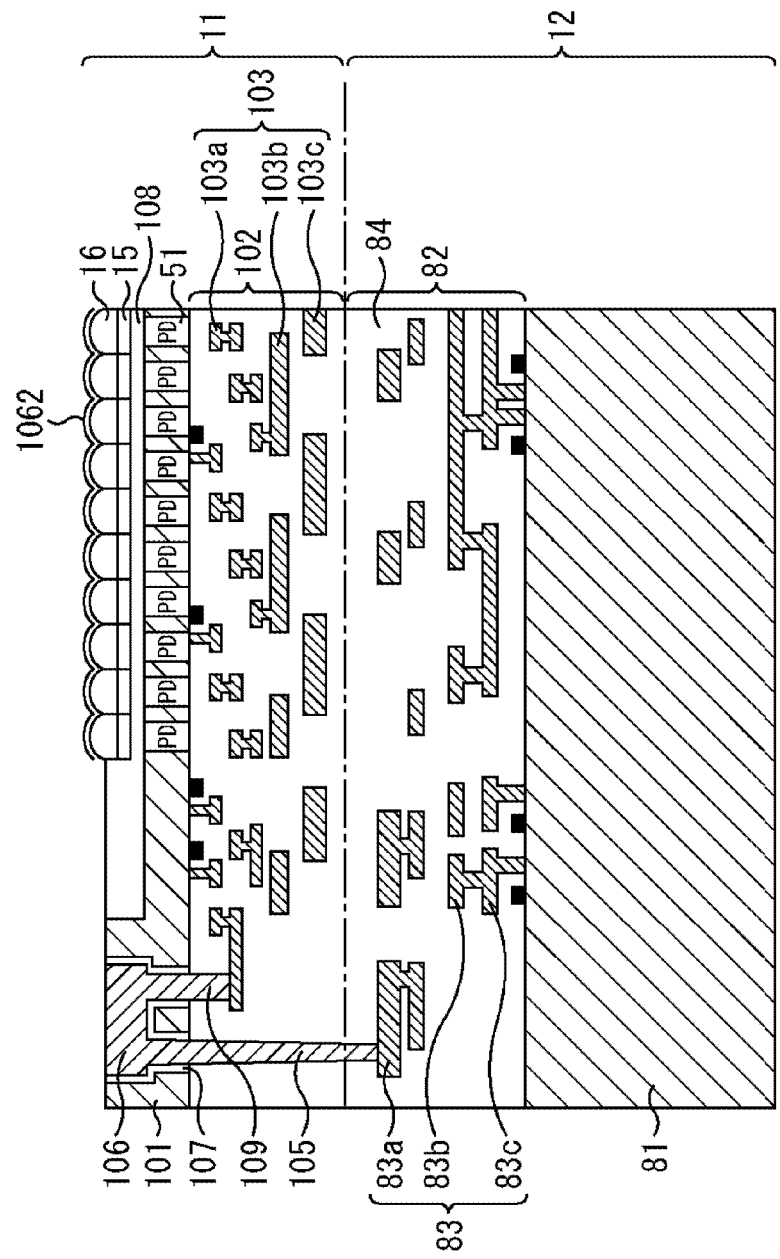
FIG. 58 is a diagram illustrating the method of manufacturing the solid-state imaging apparatus according to the fourth embodiment.

Next, as shown in FIG. 58, the color filters 15 and the on-chip lenses 16 are formed above the photodiode 51 of each pixel 31 with the planarized film 108 interposed therebetween. Moreover, the antireflection film 1062 is formed on the upper faces of the on-chip lenses 16.

Figure 59:
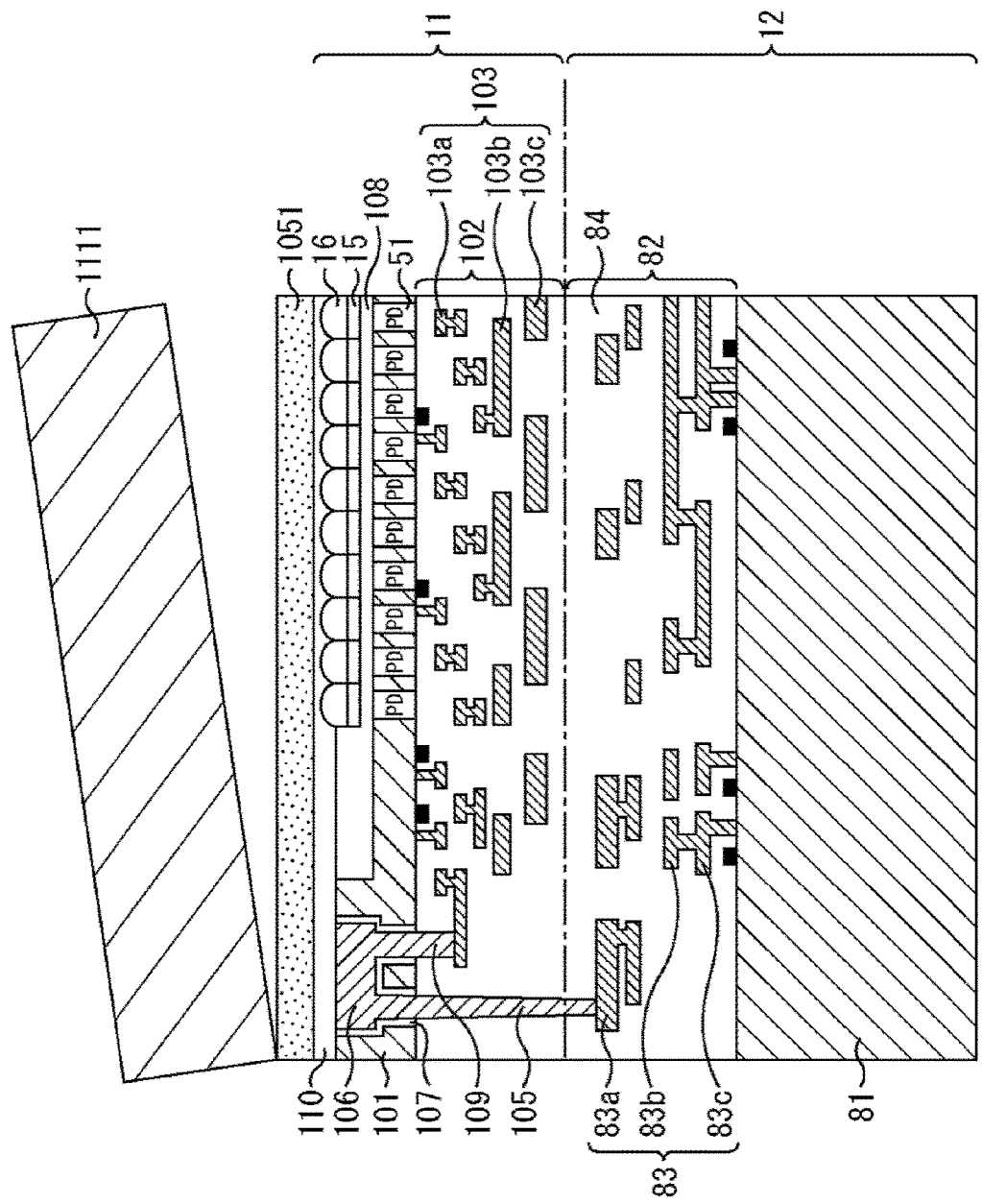
FIG. 59 is a diagram illustrating the method of manufacturing the solid-state imaging apparatus according to the fourth embodiment.
Figure 60:
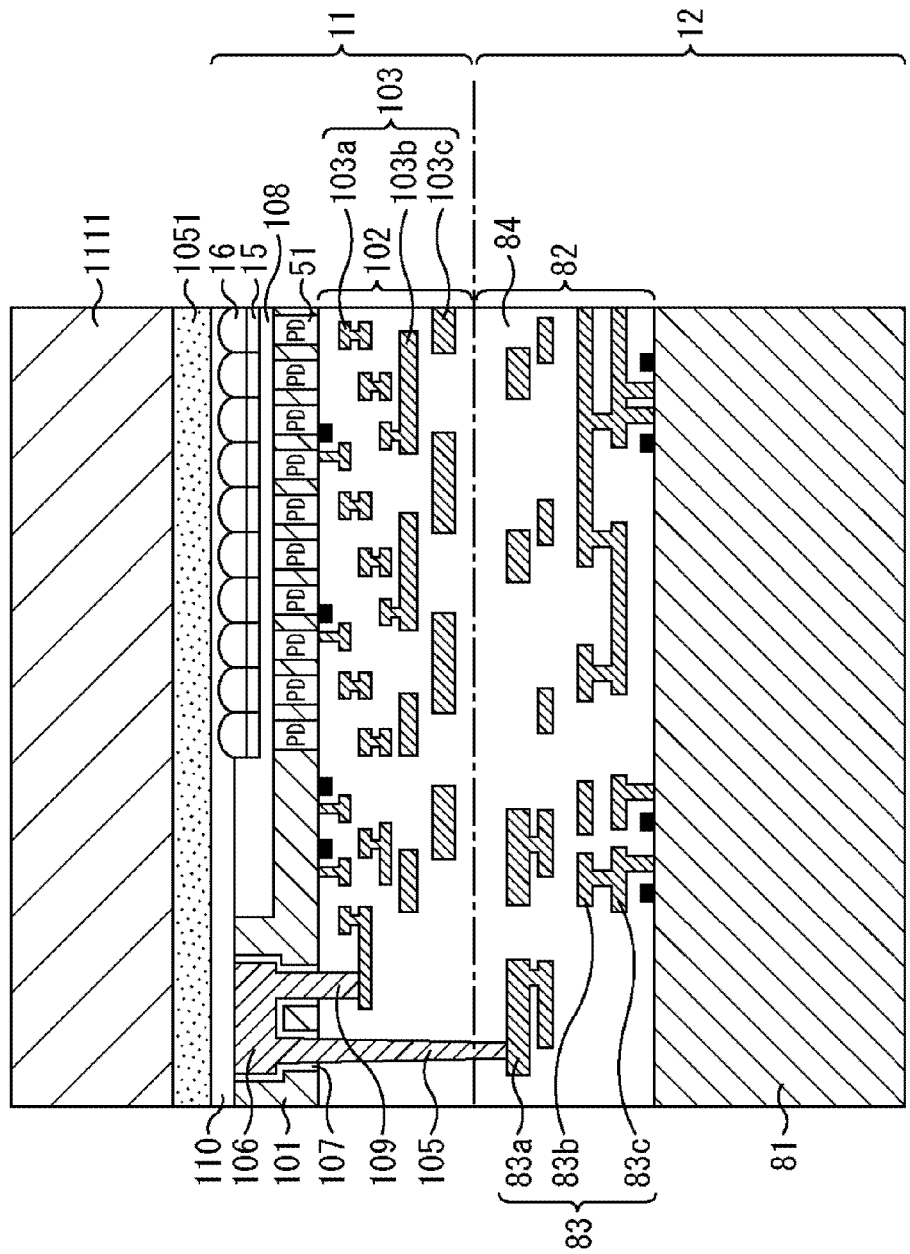
FIG. 60 is a diagram illustrating the method of manufacturing the solid-state imaging apparatus according to the fourth embodiment.

Then, the entire face, on which the on-chip lenses 16 of the affixed upper structure body 11 and the lower structure body 12 are formed, is coated with the planarized film 110 and the resin layer 1051 as shown in FIG. 59, and the silicon substrate 1111 as a support substrate is connected to the resin layer 1051 as shown in FIG. 60. In a case where the planarized film 110 also has a function of an antireflection film, the antireflection film 1062 shown in FIG. 58 can be omitted.

Figure 61:
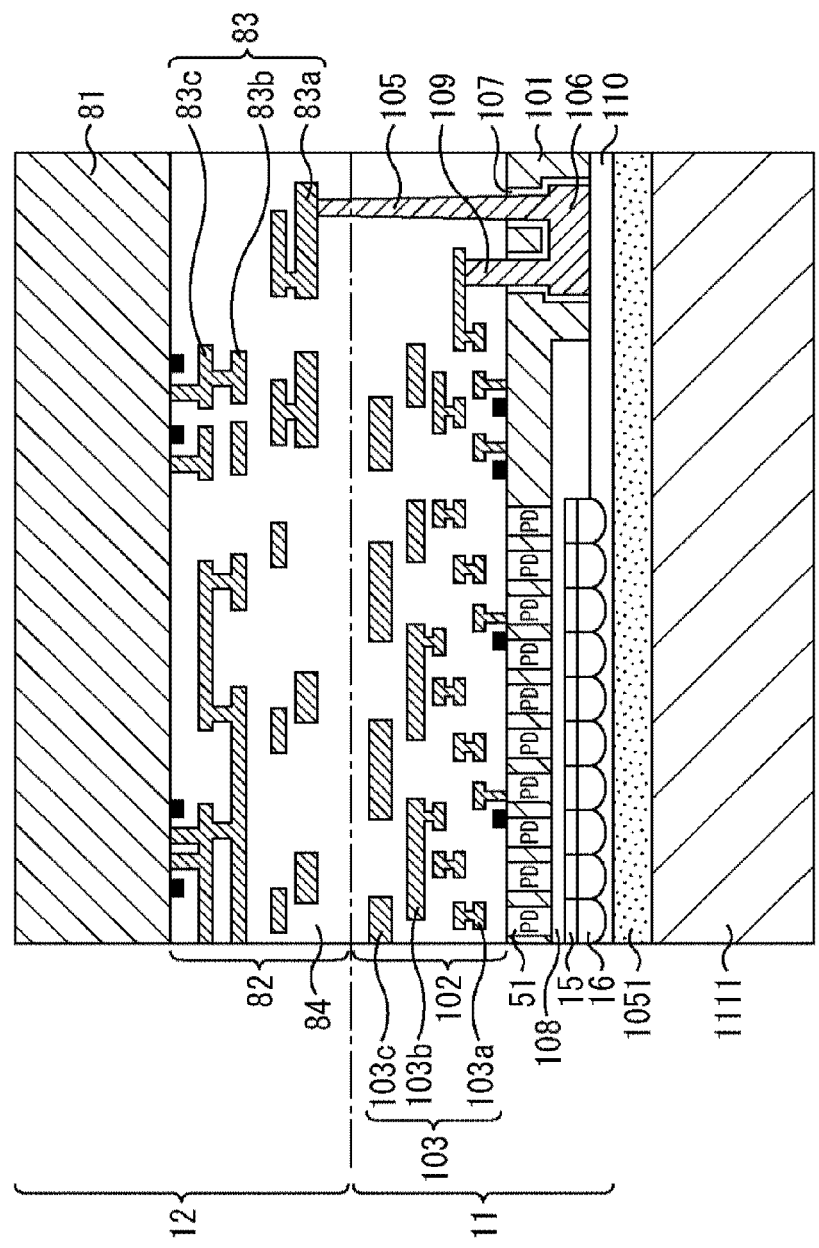
FIG. 61 is a diagram illustrating the method of manufacturing the solid-state imaging apparatus according to the fourth embodiment.

Next, as shown in FIG. 61, after the entire affixed upper structure body 11 and lower structure body 12 is inverted, the semiconductor substrate 81 of the lower structure body 12 is thinned to a thickness which does not affect the device characteristics, for example, to about 30 to 100 µm.

Figure 62:
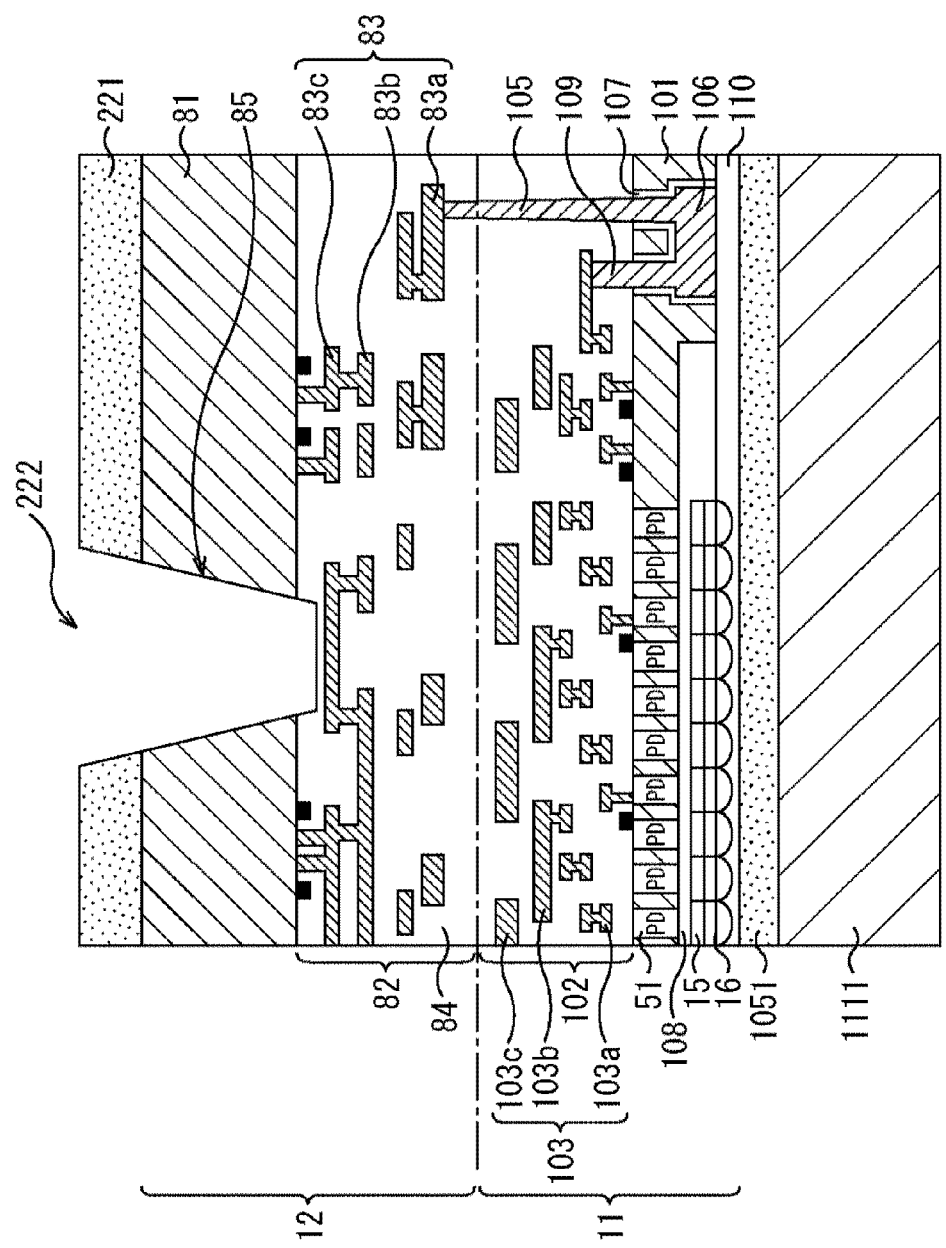
FIG. 62 is a diagram illustrating the method of manufacturing the solid-state imaging apparatus according to the fourth embodiment.

Next, as shown in FIG. 62, after the photoresist 221 is patterned so as to open the position where the through via 88 (not shown) is arranged on the thinned semiconductor substrate 81, a part of the semiconductor substrate 81 and the underlying interlayer insulating film 84 are removed by dry etching, thereby forming an opening portion 222 including the silicon through hole 85.

Figure 63:
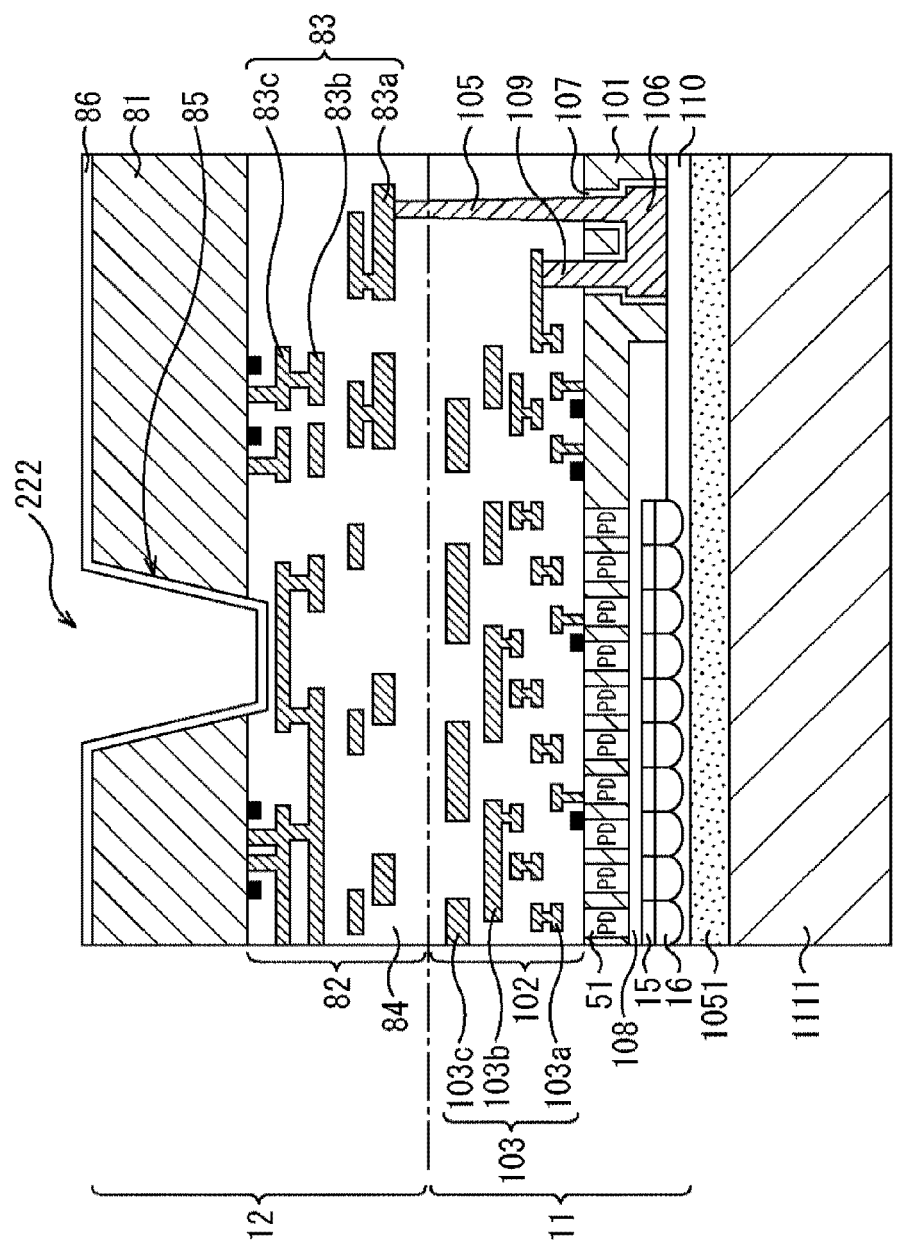
FIG. 63 is a diagram illustrating the method of manufacturing the solid-state imaging apparatus according to the fourth embodiment.

Next, as shown in FIG. 63, the insulating film 86 is formed by, for example, a plasma CVD method on the entire upper face of the semiconductor substrate 81 including the opening portion 222. As described above, the insulating film 86 can be, for example, a SiO2 film, a SiN film, or the like.

Figure 64:
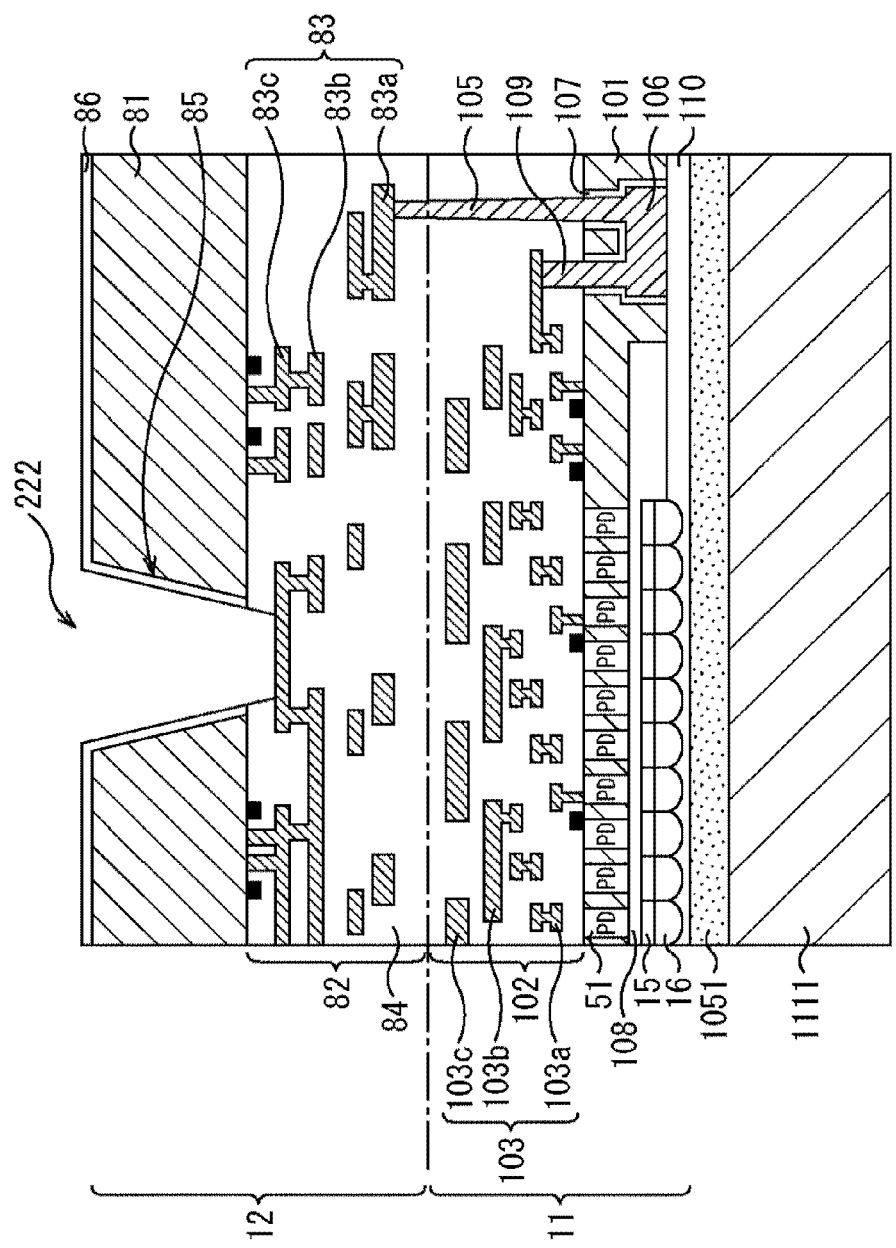
FIG. 64 is a diagram illustrating the method of manufacturing the solid-state imaging apparatus according to the fourth embodiment.

Next, as shown in FIG. 64, the insulating film 86 on the bottom face of the opening portion 222 is removed by using, for example, an etch-back method, and the wiring layer 83c closest to the semiconductor substrate 81 is exposed.

Figure 65:
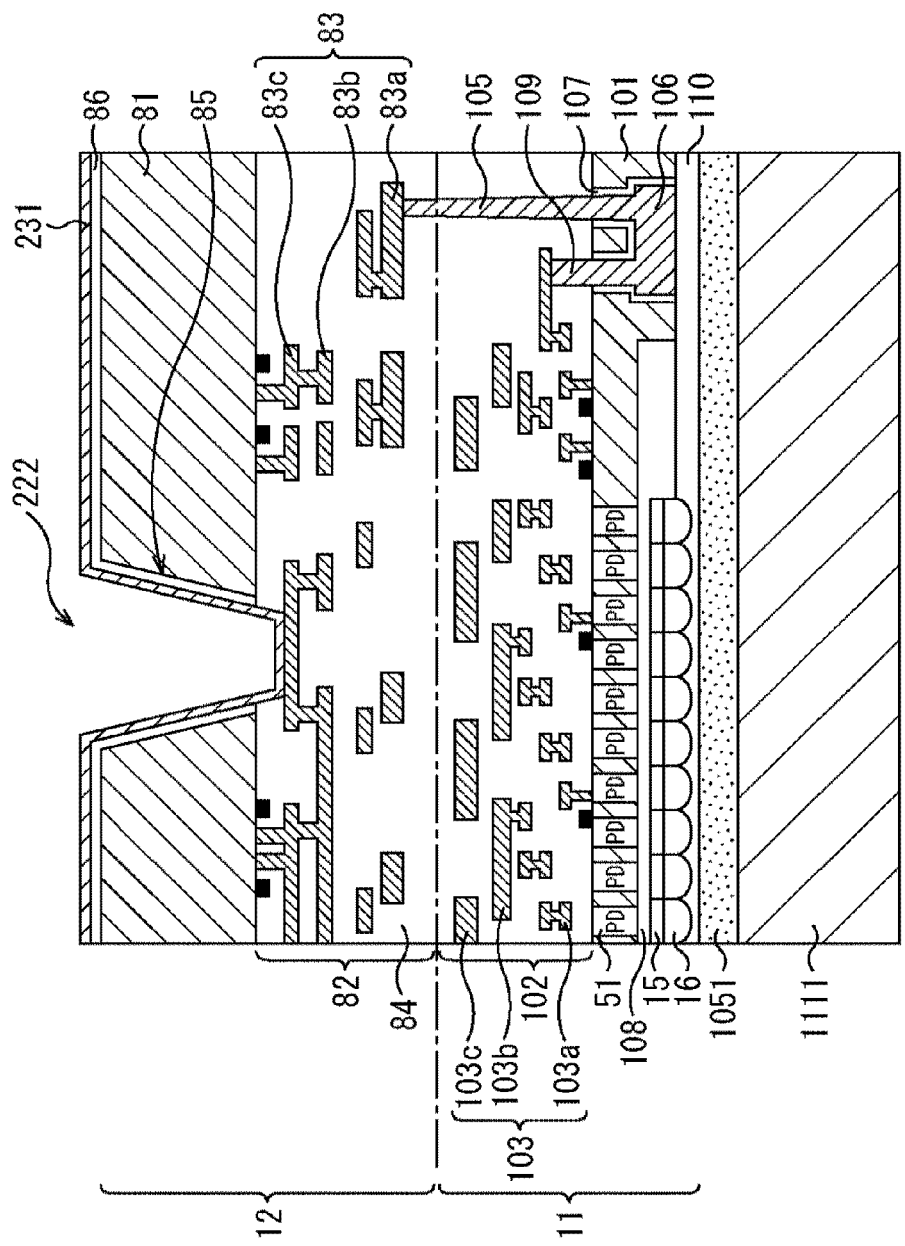
FIG. 65 is a diagram illustrating the method of manufacturing the solid-state imaging apparatus according to the fourth embodiment.

Next, as shown in FIG. 65, a barrier metal film (not shown) and a Cu seed layer 231 are formed by using a sputtering method. The barrier metal film is a film for preventing the diffusion of the connection conductor 87 (Cu) shown in FIG. 66, and the Cu seed layer 231 serves as an electrode for embedding the connection conductor 87 by an electrolytic plating method. As a material of the barrier metal film, tantalum (Ta), titanium (Ti), tungsten (W), zirconium (Zr), a nitride film thereof, a carbonized film thereof, or the like can be used. In the fourth embodiment, titanium is used as the barrier metal film.

Figure 66:
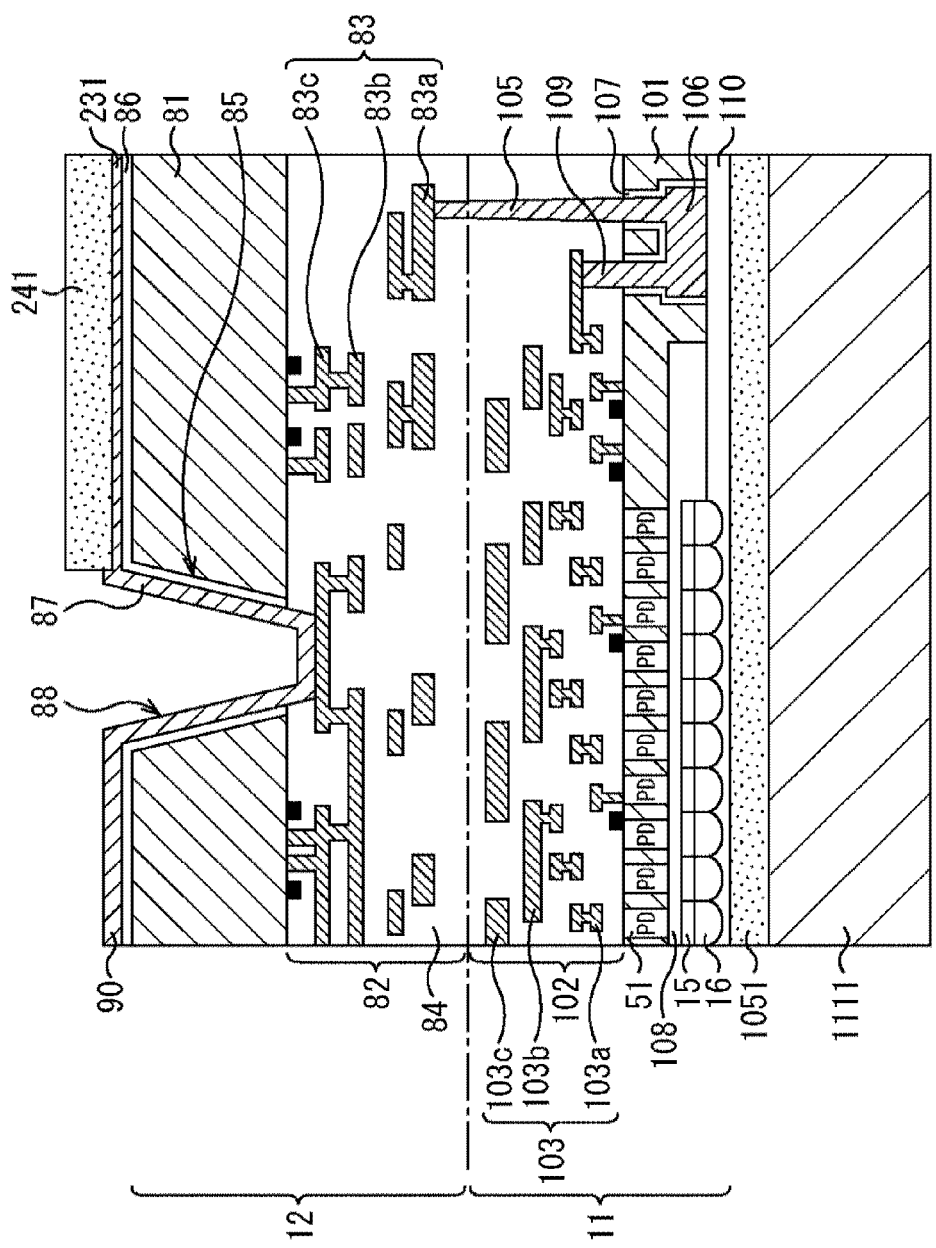
FIG. 66 is a diagram illustrating the method of manufacturing the solid-state imaging apparatus according to the fourth embodiment.

Next, as shown in FIG. 66, after a resist pattern 241 is formed on a predetermined region on the Cu seed layer 231, copper (Cu) as the connection conductor 87 is used for plating by an electrolytic plating method. Thus, the through via 88 is formed, as well as the rewiring 90 is also formed on the upper side of the semiconductor substrate 81.

Figure 67:
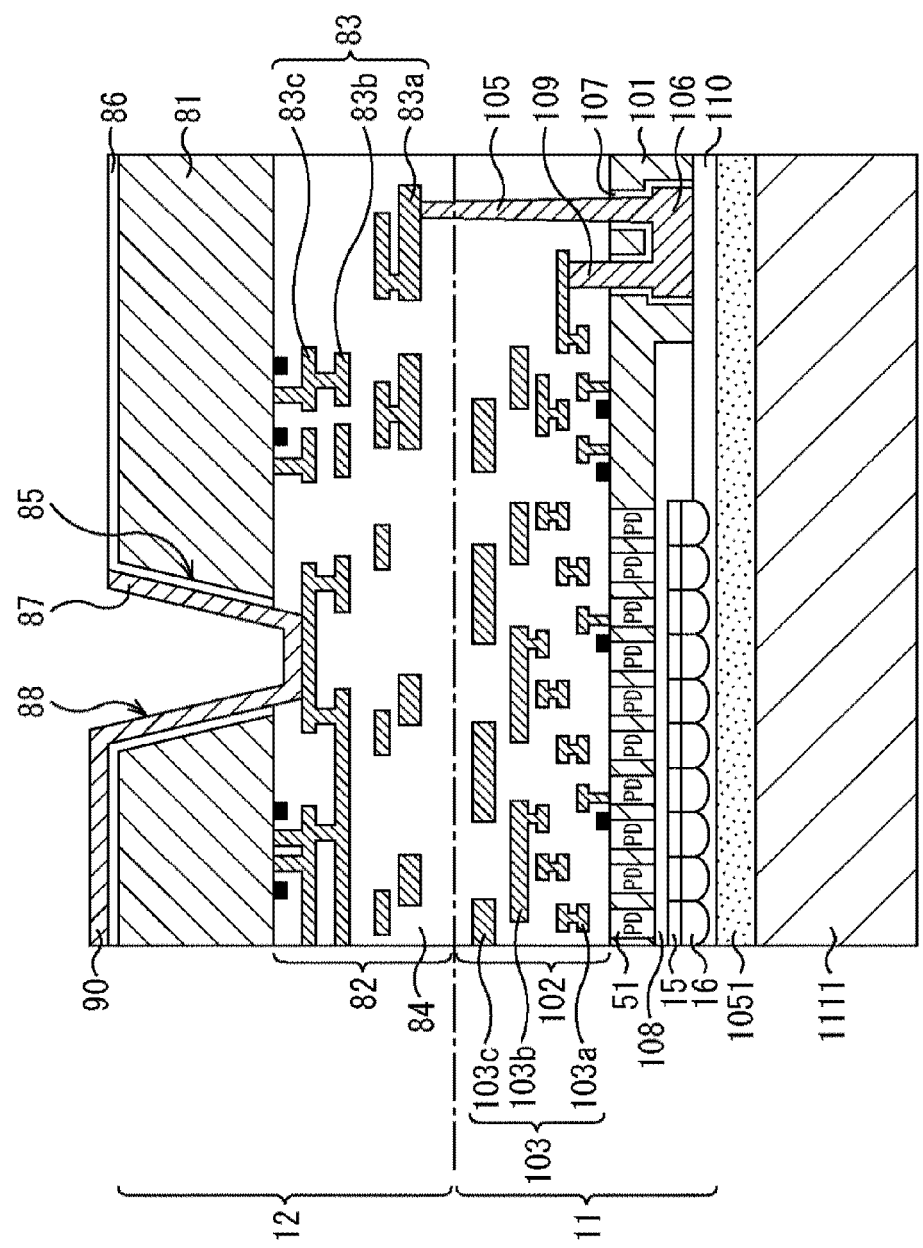
FIG. 67 is a diagram illustrating the method of manufacturing the solid-state imaging apparatus according to the fourth embodiment.

Next, as shown in FIG. 67, after the resist pattern 241 is removed, the barrier metal film (not shown) and the Cu seed layer 231 under the resist pattern 241 are removed by wet etching.

Figure 68:
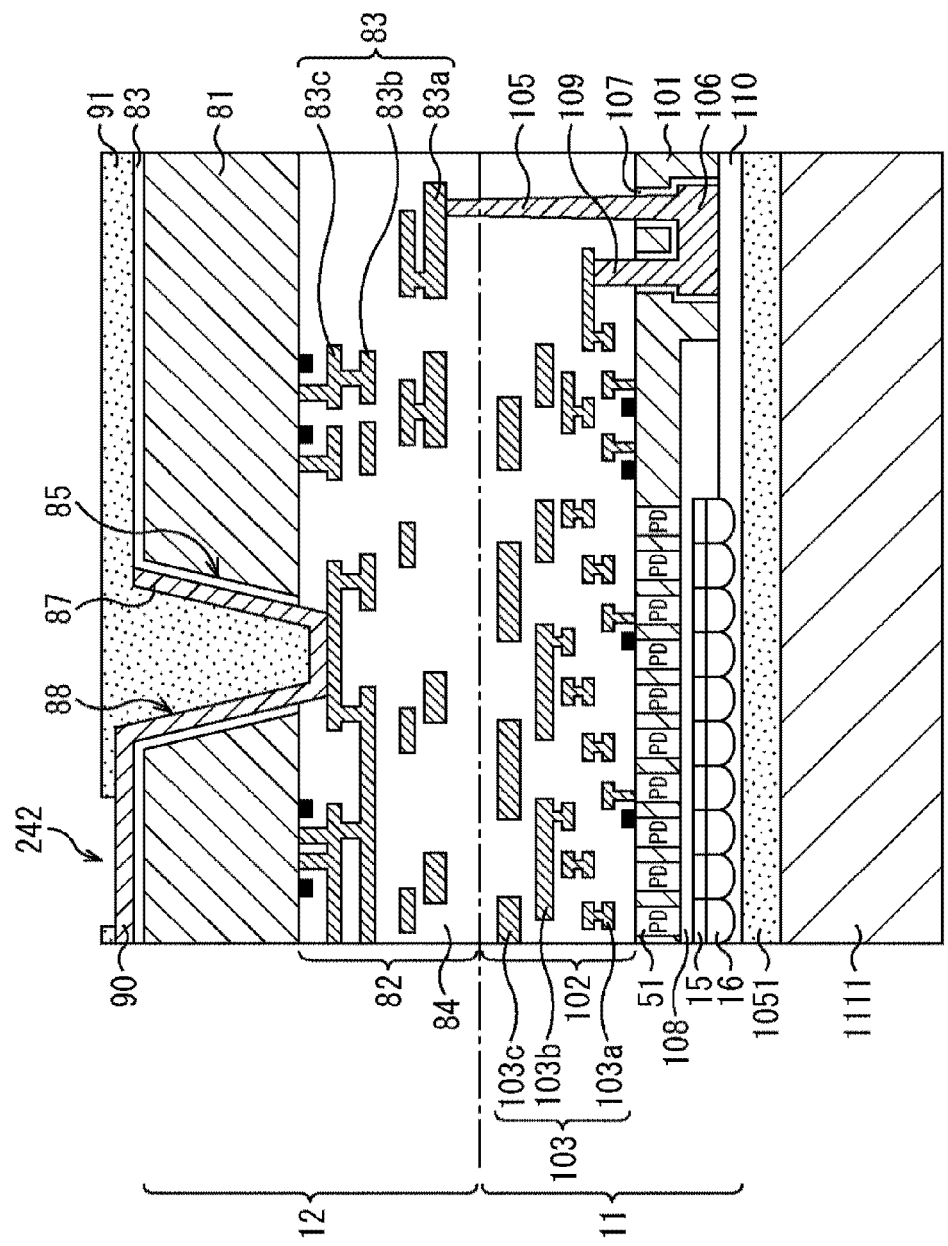
FIG. 68 is a diagram illustrating the method of manufacturing the solid-state imaging apparatus according to the fourth embodiment.

Next, as shown in FIG. 68, after the solder mask 91 is formed to protect the rewiring 90, the solder mask 91 is removed only in the region where the external terminal 14 is mounted, thereby forming a solder mask opening portion 242.

Figure 69:
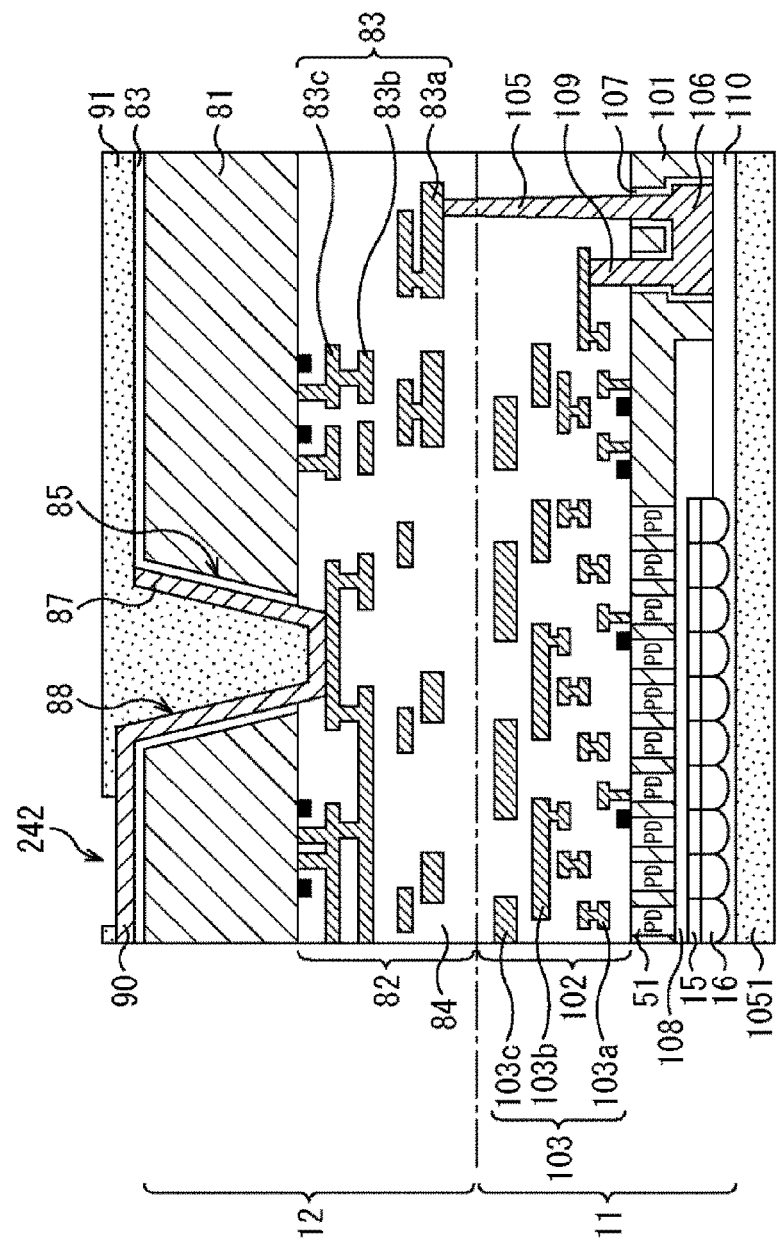
FIG. 69 is a diagram illustrating the method of manufacturing the solid-state imaging apparatus according to the fourth embodiment.

Then, as shown in FIG. 69, the silicon substrate 1111 as a support substrate connected to the upper structure body 11 is peeled off. Thus, the outermost surface of the upper structure body 11 becomes the resin layer 1051.

Figure 70:
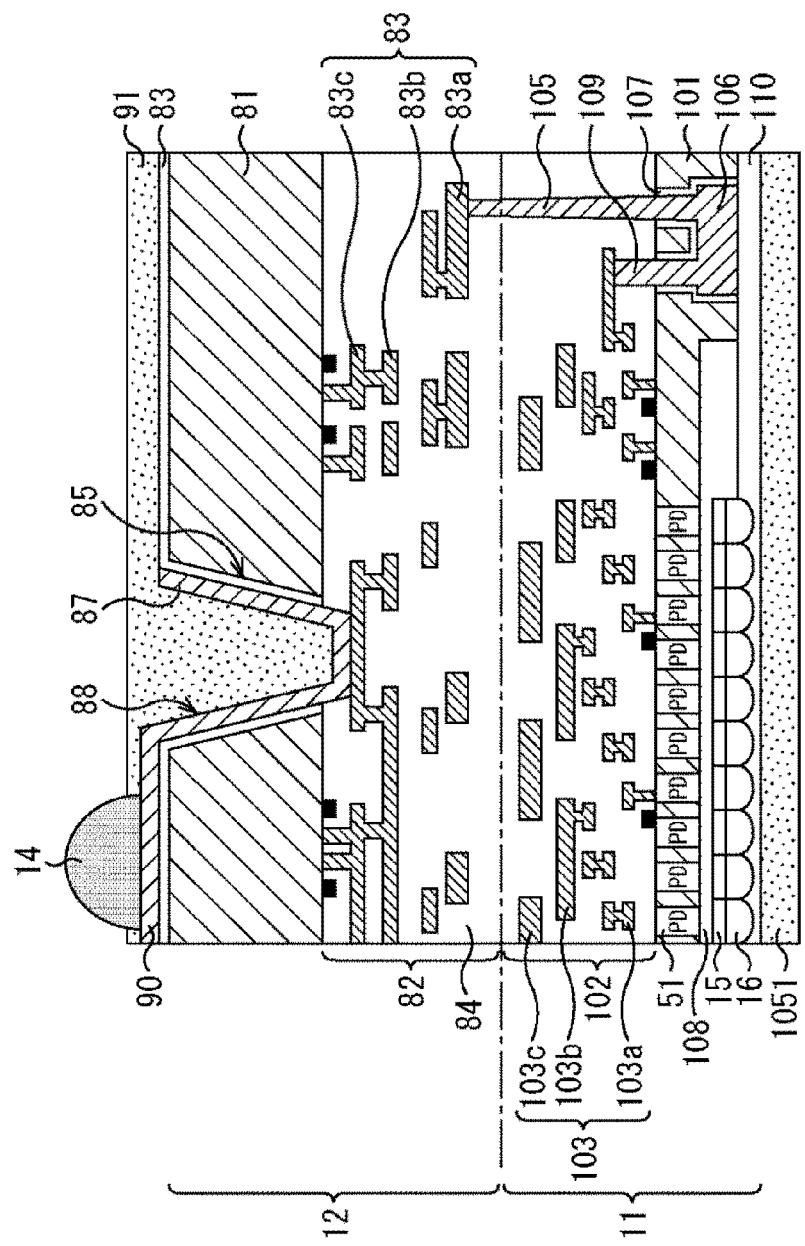
FIG. 70 is a diagram illustrating the method of manufacturing the solid-state imaging apparatus according to the fourth embodiment.

Finally, as shown in FIG. 70, the external terminal 14 is formed in the solder mask opening portion 242 in FIG. 69 by a solder ball mounting method or the like.

As described above, according to the manufacturing method described with reference to FIGS. 55 to 70, the upper structure body 11 (first semiconductor substrate), at which the photodiodes 51, which perform photoelectric conversion, the pixel transistor circuits and the like are formed, and the lower structure body 12 (second semiconductor substrate), at which the input/output circuit units 49 for outputting the pixel signals outputted from the pixels 31 to the outside of the solid-state imaging apparatus 1 are formed under the pixel array unit 24, are first affixed such that the wiring layers face each other. Then, the through via 88 penetrating the lower structure body 12 is formed, and the external terminal 14, which is electrically connected to the outside of the solid-state imaging apparatus 1 through the input/output circuit units 49 and the through via 88, is formed. Accordingly, the solid-state imaging apparatus 1 according to the fourth embodiment shown in FIG. 50 can be manufactured.

Note that, since the external terminal 14 is formed after the silicon substrate 1111 as a support substrate is peeled off as described above, the external terminal 14 may be formed by a method which does not apply a force to the resin layer 1051, such as solder paste printing, instead of the solder ball mounting method. Alternatively, a solder ball may be formed on an interposer substrate side, on which the solid-state imaging apparatus 1 is mounted, without providing the external terminal 14 on the solid-state imaging apparatus 1 side, and electrically connected to the rewiring 90 of the solid-state imaging apparatus 1.

The manufacturing method of the fourth embodiment described above is a manufacturing method in the case where the upper and lower wiring connection structure is the twin-contact structure. However, even if the upper and lower wiring connection structure is the Cu—Cu direct bonding structure, it is needless to say that the apparatus can be prepared. In this case, the difference between the manufacturing method described with reference to FIGS. 24 to 38 and the manufacturing method described with reference to FIGS. 55 to 70 can be similarly applied to the manufacturing method in the case of the Cu—Cu direct bonding structure described with reference to FIGS. 39 to 43 to manufacture the apparatus.

Note that, in a case where the rib structure body 1061 is formed as in the solid-state imaging apparatus 1 according to the fifth embodiment shown in FIG. 51 or the solid-state imaging apparatus 1 according to the sixth embodiment shown in FIG. 52, for example, a step of forming the rib structure body 1061 is added after the step of forming the silicon through electrode 109, the chip through electrode 105, and the connection wiring 106 shown in FIG. 57.

Figure 71:
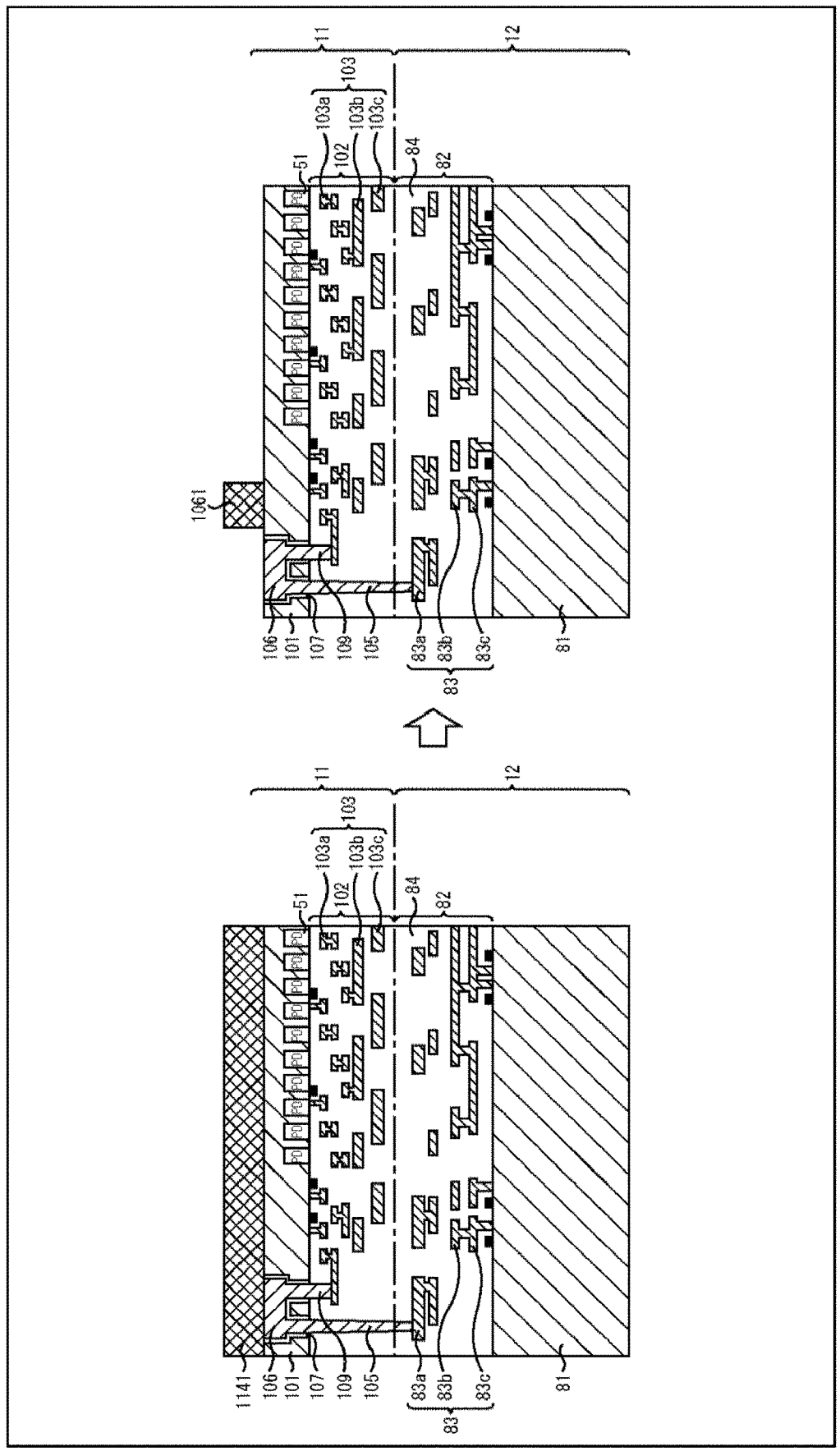
FIG. 71 is a diagram illustrating a method of manufacturing the solid-state imaging apparatuses according to the fifth and six embodiments.

Specifically, as shown in FIG. 71, after a metal film 1141 of tungsten (W) or the like is formed over the entire face of the semiconductor substrate 101 of the upper structure body 11, patterning is performed by using a photolithography technology, and the metal film 1141 in a region other than a desired region is removed by dry etching or wet etching so that the rib structure body 1061 can be formed.

Figure 72:
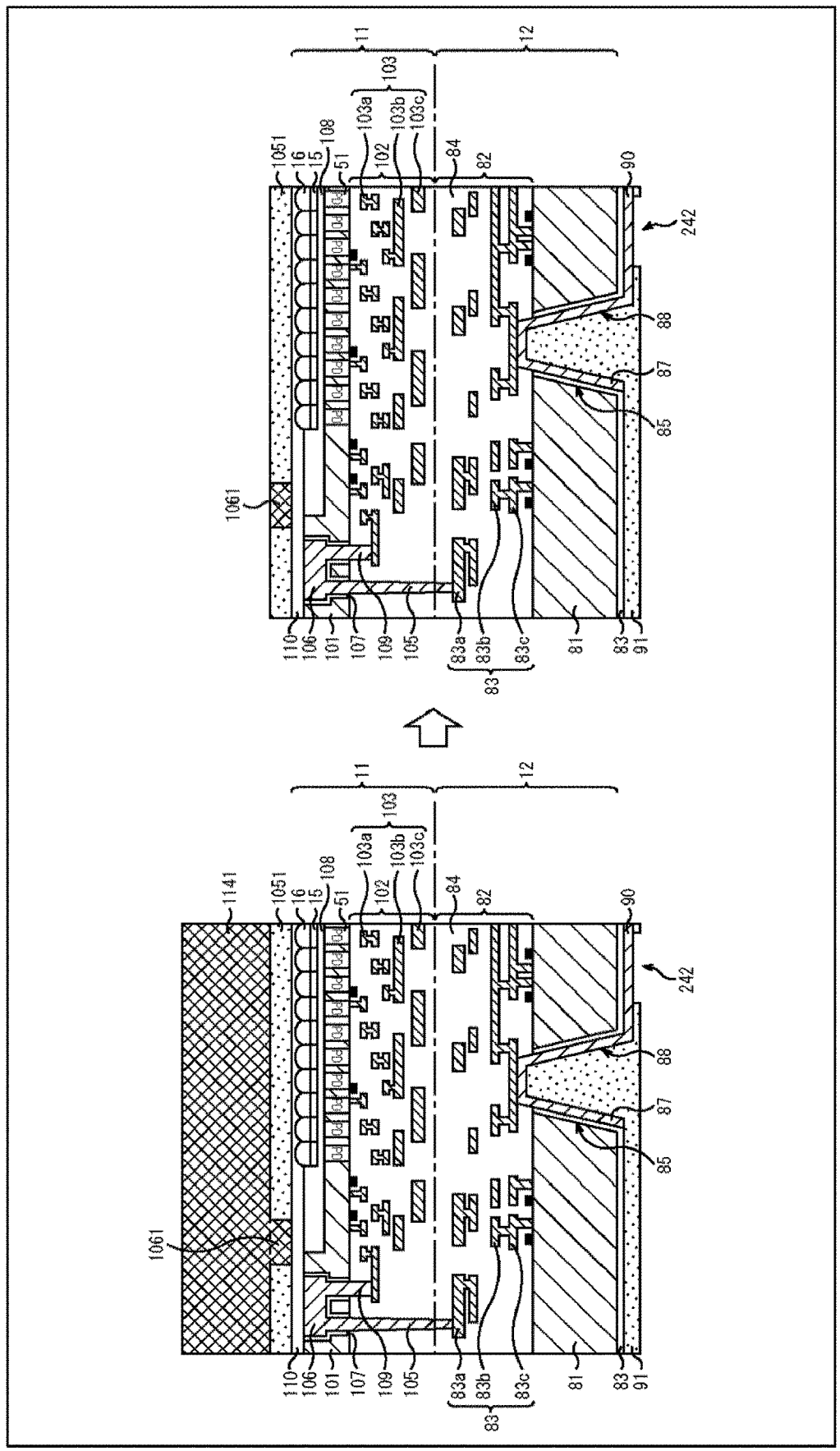
FIG. 72 is a diagram illustrating the method of manufacturing the solid-state imaging apparatuses according to the fifth and six embodiments.

Alternatively, the step of connecting the silicon substrate 1111 as a support substrate to the resin layer 1051 described with reference to FIG. 60 is changed to a step of connecting a silicon substrate 1141, which is processed in advance so as to have the shape of the rib structure body 1061, to the resin layer 1051 as shown in FIG. 72, and the silicon substrate 1141 is scraped off by chemical mechanical polishing (CMP) to leave only the rib structure body 1061, replacing the step of peeling off the silicon substrate 1111 shown in FIG. 69, so that the rib structure body 1061 can also be formed.

20. Seventh Embodiment of Solid-State Imaging Apparatus

Figure 73:
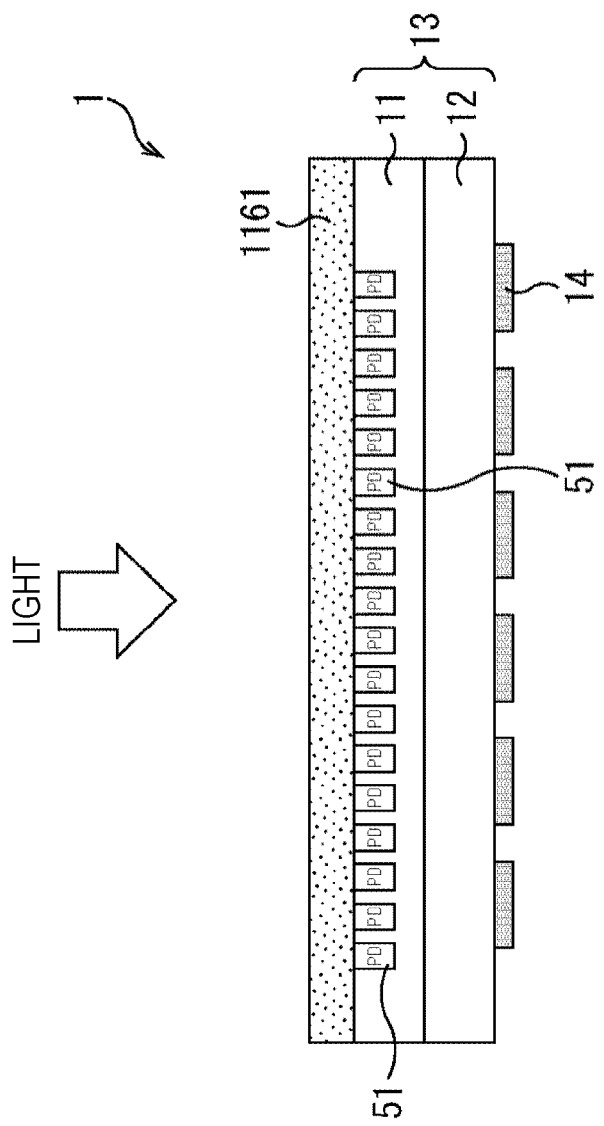
FIG. 73 is a cross-sectional view showing a schematic structure of a seventh embodiment of the solid-state imaging apparatus.

FIG. 73 shows a schematic structure of a seventh embodiment of the solid-state imaging apparatus.

Comparing a solid-state imaging apparatus 1 according to the seventh embodiment shown in FIG. 73 with that according to the first embodiment shown in FIG. 1, the color filters 15, the on-chip lenses 16, and the protective substrate 18, which have been formed at the upper structure body 11 in the first embodiment, are not formed in the solid-state imaging apparatus 1 according to the seventh embodiment. Then, above photodiodes 51 formed at an upper structure body 11 is coated with an antibody 1161, which reacts to a fluorescent protein used as a molecular or cell marker, and the uppermost surface on the light incident side of the apparatus is the antibody 1161.

The solid-state imaging apparatus 1 according to the seventh embodiment can be used as a DNA sensor.

Moreover, in a case where a chemically modified film which attaches charges is formed on the outermost surface on the light incident side of the apparatus instead of the antibody 1161 in the solid-state imaging apparatus 1 in FIG. 73, an ion sensor or a potential sensor can be realized. For the chemically modified film, for example, metal nanoparticles, polycrystalline silicon, carbon, graphite, or the like is used. For example, in a case of realizing a surface plasmon resonance biosensor (SRP biosensor) by the solid-state imaging apparatus 1, metal nanoparticles are applied as a chemically modified film instead of the antibody 1161.

21. Method of Manufacturing Seventh Embodiment

Next, with reference to FIGS. 74 to 78, a method of manufacturing the solid-state imaging apparatus 1 according to the seventh embodiment shown in FIG. 73 will be described.

Steps from bonding the upper structure body 11 and the lower structure body 12 until electrically connecting the upper structure body 11 and the lower structure body 12 by the two through electrodes (TSVs), the silicon through electrode 109 and the chip through electrode 105, are similar to the steps described with reference to FIGS. 55 to 57.

Figure 74:
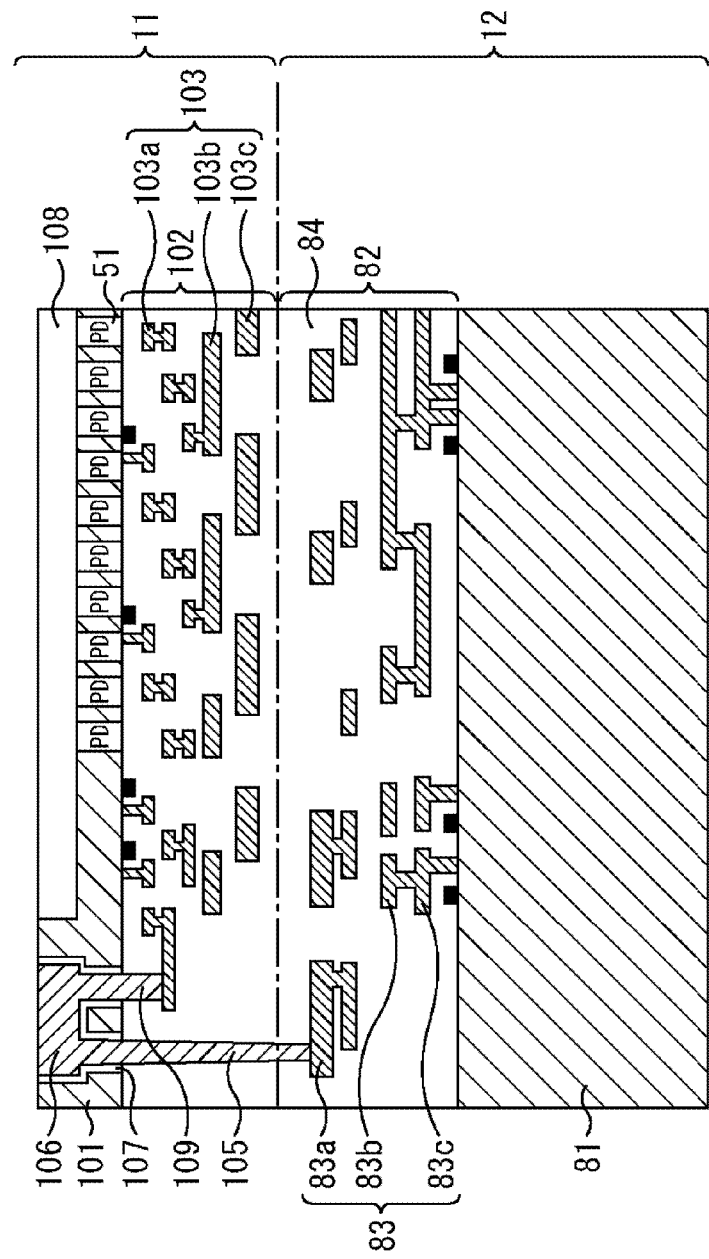
FIG. 74 is a diagram illustrating a method of manufacturing the solid-state imaging apparatus according to the seventh embodiment.

After the two through electrodes are formed, as shown in FIG. 74, the semiconductor substrate 101 above the photodiodes 51 of the upper structure body 11 is etched to form the planarized film 108.

Figure 75:
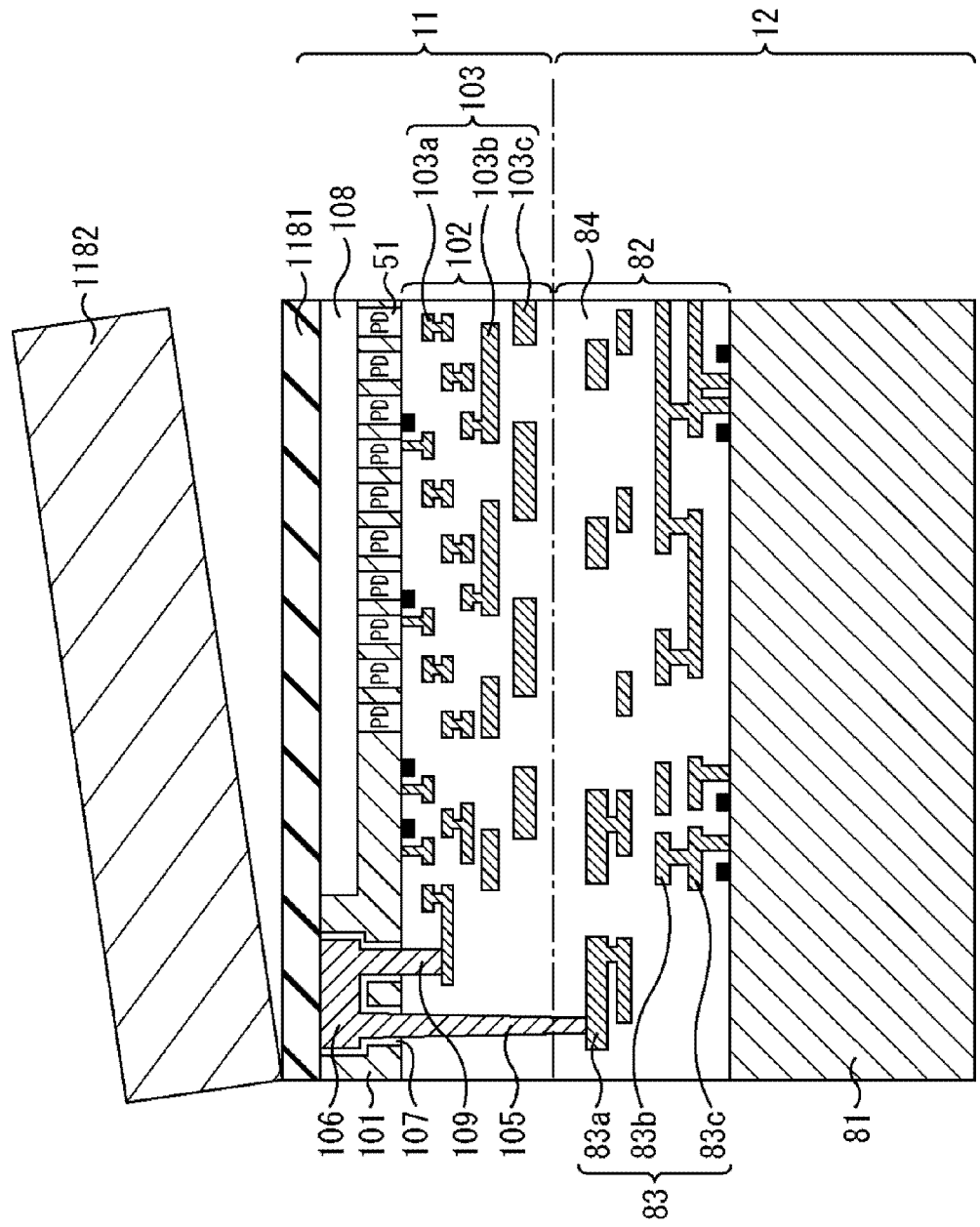
FIG. 75 is a diagram illustrating the method of manufacturing the solid-state imaging apparatus according to the seventh embodiment.

Next, as shown in FIG. 75, the silicon substrate 1182 as a support substrate is adhered onto the planarized film 108 of the upper structure body 11 by using an easily peelable tape 1181.

Figure 76:
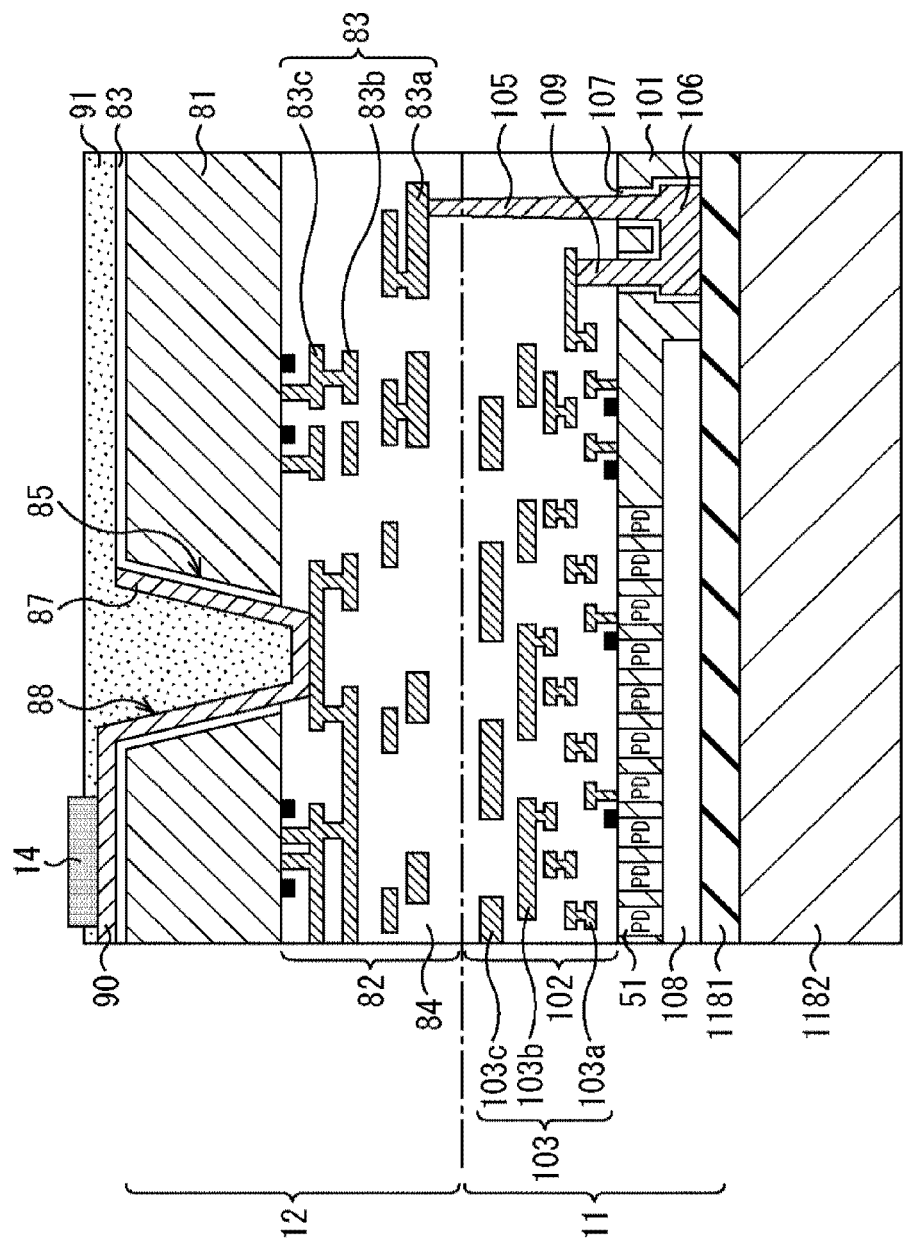
FIG. 76 is a diagram illustrating the method of manufacturing the solid-state imaging apparatus according to the seventh embodiment.

Thereafter, after steps similar to the steps described with reference to FIGS. 61 to 70 are carried out, an external terminal 14 is formed by, for example, solder paste printing as shown in FIG. 76.

Figure 77:
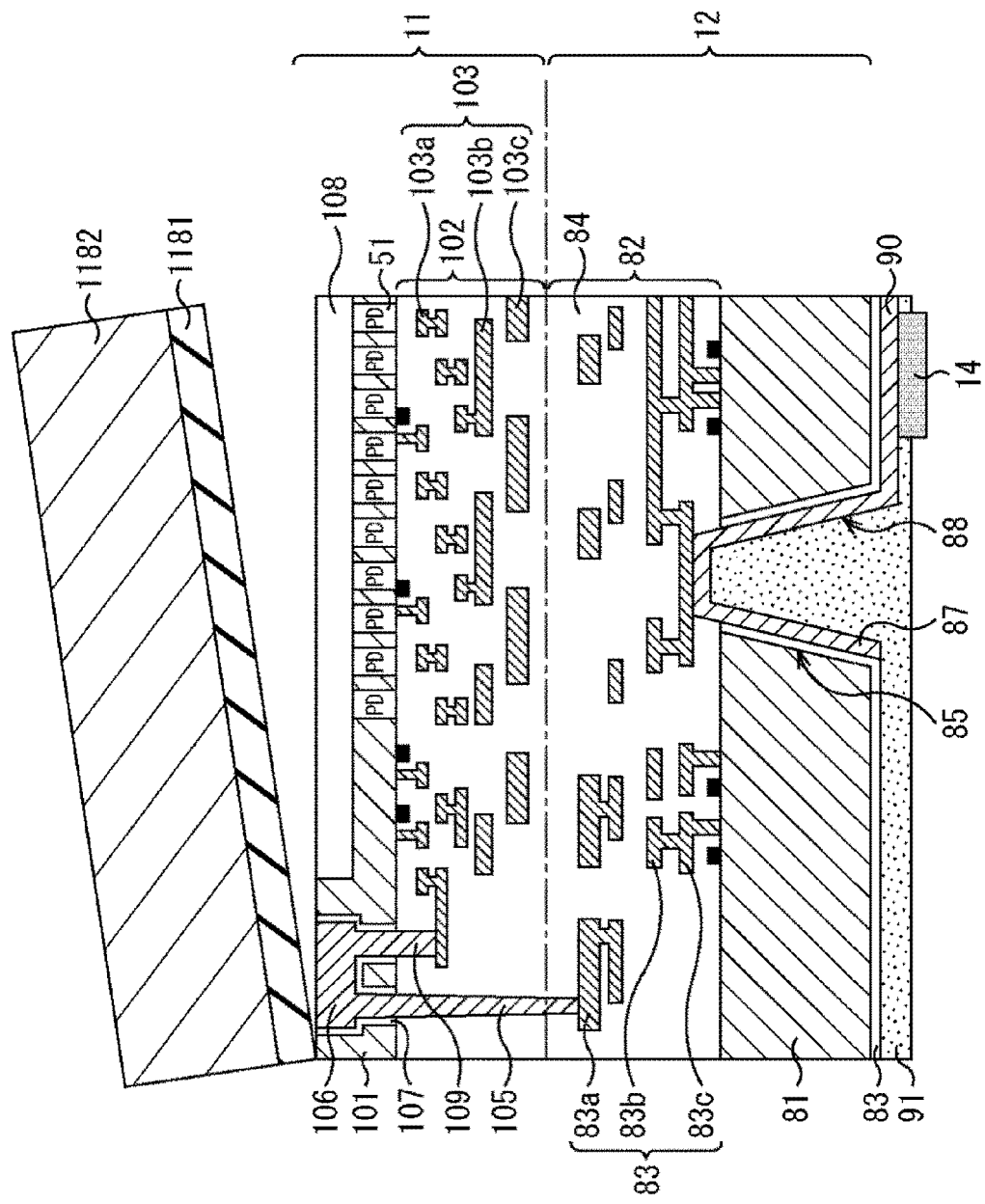
FIG. 77 is a diagram illustrating the method of manufacturing the solid-state imaging apparatus according to the seventh embodiment.

Then, as shown in FIG. 77, after the entire affixed upper structure body 11 and lower structure body 12 is inverted, the silicon substrate 1182 adhered by using the easily peelable tape 1181 is peeled off from the upper structure body 11 together with the tape 1181.

Figure 78:
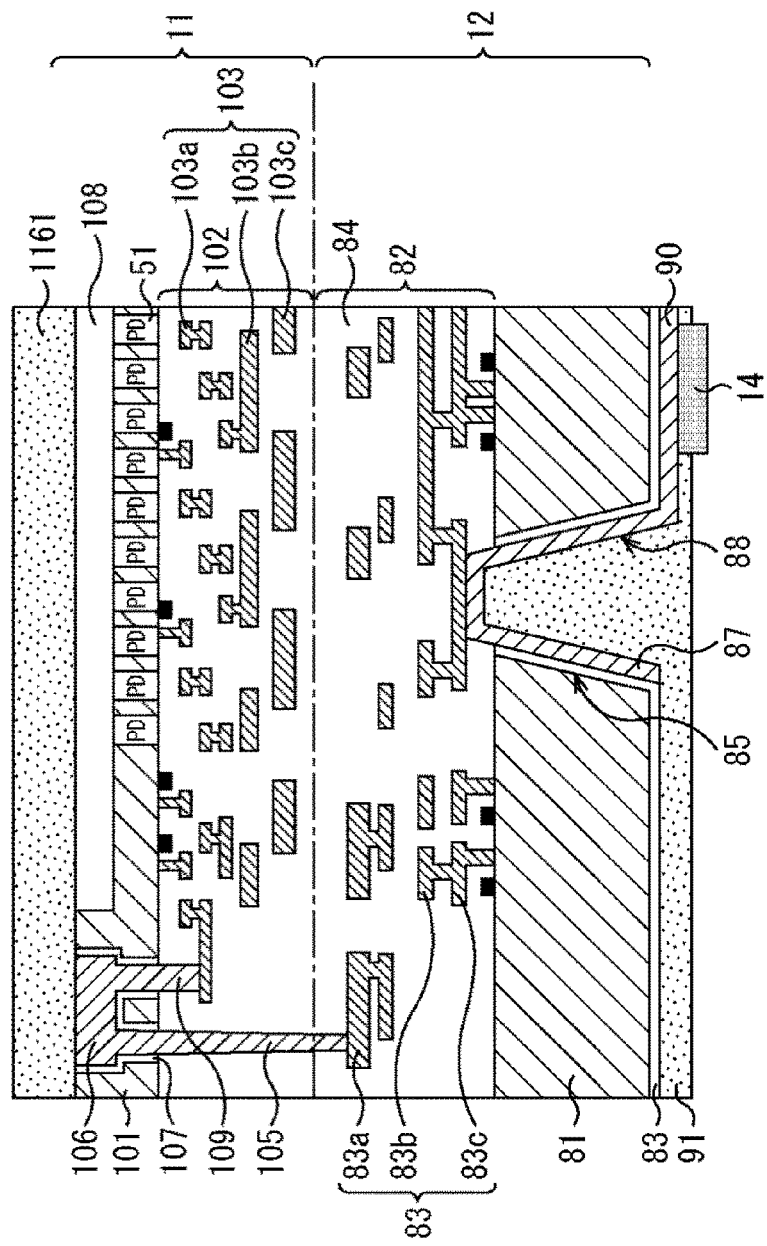
FIG. 78 is a diagram illustrating the method of manufacturing the solid-state imaging apparatus according to the seventh embodiment.

Finally, as shown in FIG. 78, the uppermost surface of the upper structure body 11 is coated with the antibody 1161, which reacts to the fluorescent protein used as a molecular or cell marker, thereby completing the solid-state imaging apparatus 1 according to the seventh embodiment. At this time, the antibody 1161 may be applied while the planarized film 108 is remained for the purpose of element protection as shown in FIG. 78. Alternatively, the antibody 1161 may be applied after the planarized film 108 is removed as shown in FIG. 73.

As described above, as the second to seventh embodiments, the structure of the solid-state imaging apparatus 1, in which the protective substrate 18 in the first embodiment has been omitted or replaced with another configuration, has been described. In the second to seventh embodiments, for the other structures of the upper structure body 11 and the lower structure body 12, for example, the circuit arrangement configurations of the input circuit unit 42 and the output circuit unit 47, and the like, various structures can be adopted like the first embodiment.

22. Example of Three-Layer Laminated Structure Body

In each of the embodiments described above, the laminated structure body 13 of the solid-state imaging apparatus 1 has been constituted by the two layers, the lower structure body 12 and the upper structure body 11, but may be constituted by three or more layers.

Figure 79:
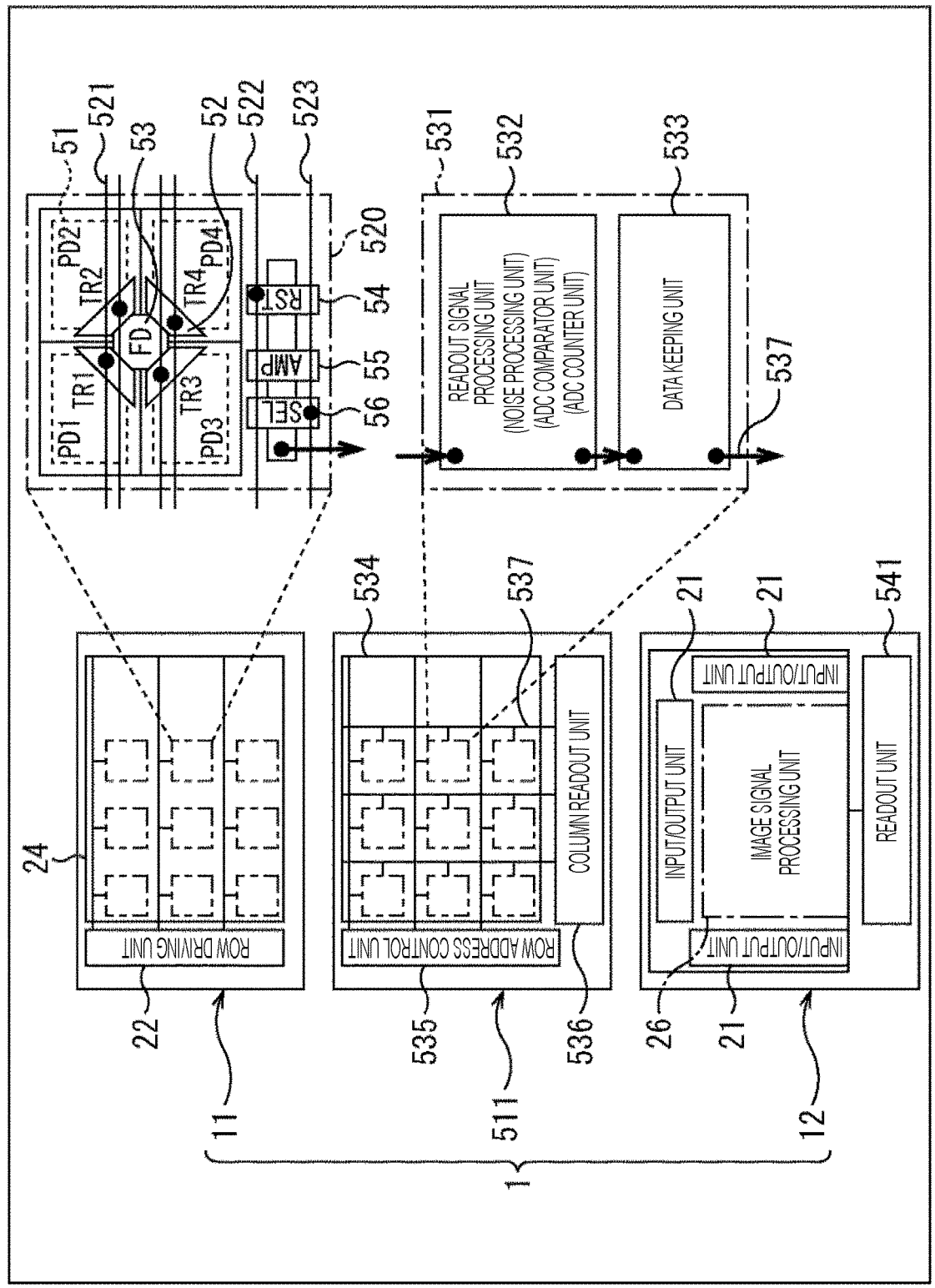
FIG. 79 is a diagram illustrating an example in which the solid-state imaging apparatus is configured with a three-layer laminated structure body.
Figure 80:
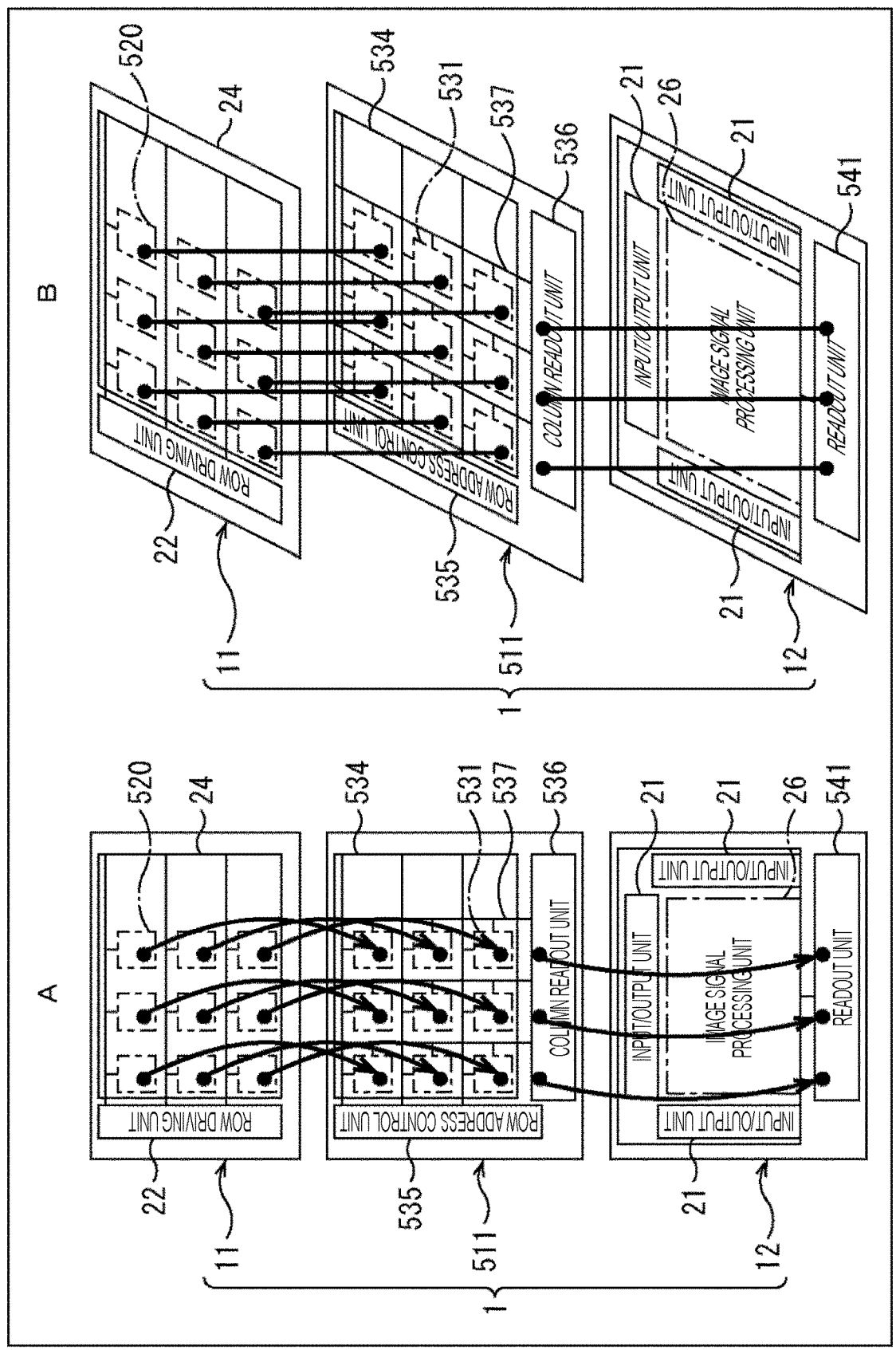
FIG. 80 is a diagram illustrating the example in which the solid-state imaging apparatus is configured with the three-layer laminated structure body.

With reference to FIGS. 79 and 80, an example, in which the laminated structure body 13 is constituted by three layers by providing a third structure body 511 between the lower structure body 12 and the upper structure body 11, will be described.

FIG. 79 shows a configuration in a case where the pixel array unit 24 has a pixel sharing structure.

The pixel sharing structure is a structure in which each pixel 31 has a photodiode (PD) 51 and a transfer transistor 52, but the plurality of pixels share an FD 53, an amplifier transistor 55, a reset transistor 54, and a selection transistor 56.

In FIG. 79, as a sharing unit 520, a structure in which the FD 53, the amplifier transistor 55, the reset transistor 54, and the selection transistor 56 are shared by four pixels (2×2), each two pixels in the row direction and each two pixels in the column direction.

Gate electrodes of four transfer transistors 52 are each connected to one transfer transistor driving signal line 521 extending in the row direction. The four transfer transistor driving signal lines 521, which are respectively connected to the gate electrodes of the four transfer transistors 52 and extend in the row direction, are arranged side by side in parallel in the column direction.

The FD 53 is connected to the gate electrode of the amplifier transistor 55 and the diffusion layer of the reset transistor 54 through wirings (not shown). To the gate electrode of the reset transistor 54, one reset transistor driving signal line 522 extending in the row direction is connected.

To the gate electrode of the selection transistor 56, one selection transistor driving signal line 523 extending in the row direction is connected. The selection transistor 56 may be omitted in some cases.

In the system configuration example of the solid-state imaging apparatus 1 shown in FIG. 2, the plurality of pixels 31 were each connected to the vertical signal lines 33 extending in the column direction. Then, each of the plurality of vertical signal lines 33 was connected to the column signal processing unit 25 arranged at the destination thereof, and the noise processing and AD conversion processing were performed in the column signal processing unit 25.

On the other hand, the solid-state imaging apparatus 1 with the three-layer laminated structure body 13 shown in FIG. 79 includes area signal processing units 531 at the third structure body 511 between the lower structure body 12 and the upper structure body 11.

The area signal processing unit 531 includes a readout signal processing unit 532, which has a noise processing unit and an ADC, and a data keeping unit 533, which keeps digital data after AD conversion.

For example, in a case where each of the pixels 31 of the sharing unit 520 outputs data expressed by 16 bits after the AD conversion, the data keeping unit 533 includes a data keeping means such as a latch for 64 bits or a shift register to keep these data.

The area signal processing unit 531 further includes an output signal wiring 537 for outputting the data kept in the data keeping unit 533 to the outside of the area signal processing unit 531. This output signal wiring may be, for example, a 64-bit signal line which outputs in parallel 64-bit data kept in the data keeping unit 533, may be a 16-bit signal line for outputting data of four pixels kept in the data keeping unit 533 by one pixel at a time, or may be an 8-bit signal line for a half of one pixel data or a 32-bit signal line for data of two pixels. Alternatively, the output signal wiring may be a 1-bit signal line which reads out, bit by bit, the data kept in the data keeping unit 533.

In the solid-state imaging apparatus 1 shown in FIG. 79, one sharing unit 520 of the upper structure body 11 is connected to one area signal processing unit 531 of the third structure body 511. In other words, the sharing unit 520 and the area signal processing unit 531 correspond to each other by one by one. Therefore, as shown in FIG. 79, the third structure body 511 includes an area signal processing unit array 534 in which the plurality of area signal processing units 531 are arrayed in both the row direction and the column direction.

Moreover, the third structure body 511 includes a row address control unit 535 which reads out the data of the data keeping unit 533 included in each of the plurality of area signal processing units 531 arrayed in the row direction and the column direction. The row address control unit 535 determines a readout position in the row direction as in a general semiconductor memory apparatus.

The area signal processing units 531 aligned in the row direction of the area signal processing unit array 534 are connected to control signal lines extending in the row direction from the row address control unit 535, and the operations of the area signal processing units 531 are controlled by the row address control unit 535.

The area signal processing units 531 aligned in the column direction of the area signal processing unit array 534 are connected to an output signal wiring 537 extending in the column direction, and the output signal wiring 537 is connected to a column readout unit 536 arranged further to the area signal processing unit array 534.

As for the data kept in the data keeping unit 533 of each area signal processing unit 531 of the area signal processing unit array 534, the data of the data keeping units 533 of all the area signal processing units 531 aligned in the row direction may be read out to the column readout unit 536 simultaneously, or only the data of a specific area signal processing unit 531 designated by the column readout unit 536 may be read out.

Wiring for outputting the data read out from the area signal processing units 531 to the outside of the third structure body 511 is connected to the column readout unit 536.

The lower structure body 12 is connected to the wiring from the column readout unit 536 of the third structure body 511 and includes a readout unit 541 for receiving the data outputted from this column readout unit 536.

Moreover, the lower structure body 12 includes an image signal processing unit 26 for image signal processing of the data received from the third structure body 511.

Furthermore, the lower structure body 12 includes input/output units 21 for outputting the data received from the third structure body 511 via the image signal processing unit 26 or outputting data without passing therethrough. This input/output unit 21 may include not only the output circuit unit 47, but also the input circuit unit 42 for inputting, for example, the timing signal used in the pixel array unit 24 and the characteristic data used in the image signal processing unit 26 into the apparatus from the outside of the solid-state imaging apparatus 1.

As shown in B of FIG. 80, each sharing unit 520 formed at the upper structure body 11 is connected to the area signal processing unit 531 of the third structure 511 arranged right under that sharing unit 520. This wiring connection between the upper structure body 11 and the third structure body 511 can be connected by, for example, the Cu—Cu direct bonding structure shown in FIG. 8.

Moreover, as shown in B of FIG. 80, the column readout unit 536 outside the area signal processing unit array 534 formed at the third structure body 511 is connected to the readout unit 541 of the lower structure body 12 arranged right under that column readout unit 536. This wiring connection between the third structure body 511 and the lower structure body 12 can be connected by, for example, the Cu—Cu direct bonding structure shown in FIG. 8 or the twin-contact structure shown in FIG. 6.

Accordingly, as shown in A of FIG. 80, the pixel signals of the respective sharing units 520 formed at the upper structure body 11 are outputted to the corresponding area signal processing units 531 of the third structure body 511. The data kept in the data keeping units 533 of the area signal processing units 531 is outputted from the column readout unit 536 and supplied to the readout unit 541 of the lower structure body 12. Then, in the image signal processing unit 26, the data is subjected to various kinds of signal processing (e.g., tone curve correction processing) and outputted to the outside of the apparatus from the input/output units 21.

Note that, in the solid-state imaging apparatus 1 with the three-layer laminated structure body 13, the input/output units 21 formed at the lower structure body 12 may be arranged on the lower side of the row address control unit 535 of the third structure body 511.

Furthermore, in the solid-state imaging apparatus 1 with the three-layer laminated structure body 13, the input/output units 21 formed at the lower structure body 12 may be arranged on the lower sides of the area signal processing units 531 of the third structure body 511.

Further, in the solid-state imaging apparatus 1 with the three-layer laminated structure body 13, the input/output units 21 formed at the lower structure body 12 may be arranged on the lower side of the pixel array unit 24 of the upper structure body 11.

23. Application Example to Electronic Devices

The present technology is not limited to application to a solid-state imaging apparatus. That is, the present disclosure can be applied to all electronic devices using a solid-state imaging apparatus in an image fetching unit (photoelectric conversion unit), such as imaging apparatuses including a digital still camera and a video camera, portable terminal apparatuses having an imaging function, copying machines using a solid-state imaging apparatus in an image reading unit, and the like. The solid-state imaging apparatus may be in a mode formed as a single chip or in a modular mode having an imaging function in which an imaging unit and a signal processing unit or an optical system are packaged together.

Figure 81:
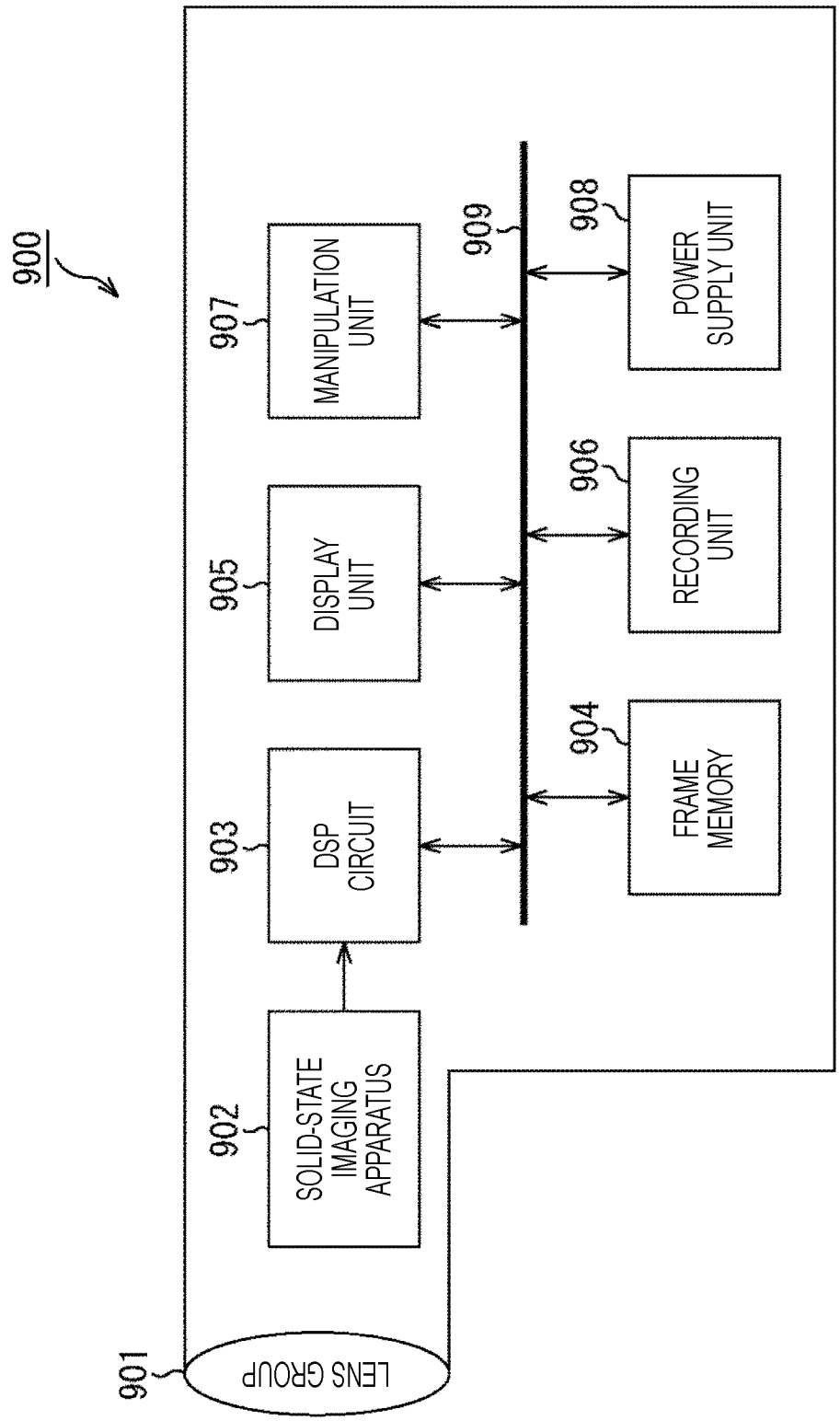
FIG. 81 is a block diagram showing a configuration example of an imaging apparatus as an electronic device to which the present technology is applied.

FIG. 81 is a block diagram showing a configuration example of an imaging apparatus as an electronic device to which the present technology is applied.

An imaging apparatus 900 in FIG. 81 includes an optical unit 901 including a lens group and the like, a solid-state imaging apparatus (imaging device) 902 adopting the configuration of the solid-state imaging apparatus 1 in FIG. 1, and a digital signal processor (DSP) circuit 903 which is a camera signal processing circuit. Moreover, the imaging apparatus 900 also includes a frame memory 904, a display unit 905, a recording unit 906, a manipulation unit 907, and a power supply unit 908. The DSP circuit 903, the frame memory 904, the display unit 905, the recording unit 906, the manipulation unit 907, and the power supply unit 908 are connected to each other via a bus line 909.

The optical unit 901 fetches incident light (image light) from a subject to be imaged on an imaging face of the solid-state imaging apparatus 902. The solid-state imaging apparatus 902 converts the light amount of the incident light imaged on the imaging face by the optical unit 901 into an electric signal on a pixel basis and outputs the electric signal as a pixel signal. As this solid-state imaging apparatus 902, a solid-state imaging apparatus, which is downsized by not providing, at the outer peripheral portion, a conductive pad for standing a measuring needle for the purpose of measuring the operation of the solid-state imaging apparatus 1 in FIG. 1, that is, the laminated structure body 13 and by arranging the input/output circuit unit 49 under the region of the pixel array unit 24 of the upper structure body 11 or in the region under the pixel peripheral circuit region 313 of the upper structure body 11, can be used.

The display unit 905 is constituted by, for example, a panel type display apparatus with a liquid crystal panel, an organic electro luminescence (EL) panel, or the like and displays a moving image or a still image imaged by the solid-state imaging apparatus 902. The recording unit 906 records the moving image or the still image imaged by the solid-state imaging apparatus 902 on a recording medium such as a hard disk or a semiconductor memory.

The manipulation unit 907 issues a manipulation command for various functions possessed by the imaging apparatus 900 under the manipulation by a user. The power supply unit 908 supplies various power supplies serving as operation power supplies of the DSP circuit 903, the frame memory 904, the display unit 905, the recording unit 906, and the manipulation unit 907 to these supply targets as appropriate.

As described above, by using the solid-state imaging apparatus 1 according to each embodiment described above as the solid-state imaging apparatus 902, the package size of the semiconductor package can be downsized. Therefore, even in the imaging apparatus 900 such as a video camera, digital still camera, a camera module for a mobile device such a portable telephone, or the like, the apparatus can be downsized.

24. Usage Examples of Image Sensor

Figure 82:
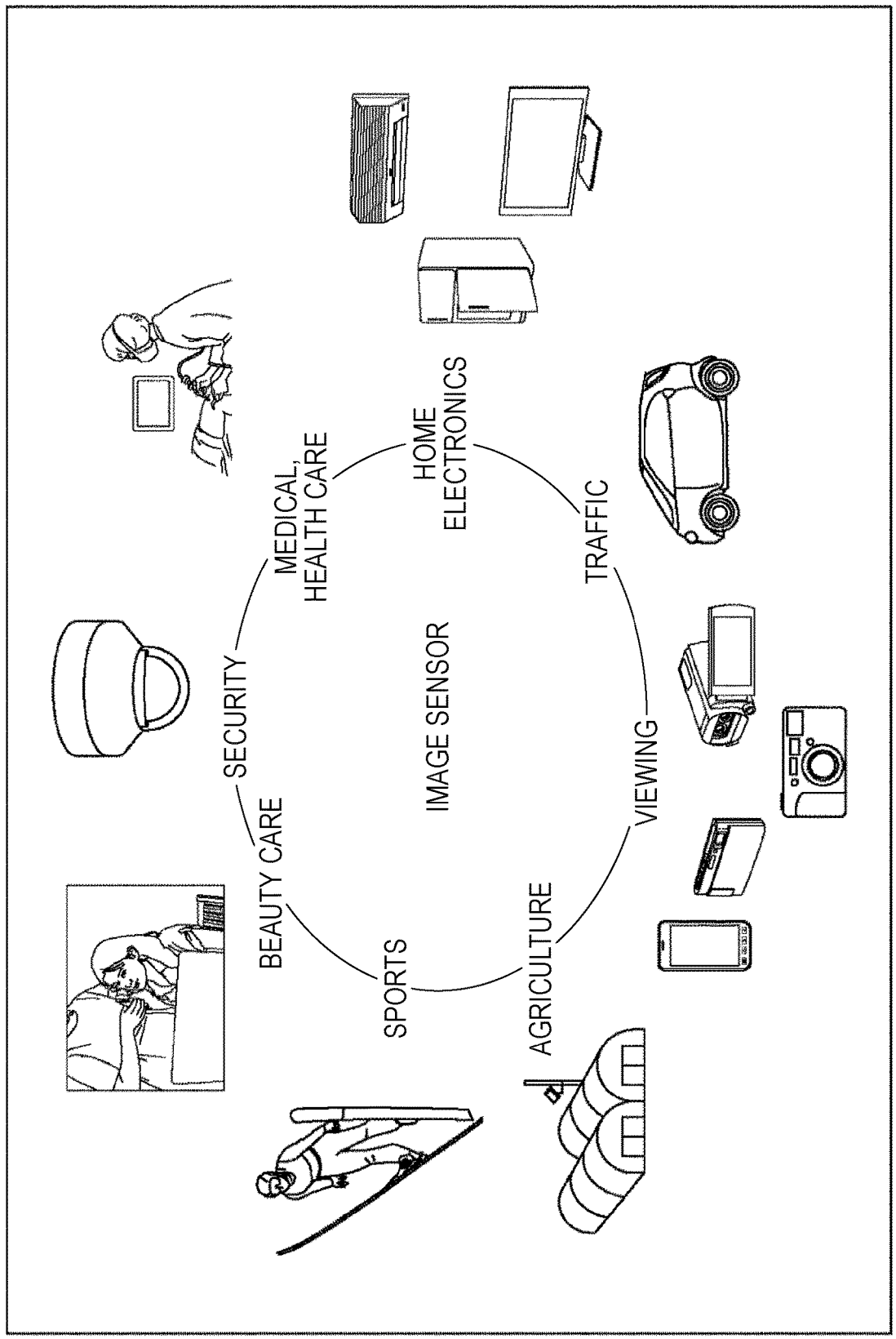
FIG. 82 is a diagram illustrating a usage example of the solid-state imaging apparatus in FIG. 1.

FIG. 82 is a diagram showing usage examples of using the aforementioned solid-state imaging apparatus 1.

A CMOS image sensor as the solid-state imaging apparatus 1 can be used in, for example, various cases for sensing light such as visible light, infrared light, ultraviolet light, or X-rays as described below.

- An apparatus, such as a digital camera and a portable device with a camera function, which captures an image to be used for viewing.
- An apparatus used for traffic, such as an in-vehicle sensor which captures the front, rear, surroundings, inside, and the like of an automobile for safe driving, such as automatic stop, recognition of driver's condition, and the like, a surveillance camera which monitors traveling vehicles and roads, a distance measuring sensor which measures the distance between the vehicles, or the like.
- An apparatus used for home electronics such as a TV, a refrigerator, and an air conditioner for capturing user's gesture to perform device manipulation according to that gesture.
- An apparatus used for medical and health care, such as an endoscope, an apparatus for performing angiography by receiving infrared light.
- An apparatus used for security, such as a surveillance camera used for crime prevention and a camera for personal authentication application.
- An apparatus used for beauty care, such as a skin measuring instrument which images skin and a microscope which images a scalp.
- An apparatus used for sports, such as an action camera and a wearable camera for sports applications and the like.
- An apparatus used for agriculture, such as a camera for monitoring the conditions of fields and crops.

The solid-state imaging apparatus 1 can be applied to both one using electrons as signal charges and one using positive holes as signal charges.

Moreover, the present disclosure is not limited to application to a solid-state imaging apparatus which senses the distribution of the amount of incident light of visible light to be imaged as an image, and can also be applied to all solid-state imaging apparatuses which image the distribution of an incident amount of infrared light, X-rays, particles, or the like as an image and to all solid-state imaging apparatuses (physical amount distribution sensing apparatuses) such as a fingerprint detection sensor in a broad sense which senses the distribution of other physical amounts of pressure and electrostatic capacity to be imaged as an image.

Furthermore, the present disclosure can be applied not only to the solid-state imaging apparatuses, but also to all semiconductor apparatuses having other semiconductor integrated circuits.

The embodiments of present disclosure are not limited to the embodiments described above, and various modifications are possible within a scope without departing from the gist of the present disclosure.

For example, a mode in which all or a part of the plurality of embodiments described above are combined can be adopted.

Note that the effects described herein are merely examples and not limited, and effects other than those described herein may be exerted.

Note that present technology can also adopt the following configurations.

(1)

A solid-state imaging apparatus, in which
a first structure body, at which a pixel array unit in which pixels for performing photoelectric conversion are two-dimensionally aligned is formed, and a second structure body, at which an output circuit unit for outputting a pixel signal outputted from the pixels to an outside of the apparatus is formed, are laminated,
the output circuit unit, a through via which penetrates a semiconductor substrate constituting a part of the second structure body, and a signal output external terminal connected to the outside of the apparatus are arranged under the pixel array unit of the first structure body,
the output circuit unit is connected to the signal output external terminal via the through via, and
an outermost surface of the apparatus is a resin layer formed on an upper layer of an on-chip lens of the pixel array unit.

(2)

The solid-state imaging apparatus according to (1), including a rib structure body on an outer peripheral portion further outside than the pixel array unit.

(3)

A solid-state imaging apparatus, in which
a first structure body, at which a pixel array unit in which pixels for performing photoelectric conversion are two-dimensionally aligned is formed, and a second structure body, at which an output circuit unit for outputting a pixel signal outputted from the pixels to an outside of the apparatus is formed, are laminated,
the output circuit unit, a through via which penetrates a semiconductor substrate constituting a part of the second structure body, and a signal output external terminal connected to the outside of the apparatus are arranged under the pixel array unit of the first structure body,
the output circuit unit is connected to the signal output external terminal via the through via, and
an outermost surface of the apparatus is an antireflection film formed on a surface of an on-chip lens of the pixel array unit.

(4)

A solid-state imaging apparatus, in which
a first structure body, at which a pixel array unit in which pixels for performing photoelectric conversion are two-dimensionally aligned is formed, a microlens array substrate or a laminated lens structure body positioned above the first structure body, and a second structure body, at which an output circuit unit for outputting a pixel signal outputted from the pixels to an outside of the apparatus is formed, are laminated, the output circuit unit, a through via which penetrates a semiconductor substrate constituting a part of the second structure body, and a signal output external terminal connected to the outside of the apparatus are arranged under the pixel array unit of the first structure body, and the output circuit unit is connected to the signal output external terminal via the through via.

(5)

A solid-state imaging apparatus, in which
a first structure body, at which a pixel array unit in which pixels for performing photoelectric conversion are two-dimensionally aligned is formed, and a second structure body, at which an output circuit unit for outputting a pixel signal outputted from the pixels to an outside of the apparatus is formed, are laminated, the output circuit unit, a through via which penetrates a semiconductor substrate constituting a part of the second structure body, and a signal output external terminal connected to the outside of the apparatus are arranged under the pixel array unit of the first structure body, the output circuit unit is connected to the signal output external terminal via the through via, and an outermost surface of the apparatus is a fluorescent material formed on an upper layer of an on-chip lens of the pixel array unit.

(6)

A solid-state imaging apparatus, in which
a first structure body, at which a pixel array unit in which pixels for performing photoelectric conversion are two-dimensionally aligned is formed, and a second structure body at which an output circuit unit for outputting a pixel signal outputted from the pixels to an outside of the apparatus is formed, are laminated, the output circuit unit, a through via which penetrates a semiconductor substrate constituting a part of the second structure body, and a signal output external terminal connected to the outside of the apparatus are arranged under the pixel array unit of the first structure body, the output circuit unit is connected to the signal output external terminal via the through via, and an outermost surface of the apparatus is an antibody which is formed on an upper layer of the pixel array unit and reacts to a fluorescent protein.

(7)

A solid-state imaging apparatus, in which
a first structure body, at which a pixel array unit in which pixels for performing photoelectric conversion are two-dimensionally aligned is formed, and a second structure body, at which an output circuit unit for outputting a pixel signal outputted from the pixels to an outside of the apparatus is formed, are laminated, the output circuit unit, a through via which penetrates a semiconductor substrate constituting a part of the second structure body, and a signal output external terminal connected to the outside of the apparatus are arranged under the pixel array unit of the first structure body, the output circuit unit is connected to the signal output external terminal via the through via, and an outermost surface of the apparatus is a chemically modified film which is formed on an upper layer of the pixel array unit and attaches a charge.

(8)

An electronic device including a solid-state imaging apparatus according to any one of (1) to (7).

REFERENCE SIGNS LIST

1 Solid-state imaging apparatus
11 First structure body (upper structure body)
12 Second structure body (lower structure body)
13 Laminated structure body
14 External terminal (signal input/output terminal)
15 Color filter
16 On-chip lens
17 Sealing resin
18 Protective substrate
21 Input/output unit
22 Row driving unit
24 Pixel array unit
25 Column signal processing unit
26 Image signal processing unit
31 Pixel
41 Input terminal
42 Input circuit unit
47 Output circuit unit
48 Output terminal
49 Input/output circuit unit
51 Photodiode
81 Semiconductor substrate
88 Through electrode via
90 Rewiring
101 Semiconductor substrate
105 Chip through electrode
106 Connection wiring
109 Silicon through electrode
311 Input/output circuit region
312 Signal processing circuit region
313 Pixel peripheral circuit region
314 Upper and lower substrate connection region
321 I/O circuit
351 Memory board
352 Memory circuit
400 Imaging apparatus
402 Solid-state imaging apparatus
511 Third structure body
531 Area signal processing unit
533 Data keeping unit
900 Imaging apparatus
902 Solid-state imaging apparatus
1011 Lens-attached substrate
1012 Laminated lens structure body
1041 Microlens array substrate
1042 Carrier substrate
1043 Light guide path
1044 Microlens
1051 Resin layer
1061 Rib structure body
1062 Antireflection film
1161 Antibody

The invention claimed is:
1. A solid-state imaging apparatus, comprising:
a laminated structure including:
a semiconductor substrate;

a pixel array unit having pixels, wherein each pixel includes a photodiode;

an output circuit outputting a pixel signal outputted from the pixels; and a signal output external terminal connected to the output circuit via a through via;

an on-chip lens above the laminated structure; and a lens structure fixed to the on-chip lens through a sealing resin.

2. The solid-state imaging apparatus according to claim 1, further comprising a rib structure body.

3. The solid-state imaging apparatus according to claim 2, wherein the rib structure body has a rectangular shape so as to surround an outer peripheral portion of the pixel array unit.

4. The solid-state imaging apparatus according to claim 1, comprising a resin layer formed on a surface of the on-chip lens.

5. The solid-state imaging apparatus according to claim 1, comprising an antireflection film formed on a surface of the on-chip lens.

6. The solid-state imaging apparatus according to claim 1, further comprising:

a laminated lens structure body formed above the laminated structure.

7. The solid-state imaging apparatus according to claim 6, wherein the laminated lens structure body comprises a plurality of lens-attached substrates.

8. The solid-state imaging apparatus according to claim 7, wherein each lens-attached substrate has a configuration in which a lens resin portion is added to a carrier substrate.

9. The solid-state imaging apparatus according to claim 8, wherein the carrier substrate has a through hole, and wherein the lens resin portion is formed inside the through hole.

10. The solid-state imaging apparatus according to claim 6, wherein the laminated lens structure body is formed by laminating together two lens-attached substrates.

* * * * *